(12) United States Patent
Kakehata

(10) Patent No.: US 10,985,278 B2
(45) Date of Patent: Apr. 20, 2021

(54) METHOD FOR MANUFACTURING SEMICONDUCTOR DEVICE

(71) Applicant: Semiconductor Energy Laboratory Co., Ltd., Atsugi (JP)

(72) Inventor: Tetsuya Kakehata, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/211,160

(22) Filed: Jul. 15, 2016

(65) Prior Publication Data
US 2017/0025543 A1 Jan. 26, 2017

(30) Foreign Application Priority Data

Jul. 21, 2015 (JP) .............................. JP2015-143858

(51) Int. Cl.
*H01L 21/00* (2006.01)
*H01L 29/786* (2006.01)
*H01L 29/66* (2006.01)

(52) U.S. Cl.
CPC .. *H01L 29/78606* (2013.01); *H01L 29/66969* (2013.01); *H01L 29/7869* (2013.01); *H01L 29/78696* (2013.01)

(58) Field of Classification Search
CPC ........... H01L 29/66969; H01L 29/7869; H01L 29/78696
USPC ............................................ 257/43; 438/104
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,392 B2 | 9/2006 | Isobe et al. |
| 7,105,868 B2 | 9/2006 | Nause et al. |
| 7,148,092 B2 | 12/2006 | Isobe et al. |
| 7,211,825 B2 | 5/2007 | Shih et al. |
| 7,282,782 B2 | 10/2007 | Hoffman et al. |
| 7,297,977 B2 | 11/2007 | Hoffman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Jay C Kim
(74) *Attorney, Agent, or Firm* — Fish & Richardson P.C.

(57) ABSTRACT

An insulator is formed over a substrate, an opening is formed in the insulator, and an oxide semiconductor is formed in the opening. Then, part of the insulator is removed to expose a side surface of the oxide semiconductor.

2 Claims, 105 Drawing Sheets

(56) References Cited

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,506 B2 | 6/2010 | Isobe et al. |
| 7,749,818 B2 | 7/2010 | Isobe et al. |
| 7,795,734 B2 | 9/2010 | Isobe et al. |
| 8,436,403 B2 * | 5/2013 | Yamazaki .......... H01L 29/7869 257/256 |
| 8,547,771 B2 | 10/2013 | Koyama |
| 8,754,409 B2 | 6/2014 | Yamazaki et al. |
| 8,779,432 B2 | 7/2014 | Yamazaki et al. |
| 8,865,555 B2 * | 10/2014 | Yamazaki ......... H01L 29/66742 257/E29.296 |
| 8,901,553 B2 | 12/2014 | Inoue et al. |
| 8,962,457 B2 | 2/2015 | Watanabe |
| 8,981,367 B2 | 3/2015 | Yoneda et al. |
| 9,029,863 B2 * | 5/2015 | Isobe .................. H01L 29/7869 257/296 |
| 9,202,925 B2 | 12/2015 | Yamazaki et al. |
| 9,276,125 B2 * | 3/2016 | Shimomura ...... H01L 29/66969 |
| 9,331,071 B2 * | 5/2016 | Sunamura ........... H01L 27/1225 |
| 9,343,579 B2 * | 5/2016 | Yamazaki ........... H01L 29/7869 |
| 9,349,844 B2 | 5/2016 | Inoue et al. |
| 9,391,209 B2 * | 7/2016 | Godo ................. H01L 29/7869 |
| 9,472,680 B2 | 10/2016 | Yoneda et al. |
| 9,691,772 B2 * | 6/2017 | Noda ............... H01L 29/78696 |
| 9,755,081 B2 | 9/2017 | Yamazaki et al. |
| 10,043,833 B2 | 8/2018 | Yoneda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 * | 4/2011 | Yamazaki ........... H01L 27/0688 257/43 |
| 2014/0326992 A1 * | 11/2014 | Hondo ............. H01L 29/78696 257/43 |
| 2015/0372009 A1 | 12/2015 | Yamazaki |
| 2016/0218219 A1 | 7/2016 | Asami et al. |
| 2016/0233339 A1 | 8/2016 | Okazaki |
| 2016/0233340 A1 | 8/2016 | Shimomura et al. |
| 2016/0240625 A1 | 8/2016 | Inoue et al. |
| 2016/0247832 A1 | 8/2016 | Suzawa et al. |
| 2016/0260822 A1 | 9/2016 | Okamoto et al. |
| 2016/0284859 A1 | 9/2016 | Asami |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-006642 A | 1/2004 |
| JP | 2004-103957 A | 4/2004 |
| JP | 2004-273614 A | 9/2004 |
| JP | 2004-273732 A | 9/2004 |
| JP | 2012-059860 A | 3/2012 |
| JP | 2012-248582 A | 12/2012 |
| JP | 2012-257187 A | 12/2012 |
| JP | 5215589 | 6/2013 |
| JP | 2013-138191 A | 7/2013 |
| JP | 2014-195062 A | 10/2014 |

(56) References Cited

FOREIGN PATENT DOCUMENTS

JP            2015-005733 A      1/2015
WO      WO-2004/114391         12/2004

OTHER PUBLICATIONS

Asaoka.Y et al., "29.1:Polarizer-Free Reflective LCD Combined With Ultra Low-Power Driving Technology", SID Disgest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A) May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxicide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87. pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digets of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214TH ECS Meeting, 2008, No. 2317, ECS.
Kimizuka.N. et al., "Spinel,YBFE2O4, and YB2FE3O7 Types of Structures for Compounds in the In2O3 and SC2O3—A2O3—BO Systems [A; Fe, Ga, or Al; B: Mg, Fe, Ni, Cu,or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13TH International Display Workshops, Dec. 7, 2006, pp. 663-666.
Lee.J et al., "World's Largest (15-Inch) XGA AMLCS Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digets '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of The 6TH International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : ID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 IN. QVGA AMOLED Display Using In—Ga—Zn-Oxide TFTS With a Novel Passivation Layer", SID Digest '09 : SID International Symposium Digets of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID DIGEST '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZNO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTS", IDW '09 : Proceedings of the 16TH International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15TH International Display Workshops, Dec. 3, 2008, pp. 1637-1640.

Tsuda.K et al., "Ultra Low Power Consumption Technologies for Mobile TFT-LCDs ", IDW '02 : Proceedings of the 9TH International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Yamazaki.S et al., "Research, Development, and Application of Crystalline Oxide Semiconductor", SID Digest '12 : SID International Symposium Digest of Technical Papers, Jun. 5, 2012, pp. 183-186.

\* cited by examiner

FIG. 5A
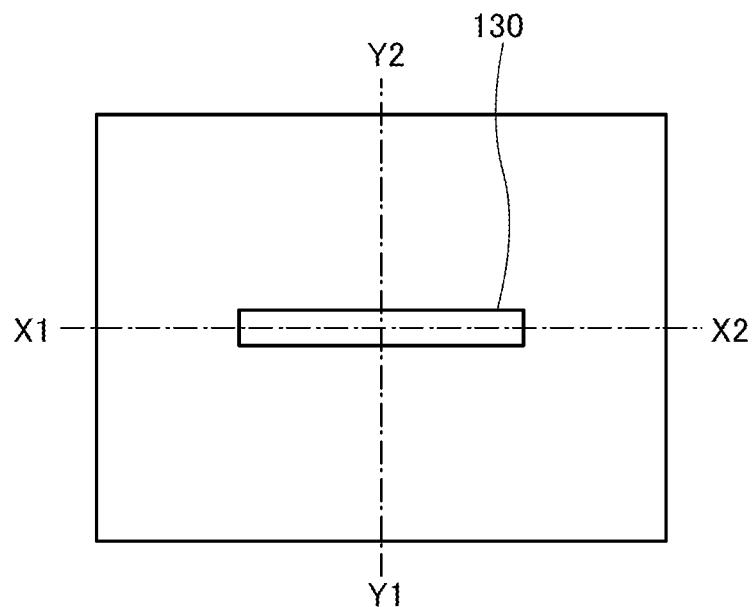
FIG. 5B    FIG. 5C
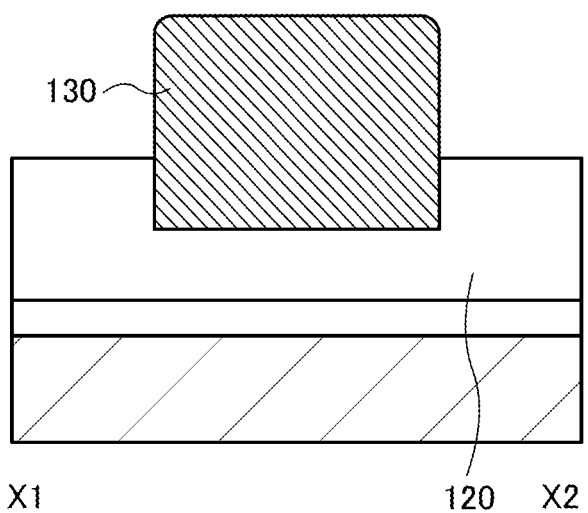 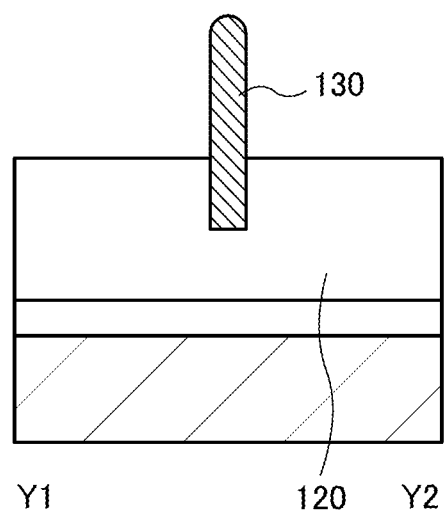

FIG. 27A
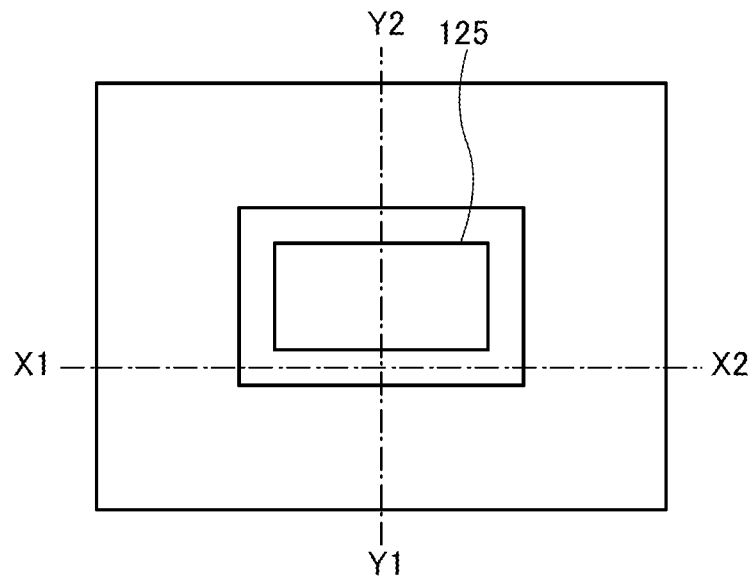
FIG. 27B
FIG. 27C
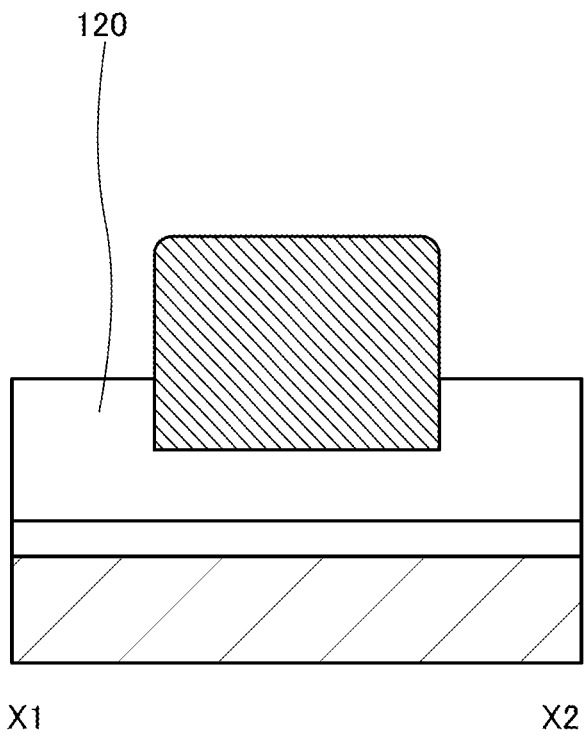
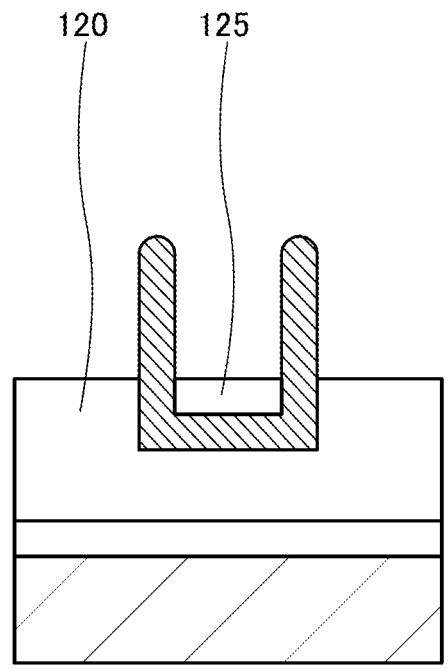

FIG. 38A
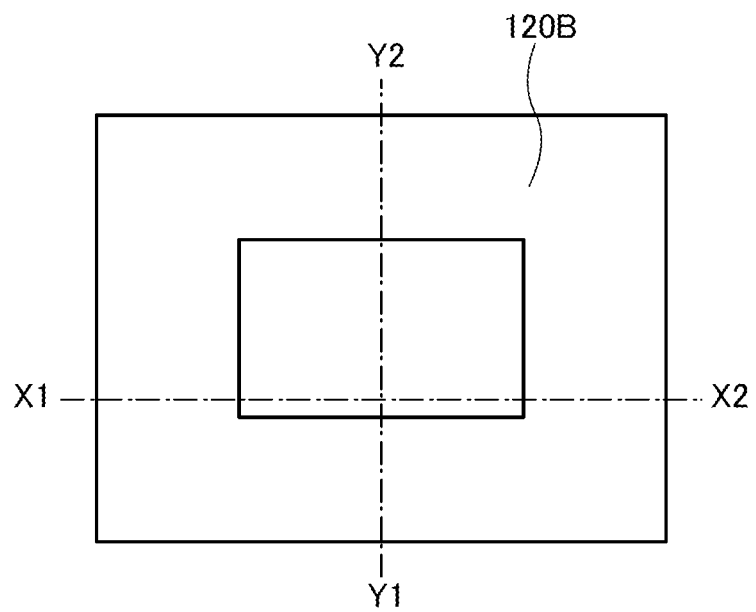
FIG. 38B
FIG. 38C
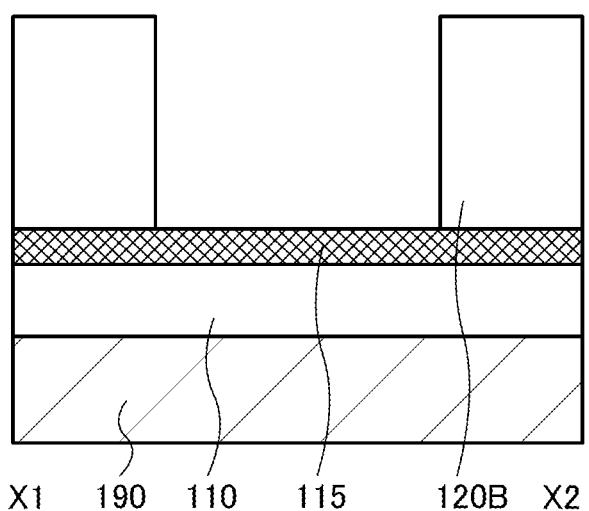
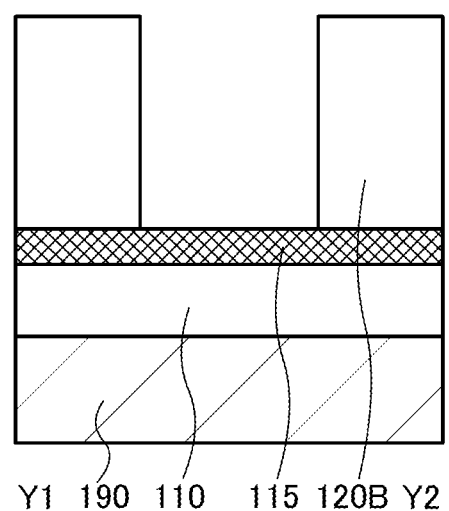

FIG. 51A
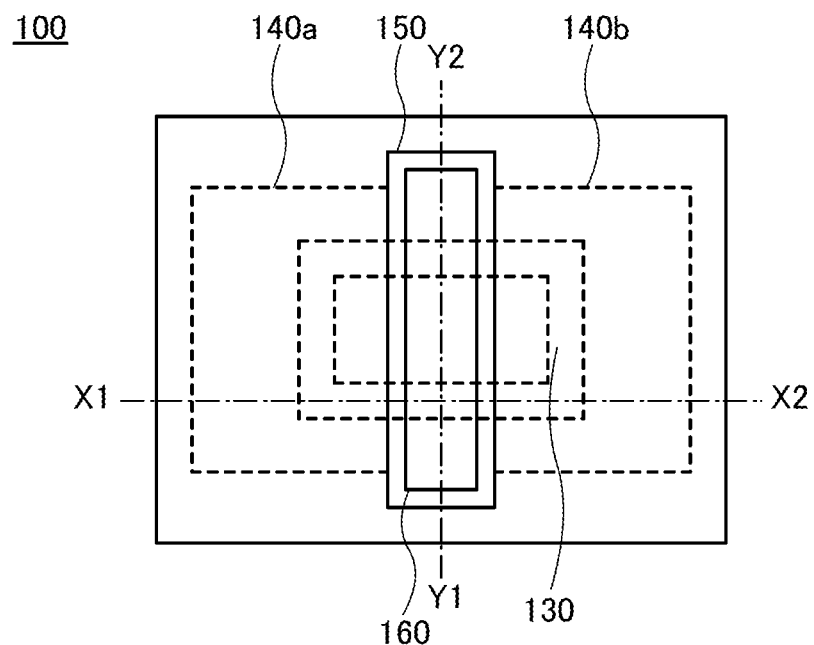
FIG. 51B
FIG. 51C
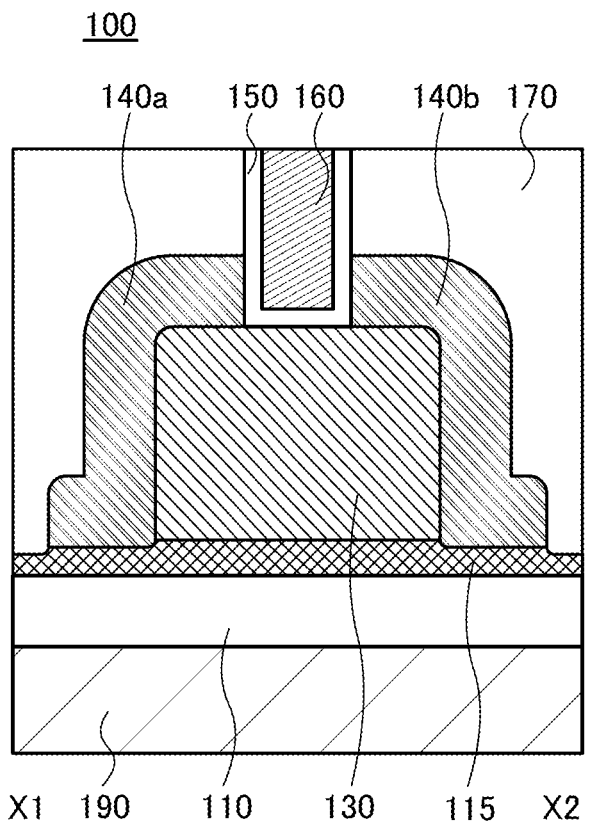

FIG. 100A1
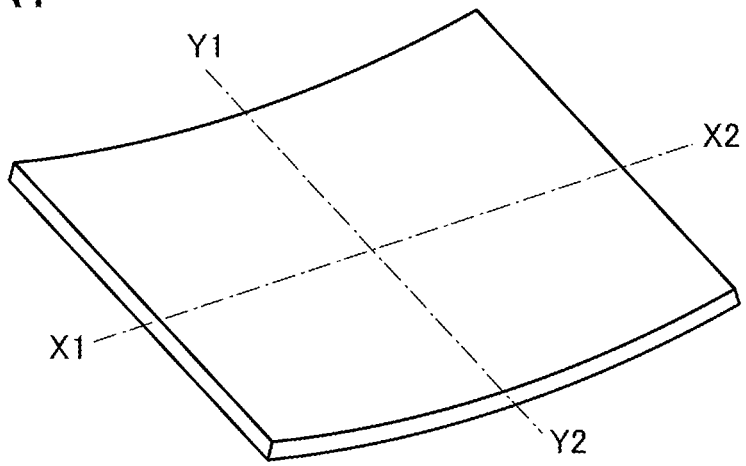
FIG. 100A2
FIG. 100A3
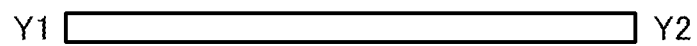
FIG. 100B1
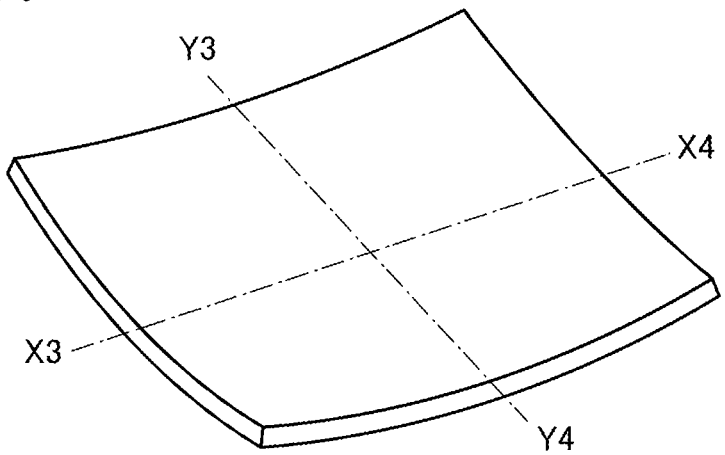
FIG. 100B2
FIG. 100B3
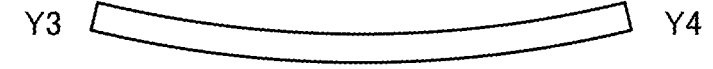

METHOD FOR MANUFACTURING SEMICONDUCTOR DEVICE

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, an imaging device, and an electronic device. The present invention relates to methods for manufacturing an oxide, a display device, a liquid crystal display device, a light-emitting device, a memory device, a processor, an imaging device, and an electronic device. The present invention relates to methods for driving a semiconductor device, a display device, a liquid crystal display device, a light-emitting device, a memory device, a processor, an imaging device, and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

In this specification and the like, a semiconductor device refers to any device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where driver circuits are formed over the same substrate, it is preferable to use polycrystalline silicon, which can be used to form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

In addition, a transistor including an amorphous oxide semiconductor is disclosed (see Patent Document 3). An oxide semiconductor can be formed by a sputtering method or the like, and thus can be used for a semiconductor of a transistor in a large display device. A transistor including an oxide semiconductor has high field-effect mobility; therefore, a high-performance display device where driver circuits are formed over the same substrate can be obtained. Moreover, there is an advantage that capital investment can be reduced because part of production equipment for a transistor including amorphous silicon can be retrofitted and utilized.

Recent research and development results show that using a crystalline oxide semiconductor increases the reliability of a transistor as compared to the case of using an amorphous oxide semiconductor (Non-Patent Document 1).

It is also disclosed that a transistor having a high field-effect mobility can be obtained by a well potential formed using an active layer including an oxide semiconductor (see Patent Document 4). It is known that a transistor including an oxide semiconductor has an extremely low leakage current in an off state. For example, a low power consumption CPU and the like utilizing a characteristic of a low leakage current of the transistor including an oxide semiconductor are disclosed (see Patent Document 5).

Semiconductor devices are miniaturized with each passing year in accordance with the scaling law. For example, reduction in channel length (gate line width) and reduction in thickness of a gate insulator are performed to achieve the miniaturization. Accordingly, it is becoming difficult to achieve miniaturization of semiconductor devices because it depends on the performances of apparatuses such as a light exposure apparatus and a deposition apparatus, and thus there is a limitation on the miniaturization of semiconductor devices. Therefore, in recent years, scaling is carried out by approaches in terms of processes independent of the performances of light exposure apparatuses, e.g., a double patterning process.

Meanwhile, even when the transistor size is reduced simply, the power supply voltage cannot be scaled; as a result, a short channel effect and the like are enhanced, which causes deterioration of the electrical characteristics of the transistor, such as reduction in the threshold voltage. In view of this problem, transistor structures in which the semiconductor layer is surrounded by the electric field of the gate, e.g., a FIN transistor and a gate-all-around (GAA) transistor, are proposed. For example, a FIN transistor can have an increased effective channel width with respect to the width of the semiconductor layer because the gate exhibits high controllability for the channel and the channel is also formed in a side surface of the semiconductor layer. However, miniaturization of such structures is difficult because the minimum width of the semiconductor layer depends on the performances of light exposure apparatuses.

In addition, it becomes difficult to accurately perform processing of the shape with the advance in miniaturization, resulting in large variation in the electrical characteristics of transistors included in a semiconductor device.

REFERENCES

Patent Documents

[Patent Document 1] Japanese Published Patent Application No. S63-239117
[Patent Document 2] Japanese translation of PCT international application No. H11-505377

[Patent Document 3] Japanese Patent No. 5215589
[Patent Document 4] Japanese Published Patent Application No. 2012-059860
[Patent Document 5] Japanese Published Patent Application No. 2012-257187

Non-Patent Document

[Non-Patent Document 1] Shunpei Yamazaki, Jun Koyama, Yoshitaka Yamamoto, and Kenji Okamoto, "Research, Development, and Application of Crystalline Oxide Semiconductor" SID 2012 DIGEST, pp. 183-186.

SUMMARY OF THE INVENTION

An object of one embodiment of the disclosed invention is to provide a transistor that can be miniaturized. Another object is to provide a transistor with low parasitic capacitance. Another object is to provide a transistor with high operation frequency. Another object is to provide a transistor with stable electrical characteristics. Another object of one embodiment of the invention disclosed is to provide a transistor whose channel length is easily adjusted. Another object of one embodiment of the invention disclosed is to provide a transistor whose amount of on-state current is large.

Another object of one embodiment of the present invention is to achieve high integration, high performance, high reliability, and high productivity also of a semiconductor device including the transistor. Another object is to provide a novel semiconductor device. Note that the descriptions of these objects do not disturb the existence of other objects. Note that one embodiment of the present invention does not necessarily achieve all the objects listed above. Other objects will be apparent from and can be derived from the description of the specification, the drawings, the claims, and the like.

According one embodiment of the present invention, a first insulator is formed over a substrate; an opening is formed in the first insulator; an oxide semiconductor is formed in the opening; part of the first insulator is removed to expose a side surface of the oxide semiconductor; a first conductor and a second conductor are formed over the oxide semiconductor; a second insulator is formed over the first conductor, the second conductor, and the oxide semiconductor; and a third conductor is formed over the second insulator.

According to one embodiment of the present invention, a first insulator is formed over a substrate; an opening is formed in the first insulator; an oxide semiconductor is formed along an inner wall of the opening; part of the first insulator is removed to expose a side surface of the oxide semiconductor; a first conductor and a second conductor are formed over the oxide semiconductor; a second insulator is formed over the first conductor, the second conductor, and the oxide semiconductor; and a third conductor is formed over the second insulator.

In any of the above structures, part of the oxide semiconductor may be embedded in the first insulator.

According to one embodiment of the present invention, a first insulator is formed over a substrate; an opening is formed in the first insulator; a first oxide semiconductor is formed along an inner wall of the opening; part of the first oxide semiconductor is removed to form a second oxide semiconductor having an island shape and a third oxide semiconductor having an island shape; a first conductor and a second conductor are formed over the second oxide semiconductor and the third oxide semiconductor; a second insulator is formed over the first conductor, the second conductor, the second oxide semiconductor, and the third oxide semiconductor; and a third conductor is formed over the second insulator.

According to one embodiment of the present invention, a first insulator is formed over a substrate; an opening is formed in the first insulator; a first oxide semiconductor is formed along an inner wall of the opening; part of the first oxide semiconductor is removed to form a second oxide semiconductor having a ring shape; a second insulator is formed over the second oxide semiconductor; part of the second oxide semiconductor is removed to form a third oxide semiconductor having an island shape and a fourth oxide semiconductor having an island shape; part of the first insulator and part of the second insulator are removed to expose a side surface of the third oxide semiconductor and a side surface of the fourth oxide semiconductor; a first conductor and a second conductor are formed over the third oxide semiconductor and the fourth oxide semiconductor; a third insulator is formed over the first conductor, the second conductor, the third oxide semiconductor, and the fourth oxide semiconductor; and a third conductor is formed over the third insulator.

According to one embodiment of the present invention, a first insulator, a second insulator, an oxide semiconductor, a first conductor, a second conductor, and a third conductor are provided over a substrate. The oxide semiconductor is embedded in the first insulator. The first conductor and the first insulator are in contact with each other at a first interface. The second conductor and the first insulator are in contact with each other at a second interface. The level of the first interface and the level of the second interface are lower than the level of a top surface of the oxide semiconductor. The level of the first interface and the level of the second interface are higher than the level of a bottom surface of the oxide semiconductor.

According to one embodiment of the present invention, a first insulator is provided over a substrate, an oxide semiconductor is provided over the first insulator, a first conductor and a second conductor are provided over the oxide semiconductor, a second insulator is provided over the oxide semiconductor, and a third conductor is provided over the second insulator. Part of the oxide semiconductor is embedded in the first insulator. The first conductor and the first insulator are in contact with each other at a first interface. The second conductor and the first insulator are in contact with each other at a second interface. The level of the first interface and the level of the second interface are lower than the level of a top surface of the oxide semiconductor. The level of the first interface and the level of the second interface are higher than the level of a bottom surface of the oxide semiconductor.

With use of the present invention, transistors that have little variation in characteristics even when being miniaturized can be provided. Alternatively, a transistor with low parasitic capacitance can be provided. A transistor with high operation frequency can be provided. A transistor with stable electrical characteristic can be provided. Furthermore, one embodiment of the invention disclosed can provide a transistor whose amount of on-state current is large.

The application of the prevent invention makes it possible to provide a miniaturized transistor without complicating a manufacturing process. Accordingly, the yield can be improved in terms of mass production. In the transistor structure, the channel width of the transistor can be easily adjusted.

Furthermore, with a structure in which a region in the oxide semiconductor layer to be a channel is in contact with an insulator containing oxygen, oxygen can be supplied to the oxide semiconductor. Oxygen vacancies in the oxide semiconductor are filled with the supplied oxygen, whereby the reliability of a transistor including the oxide semiconductor can be increased.

With the above structures, a transistor which has high and stable electrical characteristics even when being miniaturized can be provided. Furthermore, the yield in mass production is increased and the manufacturing cost can be reduced.

Furthermore, also in a semiconductor device including the transistor, high performance, high reliability, and high productivity can be achieved. Alternatively, a novel semiconductor device can be provided. Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIGS. 5A to 5C are a top view and cross-sectional views illustrating one embodiment of a method for manufacturing a semiconductor device.

FIGS. 27A to 27C are a top view and cross-sectional views illustrating one embodiment of a method for manufacturing a semiconductor device.

FIGS. 38A to 38C are a top view and cross-sectional views illustrating one embodiment of a method for manufacturing a semiconductor device.

FIGS. 51A to 51C are a top view and cross-sectional views illustrating one embodiment of a semiconductor device.

FIGS. 100A1, 100A2, 100A3, 100B1, 100B2, and 100B3 are perspective views and cross-sectional views which illustrate semiconductor devices of one embodiment of the present invention.

DETAILED DESCRIPTION OF THE INVENTION

Figure 1A:
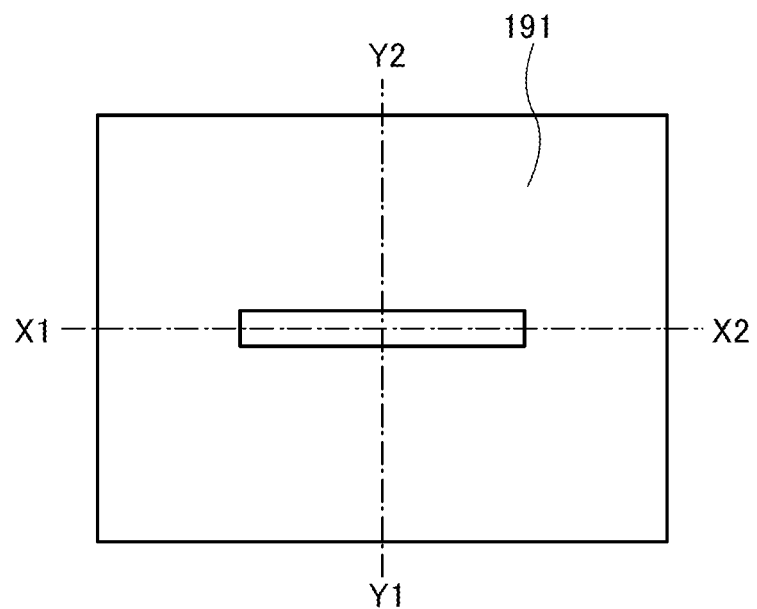
FIGS. 1A to 1C are a top view and cross-sectional views illustrating one embodiment of a method for manufacturing a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. The same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals: a gate, a drain, and a source. The transistor has a channel formation region between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Functions of a source and a drain are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating layer" can be changed into the term "insulating film" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductor, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductor, or a layer).

Even when independent components are electrically connected to each other in a circuit diagram, one component has functions of a plurality of components in some cases. For example, when part of a wiring also functions as an electrode, one conductor functions as the wiring and the electrode. Thus, the term "electrical connection" in this specification also means such a case where one conductor has functions of a plurality of components.

Embodiment 1

Structural Example 1 of Semiconductor Device

Figure 1B:
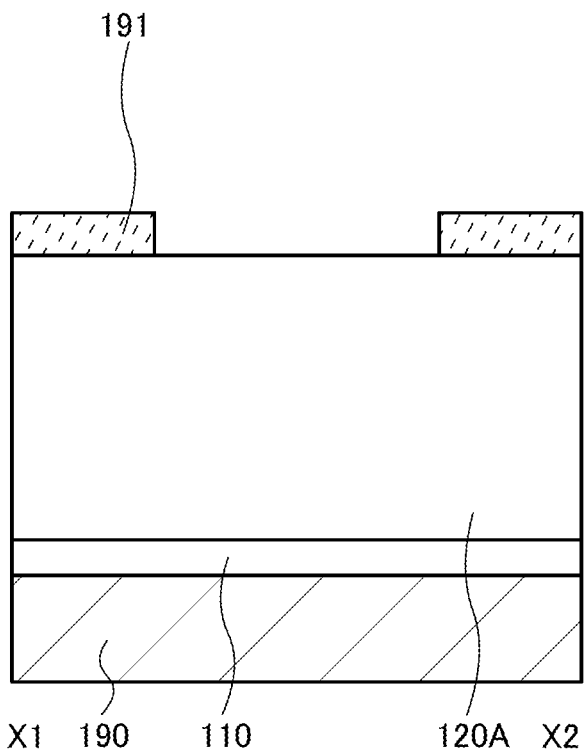
Figure 1C:
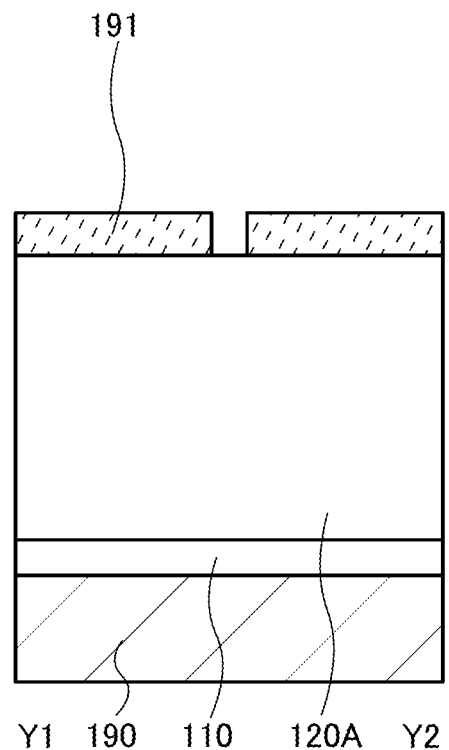
Figure 2A:
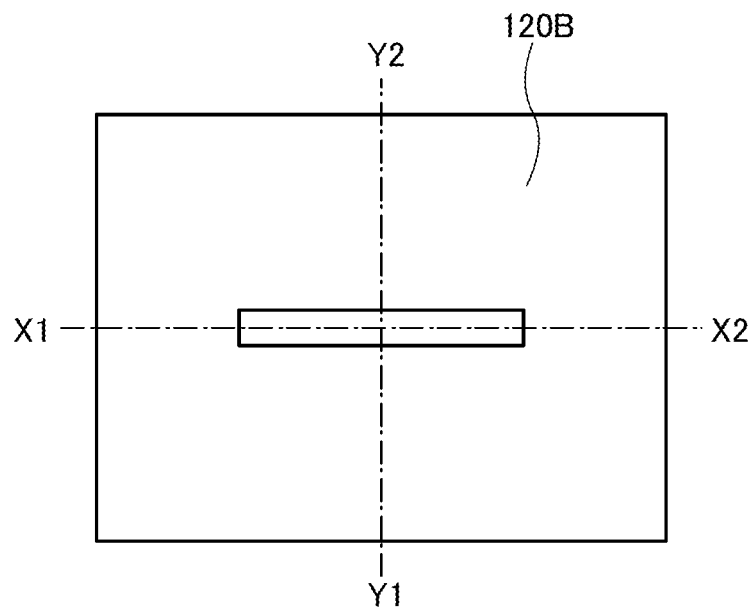
FIGS. 2A to 2C are a top view and cross-sectional views illustrating one embodiment of a method for manufacturing a semiconductor device.
Figure 2B:
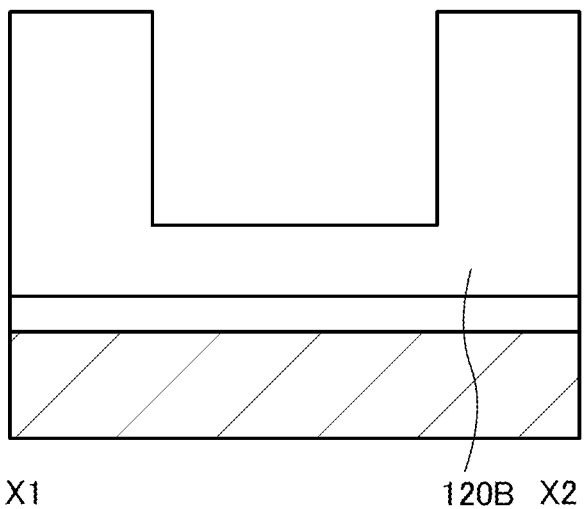
Figure 2C:
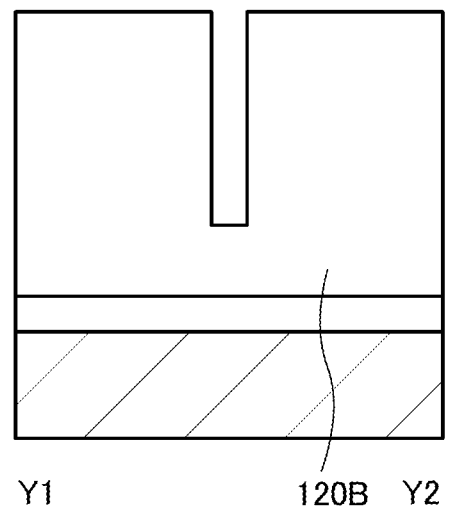

In this embodiment, examples of a structure and a manufacturing method of a semiconductor device are described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, and FIGS. 16A to 16C.
<Method 1 for Manufacturing Semiconductor Device>
An example of a method for manufacturing a semiconductor device is described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, and FIGS. 11A to 11C. Note that FIG. 1A is an example of a top view. FIG. 1B is a cross-sectional view taken along dashed-dotted line X1-X2 in FIG. 1A, and FIG. 1C is a cross-sectional view take along dashed-dotted line Y1-Y2 in FIG. 1A. The same applies to FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, and FIGS. 11A to 11C.

First, a substrate 190 is prepared. Although there is no particular limitation on a substrate that can be used as the substrate 190, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used. Further alternatively, any of these substrates provided with a semiconductor element may be used.

A flexible substrate may be used as the substrate to manufacture the semiconductor device. To manufacture a flexible semiconductor device, a transistor may be directly formed over a flexible substrate; or alternatively, a transistor may be formed over a substrate and then separated from the substrate and transferred to a flexible substrate. For separation of the transistor from the substrate and transfer to the flexible substrate, a separation layer may be provided between the substrate and the transistor including the oxide semiconductor.

Next, an insulator 110, an insulator 120A, and a resist mask 191 are formed as illustrated in FIGS. 1A to 1C.

First, the insulator 110 and the insulator 120A are formed over the substrate 190. Although the two-layer structure of the insulator 110 and the insulator 120A is described in this embodiment, the layered structure is not necessarily employed and at least the insulator 120A needs to be formed. Alternatively, a layered structure of three or more layers may be employed. The insulator 110 and the insulator 120A can be formed using, for example, a silicon oxide film, a silicon oxynitride film, a silicon nitride oxide film, a silicon nitride film, an aluminum oxide film, an aluminum oxynitride film, an aluminum nitride oxide film, an aluminum nitride film, a hafnium oxide film, a hafnium oxynitride film, a zirconium oxide film, a zirconium oxynitride film, an yttrium oxide film, a yttrium oxynitride film, a gallium oxide film, a gallium oxynitride film, a tantalum oxide film, a tantalum oxynitride film, or the like.

The substrate 190 may release gas or serve as a diffusion source of impurities. Furthermore, a semiconductor element or the like including impurities such as hydrogen and water is formed over the substrate 190 in some cases. In these cases, the insulator 110 or the insulator 120A preferably has a function of blocking such impurities.

Defect states due to impurities such as hydrogen and water might be formed in an oxide semiconductor to be formed later. Therefore, the insulator 110 and/or the insulator 120A are/is preferably an insulator having a low hydrogen-transmitting property (i.e., a hydrogen barrier property) in some cases.

Because of its small atomic radius or the like, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include an inorganic insulator such as silicon oxide or silicon oxynitride and an organic insulator such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator having crystal grain boundaries can have a high hydrogen-transmitting property. In other words, hydrogen is less likely transmitted through an insulator having no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of a device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The electrical characteristics of a transistor including an oxide semiconductor sometimes deteriorate because of oxygen vacancies in the oxide semiconductor. Therefore, the insulator 110 and/or the insulator 120A is preferably an insulator containing excess oxygen. Note that excess oxygen means oxygen in an insulator or the like which does not bond with (which is liberated from) the insulator or the like or has low bonding energy with the insulator or the like.

Here, an insulator including excess oxygen may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a surface temperature of 100° C. to 700° C. or 100° C. to 500° C.

The method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2} / S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

Note that an insulator having a low hydrogen-transmitting property is an insulator having a low oxygen-transmitting property in many cases. Therefore, it is preferable that an insulator having a low hydrogen-transmitting property be used as the insulator 110 and an insulator containing excess oxygen be used as the insulator 120A. As described above, with the layered structure including the insulator 110 and the insulator 120A, the electrical characteristics of the transistor including an oxide semiconductor can be improved.

The insulator 110 and the insulator 120A can be formed using a sputtering method, a chemical vapor deposition (CVD) method, (including a thermal CVD method, a metal organic CVD (MOCVD) method, a plasma-enhanced CVD (PECVD) method, and the like), a molecular beam epitaxy (MBE) method, an atomic layer deposition (ALD) method, a pulsed laser deposition (PLD) method, or the like. In particular, it is preferable that the insulators be formed by a CVD method, further preferably an ALD method, because coverage can be further improved. It is preferable to use a thermal CVD method, an MOCVD method, or an ALD method in order to reduce plasma damage. Alternatively, the insulators can also be formed using silicon films oxide with high step coverage that is formed by reacting tetraethyl orthosilicate (TEOS), silane, or the like with oxygen, nitrous oxide, or the like.

Next, excess oxygen may be contained in the insulator 110 and/or the insulator 120A by adding oxygen ions. The addition of oxygen ions may be performed by an ion implantation method at an acceleration voltage of greater than or equal to 2 kV and less than or equal to 50 kV at a dose of greater than or equal to $5 \times 10^{14}$ ions/cm$^2$ and less than or equal to $5 \times 10^{16}$ ions/cm$^2$, for example.

Next, the resist mask 191 is formed over the insulator 120A by lithography or the like as illustrated in FIGS. 1A to 1C.

Here, a method for processing a film is described. In the case of finely processing a film, a variety of microfabrication techniques can be used. For example, a method may be used in which a resist mask formed by lithography or the like is subjected to slimming treatment. Alternatively, a dummy pattern is formed by lithography or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As light for the exposure, extreme ultra-violet light (EUV) or electromagnetic waves such as X rays or an electron beam may be used. It is preferable to use extreme ultra-violet light (EUV), X-rays, or an electron beam because extremely minute processing can be performed. Note that in the case of performing exposure by scanning of a beam such as an electron beam, a photomask is not needed.

Before a resist film serving as a resist mask is formed, an organic resin film having a function of improving adhesion between the film to be processed and the resist film may be formed. The organic resin film can be formed to planarize a surface by covering a step under the film by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of such an organic resin film serving as an anti-reflection film include bottom anti-reflection coating (BARC) film. The organic resin film may be removed at the same time as the removal of the resist mask or after the resist mask is removed.

An unnecessary portion of the insulator 120A is removed by using the resist mask 191 to form an insulator 120B having an opening. After that, the resist mask 191 is removed, whereby the insulator 120B illustrated in FIGS. 2A to 2C can be formed. The depth of the opening may be greater than or equal to 10 nm and less than or equal to 500 nm, preferably greater than or equal to 10 nm and less than or equal to 300 nm, for example.

Although the opening is provided in the insulator 120B in this example, the opening may be formed in the stacked insulators. For example, the opening may penetrate the insulator 120A to expose the insulator 110. At that time, the materials of the insulators 110 and 120A are preferably selected so that the etching rate of the insulator 110 is different from that of the insulator 120A. The use of the insulator 110 as a stopper film can reduce variation in the height of the opening. The uniform shape of the opening can reduce the variation in the size of the oxide semiconductor to be formed in a later step, resulting in a highly reliable transistor.

Figure 3A:
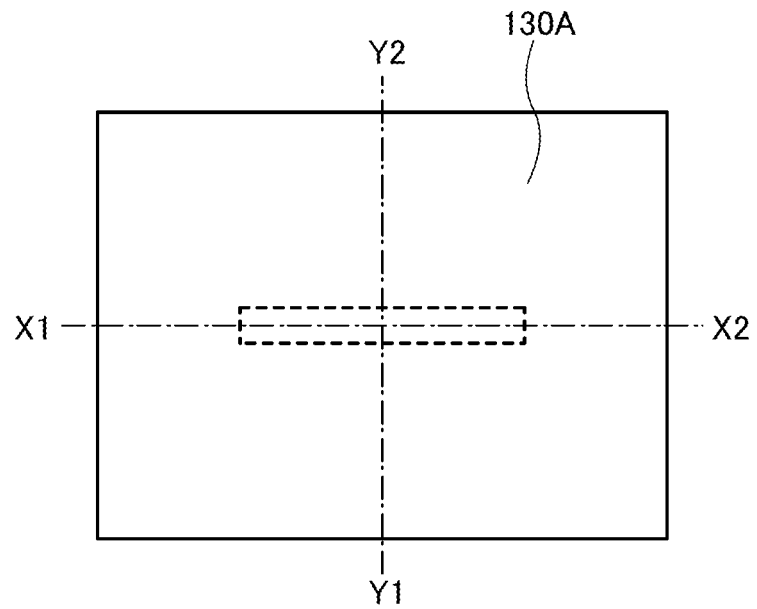
FIGS. 3A to 3C are a top view and cross-sectional views illustrating one embodiment of a method for manufacturing a semiconductor device.
Figure 3B:
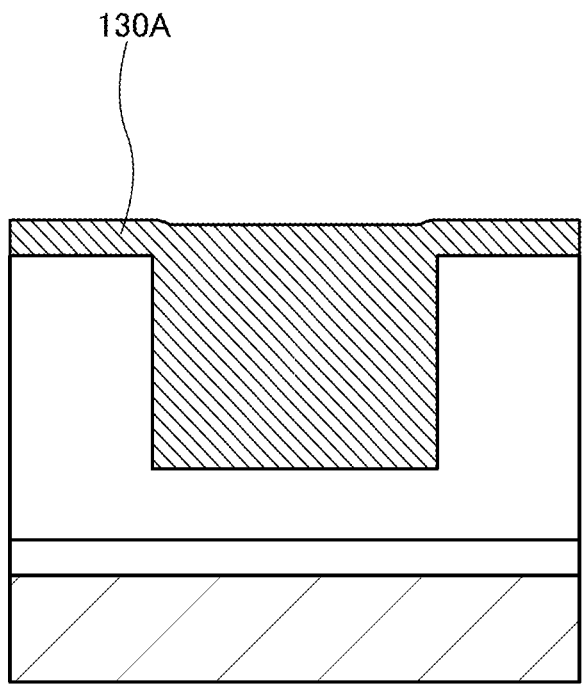
Figure 3C:
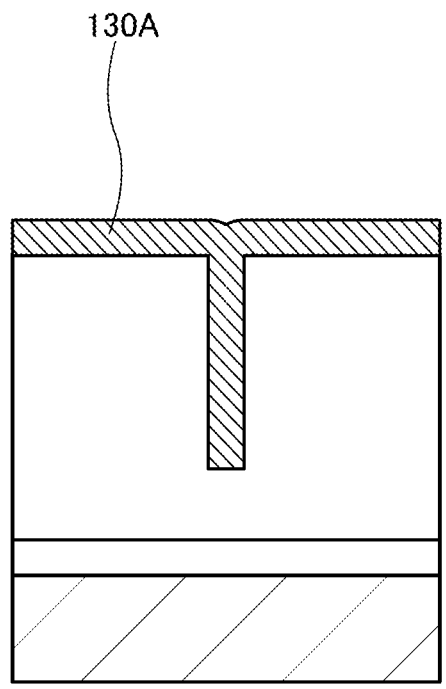

Subsequently, an oxide semiconductor 130A is formed so as to fill the opening of the insulator 120B as illustrated in FIGS. 3A to 3C. As the method for forming the oxide semiconductor 130A, a sputtering method, a coating method, an MBE method, a CVD method, a PLD method, an ALD method, or the like can be used as appropriate.

Note that excess oxygen may be contained in the oxide semiconductor 130A by adding oxygen ions. The addition of oxygen ions may be performed by an ion implantation method at an acceleration voltage of greater than or equal to 2 kV and less than or equal to 50 kV at a dose of greater than or equal to $5 \times 10^{14}$ ions/cm$^2$ and less than or equal to $5 \times 10^{16}$ ions/cm$^2$, for example. Excess oxygen in the oxide semiconductor 130A can reduce oxygen vacancies in the oxide semiconductor 130A.

For example, in the case where the oxide semiconductor is deposited by a sputtering method, specifically, the substrate temperature is set to higher than or equal to 100° C. and lower than or equal to 500° C., preferably higher than or equal to 150° C. and lower than or equal to 450° C., and the percentage of oxygen in a deposition gas is set to higher than or equal to 2 vol %, preferably higher than or equal to 5 vol %, still further preferably higher than or equal to 10 vol %.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

Here, the case where an oxide semiconductor contains indium, an element M, and zinc is considered. Here, the element M is preferably aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M A favorable range of the atomic ratio of indium to the element M and zinc (x:y:z) of the oxide semiconductor is described with reference to FIGS. 84A and 84B.

Figure 84A:
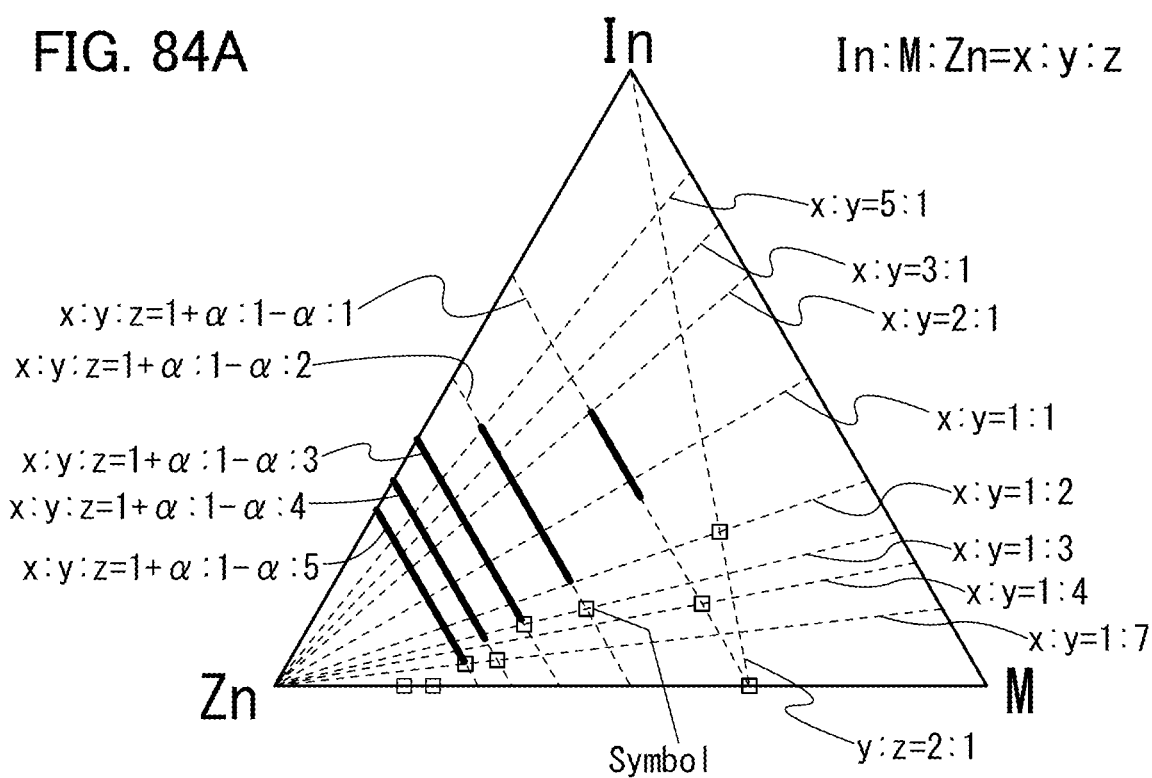
FIGS. 84A and 84B show atomic ratios of an oxide semiconductor of one embodiment of the present invention.
Figure 84B:
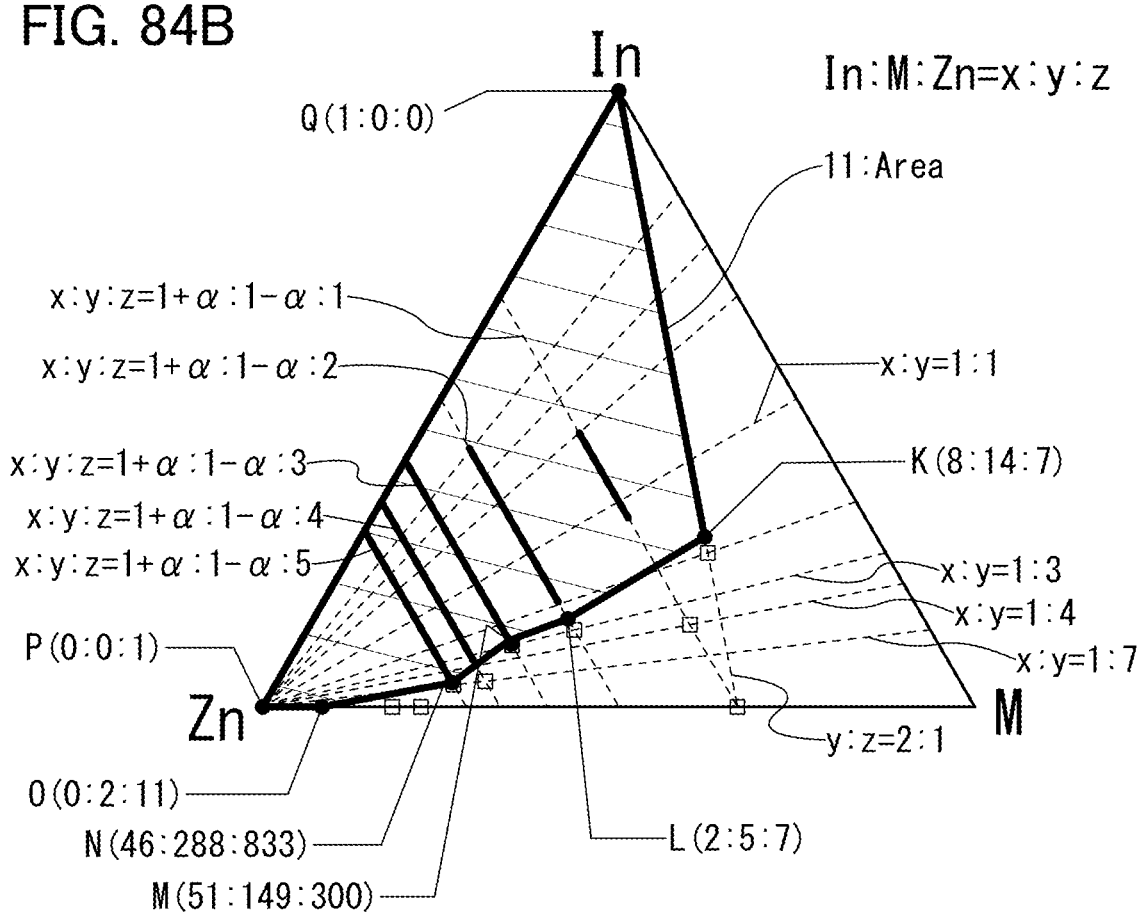

FIGS. 84A and 84B show the range of the atomic ratio of indium to the element M and zinc of the oxide semiconductor. Here, FIGS. 84A and 84B show an example in which the element M is Ga. Note that the proportion of oxygen atoms is not shown in FIGS. 84A and 84B.

For example, it is known that there is a homologous series represented by $InMO_3(ZnO)_m$ (m is a natural number) as one of oxides containing indium, the element M, and zinc. Here, for example, the case where the element M is Ga is considered. It is known that regions denoted by thick lines in FIGS. 84A and 84B indicate compositions which allow a single-phase solid solution range when powders of $In_2O_3$, $Ga_2O_3$, and ZnO are mixed and sintered at 1350° C., for example. Coordinates denoted by square symbols in FIGS. 84A and 84B correspond to known compositions with which a spinel crystal structure is likely to be mixed.

For example, a compound represented by $ZnM_2O_4$, such as $ZnGa_2O_4$, is known as a compound having a spinel crystal structure, for example. Furthermore, for example, when a composition is in the neighborhood of $ZnGa_2O_4$ as illustrated in FIGS. 84A and 84B, that is, the ratio of x toy and z is close to 0:2:1, a spinel crystal structure is likely to be formed. The element M is substituted with In in some cases. Thus, a spinel crystal structure is likely to be formed also in the case where the ratio of x to y and z is close to a:1-a:2 (a is greater than or equal to 0 and less than or equal to 1).

Here, the oxide semiconductor is preferably a CAAC-OS film. Specifically, the CAAC-OS film having no spinel crystal structure is preferred. In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby the carrier mobility can be increased.

Accordingly, the atomic ratio of indium to the element M and zinc, x:y:z, of the oxide semiconductor is preferably within the range of an area 11 shown in FIG. 84B, for example. Here, the area 11 includes atomic ratios within the range of an area surrounded by line segments that connect first coordinates K (x:y:z=8:14:7), second coordinates L (x:y:z=2:5:7), third coordinates M (x:y:z=51:149:300), fourth coordinates N (x:y:z=46:288:833), fifth coordinates O (x:y:z=0:2:11), sixth coordinates P (x:y:z=0:0:1), seventh coordinates Q (x:y:z=1:0:0) and the first coordinates K, in this order. Note that the area 11 also includes coordinates positioned on the straight line.

When x:y:z is within the area 11 in FIG. 84B, a spinel crystal structure is not observed or is hardly observed by nanobeam diffraction. Thus, an excellent CAAC-OS film can be obtained. Furthermore, carrier scattering or the like at the boundary between a CAAC structure and a spinel crystal structure can be reduced; therefore, when the oxide semiconductor is used for a transistor, the transistor can have high field-effect mobility. In addition, the transistor can have high reliability.

In the case where the oxide semiconductor is formed by a sputtering method, a film having an atomic ratio deviated from the atomic ratio of the target is formed in some cases. Especially for zinc, the proportion of zinc atoms of a deposited film is smaller than that of zinc atoms of the target in some cases. Specifically, the proportion of zinc atoms of the film may be approximately 40% to 90% of the proportion of zinc atoms of the target. The target used here is preferably polycrystalline.

Although the oxide semiconductor 130A has a single-layer structure in this embodiment, it may have a stacked-layer structure consisting of n layers (n is greater than or equal to 2).

For example, when a second semiconductor is formed over a first semiconductor in which impurities are reduced, the second semiconductor can have fewer impurities than the first semiconductor and prevent diffusion of impurities from layers positioned below the second semiconductor. In the case where a layer is additionally stacked over the oxide semiconductor in a subsequent step, forming a third semiconductor with a small thickness over the second semiconductor can prevent diffusion of impurities from layers positioned over the third oxide semiconductor to the second semiconductor. By using a transistor formed such that the second semiconductor in which impurities are reduced serves as a channel formation region, a highly reliable semiconductor device can be provided.

After the oxide semiconductor 130A is formed, heat treatment is preferably performed. The heat treatment is preferably performed at a temperature of higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here can remove impurities such as hydrogen and water from the oxide semiconductor 130A. Furthermore, by this heat treatment, oxygen can be supplied from the insulator 120B to the oxide semiconductor 130A. At this time, the insulator 120B preferably contains excess oxygen, in which case oxygen can be supplied efficiently to the oxide semiconductors.

Figure 4A:
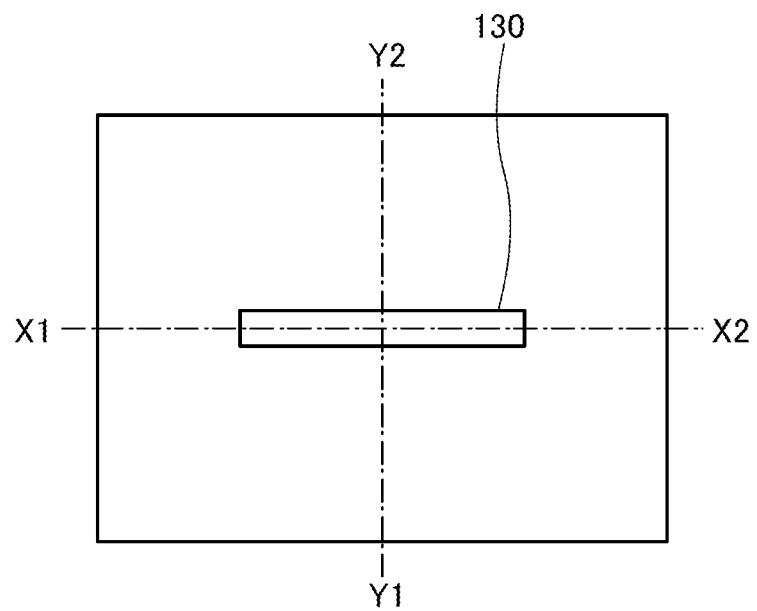
FIGS. 4A to 4C are a top view and cross-sectional views illustrating one embodiment of a method for manufacturing a semiconductor device.
Figure 4B:
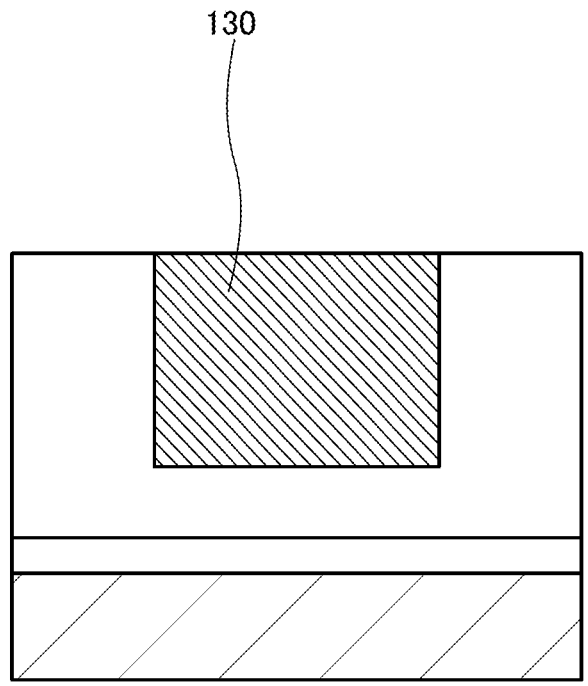
Figure 4C:
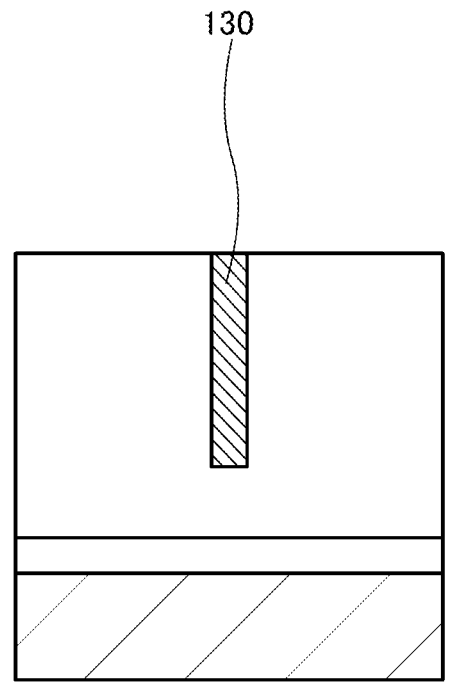

Next, an unnecessary portion of the oxide semiconductor 130A is removed to form an oxide semiconductor 130 as illustrated in FIGS. 4A to 4C.

To remove the unnecessary portion of the oxide semiconductor 130A, part of the oxide semiconductor 130A is removed by, for example, an etch-back process or a chemical mechanical polishing (CMP) process until the insulator 120B is exposed; as a result, the oxide semiconductor 130 is formed. Here, the insulator 120B can be used as a stopper layer, and the thickness of the insulator 120B is reduced in some cases.

The CMP process is a process for planarizing a surface of an object to be processed by a combination of chemical and mechanical actions. More specifically, the CMP process is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP process may be performed only once or plural times. When the CMP process is performed plural times, it is preferable that first polishing be performed at a high polishing rate and final polishing be performed at a low polishing rate. In this manner, polishing processes using different polishing rates may be used in combination.

Then, an unnecessary portion of the insulator 120B is removed, whereby side surfaces of the oxide semiconductor 130 are exposed and an insulator 120 is formed as illustrated in FIGS. 5A to 5C. In this step, an etch-back process using a dry etching method may be performed on the insulator 120B, for example. At that time, part of the oxide semiconductor 130 is embedded in the insulator 120 as illustrated in FIGS. 5B and 5C, which can prevent the oxide semiconductor 130 to fall down in a later step.

Figure 6A:
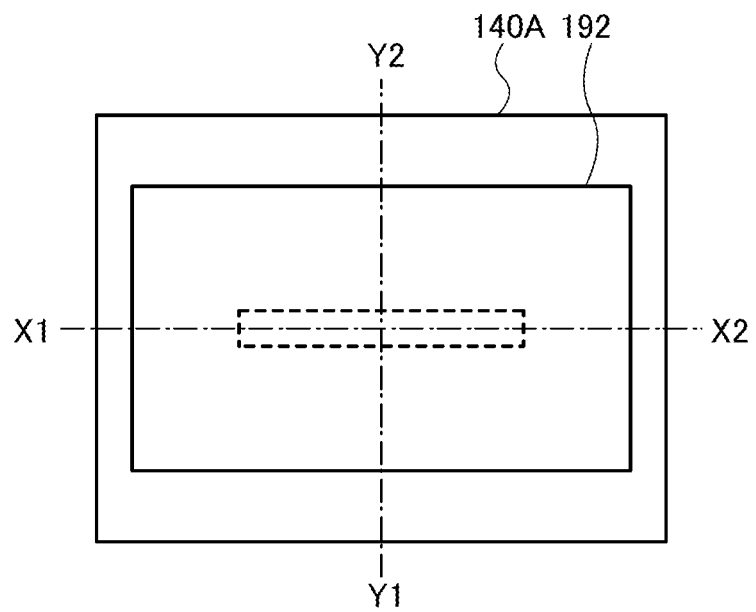
FIGS. 6A to 6C are a top view and cross-sectional views illustrating one embodiment of a method for manufacturing a semiconductor device.
Figure 6B:
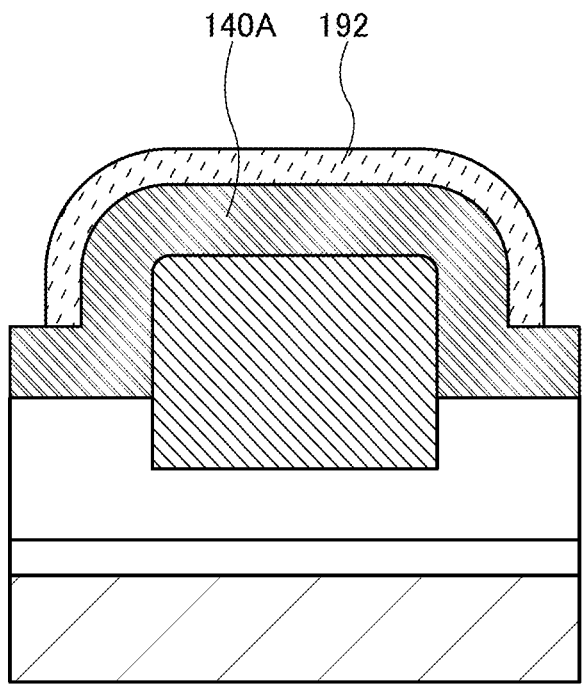
Figure 6C:
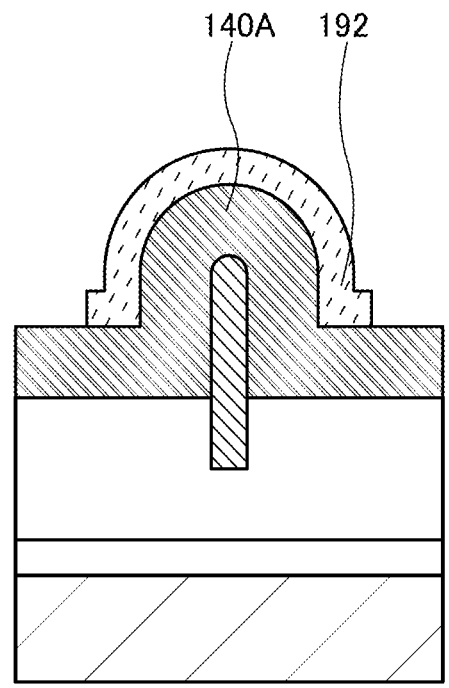

Next, a conductor 140A is formed so as to cover the oxide semiconductor 130, and a resist mask 192 is formed over the conductor 140A by lithography or the like, as illustrated in FIGS. 6A to 6C. Although the conductor 140A has a single-layer structure here, the structure is not limited to the single-layer structure, and the conductor 140A may have a stacked-layer structure of two or more layers.

As the conductor 140A, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used. Alternatively, a semiconductor typified by a polycrystalline silicon doped with an impurity element such as phosphorus, or a silicide film such as a nickel silicide may be used as the conductor 140A. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Moreover, the conductor 140A can have a stacked structure of the above conductive material and the above metal material. For example, a 5-nm-thick titanium film, a 10-nm-thick titanium nitride film, and a 100-nm-thick tungsten film may be stacked.

The conductor 140A can be formed by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage.

Figure 7A:
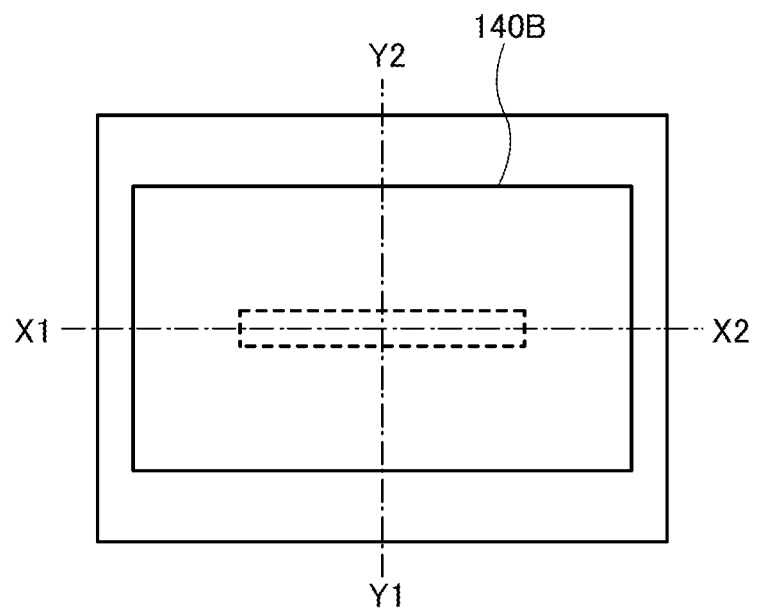
FIGS. 7A to 7C are a top view and cross-sectional views illustrating one embodiment of a method for manufacturing a semiconductor device.
Figure 7B:
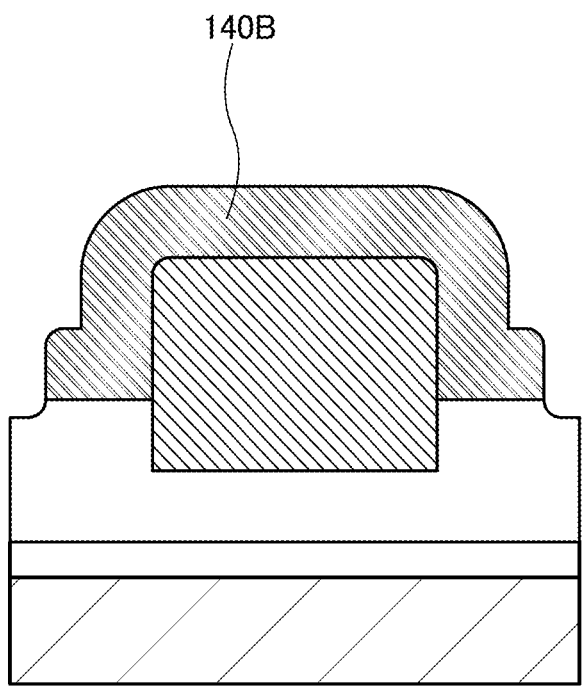
Figure 7C:
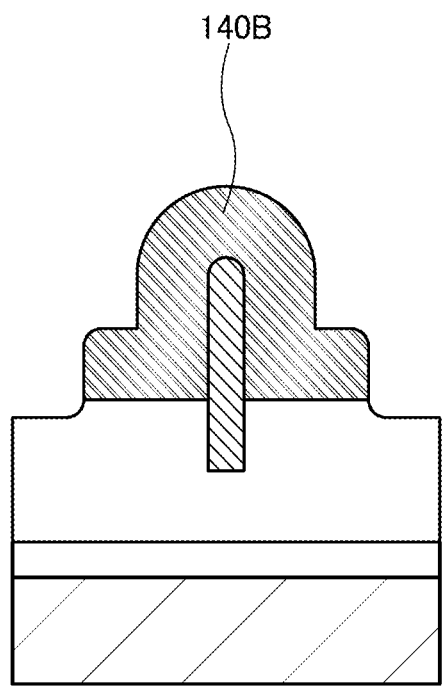

Etching is performed by using the resist mask 192 as a mask, whereby a conductor 140B is formed as illustrated in FIGS. 7A to 7C.

Figure 8A:
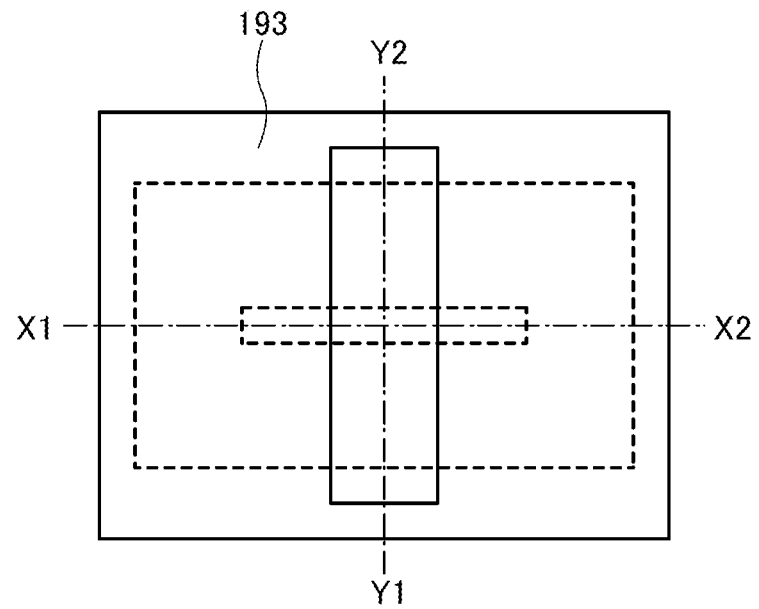
FIGS. 8A to 8C are a top view and cross-sectional views illustrating one embodiment of a method for manufacturing a semiconductor device.
Figure 8B:
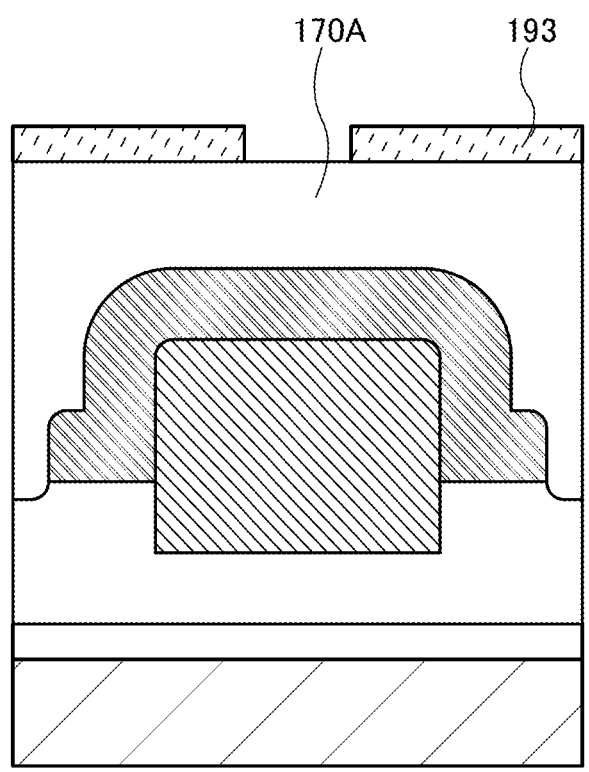
Figure 8C:
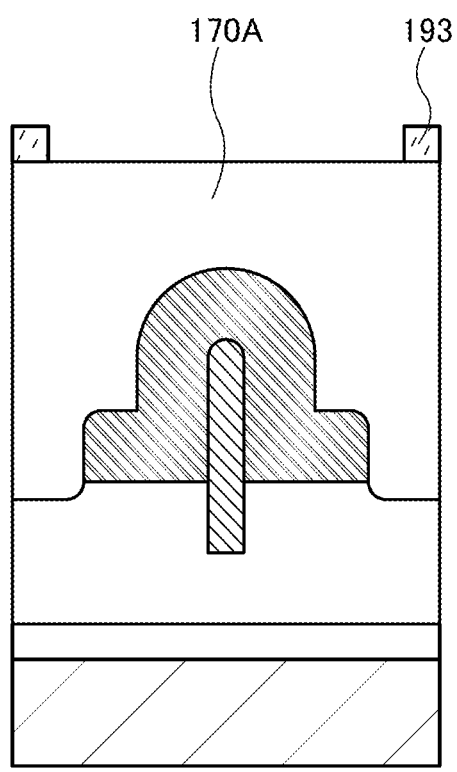

Then, an insulator 170A and a resist mask 193 are formed over the conductor 140B as illustrated in FIGS. 8A to 8C. The insulator 170A is an insulator containing oxygen, such as a silicon oxide film or a silicon oxynitride film. Note that the insulator 170A may be an insulator which does not contain oxygen as a main component. For example, a silicon nitride film or the like may be used.

Note that the insulator 170A preferably contains excess oxygen. The insulator containing excess oxygen can be formed using a silicon oxide film or a silicon oxynitride film containing a large amount of oxygen as a result of film formation by a CVD method or a sputtering method under the conditions which are set as appropriate. After the silicon oxide film or the silicon oxynitride film is formed, oxygen may be added by an ion implantation method, an ion doping method, or plasma treatment.

Figure 9A:
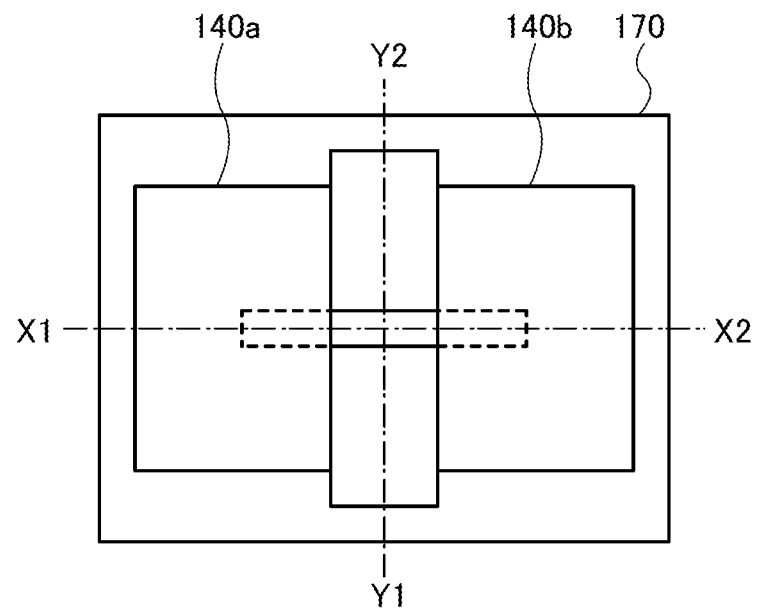
FIGS. 9A to 9C are a top view and cross-sectional views illustrating one embodiment of a method for manufacturing a semiconductor device.
Figure 9B:
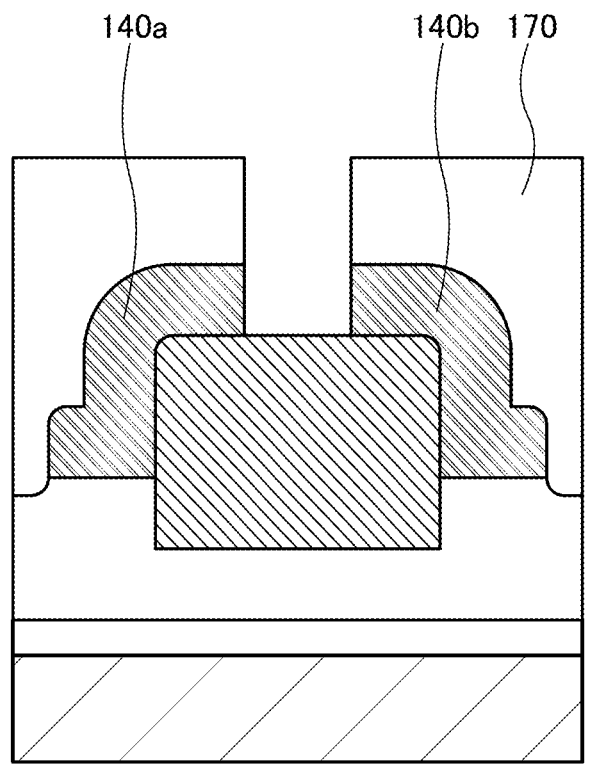
Figure 9C:
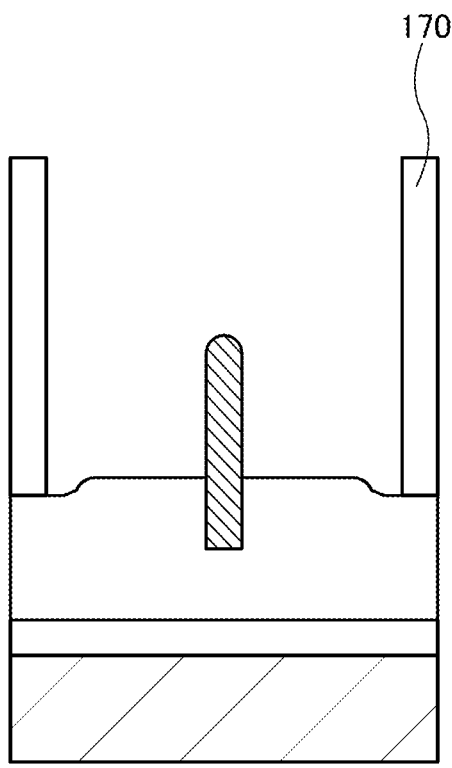

Next, an unnecessary portion of the insulator 170A is removed by using the resist mask 193 to form an insulator 170. Then, part of the conductor 140B is removed by using the insulator 170 as a mask, so that a conductor 140a, a conductor 140b, and an opening are formed as illustrated in FIGS. 9A to 9C.

Figure 10A:
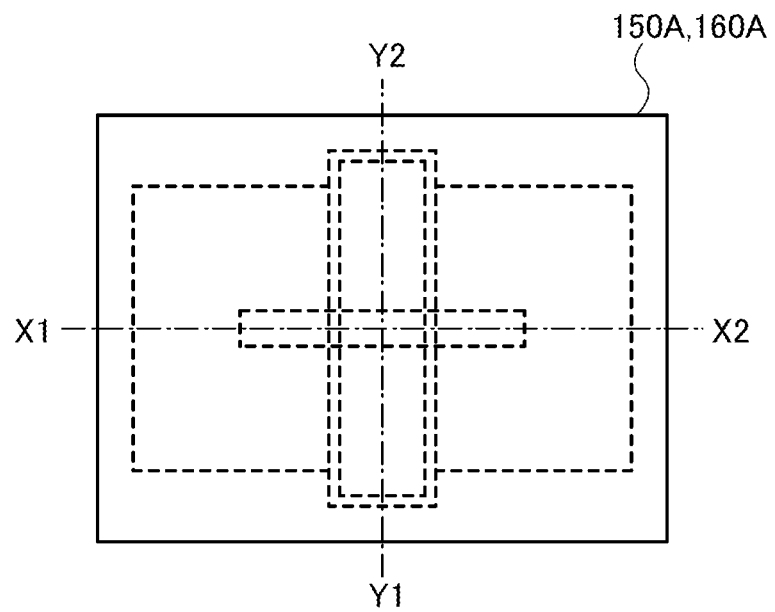
FIGS. 10A to 10C are a top view and cross-sectional views illustrating one embodiment of a method for manufacturing a semiconductor device.
Figure 10B:
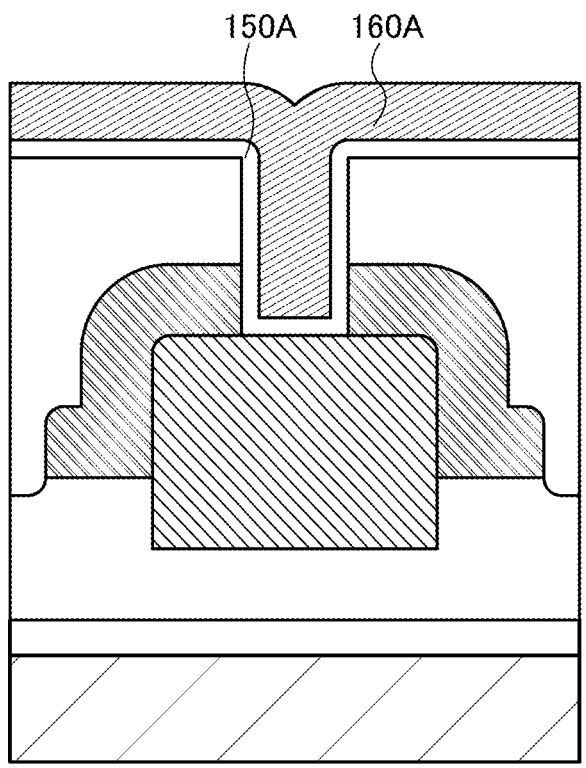
Figure 10C:
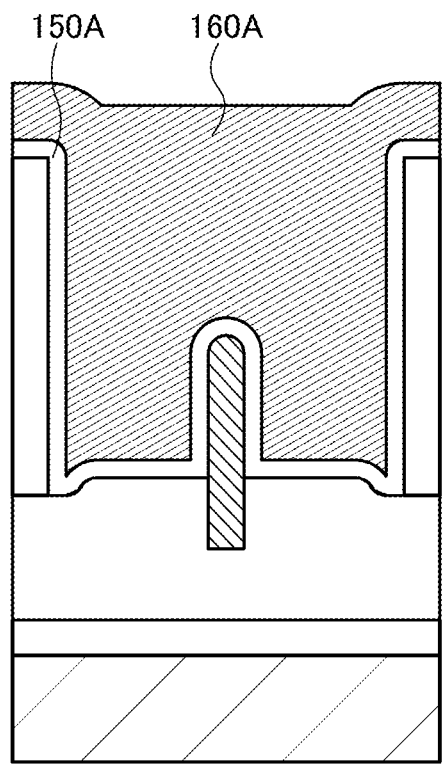

Next, as illustrated in FIGS. 10C to 10C, an insulator 150A and a conductor 160A are formed.

The insulator 150A has a thickness greater than or equal to 1 nm and less than or equal to 20 nm and can be formed by a sputtering method, an MBE method, a CVD method, a pulsed laser deposition method, an ALD method, or the like as appropriate. The insulator 150A may be formed with a sputtering apparatus which performs deposition in the state where surfaces of a plurality of substrates are substantially perpendicular to a surface of a sputtering target. Alternatively, an MOCVD method may be employed. For example, a gallium oxide film deposited by an MOCVD method can be used as the insulator 150A.

The insulator 150A can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. The insulator 150A preferably contains oxygen in a portion in contact with the oxide semiconductor 130. In particular, the insulator 150A preferably contains an amount of oxygen which exceeds the stoichiometric composition in the film (bulk). In this embodiment, a silicon oxynitride film formed by a CVD method is used as the insulator 150A. By using a silicon oxynitride film containing excess oxygen as the insulator 150A, oxygen can be supplied to the oxide semiconductor 130, leading to good transistor characteristics. Furthermore, the insulator 150A is processed into an insulator 150 in a later step; thus formation of the insulator 150A is preferably performed in consideration of the size or the like, of the transistor that is to be formed.

Alternatively, the insulator 150A can be formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate ($HfAl_xO_y$ (x>0, y>0)), or lanthanum oxide. Note that the insulator 150A may have either a single-layer structure or a stacked structure.

The conductor 160A can be formed using a sputtering method, an evaporation method, a CVD method, or the like. As the conductor 160A, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used. Alternatively, a semiconductor typified by a polycrystalline silicon doped with an impurity element such as phosphorus, or a silicide film such as a nickel silicide may be used as the conductor 160A. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Moreover, the conductor 160A can have a stacked structure of the above conductive material and the above metal material. For example, a 5-nm-thick titanium film, a 10-nm-thick titanium nitride film, and a 100-nm-thick tungsten film may be stacked.

Figure 11A:
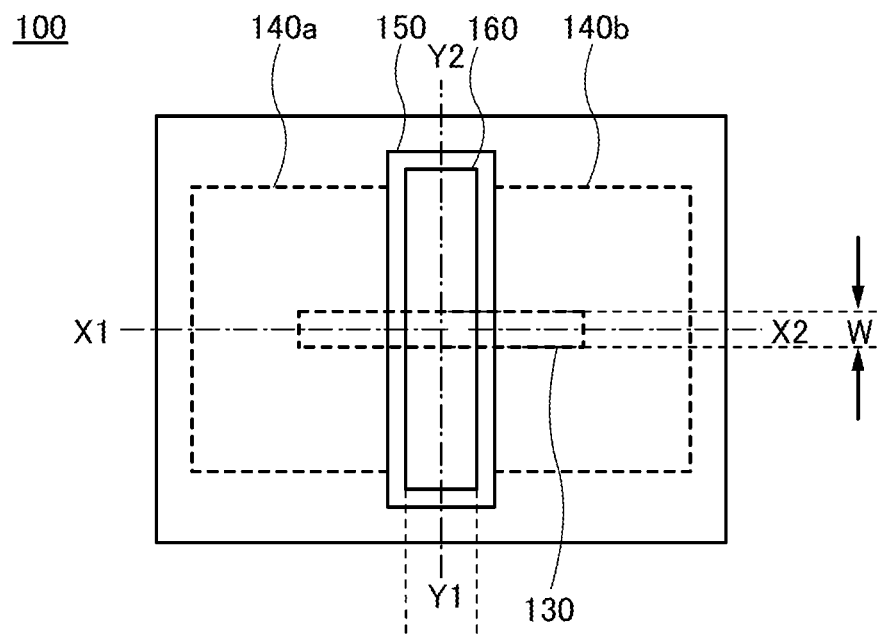
FIGS. 11A to 11C are a top view and cross-sectional views illustrating one embodiment of a semiconductor device.
Figure 11B:
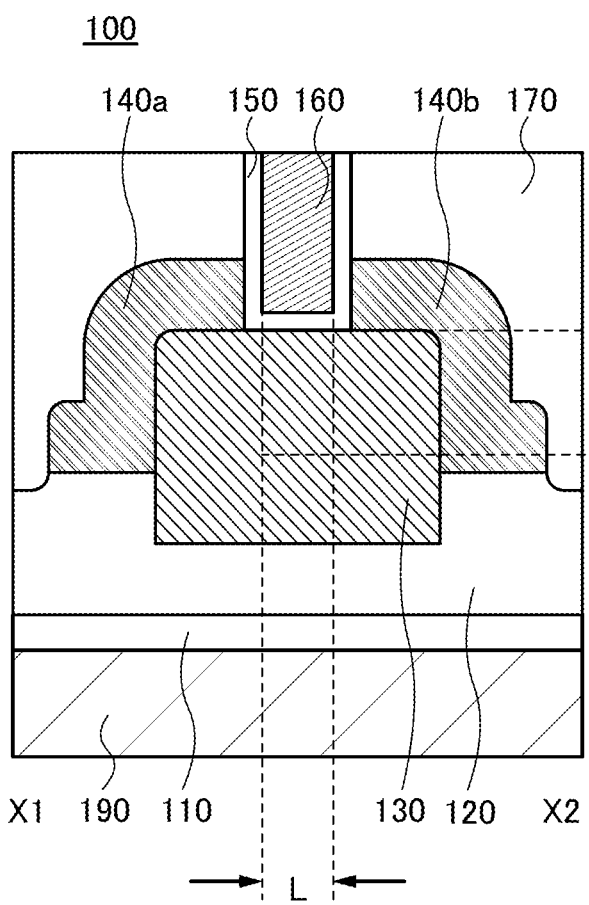
Figure 11C:
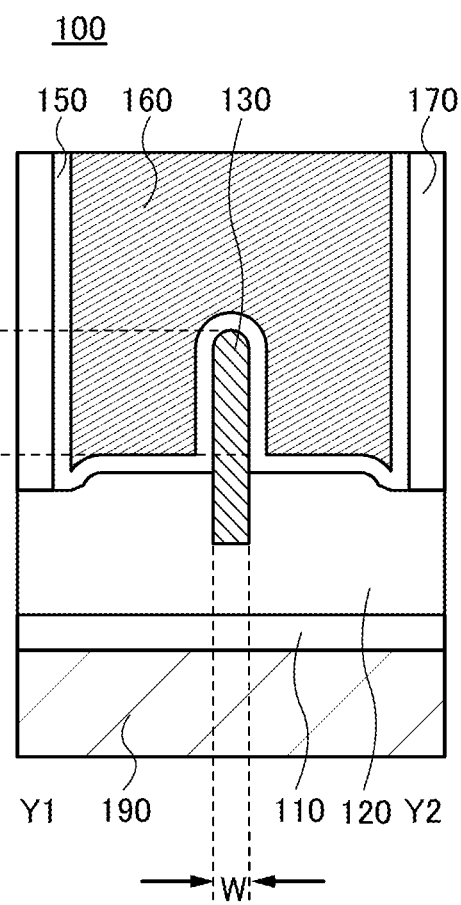

Next, part of the conductor 160A and part of the insulator 150A are removed by a CMP process or the like until the insulator 170 is exposed, whereby the insulator 150 and a conductor 160 are formed as illustrated in FIGS. 11A to 11C. At that time, the insulator 170 can also be used as a stopper layer. The top surface of the insulator 170 might be removed in the CMP process to reduce the thickness of the insulator 170.

Note that the CMP process may be performed only once or plural times. When the CMP process is performed plural times, it is preferable that first polishing be performed at a high polishing rate and final polishing be performed at a low polishing rate. By performing polishing processes with different polishing rates in combination, the planarity of the polished surface can be further increased.

Through the above-described steps, a transistor 100 illustrated in FIGS. 11A to 11C can be formed. In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

Here, as illustrated in FIGS. 11A to 11C, the width of the oxide semiconductor 130 is represented as W. In addition, the length of a region of the oxide semiconductor 130 which overlaps with the conductor 160 with the insulator 150 positioned therebetween is represented as L. The height of part of the oxide semiconductor 130 which faces the conductor 160 with the insulator 150 positioned therebetween is represented as H.

In some cases, the channel is formed in a region of the oxide semiconductor 130 which faces or overlaps with the conductor 160 with the insulator 150 positioned therebetween. Therefore, the channel formation region can be determined by the length L, the width W, and the height H.

In this structure, the three sides of the channel formation region are surrounded by the conductor 160 with the insulator 150 positioned therebetween. That is, an electric field can be applied to at least the three sides of the channel formation region of the oxide semiconductor 130 owing to the electric field generated from the conductor 160. Accordingly, a large current can flow between the source and drain of the transistor having this structure, so that the on-state current can be increased. In addition, the electric field is applied to at least the three sides of the channel formation region, which makes it possible to provide a transistor whose leakage current due to a punch-through phenomenon is reduced.

Note that as the height H becomes large, the channel formation region is enlarged in the oxide semiconductor 130, and the on-state current of the transistor can be increased. In addition, as the width W of the oxide semiconductor 130 is reduced, the proportion of a region with a high carrier controllability increases, leading to a smaller subthreshold swing value.

Accordingly, for example, the height H is preferably greater than or equal to three times the width W. When the height H is greater than or equal to three times the width W, the transistor can have a small subthreshold swing value and exhibit favorable on-state characteristics. Specifically, for example, the height H in the oxide semiconductor 130 may be greater than or equal to 10 nm, preferably greater than or equal to 20 nm, further preferably greater than or equal to 30 nm, still further preferably greater than or equal to 50 nm. Note that the height H of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the oxide semiconductor 130 has a region in which the length L is preferably less than or equal to 40 nm, further preferably less than or equal to 30 nm, still further preferably less than or equal to 20 nm and has a region in which the width W is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a material that is difficult to etch (also referred to as a hardly-etched material) is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 1 of Semiconductor Device

A modification example of the transistor 100 is described below with reference to FIGS. 12A to 12C. Note that, for components denoted by the same reference numerals as those of the transistor 100 described in Method 1 for manufacturing semiconductor device, Method 1 for manufacturing semiconductor device can be referred to.

First, a film 115 is formed over the insulator 110, and the insulator 120A is formed over the film 115. Then, an unnecessary portion of the insulator 120A is removed by using a resist mask. At that time, the film 115 functions as a stopper film. Therefore, the film 115 can reduce variation in the height of the opening although the film 115 is not an indispensable component. The uniform shape of the opening can reduce the variation in the size of the oxide semiconductor to be formed in a later step, resulting in a highly reliable transistor.

Then, the oxide semiconductor 130 is formed in the opening formed in the insulator 120A by a process similar to that described in Method 1 for manufacturing semiconductor device.

Next, the insulator 120B is removed by a process similar to that described in Method 1 for manufacturing semiconductor device to expose all the side surfaces of the oxide semiconductor 130. The film 115 can also be used as a stopper film at that time, which facilitates the exposure of all the side surfaces of the oxide semiconductor 130. By exposing all the side surfaces of the oxide semiconductor 130 in this step, the region which faces the conductor 160 with the insulator 150, which is to be formed in a later step, positioned therebetween is enlarged, so that the region whose length serves as the channel length can be efficiently formed.

Figure 12A:
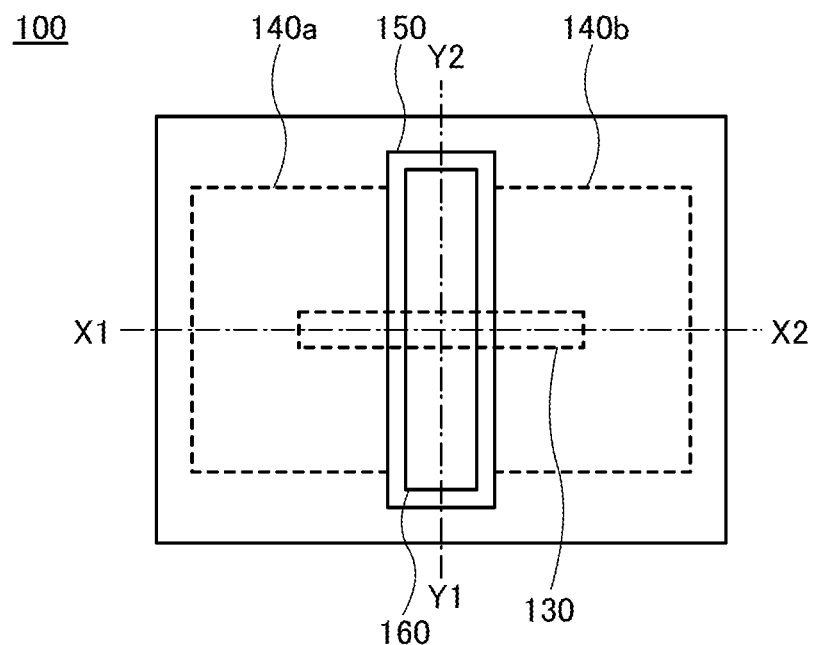
FIGS. 12A to 12C are a top view and cross-sectional views illustrating one embodiment of a semiconductor device.
Figure 12B:
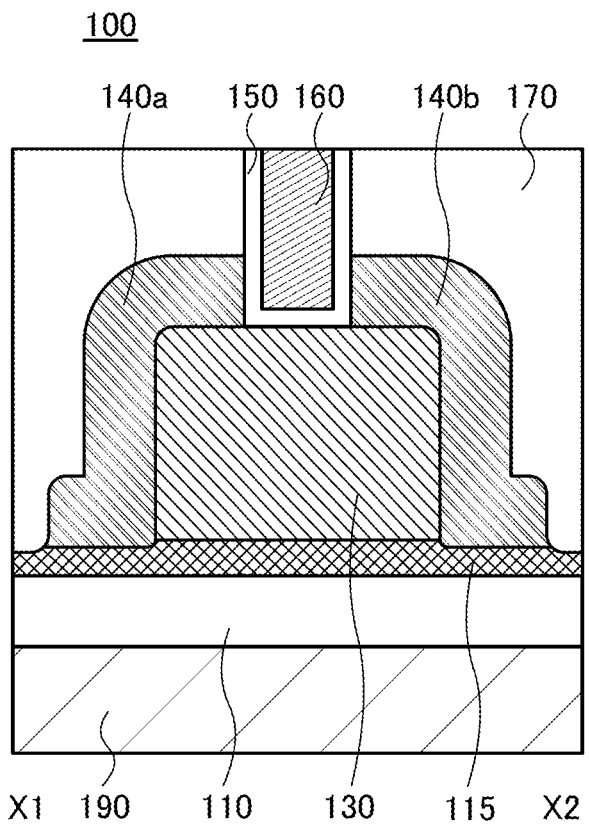
Figure 12C:
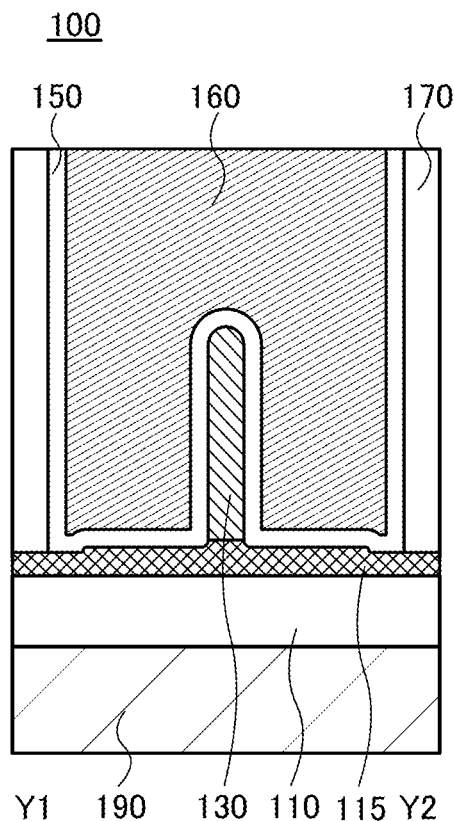

After the step for exposing the oxide semiconductor 130, steps similar to those described in Method 1 for manufacturing semiconductor device are performed, whereby the transistor 100 illustrated in FIGS. 12A to 12C can be manufactured.

FIG. 12A illustrates an example of a top view of the transistor 100. FIG. 12B is a cross-sectional view taken along dashed-dotted line X1-X2 in FIG. 12A, and FIG. 12C is a cross-sectional view take along dashed-dotted line Y1-Y2 in FIG. 12A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that in the case where the channel is formed in all the surfaces of the channel formation region, as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130, resulting in a transistor with a small subthreshold swing value and favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 2 of Semiconductor Device

A modification example of the transistor 100 is described below with reference to FIGS. 13A to 13C. Note that, for components denoted by the same reference numerals as those of the transistor 100 described in Method 1 for manufacturing semiconductor device, Method 1 for manufacturing semiconductor device can be referred to.

First, the film 115 is formed over the insulator 110, and the insulator 120A is formed over the film 115. Then, an unnecessary portion of the insulator 120A is removed by using a resist mask.

Then, the oxide semiconductor 130 is formed in the opening formed in the insulator 120A by a process similar to that described in Method 1 for manufacturing semiconductor device.

Next, the insulator 120B is removed by a process similar to that described in Method 1 for manufacturing semiconductor device to expose all the side surfaces of the oxide semiconductor 130. At that time, the insulator 120B is removed so that the depth has a value obtained by adding at least the thickness of the insulator 150, which is to be formed later, to the height of the oxide semiconductor 130; as a result, the insulator 120 is formed. That is, in the completed transistor 100 illustrated in FIGS. 13A to 13C, the top and side surfaces of part of the oxide semiconductor 130 are covered with the conductor 160 with the insulator 150 positioned therebetween.

In this structure, the film 115 is preferably used as a stopper film. The use of the film 115 can prevent excess etching at the time of removing the insulator 120B so as not to etch a portion of the insulator 120B below the oxide semiconductor 130; accordingly, falling down of the oxide semiconductor 130 can be inhibited.

Figure 13A:
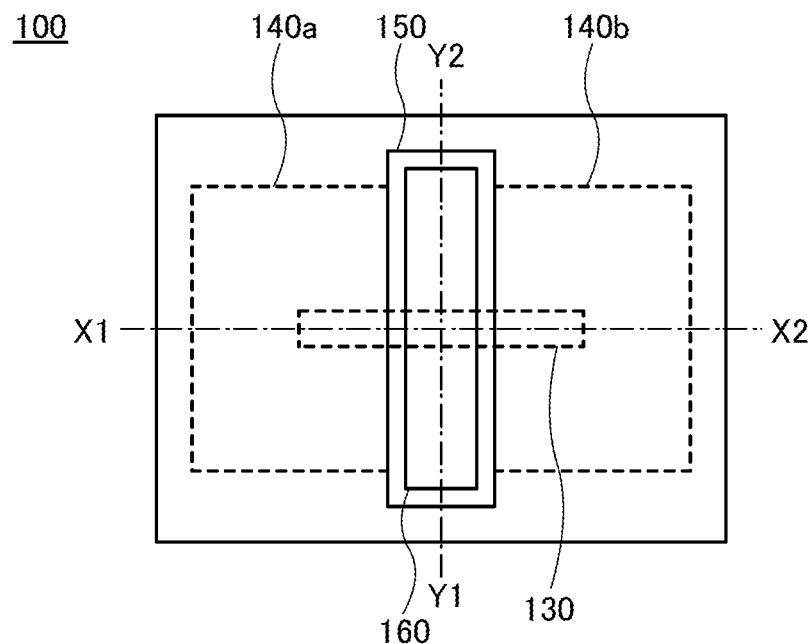
FIGS. 13A to 13C are a top view and cross-sectional views illustrating one embodiment of a semiconductor device.
Figure 13B:
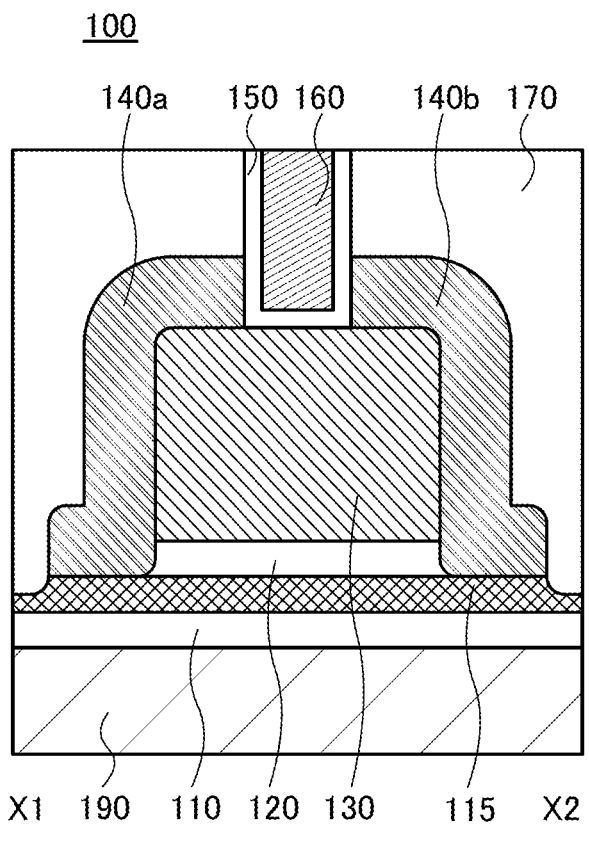
Figure 13C:
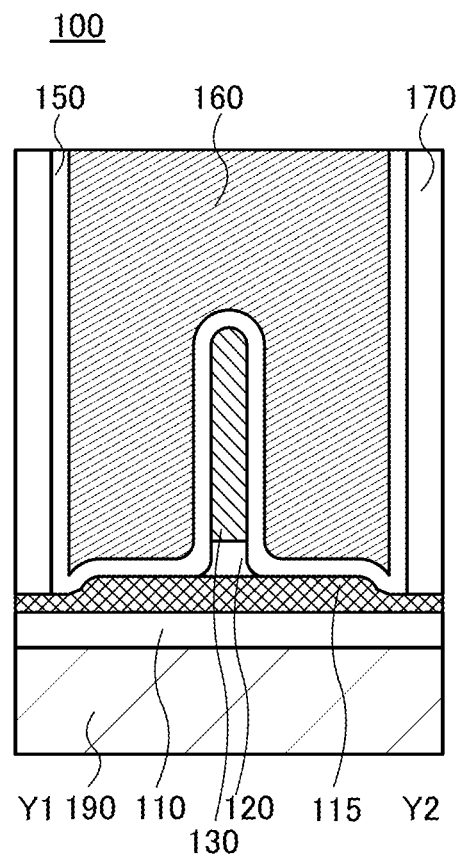

After the step for exposing the oxide semiconductor 130, steps similar to those described in Method 1 for manufacturing semiconductor device are performed, whereby the transistor 100 illustrated in FIGS. 13A to 13C can be manufactured.

FIG. 13A illustrates an example of a top view of the transistor 100. FIG. 13B is a cross-sectional view taken along dashed-dotted line X1-X2 in FIG. 13A, and FIG. 13C is a cross-sectional view take along dashed-dotted line Y1-Y2 in FIG. 13A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that in the case where the channel is formed in all the surfaces of the channel formation region, as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130, resulting in a transistor with a small subthreshold swing value and favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue.

Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 3 of Semiconductor Device

A modification example of the transistor 100 is described below with reference to FIGS. 14A to 14C. Note that, for components denoted by the same reference numerals as those of the transistor 100 described in Method 1 for manufacturing semiconductor device, Method 1 for manufacturing semiconductor device can be referred to.

First, an oxide semiconductor 130a is formed over the insulator 110, and the insulator 120A is formed over the oxide semiconductor 130a. Note that the oxide semiconductor 130a can be formed by a step similar to that for forming the oxide semiconductor 130A described in Method 1 for manufacturing semiconductor device.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, an oxide semiconductor 130b is formed in the opening formed in the insulator 120A by steps similar to those described in Method 1 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a step similar to that described in Method 1 for manufacturing semiconductor device to expose the side surfaces of the oxide semiconductor 130. At that time, part of the oxide semiconductor 130 is embedded in the insulator 120, which prevents the oxide semiconductor 130 to fall down in a later step.

Subsequently, the conductor 140a, the conductor 140b, and the insulator 170 having an opening are formed by steps similar to those described in Method 1 for manufacturing semiconductor device.

Then, an oxide semiconductor 130C that is to be an oxide semiconductor 130c, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130b with reduced impurities serves as a channel formation region, a highly reliable semiconductor device can be achieved.

Next, in a manner to similar to that in Method 1 for manufacturing semiconductor device, part of the conductor 160A, part of the insulator 150A, and part of the oxide semiconductor 130C are removed by a CMP process or the like until the insulator 170 is exposed, whereby the oxide semiconductor 130c, the insulator 150, and the conductor 160 are formed. At that time, the insulator 170 can be used as a stopper layer and the thickness of the insulator 170 is reduced in some cases.

Figure 14A:
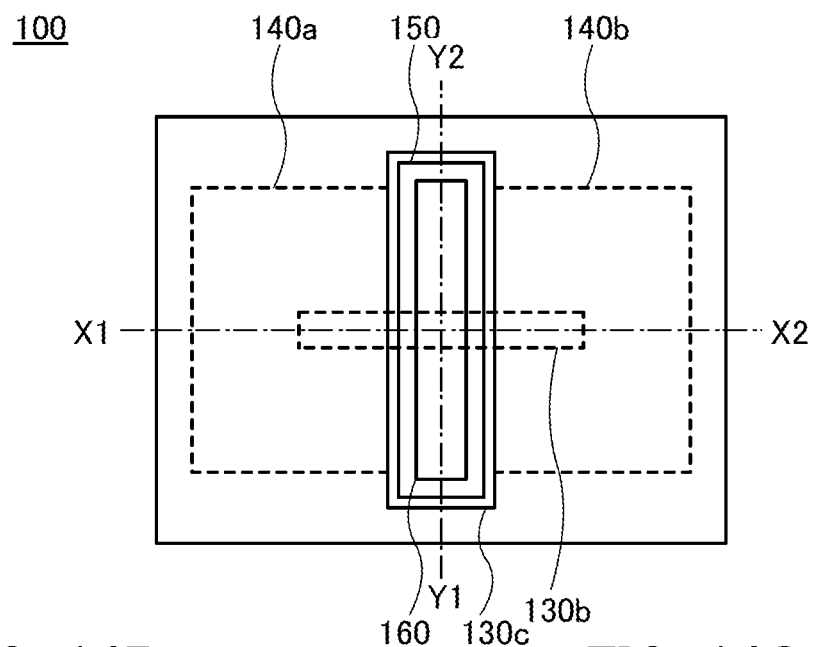
FIGS. 14A to 14C are a top view and cross-sectional views illustrating one embodiment of a semiconductor device.
Figure 14B:
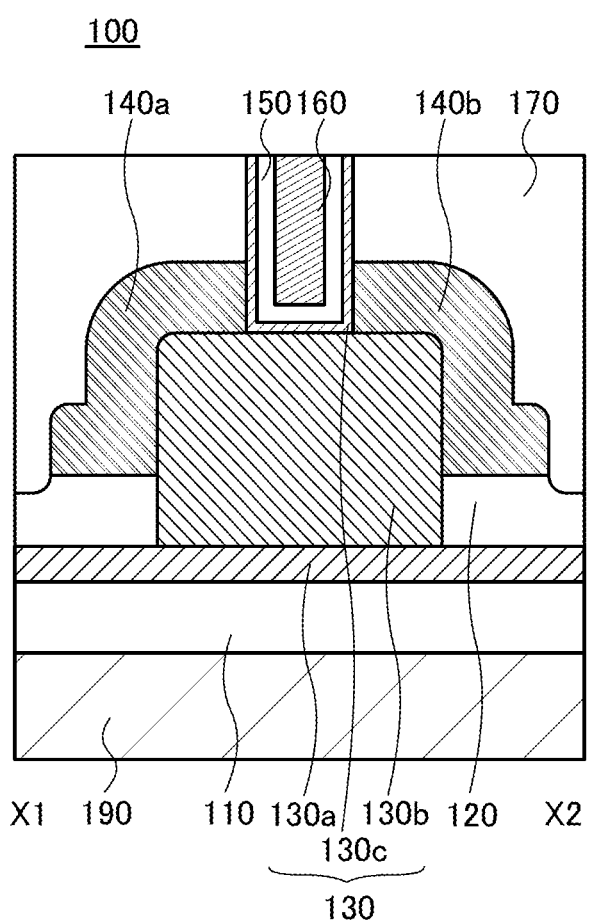
Figure 14C:
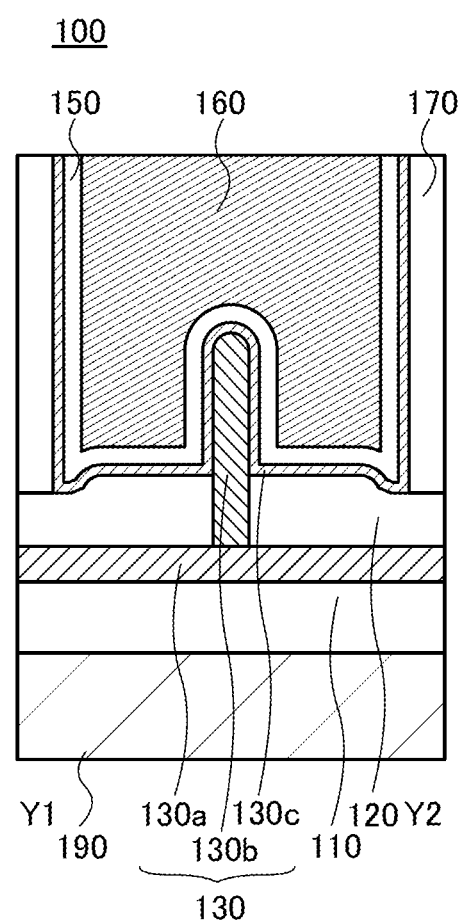

Through the above steps, the transistor 100 illustrated in FIGS. 14A to 14C can be manufactured.

FIG. 14A illustrates an example of a top view of the transistor 100. FIG. 14B is a cross-sectional view taken along dashed-dotted line X1-X2 in FIG. 14A, and FIG. 14C is a cross-sectional view take along dashed-dotted line Y1-Y2 in FIG. 14A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Therefore, for example, the height of the channel formation region is preferably greater than or equal to three times the width of the channel formation region in the oxide semiconductor 130b. When the height of the channel formation region is greater than or equal to three times the width of the channel formation region, the transistor can have a small subthreshold swing value and exhibits favorable on-state characteristics.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 4 of Semiconductor Device

A modification example of the transistor 100 is described below with reference to FIGS. 15A to 15C. Note that, for components denoted by the same reference numerals as those of the transistor 100 described in Method 1 for manufacturing semiconductor device, Method 1 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A described in Method 1 for manufacturing semiconductor device.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 1 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a process similar to that described in Method 1 for manufacturing semiconductor device to expose all the side surfaces of the oxide semiconductor 130b. The oxide semiconductor 130a can be used as a stopper film at that time, which facilitates the exposure of all the side surfaces of the oxide semiconductor 130b. By exposing all the side surfaces of the oxide semiconductor 130b in this step, the region which faces the conductor 160 with the insulator 150, which is to be formed in a later step, positioned therebetween is enlarged, so that the region whose length serves as the channel length can be efficiently formed.

Next, the conductor 140a, the conductor 140b, and the insulator 170 having an opening are formed by steps similar to those described in Method 1 for manufacturing semiconductor device.

Then, the oxide semiconductor 130c, the insulator 150, and the conductor 160 are formed in the opening formed in the insulator 170 by steps similar to those described in Modification example 3 of semiconductor device.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130c into the oxide semiconductor 130b can be prevented. By using a transistor formed so that the oxide semiconductor 130b with reduced impurities serves as a channel formation region, a highly reliable semiconductor device can be achieved.

Figure 15A:
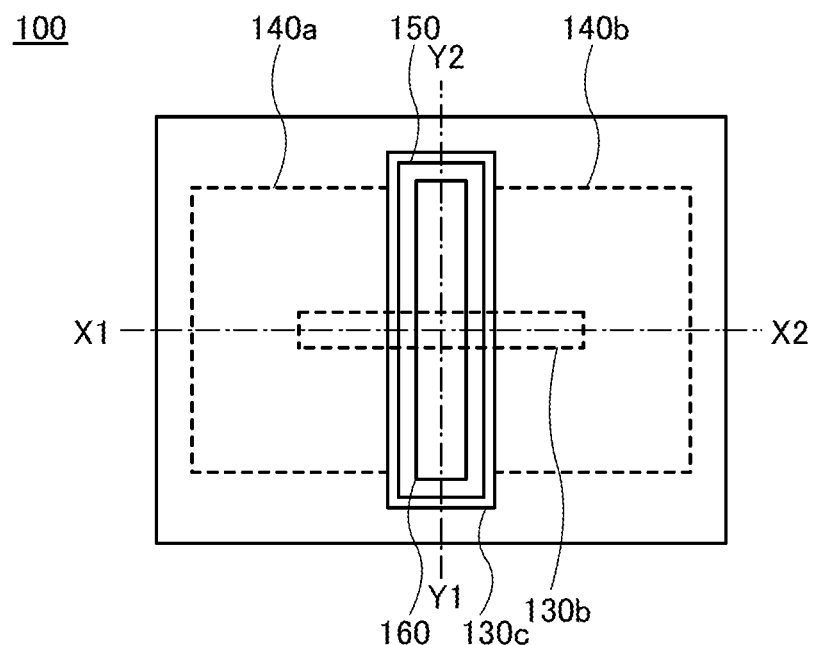
FIGS. 15A to 15C are a top view and cross-sectional views illustrating one embodiment of a semiconductor device.
Figure 15B:
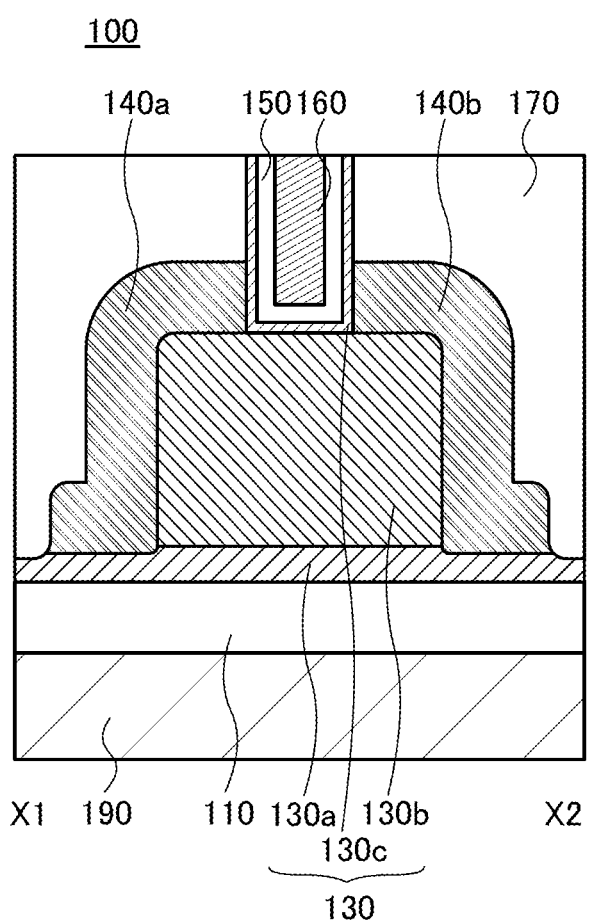
Figure 15C:
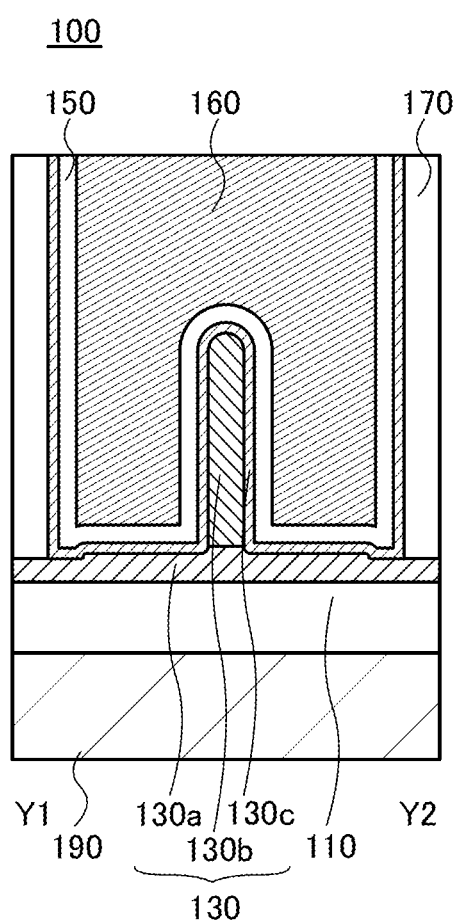

Through the above steps, the transistor 100 illustrated in FIGS. 15A to 15C can be manufactured.

FIG. 15A illustrates an example of a top view of the transistor 100. FIG. 15B is a cross-sectional view taken along dashed-dotted line X1-X2 in FIG. 15A, and FIG. 15C is a cross-sectional view take along dashed-dotted line Y1-Y2 in FIG. 15A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130b, resulting in a transistor with a small subthreshold swing value and favorable on-state characteristics. In addition, for example, the height of the oxide semiconductor 130b may be greater than or equal to 10 nm, preferably greater than or equal to 20 nm, further preferably greater than or equal to 30 nm, still further preferably greater than or equal to 50 nm. Note that the height of the oxide semiconductor 130b is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 5 of Semiconductor Device

A modification example of the transistor 100 is described below with reference to FIGS. 16A to 16C. Note that, for components denoted by the same reference numerals as those of the transistor 100 described in Method 1 for manufacturing semiconductor device, Method 1 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A described in Method 1 for manufacturing semiconductor device.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 1 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a process similar to that described in Method 1 for manufacturing semiconductor device to expose all the side surfaces of the oxide semiconductor 130. At that time, part of the oxide semiconductor 130a and part of the insulator 110 are removed so that the depth has a value greater than or equal to the sum of the height of the oxide semiconductor 130b and the thickness of the insulator 150 to be formed later. That is, in the completed transistor 100 illustrated in FIGS. 16A to 16C, the top and side surfaces of part of the oxide semiconductor 130b are covered with the conductor 160 with the insulator 150 positioned therebetween.

In this structure, when the thickness of the oxide semiconductor 130a is greater than the total thickness of the oxide semiconductor 130c and the insulator 150, the insulator 110 can be used as a stopper film. The use of the insulator 110 as a stopper film can prevent excess etching so as not to etch the insulator below the oxide semiconductor 130 at the time of exposing the side surfaces of the oxide semiconductor 130b; as a result, falling down of the oxide semiconductor 130 can be inhibited.

Next, the conductor 140a, the conductor 140b, and the insulator 170 having an opening are formed by steps similar to those described in Method 1 for manufacturing semiconductor device.

Then, the oxide semiconductor 130c, the insulator 150, and the conductor 160 are formed in the opening formed in the insulator 170 by steps similar to those described in Modification example 1 of semiconductor device.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130b with reduced impurities serves as a channel formation region, a highly reliable semiconductor device can be achieved.

Figure 16A:
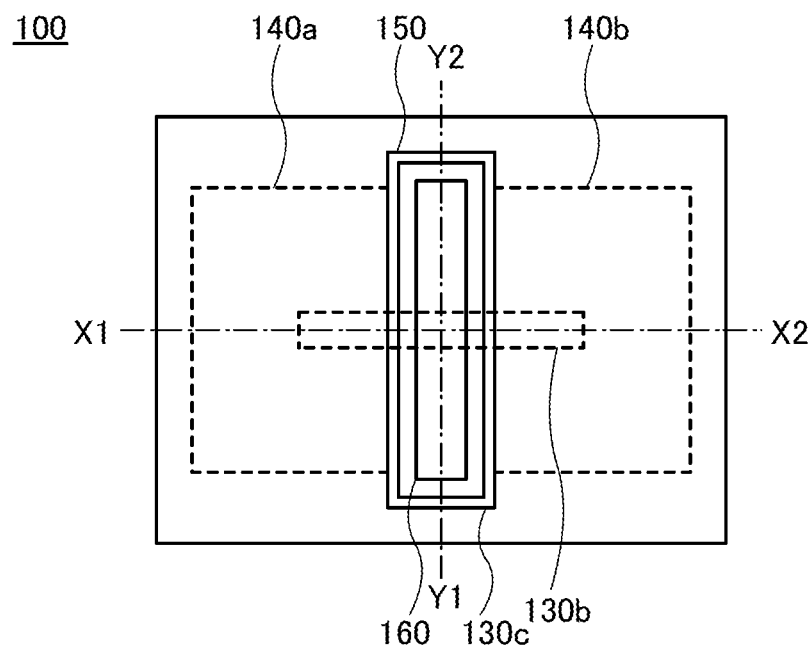
FIGS. 16A to 16C are a top view and cross-sectional views illustrating one embodiment of a semiconductor device.
Figure 16B:
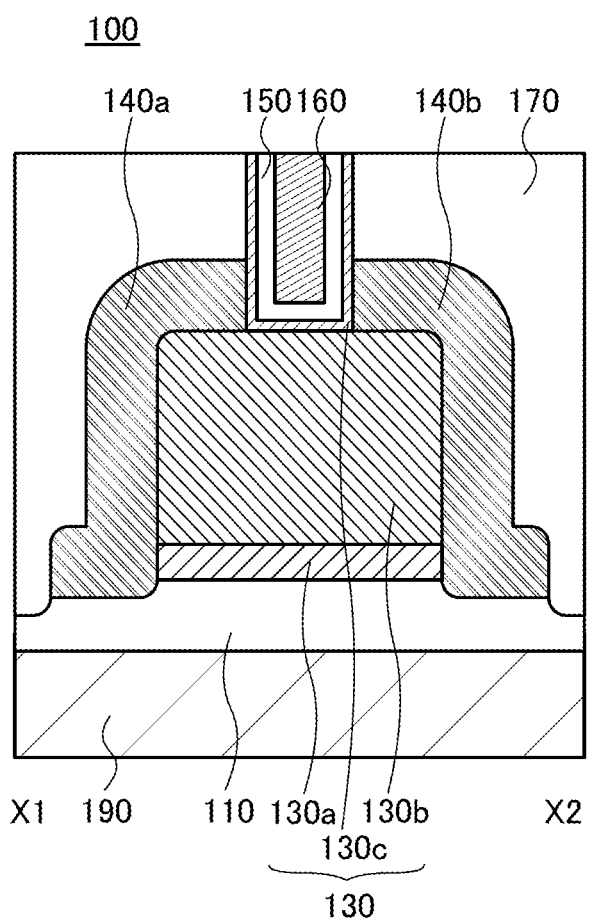
Figure 16C:
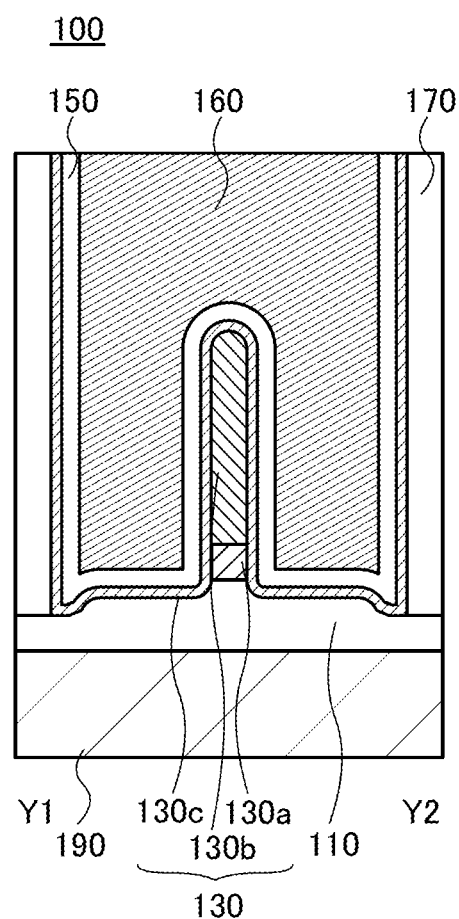

Through the above steps, the transistor 100 illustrated in FIGS. 16A to 16C can be manufactured.

FIG. 16A illustrates an example of a top view of the transistor 100. FIG. 16B is a cross-sectional view taken along dashed-dotted line X1-X2 in FIG. 16A, and FIG. 16C is a cross-sectional view take along dashed-dotted line Y1-Y2 in FIG. 16A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130b, resulting in a transistor with a small subthreshold swing value and favorable on-state characteristics. In addition, for example, the height of the oxide semiconductor 130b may be greater than or equal to 10 nm, preferably greater than or equal to 20 nm, further preferably greater than or equal to 30 nm, still further preferably greater than or equal to 50 nm. Note that the height of the oxide semiconductor 130b is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Thus, the oxide semiconductor is formed in the opening formed in the insulator, whereby an island-shaped oxide semiconductor can be formed without a resist mask.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 2

In this embodiment, a method for manufacturing the transistor 100 is described with reference to FIGS. 17A to 17C, FIGS. 18A to 18C, FIGS. 19A to 19C, FIGS. 20A to 20C, FIGS. 21A to 21C, and FIGS. 22A to 22C.
<Method 2 for Manufacturing Semiconductor Device>

An example of a method for manufacturing the semiconductor device is described with reference to FIGS. 17A to 17C and FIGS. 18A to 18C. Note that the transistor 100 in Embodiment 1 can be referred to for components denoted by the same reference numerals as those in the transistor 100.

Figure 17A:
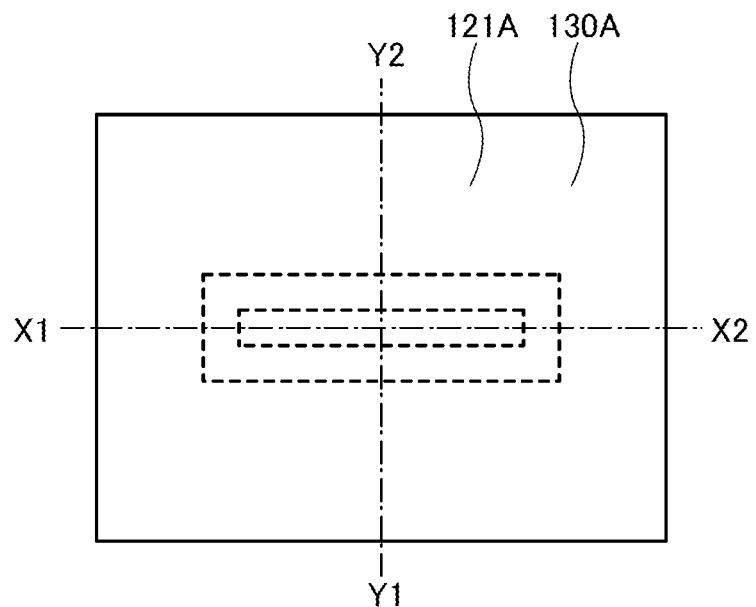
FIGS. 17A to 17C are a top view and cross-sectional views illustrating one embodiment of a method for manufacturing a semiconductor device.
Figure 17B:
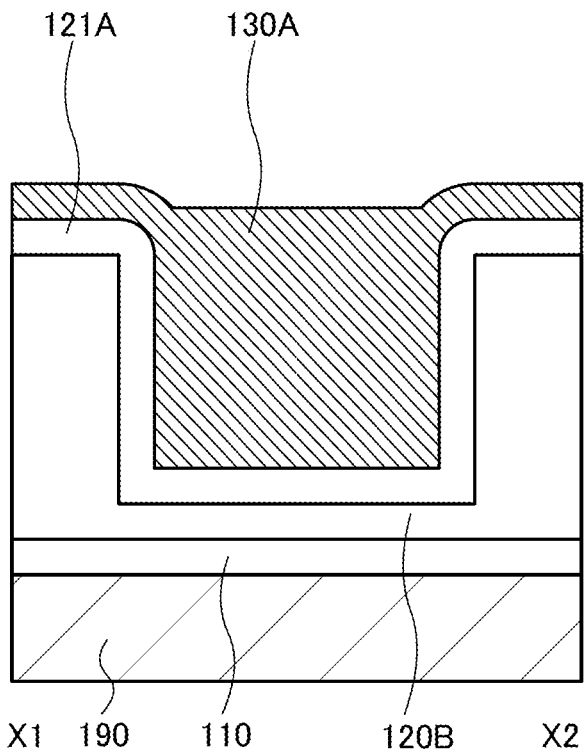
Figure 17C:
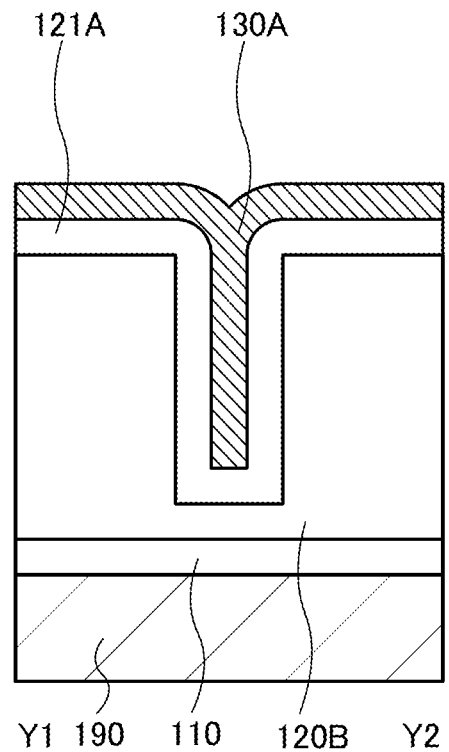

In a manner similar to that in Embodiment 1, the insulator 120B having an opening is formed through the steps illustrated in FIGS. 1A to 1C and FIGS. 2A to 2C. After that, an insulator 121A is formed, and then the oxide semiconductor 130A is formed as illustrated in FIGS. 17A to 17C. Note that the insulator 121A can be formed by a step similar to that for forming the insulator 110 or the insulator 120A.

Figure 18A:
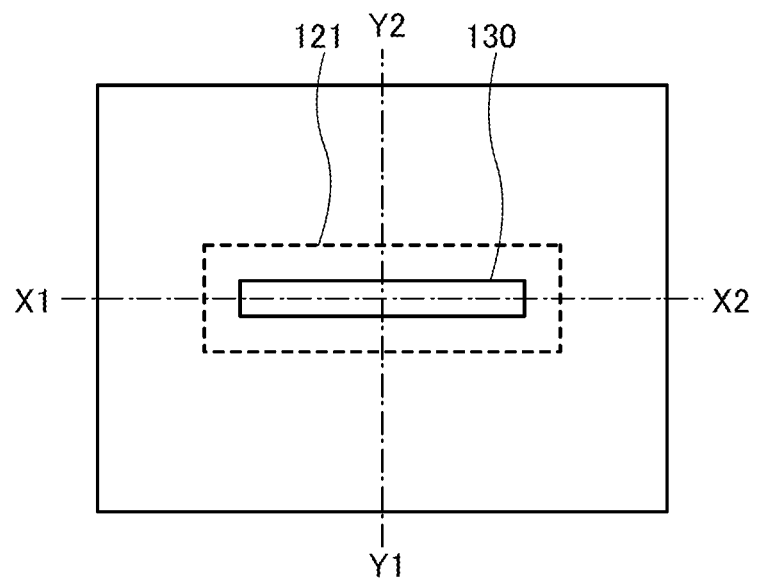
FIGS. 18A to 18C are a top view and cross-sectional views illustrating one embodiment of a method for manufacturing a semiconductor device.
Figure 18B:
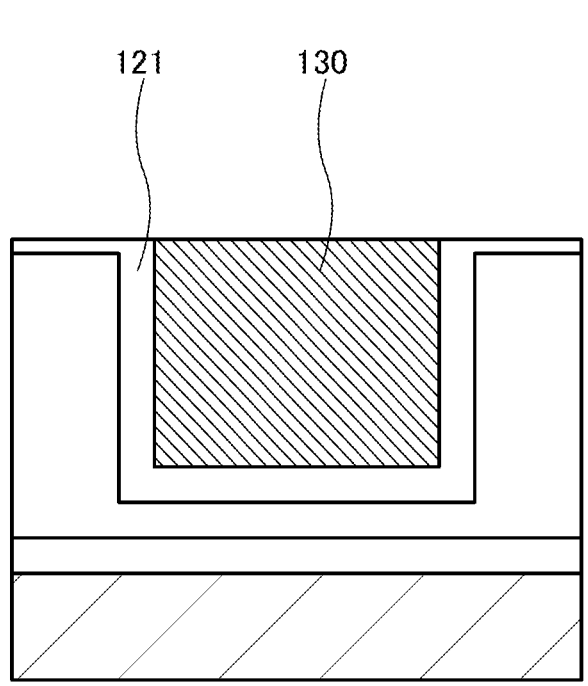
Figure 18C:
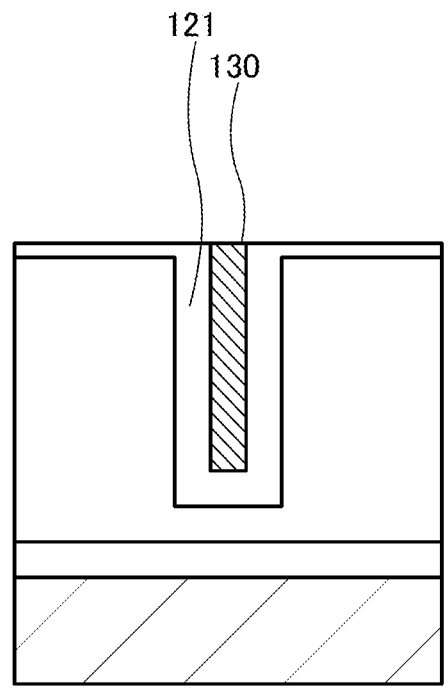

Subsequently, part of the oxide semiconductor 130A is removed by a CMP process or the like until the insulator 121A or the insulator 120B is exposed, whereby the oxide semiconductor 130 and an insulator 121 are formed as illustrated in FIGS. 18A to 18C. Although FIGS. 18A to 18C illustrate the case where the insulator 121 is exposed, the insulator 121A may be removed until the top surface of the insulator 120B is exposed. The thickness and processed shape of the insulator 121A may be set as appropriate so as to be suitable for the designed shape of the oxide semiconductor 130.

Note that the CMP process may be performed only once or plural times. When the CMP process is performed plural times, it is preferable that first polishing be performed at a high polishing rate and final polishing be performed at a low polishing rate. In this manner, by performing polishing processes with different polishing rates in combination, the planarity of the insulator 121 or the insulator 120B can be further improved.

When the insulator 121A is formed, the opening formed in the insulator 120B becomes narrower by the film thickness of the insulator 121A. This makes it possible to provide a transistor in which the width of a region serving as a channel width in the oxide semiconductor 130 embedded in the opening is reduced. A smaller channel width enables the transistor to have improved channel controllability by the gate electric field.
<Method 3 for Manufacturing Semiconductor Device>

An example of a method for manufacturing a semiconductor device in which an oxide semiconductor has a stacked-layer structure is described below with reference to FIGS. 19A to 19C, FIGS. 20A to 20C, FIGS. 21A to 21C, and FIGS. 22A to 22C. Note that the transistor 100 in Embodiment 1 can be referred to for components denoted by the same reference numerals as those in the transistor 100.

Figure 19A:
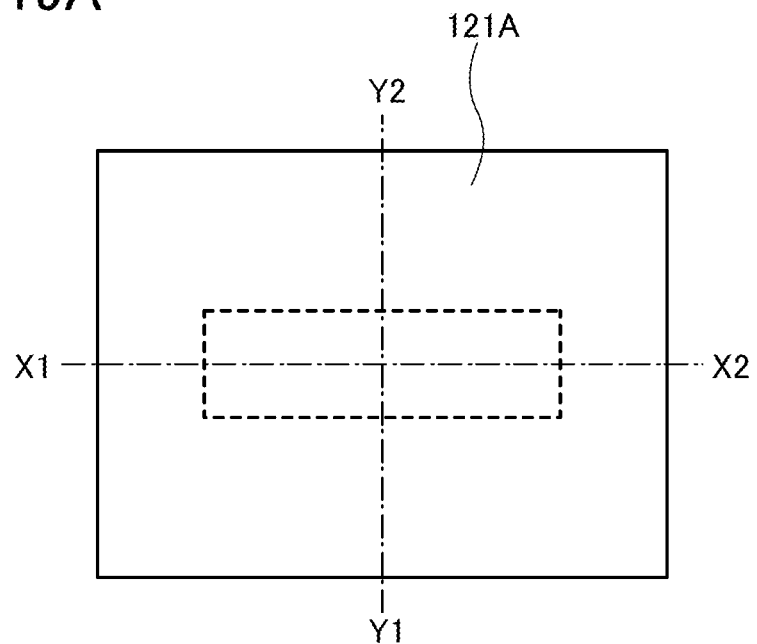
FIGS. 19A to 19C are a top view and cross-sectional views illustrating one embodiment of a method for manufacturing a semiconductor device.
Figure 19B:
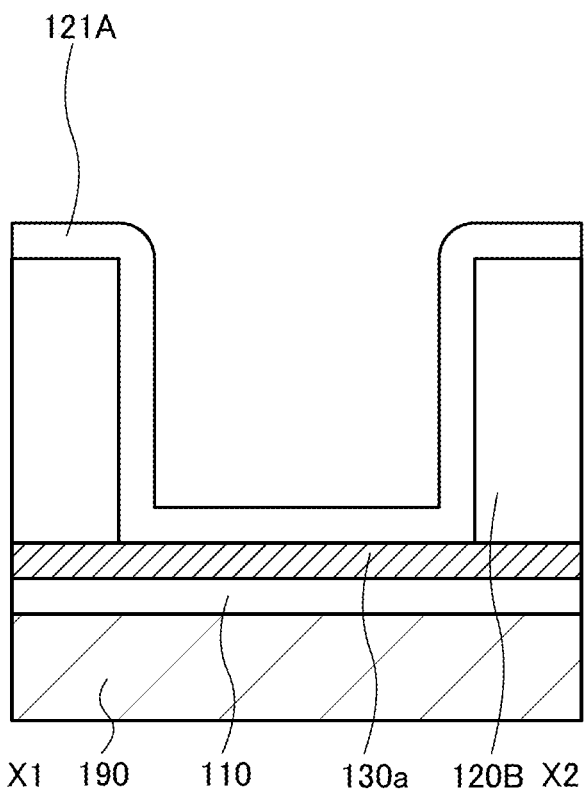
Figure 19C:
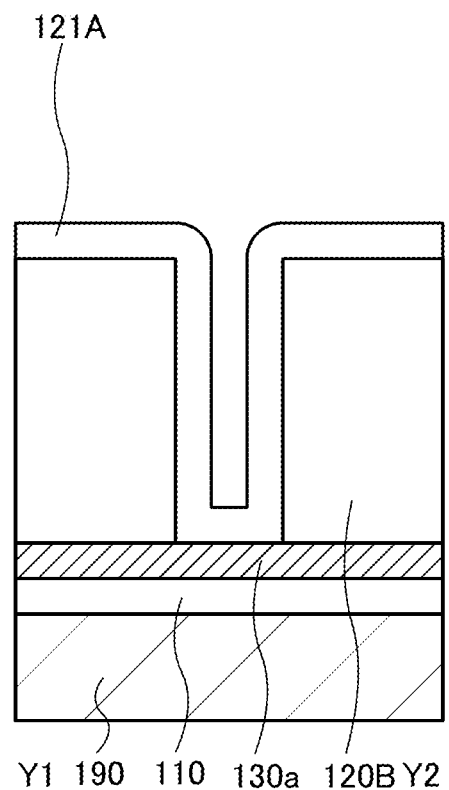

First, the insulator 110, the oxide semiconductor 130a, and the insulator 120B having an opening are formed over the substrate 190 by steps similar to those described in Embodiment 1. Then, the insulator 121A is formed as illustrated in FIGS. 19A to 19C. Note that the insulator 121A can be formed by a step similar to that for forming the insulator 110 or the insulator 120A.

Figure 20A:
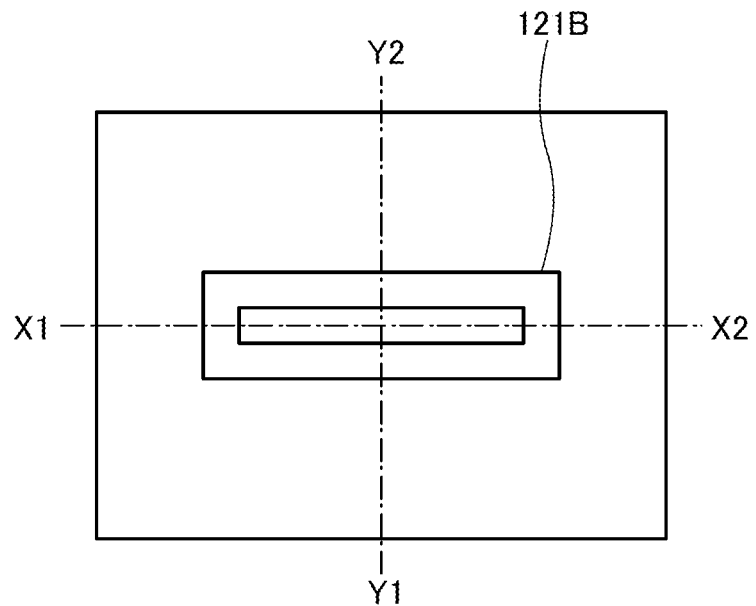
FIGS. 20A to 20C are a top view and cross-sectional views illustrating one embodiment of a method for manufacturing a semiconductor device.
Figure 20B:
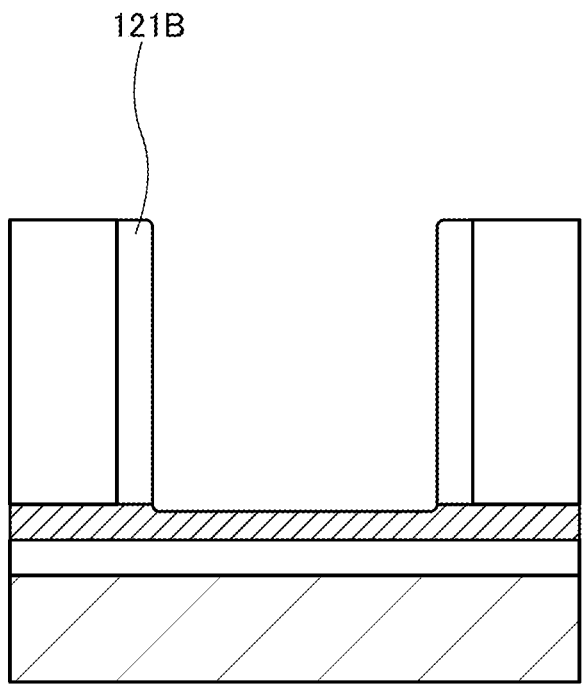
Figure 20C:
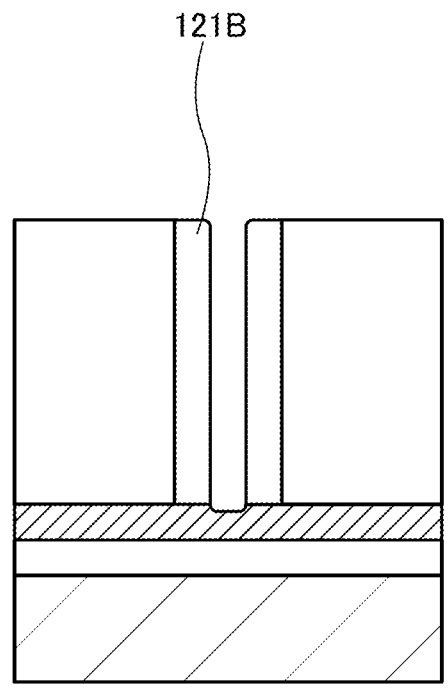

Next, part of the insulator 121A is removed, whereby an insulator 121B is formed and part of the oxide semiconductor 130a is exposed as illustrated in FIGS. 20A to 20C. Note that the removal of the unnecessary portion of the insulator 121A is preferably performed by an etch-back process, for example.

Figure 21A:
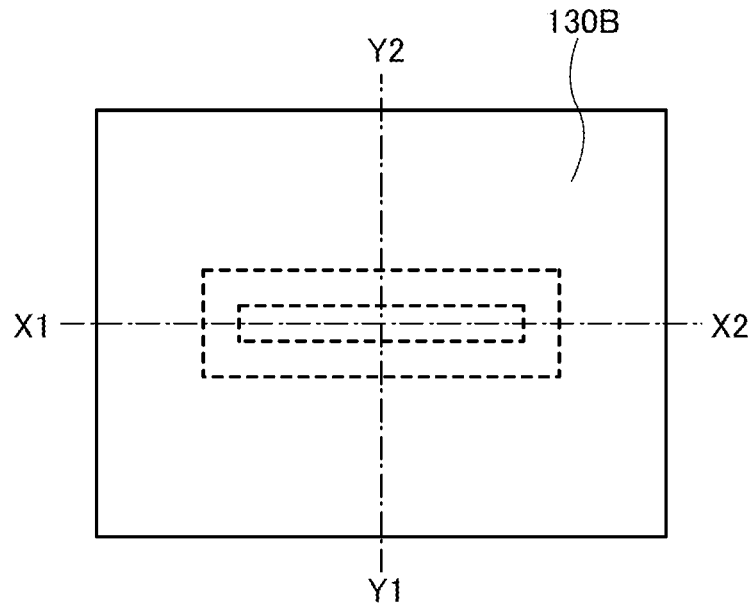
FIGS. 21A to 21C are a top view and cross-sectional views illustrating one embodiment of a method for manufacturing a semiconductor device.
Figure 21B:
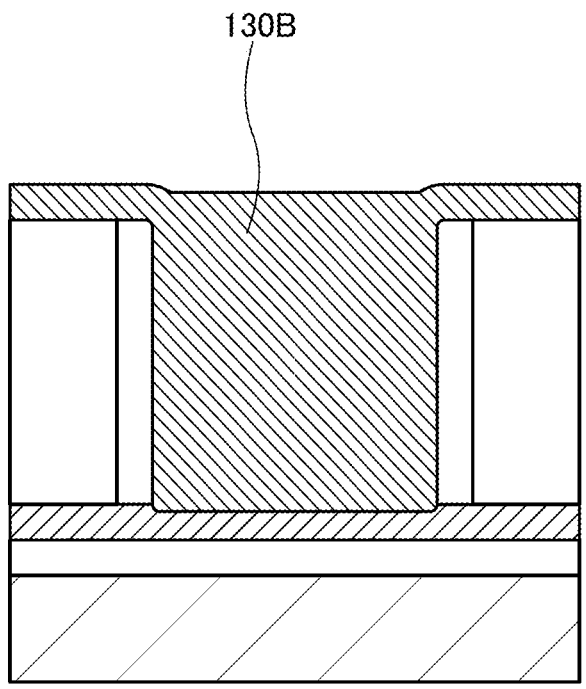
Figure 21C:
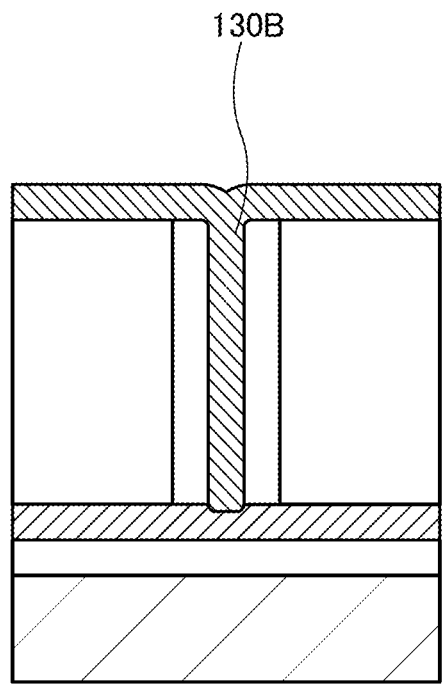

Subsequently, an oxide semiconductor 130B is formed over the insulator 120B, the insulator 121B, and the oxide semiconductor 130a as illustrated in FIGS. 21A to 21C. Note that the oxide semiconductor 130B can be formed by a step similar to that for forming the oxide semiconductor 130A described in Embodiment 1.

Figure 22A:
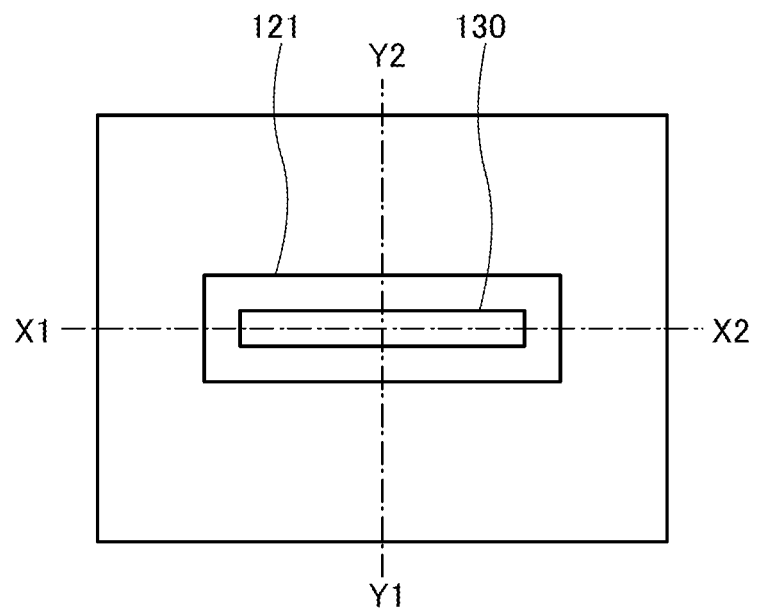
FIGS. 22A to 22C are a top view and cross-sectional views illustrating one embodiment of a method for manufacturing a semiconductor device.
Figure 22B:
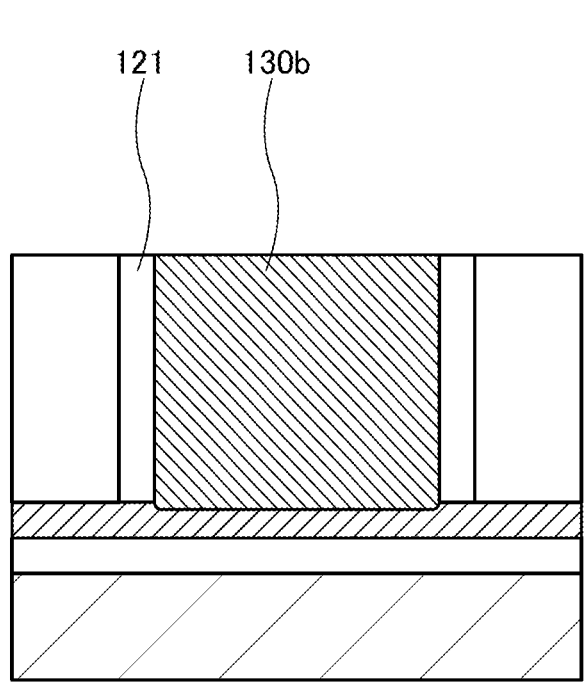
Figure 22C:
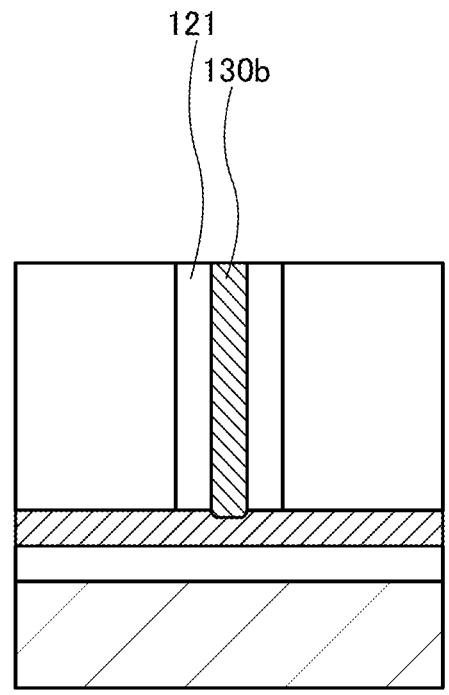

Subsequently, part of the oxide semiconductor 130B is removed by a CMP process or the like until the insulator 121B or the insulator 120B is exposed, whereby the oxide semiconductor 130b and the insulator 121 are formed as illustrated in FIGS. 22A to 22C.

Note that the CMP process may be performed only once or plural times. When the CMP process is performed plural times, it is preferable that first polishing be performed at a high polishing rate and final polishing be performed at a low polishing rate. In this manner, by performing polishing processes with different polishing rates in combination, the planarity of the insulator 121 or the insulator 120B can be further improved.

When the insulator 121A is formed, the opening formed in the insulator 120B becomes narrower by the film thickness of the insulator 121A. Accordingly, the oxide semiconductor 130 embedded in the opening can have a more minute shape.

Therefore, it is possible to provide a transistor in which the width of a region serving as a channel width in the oxide semiconductor 130 embedded in the opening is reduced. A smaller channel width enables the transistor to have improved channel controllability by the gate electric field.

The structures, the methods, and the like described in this embodiment can be combined as appropriate with any of the structures, the methods, and the like described in the other embodiments.

Embodiment 3

Modification Example 6 of Semiconductor Device

In this embodiment, a modification example of the transistor 100 is described with reference to FIGS. 23A to 23C, FIGS. 24A to 24C, FIGS. 25A to 25C, FIGS. 26A to 26C, FIGS. 27A to 27C, FIGS. 28A to 28C, FIGS. 29A to 29C, FIGS. 30A to 30C, FIGS. 31A to 31C, FIGS. 32A to 32C, FIGS. 33A to 33C, FIGS. 34A to 34C, FIGS. 35A to 35C, FIGS. 36A to 36C, and FIGS. 37A to 37C.

<Method 4 for Manufacturing Semiconductor Device>

Figure 23A:
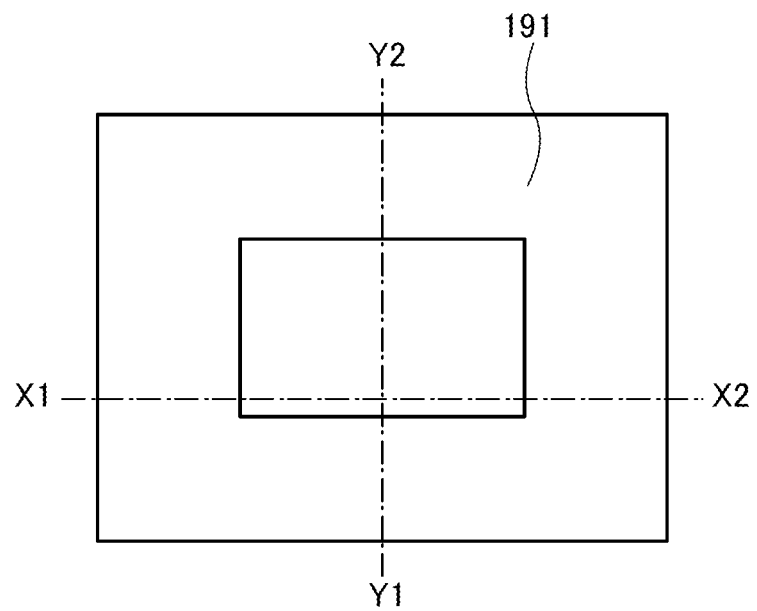
FIGS. 23A to 23C are a top view and cross-sectional views illustrating one embodiment of a method for manufacturing a semiconductor device.
Figure 23B:
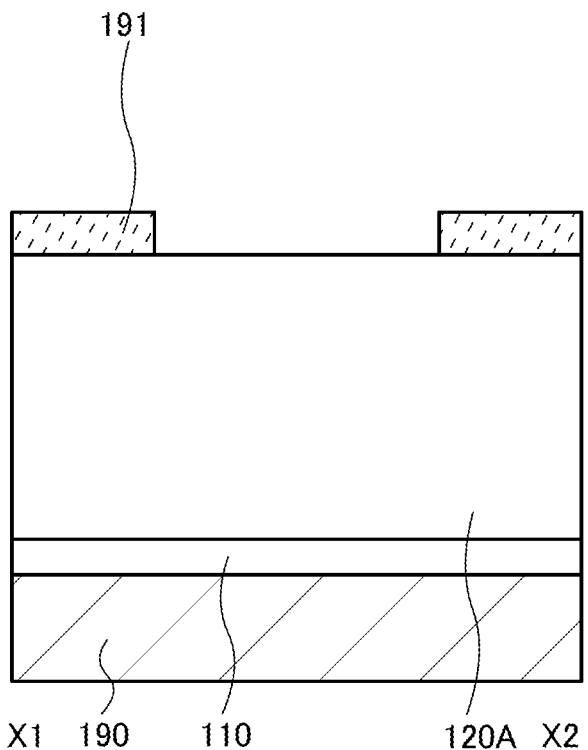
Figure 23C:
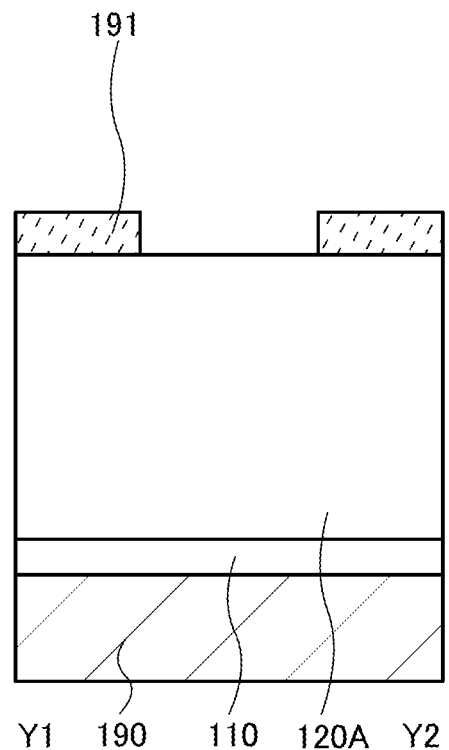

An example of a method for manufacturing a semiconductor device is described below with reference to FIGS. 23A to 23C, FIGS. 24A to 24C, FIGS. 25A to 25C, FIGS. 26A to 26C, FIGS. 27A to 27C, FIGS. 28A to 28C, FIGS. 29A to 29C, FIGS. 30A to 30C, FIGS. 31A to 31C, and FIGS. 32A to 32C. Note that FIG. 23A is an example of a top view. FIG. 23B is a cross-sectional view taken along dashed-dotted line X1-X2 in FIG. 23A, and FIG. 23C is a cross-sectional view take along dashed-dotted line Y1-Y2 in FIG. 23A. The same applies to FIGS. 24A to 24C, FIGS. 25A to 25C, FIGS. 26A to 26C, FIGS. 27A to 27C, FIGS. 28A to 28C, FIGS. 29A to 29C, FIGS. 30A to 30C, FIGS. 31A to 31C, and FIGS. 32A to 32C. Note that the structure having a function similar to that of the transistor 100 in Embodiment 1 is denoted by the same reference numerals in the transistor 100, and the transistor in Embodiment 1 can be referred to.

First, the insulator 110, the insulator 120A, and the resist mask 191 are formed over the substrate 190 as illustrated in FIGS. 23A to 23C.

Figure 24A:
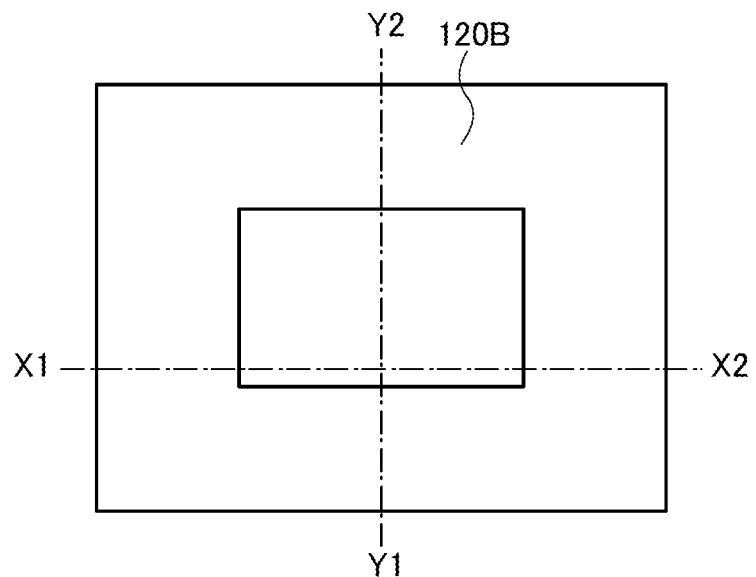
FIGS. 24A to 24C are a top view and cross-sectional views illustrating one embodiment of a method for manufacturing a semiconductor device.
Figure 24B:
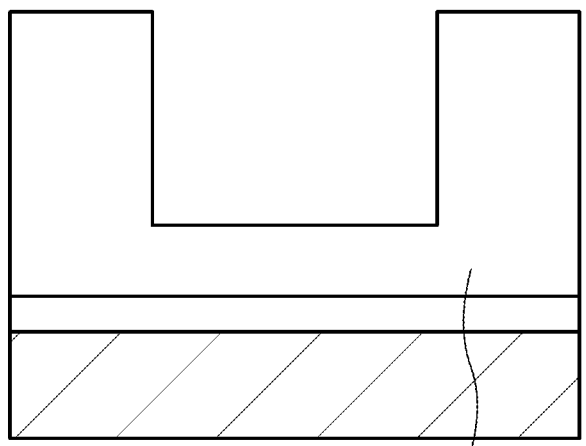
Figure 24C:
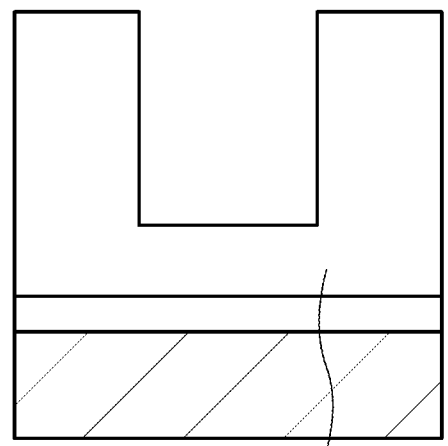

Then, an unnecessary portion of the insulator 120A is removed by using the resist mask 191 to form the insulator 120B as illustrated in FIGS. 24A to 24C.

Figure 25A:
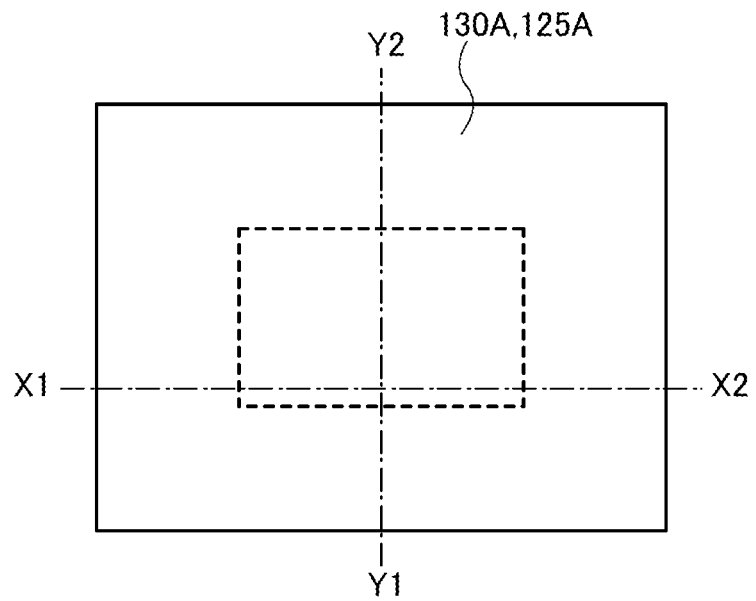
FIGS. 25A to 25C are a top view and cross-sectional views illustrating one embodiment of a method for manufacturing a semiconductor device.
Figure 25B:
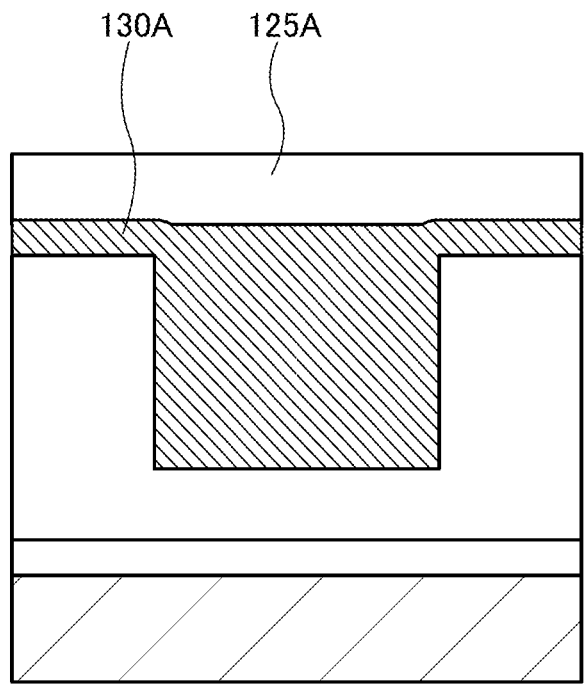
Figure 25C:
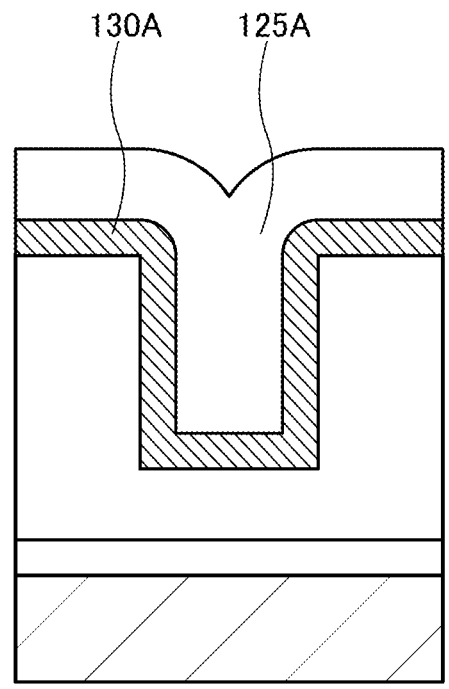

Subsequently, the oxide semiconductor 130A is formed along the inner wall of an opening of the insulator 120B as illustrated in FIGS. 25A to 25C. After that, an insulator 125A is formed over the oxide semiconductor 130A. Note that the insulator 125A can be formed by a step similar to that for forming the insulator 110 or the insulator 120A.

Figure 26A:
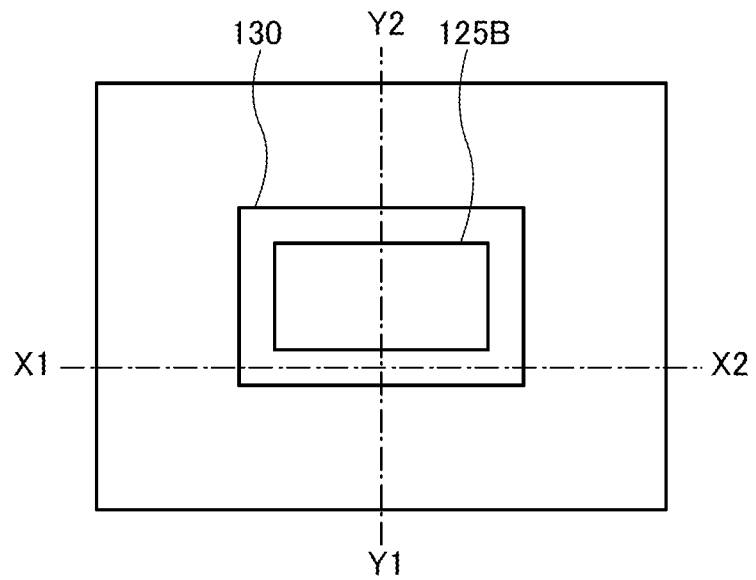
FIGS. 26A to 26C are a top view and cross-sectional views illustrating one embodiment of a method for manufacturing a semiconductor device.
Figure 26B:
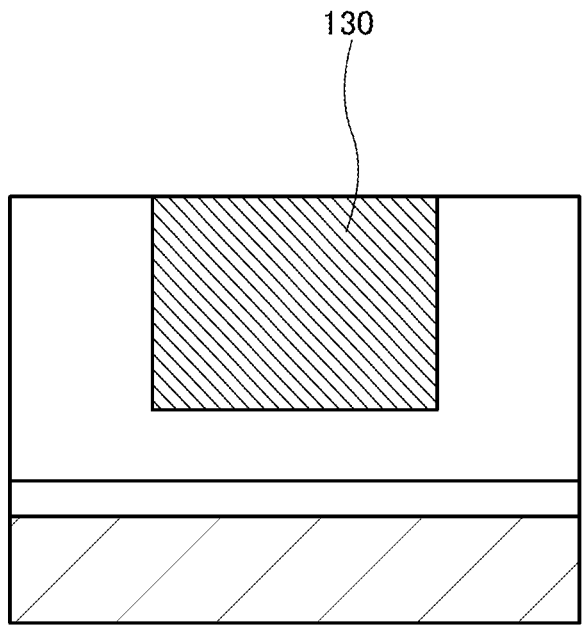
Figure 26C:
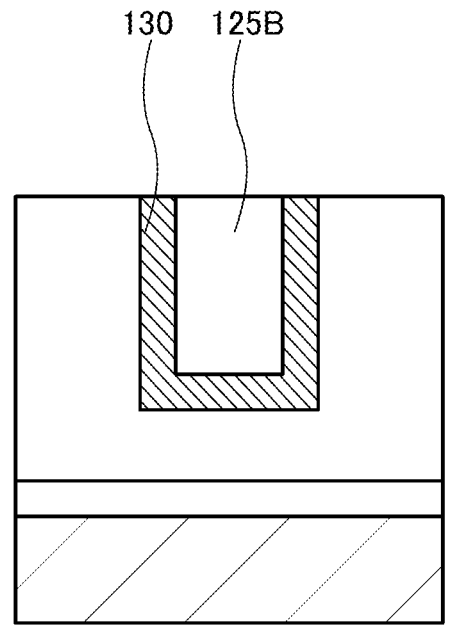

Next, unnecessary portions of the insulator 125A and the oxide semiconductor 130A are removed to form the oxide semiconductor 130 and an insulator 125B as illustrated in FIGS. 26A to 26C.

To remove the unnecessary portions of the oxide semiconductor 130A and the insulator 125A, part of the insulator 125A and part of the oxide semiconductor 130A may be removed by, for example, an etch-back process or a CMP process until the insulator 120B is exposed. Here, the insulator 120B can be used as a stopper layer, and the thickness of the insulator 120B is reduced in some cases.

Then, unnecessary portions of the insulator 120B and the insulator 125B are removed, whereby the top surface and part of the side surfaces of the oxide semiconductor 130 are exposed and the insulator 120 and an insulator 125 are formed as illustrated in FIGS. 27A to 27C. In this step, an etch-back process using a dry etching method may be performed on the insulator 120B and the insulator 125B, for example. At that time, part of the oxide semiconductor 130 is embedded in the insulator 120 and the insulator 125 as illustrated in FIGS. 27B and 27C, which can prevent the oxide semiconductor 130 to fall down in a later step.

Figure 28A:
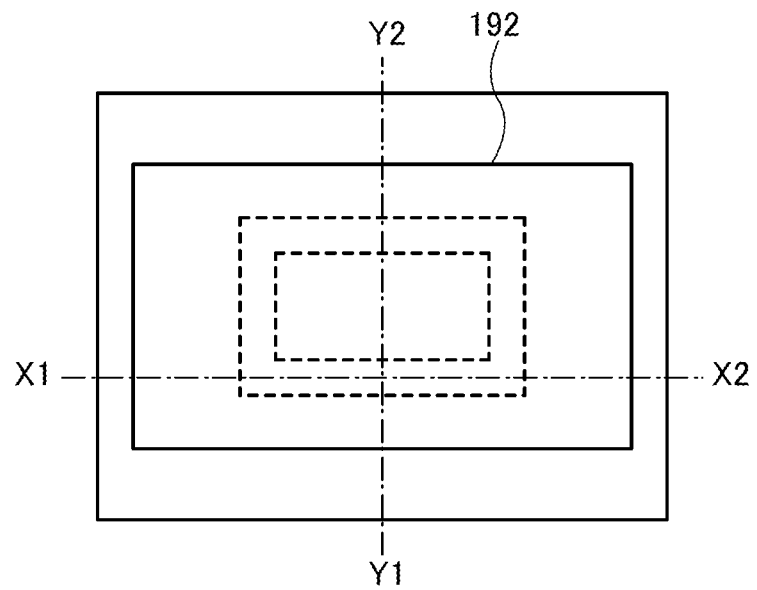
FIGS. 28A to 28C are a top view and cross-sectional views illustrating one embodiment of a method for manufacturing a semiconductor device.
Figure 28B:
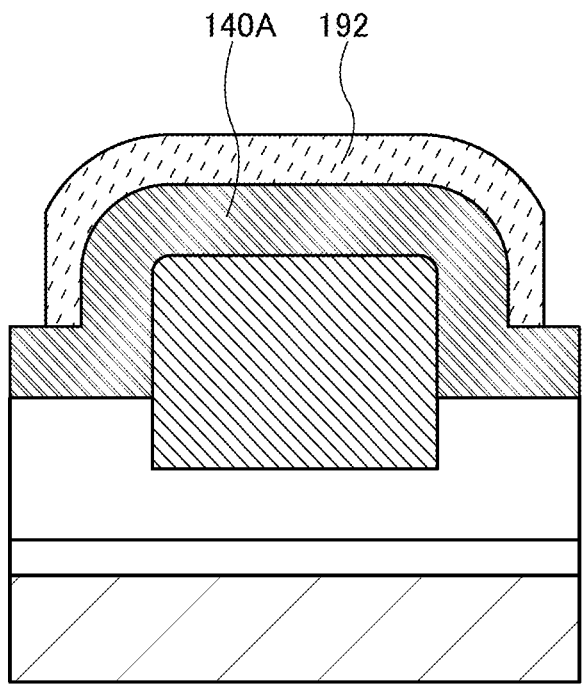
Figure 28C:
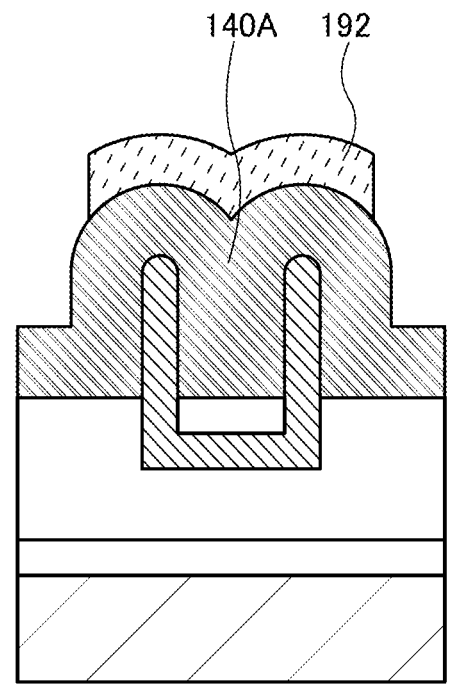

Next, the conductor 140A and the resist mask 192 are formed over the oxide semiconductor 130 as illustrated in FIGS. 28A to 28C. Then, an unnecessary portion of the conductor 140A is removed by using the resist mask 192 to form the conductor 140B.

Figure 29A:
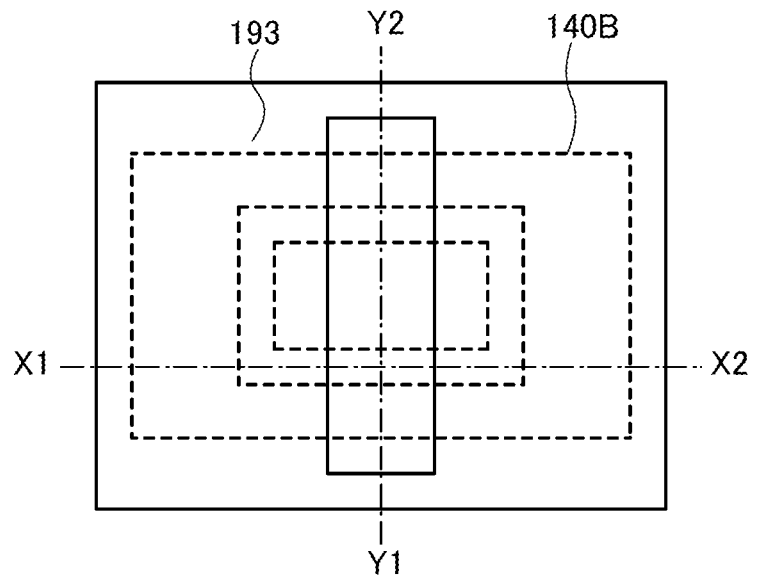
FIGS. 29A to 29C are a top view and cross-sectional views illustrating one embodiment of a method for manufacturing a semiconductor device.
Figure 29B:
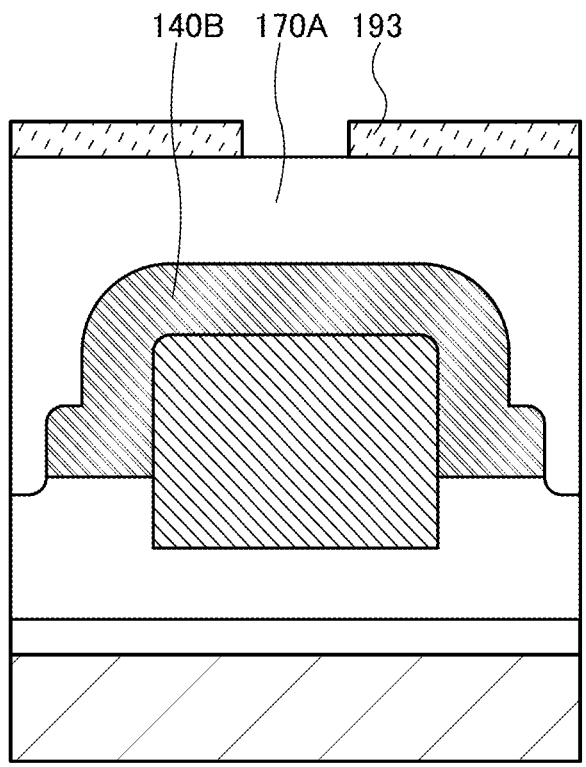
Figure 29C:
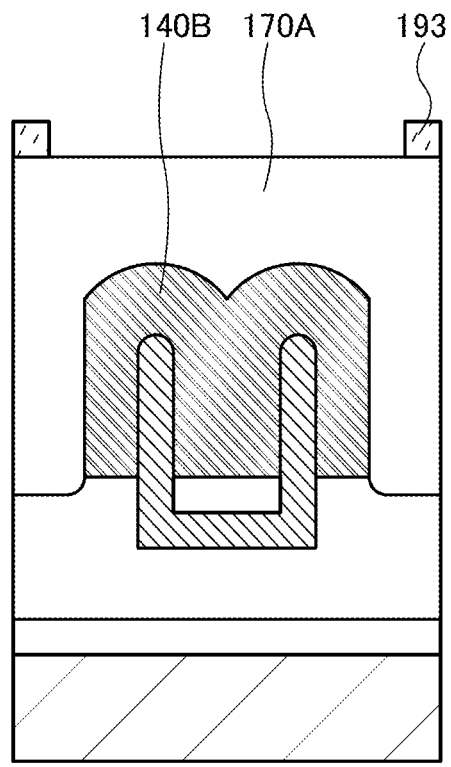
Figure 30A:
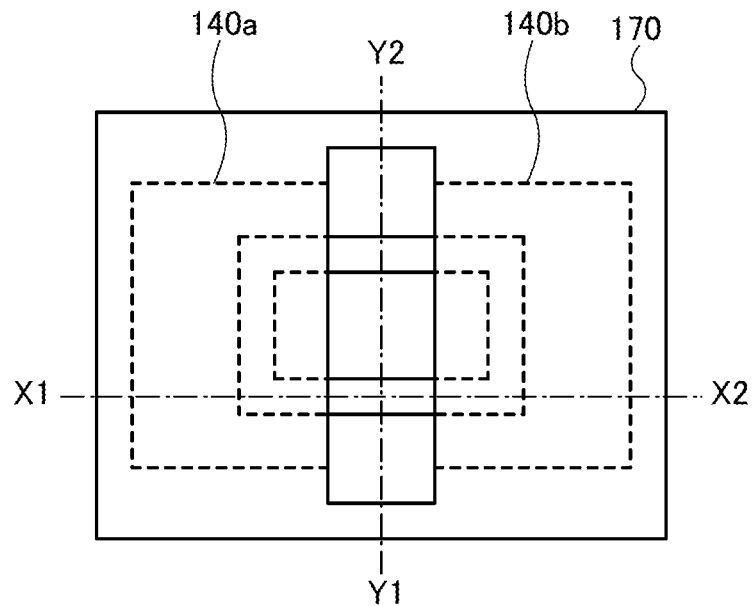
FIGS. 30A to 30C are a top view and cross-sectional views illustrating one embodiment of a method for manufacturing a semiconductor device.
Figure 30B:
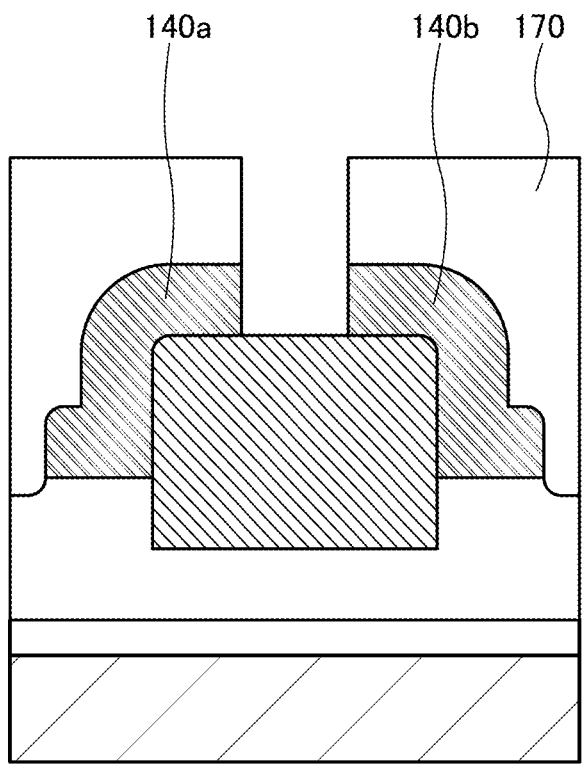
Figure 30C:
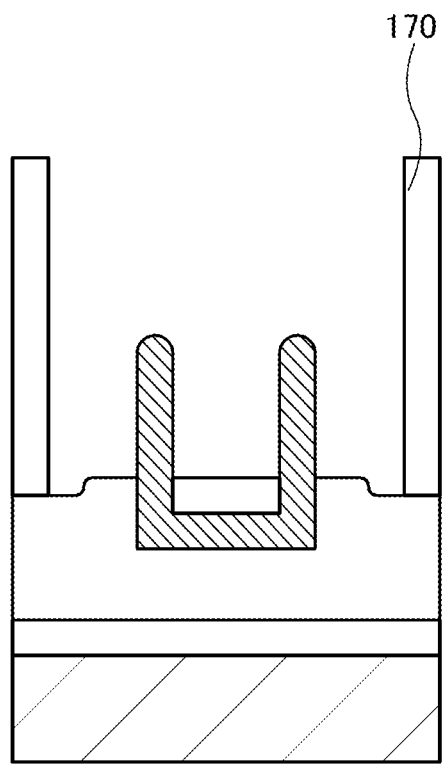

After that, the insulator 170A and the resist mask 193 are formed over the conductor 140B as illustrated in FIGS. 29A to 29C. Subsequently, unnecessary portions of the insulator 170A and the conductor 140B are removed by using the resist mask 193, whereby the insulator 170 and the conductor 140a and the conductor 140b are formed as illustrated in FIGS. 30A to 30C.

Figure 31A:
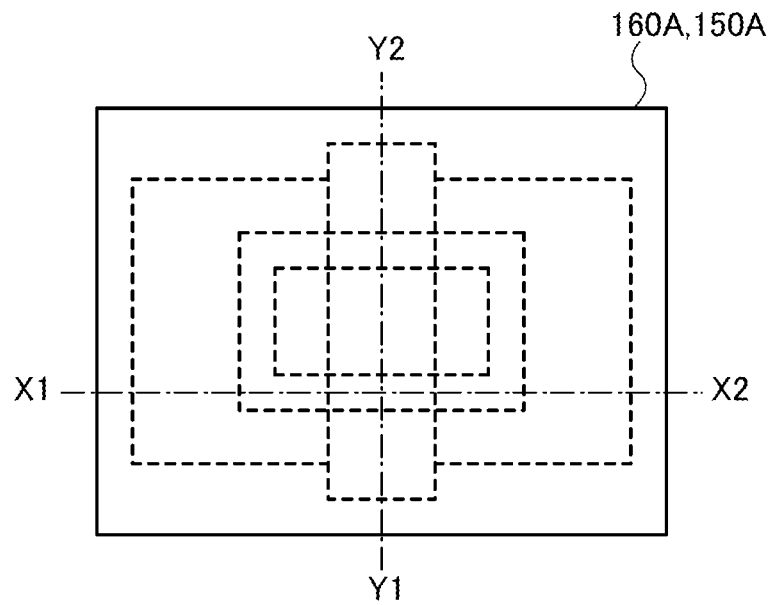
FIGS. 31A to 31C are a top view and cross-sectional views illustrating one embodiment of a method for manufacturing a semiconductor device.
Figure 31B:
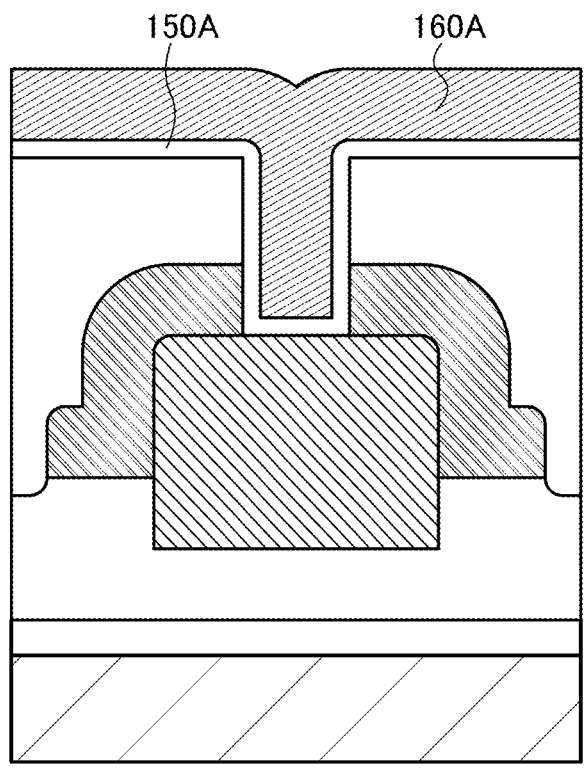
Figure 31C:
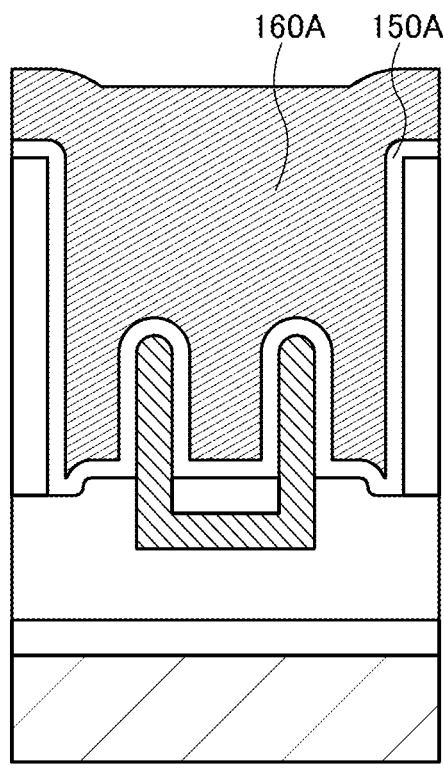
Figure 32A:
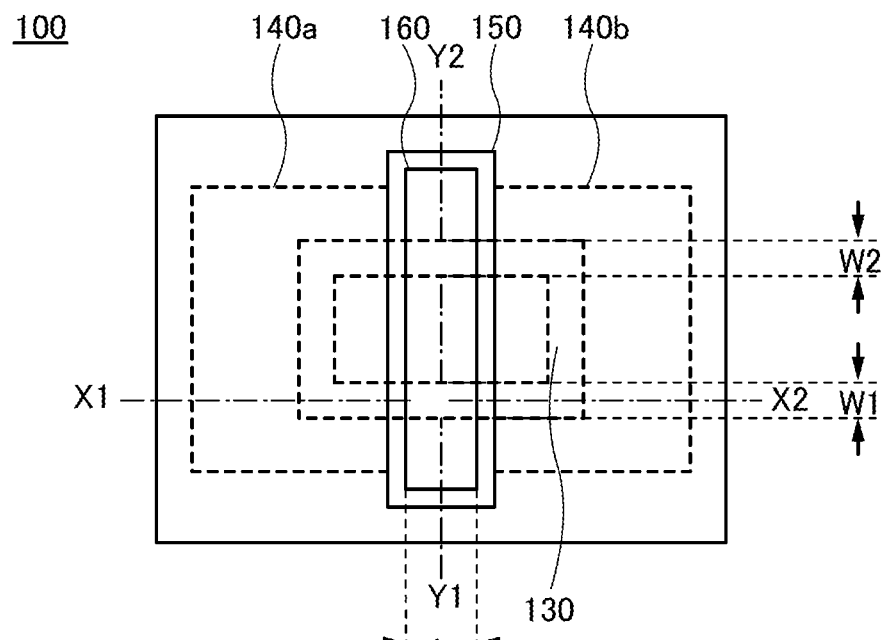
FIGS. 32A to 32C are a top view and cross-sectional views illustrating one embodiment of a method for manufacturing a semiconductor device.
Figures 32B, 32C:
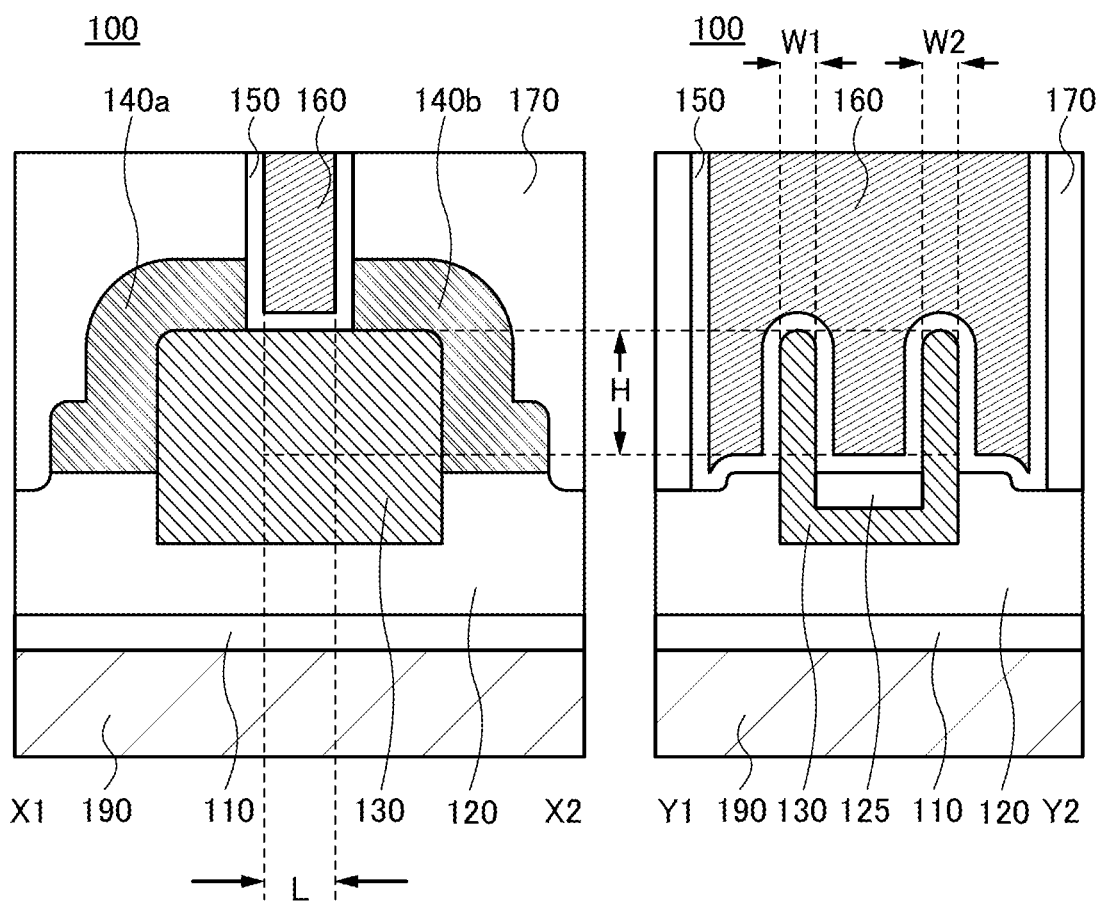

Next, the insulator 150A and the conductor 160A are formed over the oxide semiconductor 130 as illustrated in FIGS. 31A to 31C. Then, unnecessary portions of the insulator 150A and the conductor 160A are removed as illustrated in FIGS. 32A to 32C. Note that in this step, part of the insulator 150A and part of the conductor 160A may be removed by, for example, a CMP process until the insulator 170 is exposed. At that time, the insulator 170 can also be used as a stopper layer and the thickness of the insulator 170 is reduced in some cases.

Through the above-described steps, the transistor 100 illustrated in FIGS. 32A to 32C can be formed. In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

Here, as illustrated in FIGS. 32A to 32C, the widths of regions of the oxide semiconductor 130 which overlap with the conductor 160 with the insulator 150 positioned therebetween are represented as W1 and W2. In addition, the length of the regions of the oxide semiconductor 130 which overlap with the conductor 160 with the insulator 150 positioned therebetween is represented as L. The height of part of the oxide semiconductor 130 which faces the conductor 160 with the insulator 150 positioned therebetween is represented as H.

In some cases, the channel is formed in a region of the oxide semiconductor 130 which faces or overlaps with the conductor 160 with the insulator 150 positioned therebetween. Therefore, the channel formation region can be determined by the length L, the width W1, the width W2, and the height H.

In this structure, the width W1 and the width W2 in the oxide semiconductor 130 can be adjusted by changing the thickness of the oxide semiconductor 130 regardless of the size of the opening. Thus, a miniaturized transistor can be provided easily.

Furthermore, the area of the channel formation in this structure is twice as large as that in any of the structures described above. Accordingly, the on-state characteristics can be increased and the controllability of the transistor can be improved. Furthermore, the three sides of the channel formation region are surrounded by the conductor 160 with the insulator 150 positioned therebetween.

In this structure, an electric field can be applied to at least the three sides of the channel formation region of the oxide semiconductor 130 owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the height H becomes large, the channel formation region is enlarged in the oxide semiconductor 130, and the on-state current of the transistor can be increased. In addition, as the width W1 and the width W2 of the oxide semiconductor 130 are reduced, the proportion of a region with a high carrier controllability increases, leading to a smaller subthreshold swing value.

Accordingly, for example, the height H is preferably greater than or equal to three times the width W1 or the width W2. When the height H is greater than or equal to three times the width W1 or the width W2, the transistor can have a small subthreshold swing value and exhibit favorable on-state characteristics. Specifically, for example, the height H of the oxide semiconductor 130 may be greater than or equal to 10 nm, preferably greater than or equal to 20 nm, further preferably greater than or equal to 30 nm, still further preferably greater than or equal to 50 nm. Note that the height H of the oxide semiconductor 130 is set to, for example, less than or equal to 300 nm, preferably less than or equal to 200 nm, and further preferably less than or equal to 150 nm because the productivity of the semiconductor device might be decreased.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 7 of Semiconductor Device

A modification example of the transistor 100 is described below with reference to FIGS. 33A to 33C. Note that, for components denoted by the same reference numerals as those of the transistor 100 described in Method 4 for manufacturing semiconductor device, Method 4 for manufacturing semiconductor device can be referred to.

First, the film 115 is formed over the insulator 110, and the insulator 120A is formed over the film 115. Then, an unnecessary portion of the insulator 120A is removed by using a resist mask. At that time, the film 115 functions as a stopper film. Therefore, the film 115 can reduce variation in the height of the opening although the film 115 is not an indispensable component. The uniform shape of the opening can reduce the variation in the size of the oxide semiconductor to be formed in a later step, resulting in a highly reliable transistor.

Then, the oxide semiconductor 130 is formed in the opening formed in the insulator 120A by a process similar to that described in Method 4 for manufacturing semiconductor device.

Next, the insulator 120B is removed by a process similar to that described in Method 4 for manufacturing semiconductor device to expose all the side surfaces of the oxide semiconductor 130. The film 115 can also be used as a stopper film at that time, which facilitates the exposure of all the side surfaces of the oxide semiconductor 130. By exposing all the side surfaces of the oxide semiconductor 130 in this step, the region which faces the conductor 160 with the insulator 150, which is to be formed in a later step, positioned therebetween is enlarged, so that the region whose length serves as the channel length can be efficiently formed.

Figure 33A:
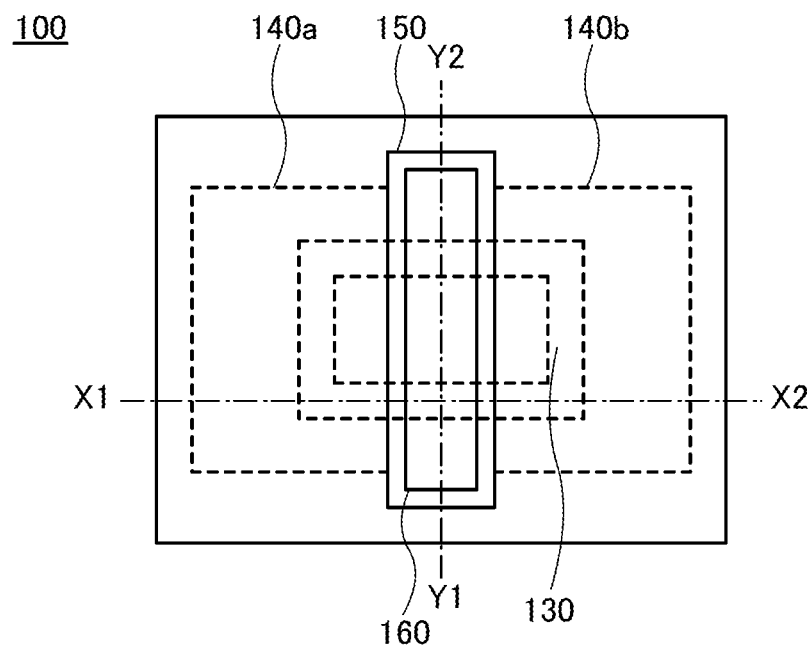
FIGS. 33A to 33C are a top view and cross-sectional views illustrating one embodiment of a semiconductor device.
Figure 33B:
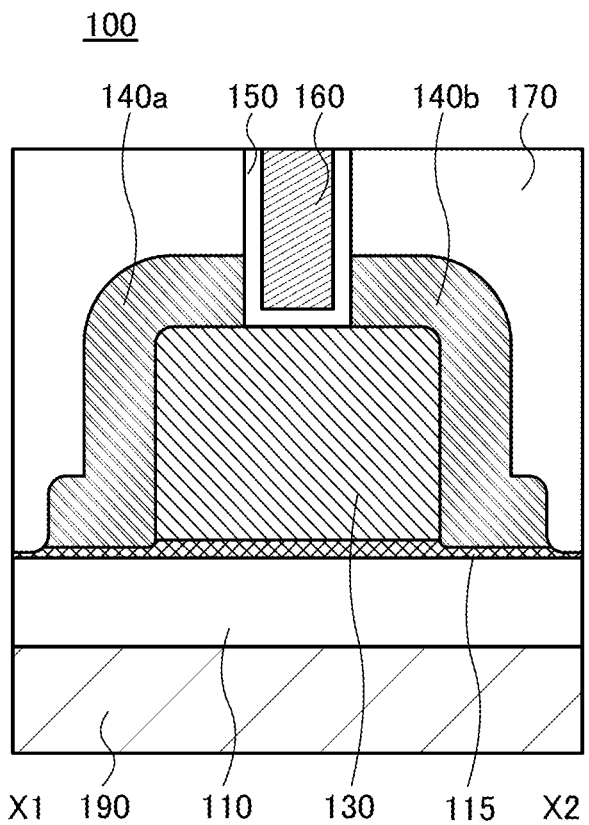
Figure 33C:
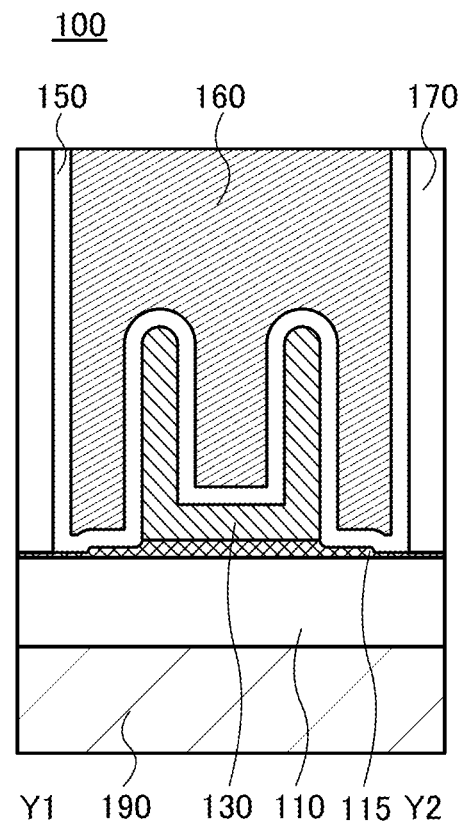

After the step for exposing the oxide semiconductor 130, steps similar to those described in Method 4 for manufacturing semiconductor device are performed, whereby the transistor 100 illustrated in FIGS. 33A to 33C can be manufactured.

FIG. 12A illustrates an example of a top view of the transistor 100. FIG. 12B is a cross-sectional view taken along dashed-dotted line X1-X2 in FIG. 12A, and FIG. 12C is a cross-sectional view take along dashed-dotted line Y1-Y2 in FIG. 12A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130 can be adjusted by changing the thickness of the oxide semiconductor 130 regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130, resulting in a transistor with a small subthreshold swing value and favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 8 of Semiconductor Device

A modification example of the transistor 100 is described below with reference to FIGS. 34A to 34C. Note that, for components denoted by the same reference numerals as those of the transistor 100 described in Method 4 for manufacturing semiconductor device, Method 4 for manufacturing semiconductor device can be referred to.

First, the film 115 is formed over the insulator 110, and the insulator 120A is formed over the film 115. Then, an unnecessary portion of the insulator 120A is removed by using a resist mask.

Then, the oxide semiconductor 130 is formed in the opening formed in the insulator 120A by a process similar to that described in Method 4 for manufacturing semiconductor device.

Next, the insulator 120B is removed by a process similar to that described in Method 4 for manufacturing semiconductor device to expose all the side surfaces of the oxide semiconductor 130. At that time, the insulator 120B is removed so that the depth has a value obtained by adding at least the thickness of the insulator 150, which is to be formed later, to the height of the oxide semiconductor 130; as a result, the insulator 120 is formed. That is, in the completed transistor 100 illustrated in FIGS. 34A to 34C, the top surface and all the side surfaces of part of the oxide semiconductor 130 are covered with the conductor 160 with the insulator 150 positioned therebetween.

In this structure, the film 115 is preferably used as a stopper film. The use of the film 115 can prevent excess etching at the time of removing the insulator 120B so as not to etch a portion of the insulator 120B below the oxide semiconductor 130; accordingly, falling down of the oxide semiconductor 130 can be inhibited.

Figure 34A:
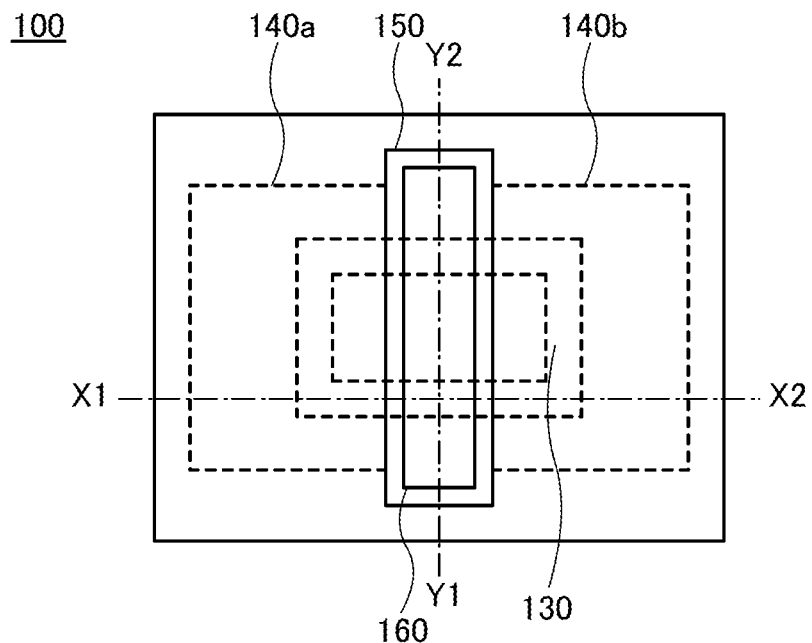
FIGS. 34A to 34C are a top view and cross-sectional views illustrating one embodiment of a semiconductor device.
Figure 34B:
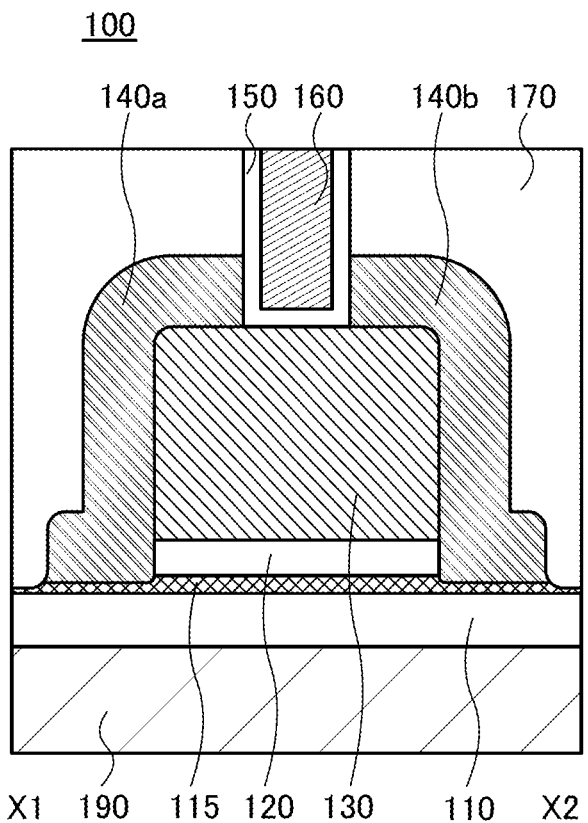
Figure 34C:
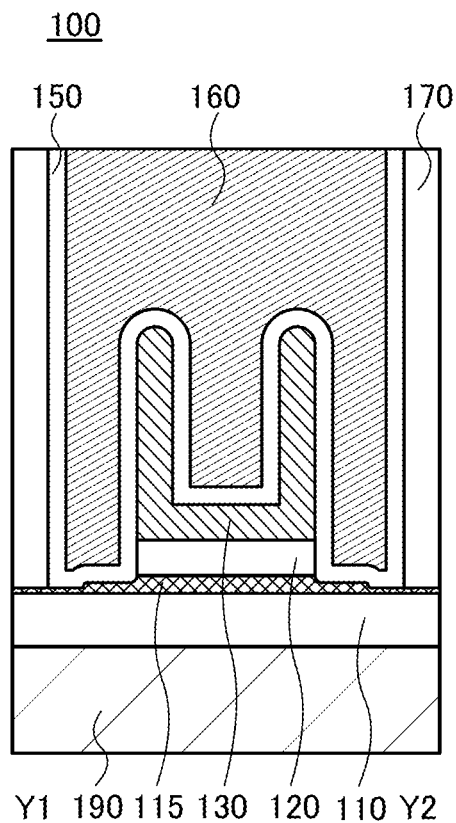

After the step for exposing the oxide semiconductor 130, steps similar to those described in Method 4 for manufacturing semiconductor device are performed, whereby the transistor 100 illustrated in FIGS. 34A to 34C can be manufactured.

FIG. 34A illustrates an example of a top view of the transistor 100. FIG. 34B is a cross-sectional view taken along dashed-dotted line X1-X2 in FIG. 134A, and FIG. 34C is a cross-sectional view take along dashed-dotted line Y1-Y2 in FIG. 34A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130 can be adjusted by changing the thickness of the oxide semiconductor 130 regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130, resulting in a transistor with a small subthreshold swing value and favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 9 of Semiconductor Device

A modification example of the transistor 100 is described below with reference to FIGS. 35A to 35C. Note that, for components denoted by the same reference numerals as those of the transistor 100 described in Method 4 for manufacturing semiconductor device, Method 4 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 4 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a step similar to that described in Method 4 for manufacturing semiconductor device to expose the side surfaces of the oxide semiconductor 130b. At that time, part of the oxide semiconductor 130b is embedded in the insulator 120, which prevents the oxide semiconductor 130b to fall down in a later step.

Subsequently, the conductor 140a, the conductor 140b, and the insulator 170 having an opening are formed by steps similar to those described in Method 4 for manufacturing semiconductor device.

Then, the oxide semiconductor 130C that is to be the oxide semiconductor 130c, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130*b* with reduced impurities serves as a channel formation region, a highly reliable semiconductor device can be achieved.

Next, in a manner to similar to that in Method 4 for manufacturing semiconductor device, part of the conductor 160A, part of the insulator 150A, and part of the oxide semiconductor 130C are removed by a CMP process or the like until the insulator 170 is exposed, whereby the oxide semiconductor 130*c*, the insulator 150, and the conductor 160 are formed. At that time, the insulator 170 can be used as a stopper layer and the thickness of the insulator 170 is reduced in some cases.

Figure 35A:
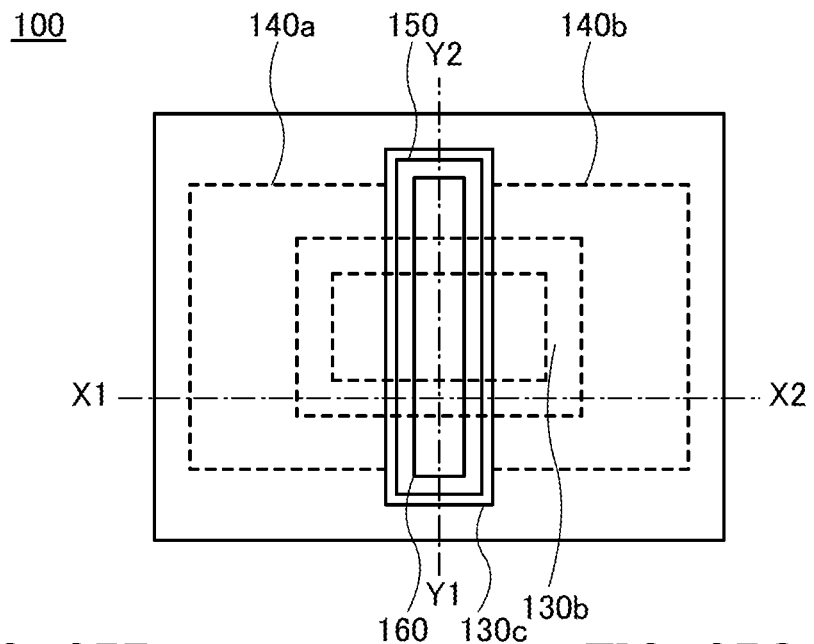
FIGS. 35A to 35C are a top view and cross-sectional views illustrating one embodiment of a semiconductor device.
Figure 35B:
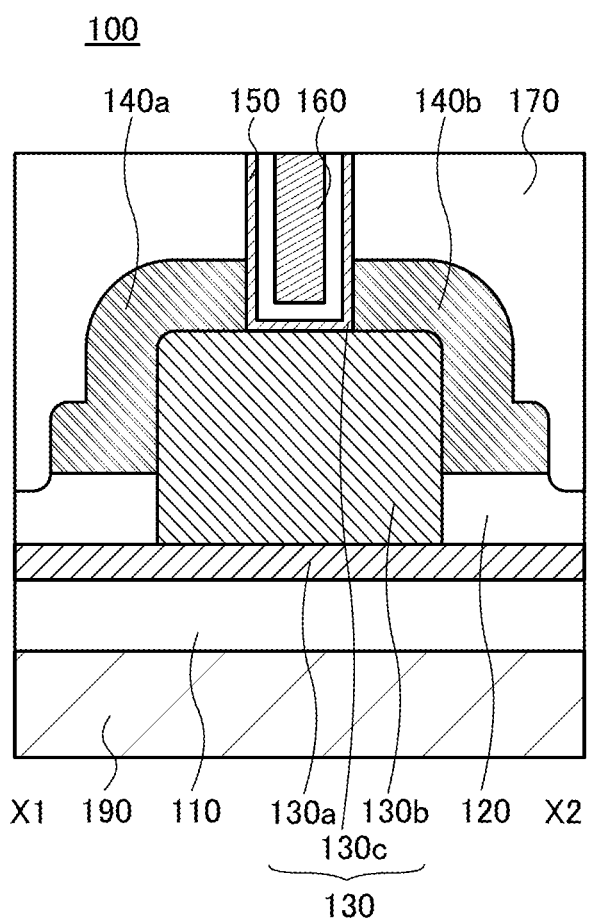
Figure 35C:
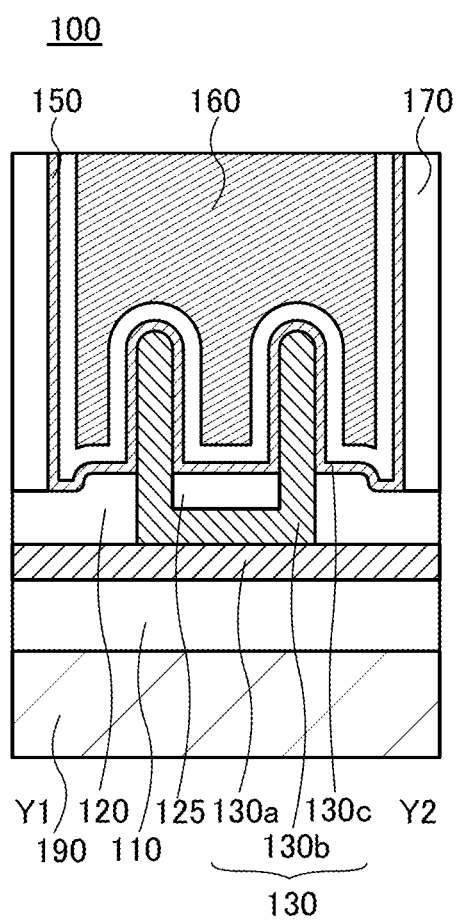

Through the above steps, the transistor 100 illustrated in FIGS. 35A to 35C can be manufactured.

FIG. 35A illustrates an example of a top view of the transistor 100. FIG. 35B is a cross-sectional view taken along dashed-dotted line X1-X2 in FIG. 35A, and FIG. 35C is a cross-sectional view take along dashed-dotted line Y1-Y2 in FIG. 35A.

In the transistor 100, the oxide semiconductor 130*b* functions as a channel formation region. The conductor 140*a* and the conductor 140*b* function as a source electrode and a drain electrode. The insulator 150 functions as a gate insulator. The conductor 160 functions as a gate electrode.

In this structure, the width of the oxide semiconductor 130*b* can be adjusted by changing the thickness of the oxide semiconductor 130*b* regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130*b* which faces or overlaps with the conductor 160 with the insulator 150 positioned therebetween. In this structure, the channel formation region of the oxide semiconductor 130*b* is surrounded by the conductor 160 with the insulator 150 positioned therebetween.

In this structure, an electric field can be applied to at least the three sides of a region of the oxide semiconductor 130*b* where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130*b* which faces the conductor 160 with the insulator 150 positioned therebetween is enlarged, the channel formation region is enlarged, and the on-state current of the transistor can be increased. In addition, as the width of the channel formation region in the oxide semiconductor 130*b* is reduced, the proportion of a region with a high carrier controllability increases, leading to a smaller subthreshold swing value.

Therefore, for example, the height of the channel formation region is preferably greater than or equal to three times the width of the channel formation region in the oxide semiconductor 130*b*. When the height of the channel formation region is greater than or equal to three times the width of the channel formation region, the transistor can have a small subthreshold swing value and exhibits favorable on-state characteristics.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140*a* and the conductor 140*b* hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 10 of Semiconductor Device

A modification example of the transistor 100 is described below with reference to FIGS. 36A to 36C. Note that, for components denoted by the same reference numerals as those of the transistor 100 described in Method 4 for manufacturing semiconductor device, Method 4 for manufacturing semiconductor device can be referred to.

First, the oxide semiconductor 130*a* is formed over the insulator 110, and the insulator 120A is formed over the oxide semiconductor 130*a*. Note that the oxide semiconductor 130*a* can be formed by a step similar to that for forming the oxide semiconductor 130A described in Method 4 for manufacturing semiconductor device.

Then, an unnecessary portion of the insulator 120A is removed by using a resist mask to expose the oxide semiconductor 130*a*. At that time, the oxide semiconductor 130*a* also functions as a stopper film. The use of the oxide semiconductor 130*a* as a stopper film can reduce variation in the height of the opening. The uniform shape of the opening can reduce the variation in the size of the oxide semiconductor to be formed in a later step, resulting in a highly reliable transistor.

Next, the oxide semiconductor 130*b* is formed in the opening formed in the insulator 120A by steps similar to those described in Method 4 for manufacturing semiconductor device. That is, the oxide semiconductor 130*b* is formed in contact with the oxide semiconductor 130*a*. Accordingly, the oxide semiconductor 130*b* contains a smaller amount of impurities than the oxide semiconductor 130*a* and can prevent diffusion of impurities from layers below the oxide semiconductor 130*b*.

Next, the insulator 120B is removed by a process similar to that described in Method 4 for manufacturing semiconductor device to expose all the side surfaces of the oxide semiconductor 130. The oxide semiconductor 130a can be used as a stopper film at that time, which facilitates the exposure of all the side surfaces of the oxide semiconductor 130. By exposing all the side surfaces of the oxide semiconductor 130 in this step, the region which faces the conductor 160 with the insulator 150, which is to be formed in a later step, positioned therebetween is enlarged, so that the region whose length serves as the channel length can be efficiently formed.

Next, the conductor 140a, the conductor 140b, and the insulator 170 having an opening are formed by steps similar to those described in Method 4 for manufacturing semiconductor device.

Then, the oxide semiconductor 130c, the insulator 150, and the conductor 160 are formed in the opening formed in the insulator 170 by steps similar to those described in Modification example 1 of semiconductor device.

The oxide semiconductor 130c can be formed in a similar manner to that of the oxide semiconductor 130a and the oxide semiconductor 130b. Note that the thickness of the oxide semiconductor 130c is preferably as small as possible to increase the on-state current of the transistor. For example, the oxide semiconductor 130c has a region with a thickness of less than 20 nm, preferably less than or equal to 10 nm, further preferably less than or equal to 5 nm. Meanwhile, the oxide semiconductor 130c has a function of blocking entry of elements other than oxygen (such as hydrogen and silicon) included in the adjacent insulator into the oxide semiconductor 130b where a channel is formed. For this reason, it is preferable that the oxide semiconductor 130c have a certain thickness. For example, the oxide semiconductor 130c may have a region with a thickness of greater than or equal to 0.3 nm, preferably greater than or equal to 1 nm, further preferably greater than or equal to 2 nm. The oxide semiconductor 130c preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130b with reduced impurities serves as a channel formation region, a highly reliable semiconductor device can be achieved.

Figure 36A:
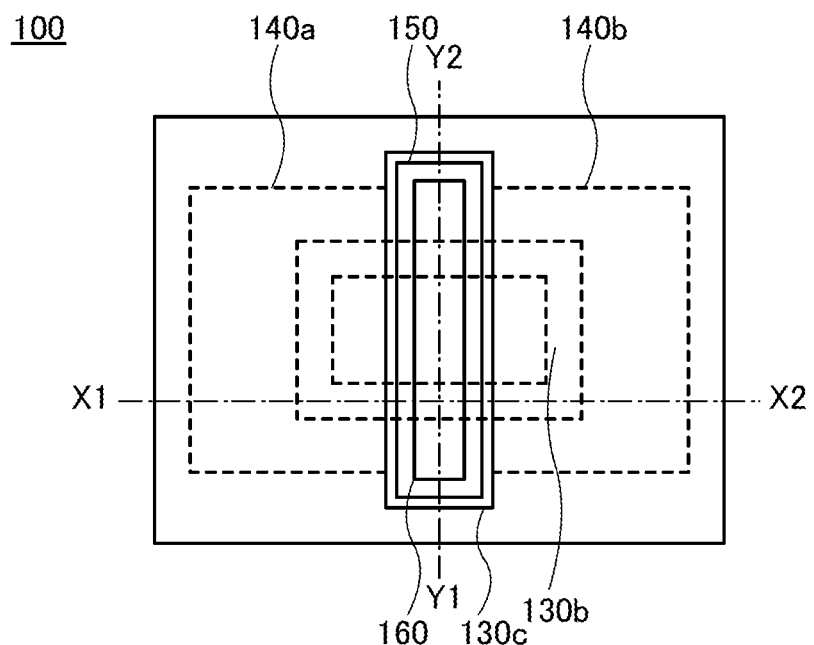
FIGS. 36A to 36C are a top view and cross-sectional views illustrating one embodiment of a semiconductor device.
Figure 36B:
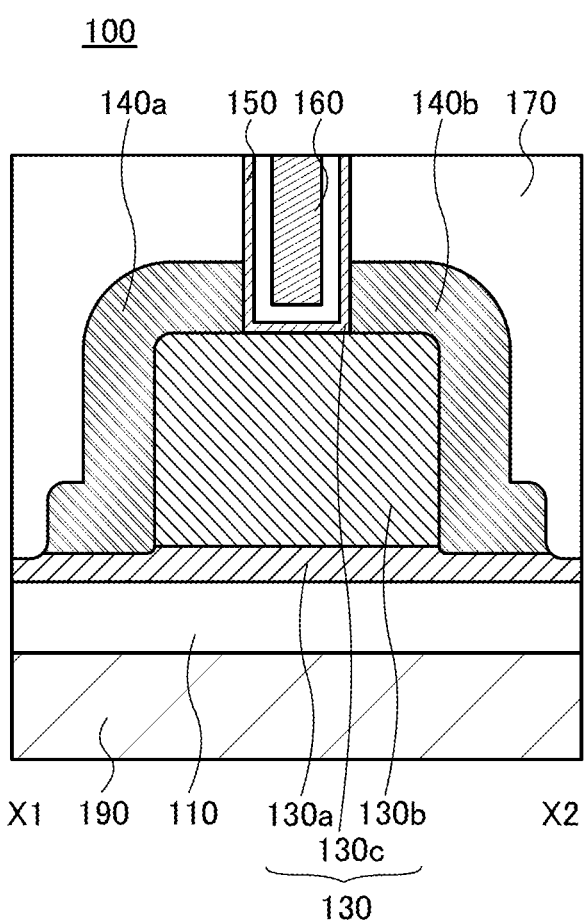
Figure 36C:
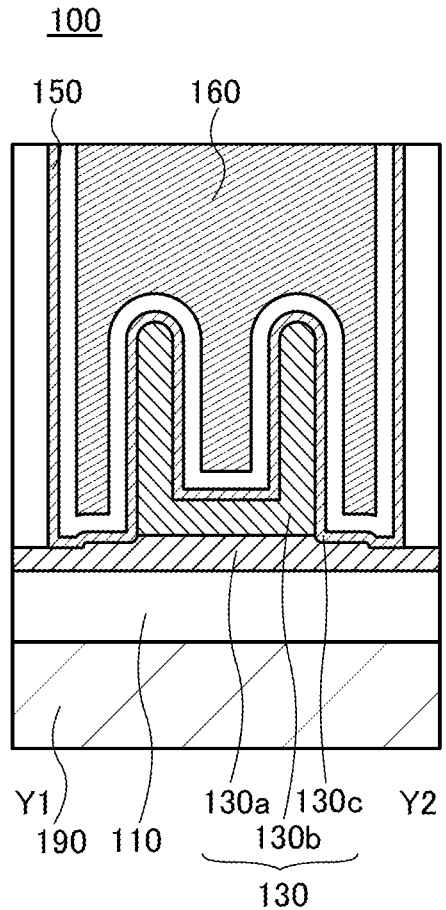

Through the above steps, the transistor 100 illustrated in FIGS. 36A to 36C can be manufactured.

FIG. 36A illustrates an example of a top view of the transistor 100. FIG. 36B is a cross-sectional view taken along dashed-dotted line X1-X2 in FIG. 36A, and FIG. 36C is a cross-sectional view take along dashed-dotted line Y1-Y2 in FIG. 36A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130b can be adjusted by changing the thickness of the oxide semiconductor 130b regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130b, resulting in a transistor with a small subthreshold swing value and favorable on-state characteristics. In addition, for example, the height of the oxide semiconductor 130b may be greater than or equal to 10 nm, preferably greater than or equal to 20 nm, further preferably greater than or equal to 30 nm, still further preferably greater than or equal to 50 nm. Note that the height of the oxide semiconductor 130b is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 11 of Semiconductor Device

A modification example of the transistor 100 is described below with reference to FIGS. 37A to 37C. Note that, for components denoted by the same reference numerals as those of the transistor 100 described in Method 4 for manufacturing semiconductor device, Method 4 for manufacturing semiconductor device can be referred to.

First, the oxide semiconductor 130*a* is formed over the insulator 110, and the insulator 120A is formed over the oxide semiconductor 130*a*. Note that the oxide semiconductor 130*a* can be formed by a step similar to that for forming the oxide semiconductor 130A described in Method 4 for manufacturing semiconductor device.

Then, an unnecessary portion of the insulator 120A is removed by using a resist mask to expose the oxide semiconductor 130*a*. At that time, the oxide semiconductor 130*a* also functions as a stopper film. The use of the oxide semiconductor 130*a* as a stopper film can reduce variation in the height of the opening. The uniform shape of the opening can reduce the variation in the size of the oxide semiconductor to be formed in a later step, resulting in a highly reliable transistor.

Next, the oxide semiconductor 130*b* is formed in the opening formed in the insulator 120A by steps similar to those described in Method 4 for manufacturing semiconductor device. That is, the oxide semiconductor 130*b* is formed in contact with the oxide semiconductor 130*a*. Accordingly, the oxide semiconductor 130*b* contains a smaller amount of impurities than the oxide semiconductor 130*a* and can prevent diffusion of impurities from layers below the oxide semiconductor 130*b*.

Next, the insulator 120B is removed by a process similar to that described in Method 4 for manufacturing semiconductor device to expose all the side surfaces of the oxide semiconductor 130. At that time, part of the oxide semiconductor 130*a* and part of the insulator 110 are removed so that the depth has a value greater than or equal to the sum of the height of the oxide semiconductor 130*b* and the thickness of the insulator 150 to be formed later; as a result, the insulator 120 is formed. That is, in the completed transistor 100 illustrated in FIGS. 37A to 37C, the top and side surfaces of part of the oxide semiconductor 130*b* are covered with the conductor 160 with the insulator 150 positioned therebetween.

In this structure, when the thickness of the oxide semiconductor 130*a* is greater than the total thickness of the oxide semiconductor 130*c* and the insulator 150, the insulator 110 can be used as a stopper film. The use of the insulator 110 as a stopper film can prevent excess etching so as not to etch the insulator below the oxide semiconductor 130 at the time of exposing the side surfaces of the oxide semiconductor 130*b*; as a result, falling down of the oxide semiconductor 130 can be inhibited.

Next, the conductor 140*a*, the conductor 140*b*, and the insulator 170 are formed by steps similar to those described in Method 4 for manufacturing semiconductor device.

Then, the oxide semiconductor 130*c*, the insulator 150, and the conductor 160 are formed in the opening formed in the insulator 170 by steps similar to those described in Modification example 1 of semiconductor device.

The oxide semiconductor 130*c* can be formed in a similar manner to that of the oxide semiconductor 130*a* and the oxide semiconductor 130*b*. Note that the thickness of the oxide semiconductor 130*c* is preferably as small as possible to increase the on-state current of the transistor. For example, the oxide semiconductor 130*c* has a region with a thickness of less than 20 nm, preferably less than or equal to 10 nm, further preferably less than or equal to 5 nm. Meanwhile, the oxide semiconductor 130*c* has a function of blocking entry of elements other than oxygen (such as hydrogen and silicon) included in the adjacent insulator into the oxide semiconductor 130*b* where a channel is formed. For this reason, it is preferable that the oxide semiconductor 130*c* have a certain thickness. For example, the oxide semiconductor 130*c* may have a region with a thickness of greater than or equal to 0.3 nm, preferably greater than or equal to 1 nm, further preferably greater than or equal to 2 nm. The oxide semiconductor 130*c* preferably has an oxygen blocking property to prevent outward diffusion of oxygen released from the substrate 190, or an insulator or the like between the substrate 190 and the oxide semiconductor 130*b*.

That is, when the oxide semiconductor 130*c* with a small thickness is formed over the oxide semiconductor 130*b*, diffusion of impurities from layers over the oxide semiconductor 130 into the oxide semiconductor 130*b* can be prevented. By using a transistor formed so that the oxide semiconductor 130*b* with reduced impurities serves as a channel formation region, a highly reliable semiconductor device can be achieved.

Figure 37A:
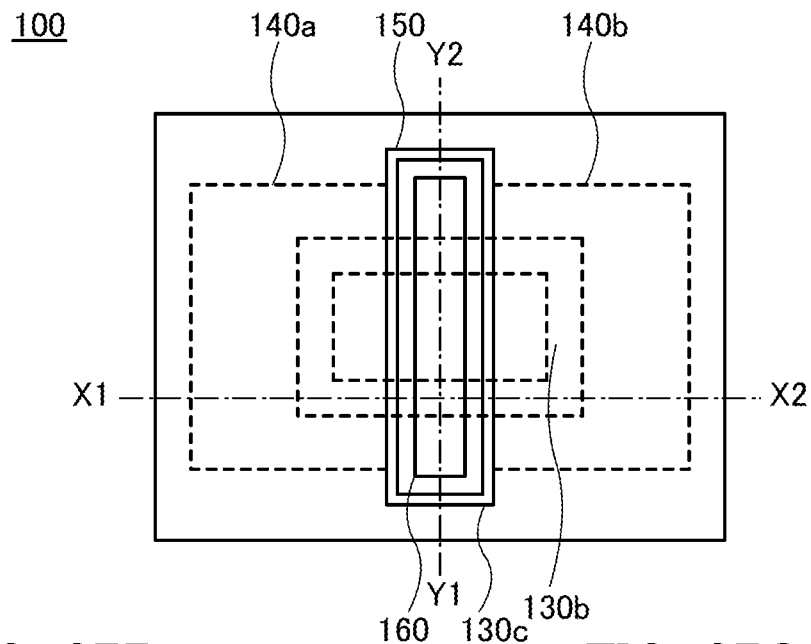
FIGS. 37A to 37C are a top view and cross-sectional views illustrating one embodiment of a semiconductor device.
Figure 37B:
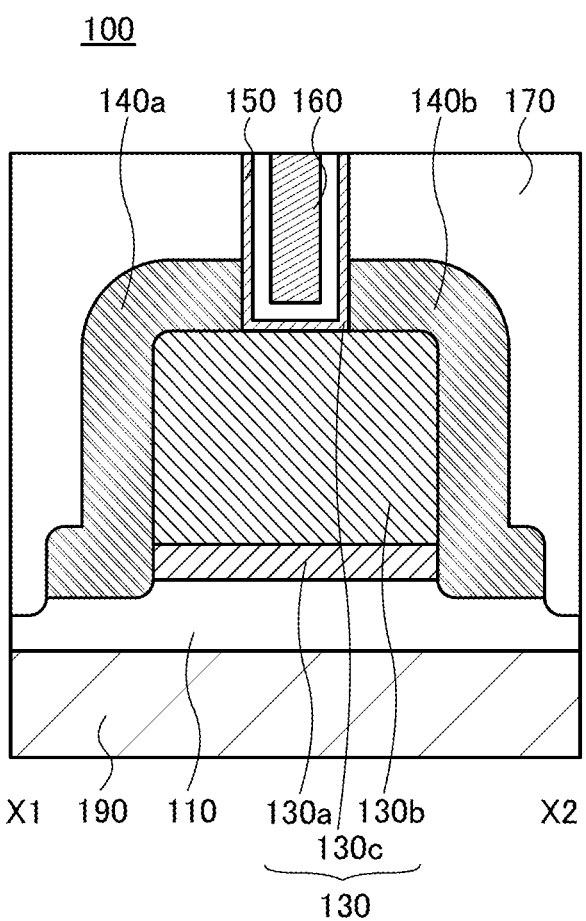
Figure 37C:
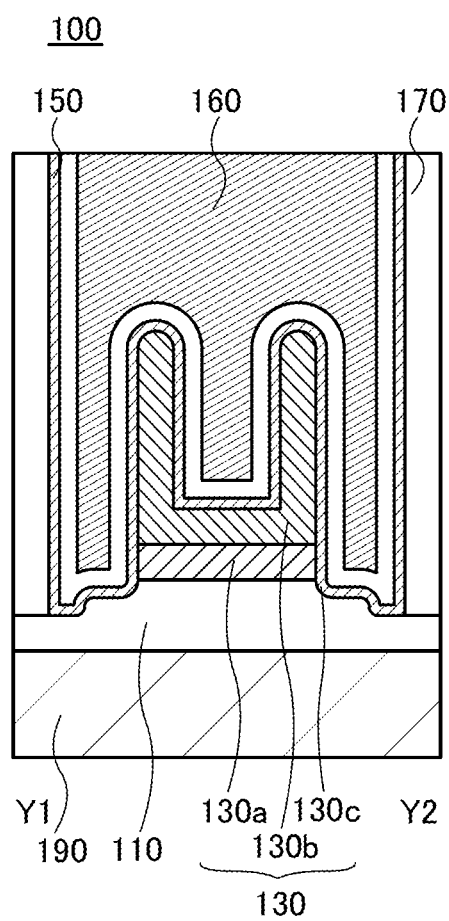

Through the above steps, the transistor 100 illustrated in FIGS. 37A to 37C can be manufactured.

FIG. 37A illustrates an example of a top view of the transistor 100. FIG. 37B is a cross-sectional view taken along dashed-dotted line X1-X2 in FIG. 37A, and FIG. 37C is a cross-sectional view take along dashed-dotted line Y1-Y2 in FIG. 37A.

In the transistor 100, the oxide semiconductor 130*b* functions as a channel formation region. The conductor 140*a* and the conductor 140*b* function as a source electrode and a drain electrode. The insulator 150 functions as a gate insulator. The conductor 160 functions as a gate electrode.

In this structure, the width of the oxide semiconductor 130*b* can be adjusted by changing the thickness of the oxide semiconductor 130*b* regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130*b* which faces or overlaps with the conductor 160 with the insulator 150 positioned therebetween. In this structure, the channel formation region of the oxide semiconductor 130*b* is surrounded by the conductor 160 with the insulator 150 positioned therebetween.

In this structure, an electric field can be applied to at least the three sides of a region of the oxide semiconductor 130*b* where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Accordingly, even if the width of the channel formation region is reduced in this structure, the channel formation region can be formed over a wide area of the side surface of the oxide semiconductor 130b, resulting in a transistor with a small subthreshold swing value and favorable on-state characteristics. In addition, for example, the height of the oxide semiconductor 130b may be greater than or equal to 10 nm, preferably greater than or equal to 20 nm, further preferably greater than or equal to 30 nm, still further preferably greater than or equal to 50 nm. Note that the height of the oxide semiconductor 130b is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Thus, the oxide semiconductor is formed in the opening formed in the insulator, whereby an island-shaped oxide semiconductor can be formed without a resist mask.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 4

Modification Example 12 of Semiconductor Device

In this embodiment, a modification example of the transistor 100 is described with reference to FIGS. 38A to 38C, FIGS. 39A to 39C, FIGS. 40A to 40C, FIGS. 41A to 41C, FIGS. 42A to 42C, FIGS. 43A to 43C, FIGS. 44A to 44C, FIGS. 45A to 45C, FIGS. 46A to 46C, FIGS. 47A to 47C, FIGS. 48A to 48C, FIGS. 49A to 49C, FIGS. 50A to 50C, FIGS. 51A to 51C, FIGS. 52A to 52C, FIGS. 53A to 53C, and FIGS. 54A to 54C.

<Method 5 for Manufacturing Semiconductor Device>

An example of a method for manufacturing a semiconductor device is described below with reference to FIGS. 38A to 38C, FIGS. 39A to 39C, FIGS. 40A to 40C, FIGS. 41A to 41C, FIGS. 42A to 42C, FIGS. 43A to 43C, FIGS. 44A to 44C, FIGS. 45A to 45C, FIGS. 46A to 46C, FIGS. 47A to 47C, and FIGS. 48A to 48C. Note that FIG. 38A is an example of a top view. FIG. 38B is a cross-sectional view taken along dashed-dotted line X1-X2 in FIG. 38A, and FIG. 38C is a cross-sectional view take along dashed-dotted line Y1-Y2 in FIG. 38A. The same applies to FIGS. 39A to 39C, FIGS. 40A to 40C, FIGS. 41A to 41C, FIGS. 42A to 42C, FIGS. 43A to 43C, FIGS. 44A to 44C, FIGS. 45A to 45C, FIGS. 46A to 46C, FIGS. 47A to 47C, and FIGS. 48A to 48C. Note that the structure having a function similar to that of the transistor 100 in Embodiment 1 is denoted by the same reference numerals in the transistor 100, and the transistor in Embodiment 1 can be referred to.

First, the insulator 110, the film 115, and the insulator 120B having an opening are formed over the substrate 190 as illustrated in FIGS. 38A to 38C.

Figure 39A:
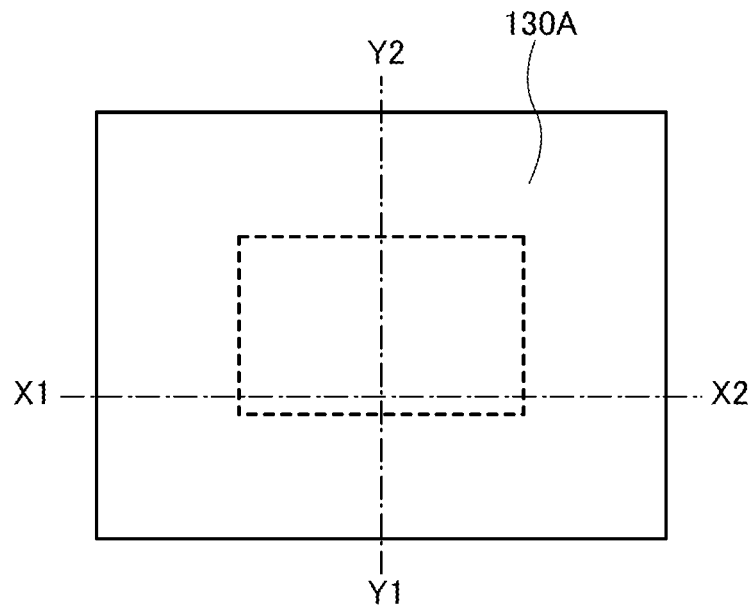
FIGS. 39A to 39C are a top view and cross-sectional views illustrating one embodiment of a method for manufacturing a semiconductor device.
Figure 39B:
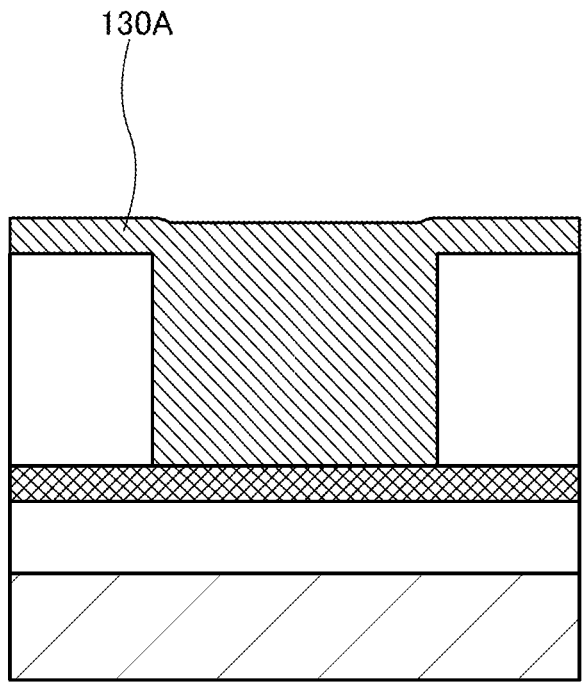
Figure 39C:
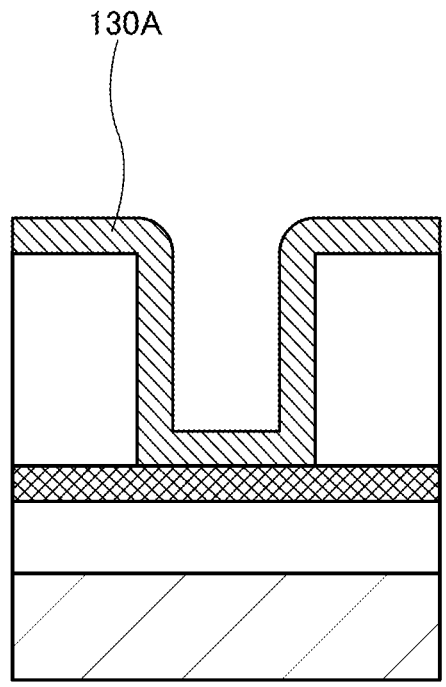
Figure 40A:
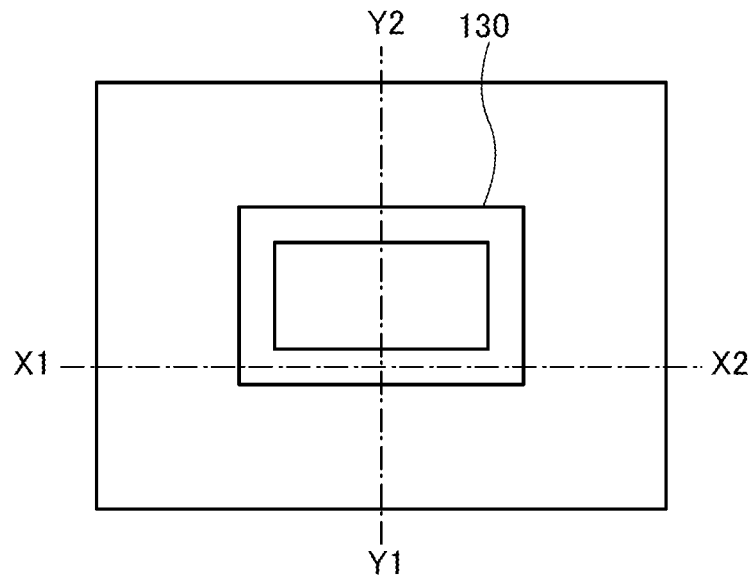
FIGS. 40A to 40C are a top view and cross-sectional views illustrating one embodiment of a method for manufacturing a semiconductor device.
Figure 40B:
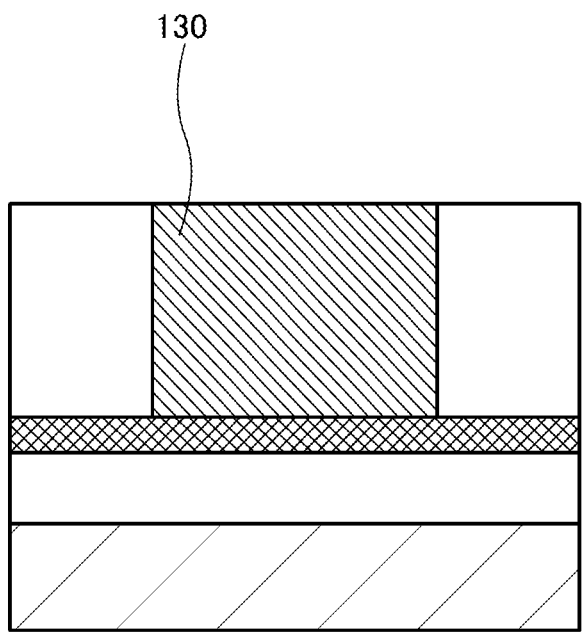
Figure 40C:
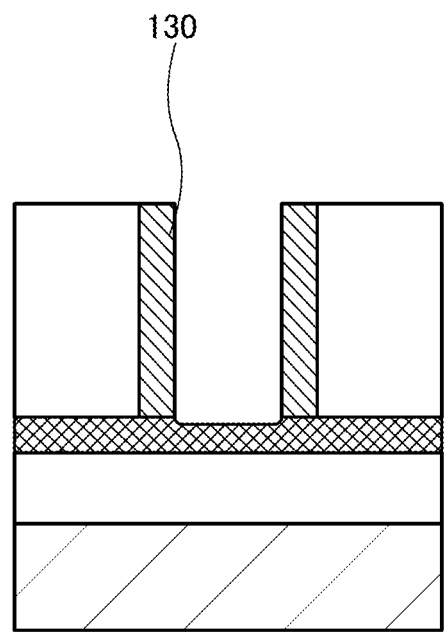

Subsequently, the oxide semiconductor 130A is formed along the inner wall of the opening of the insulator 120B as illustrated in FIGS. 39A to 39C. Then, an unnecessary portion of the oxide semiconductor 130A is removed to form the oxide semiconductor 130 having a ring shape as illustrated in FIGS. 40A to 40C. This step can be performed by an etch-back process employing a dry etching method, where the film 115 is used as a stopper film, for example.

Figure 41A:
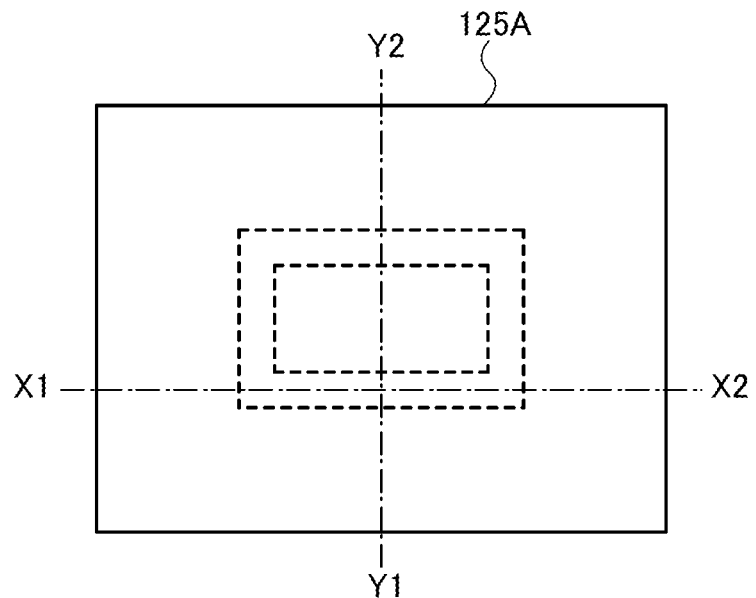
FIGS. 41A to 41C are a top view and cross-sectional views illustrating one embodiment of a method for manufacturing a semiconductor device.
Figure 41B:
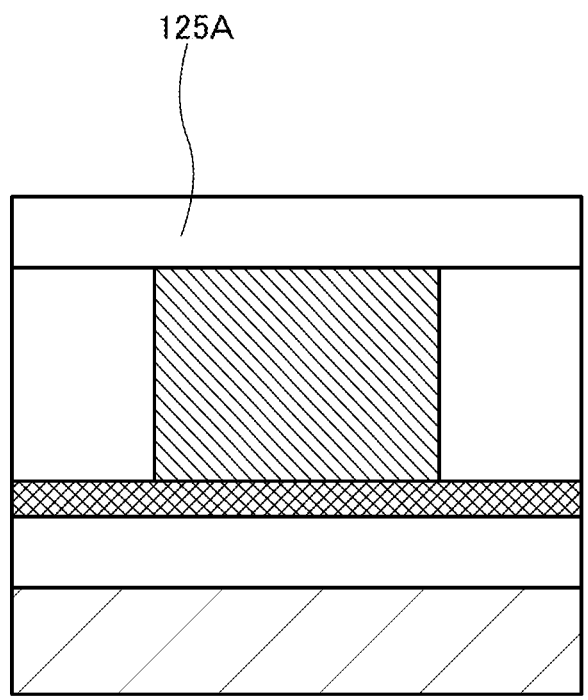
Figure 41C:
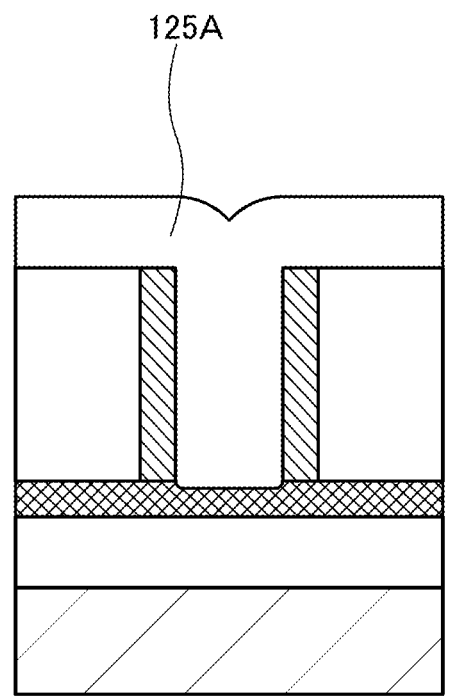

Next, the insulator 125A is formed over the insulator 120B, the oxide semiconductor 130, and the film 115 as illustrated in FIGS. 41A to 41C. Note that the insulator 125A can be formed by a step similar to that for forming the insulator 110 or the insulator 120A.

Figure 42A:
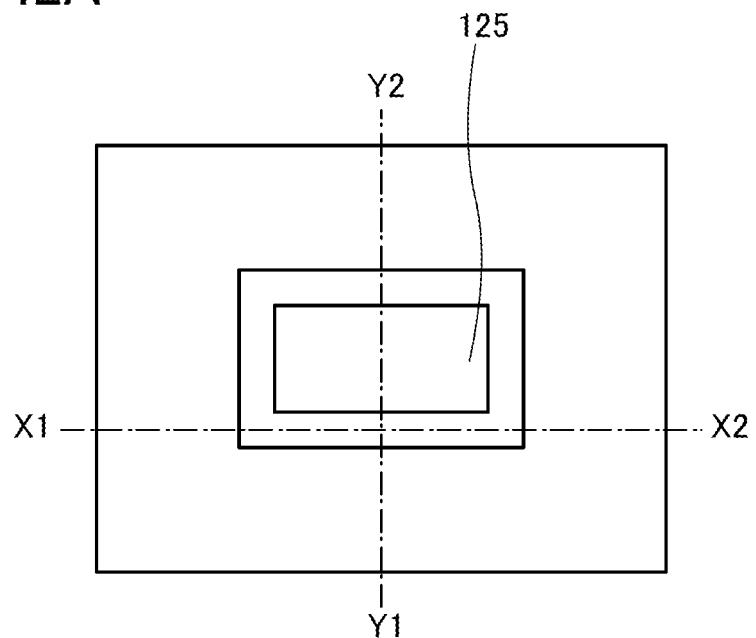
FIGS. 42A to 42C are a top view and cross-sectional views illustrating one embodiment of a method for manufacturing a semiconductor device.
Figure 42B:
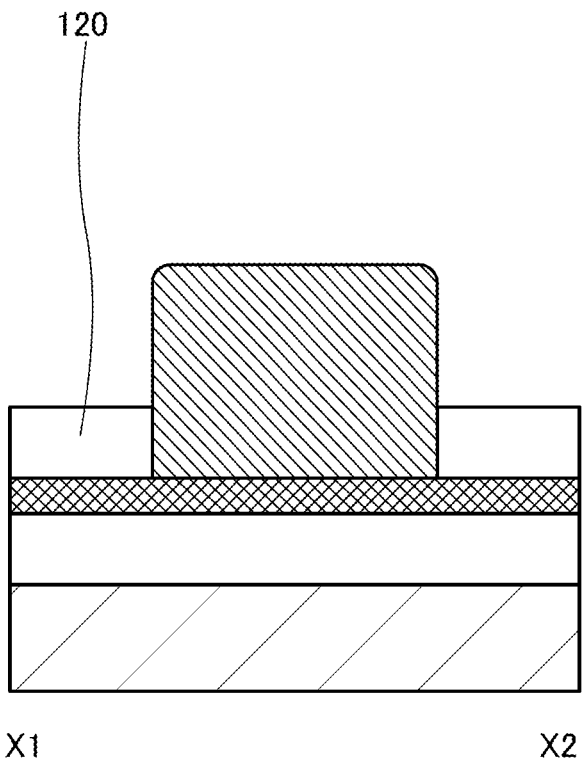
Figure 42C:
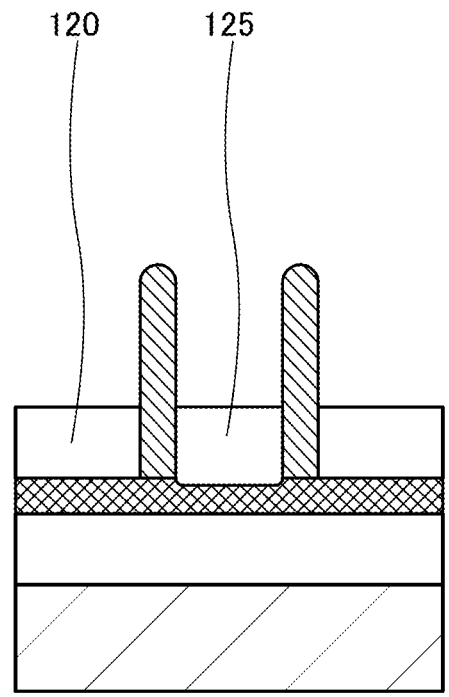

Then, unnecessary portions of the insulator 120B and the insulator 125A are removed, whereby the top surface and part of the side surfaces of the oxide semiconductor 130 are exposed and the insulator 120 and an insulator 125 are formed as illustrated in FIGS. 42A to 42C. In this step, an etch-back process using a dry etching method may be performed on the insulator 120B and the insulator 125A, for example. At that time, part of the oxide semiconductor 130 is embedded in the insulator 120 and the insulator 125 as illustrated in FIGS. 42B and 24C, which can prevent the oxide semiconductor 130 to fall down in a later step.

Figure 43A:
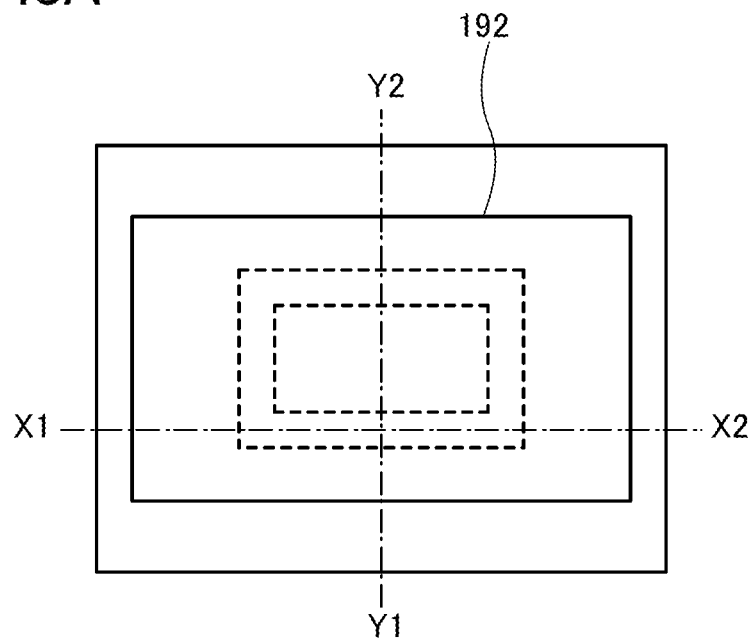
FIGS. 43A to 43C are a top view and cross-sectional views illustrating one embodiment of a method for manufacturing a semiconductor device.
Figure 43B:
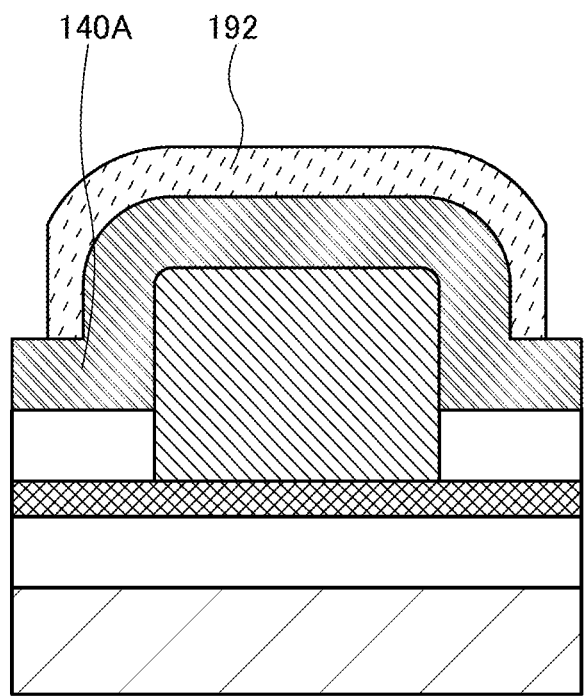
Figure 43C:
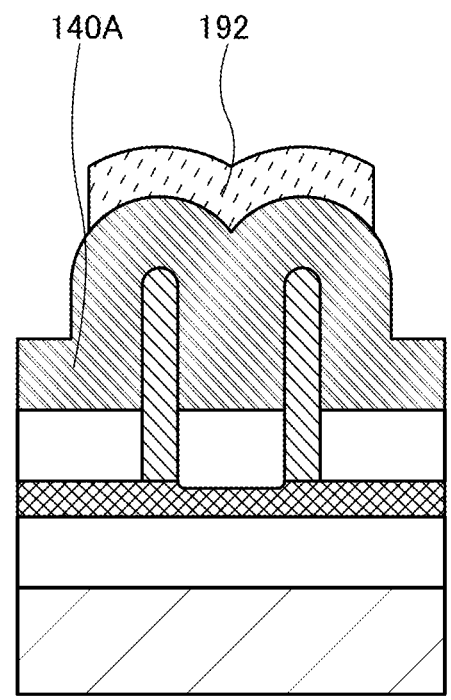

Next, the conductor 140A and the resist mask 192 are formed over the oxide semiconductor 130 as illustrated in FIGS. 43A to 43C.

Figure 44A:
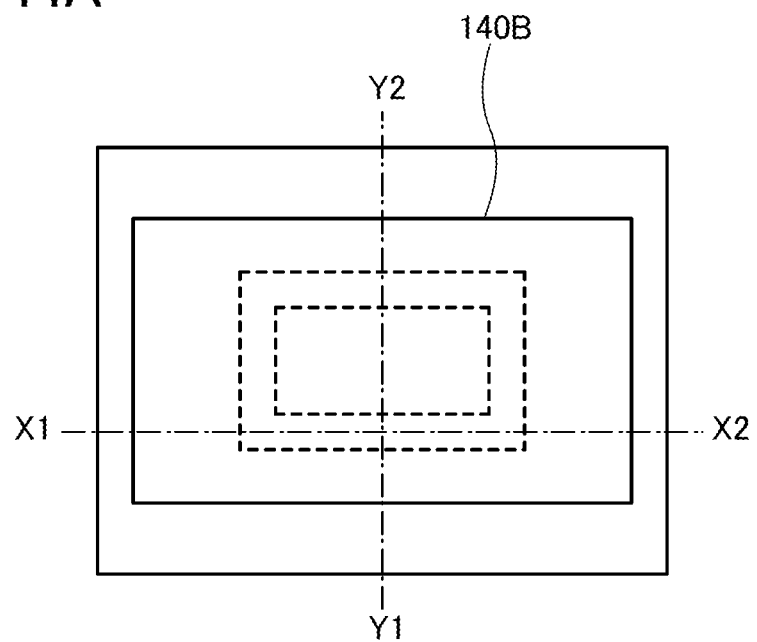
FIGS. 44A to 44C are a top view and cross-sectional views illustrating one embodiment of a method for manufacturing a semiconductor device.
Figure 44B:
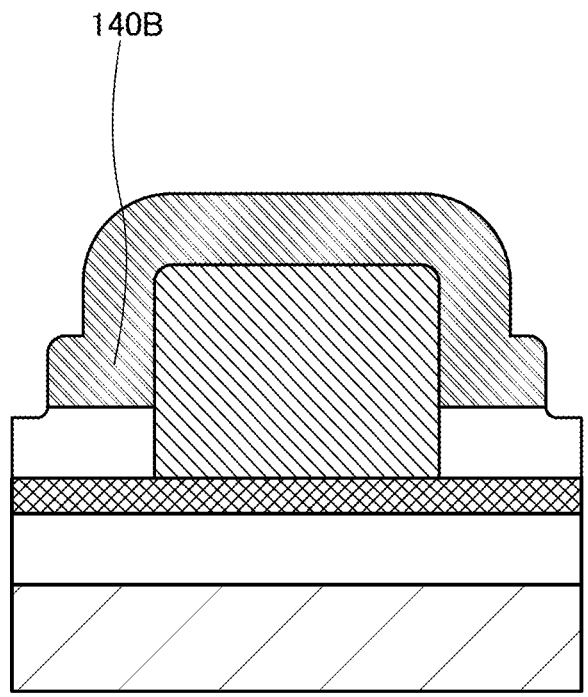
Figure 44C:
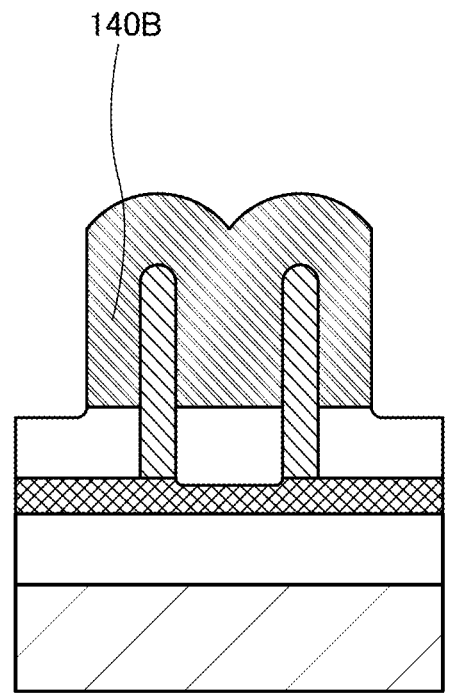

Then, an unnecessary portion of the conductor 140A is removed by using the resist mask 192 to form the conductor 140B as illustrated in FIGS. 44A to 44C.

Figure 45A:
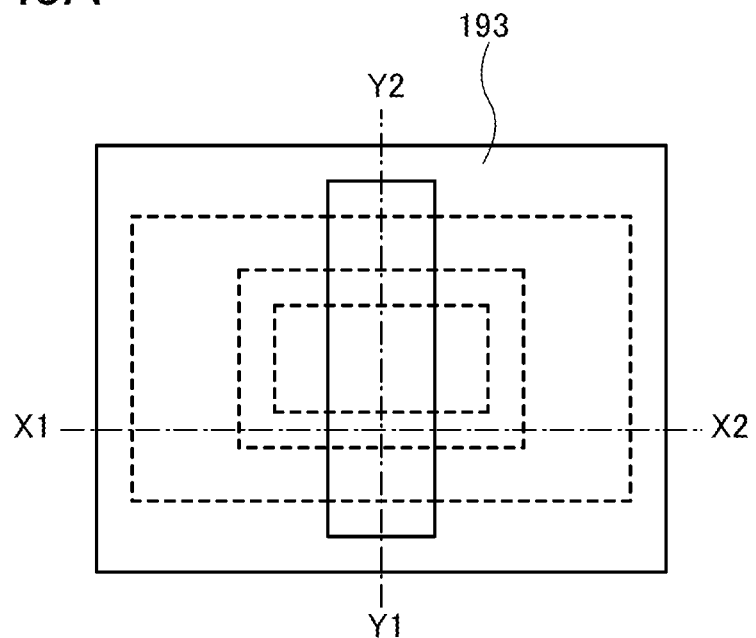
FIGS. 45A to 45C are a top view and cross-sectional views illustrating one embodiment of a method for manufacturing a semiconductor device.
Figure 45B:
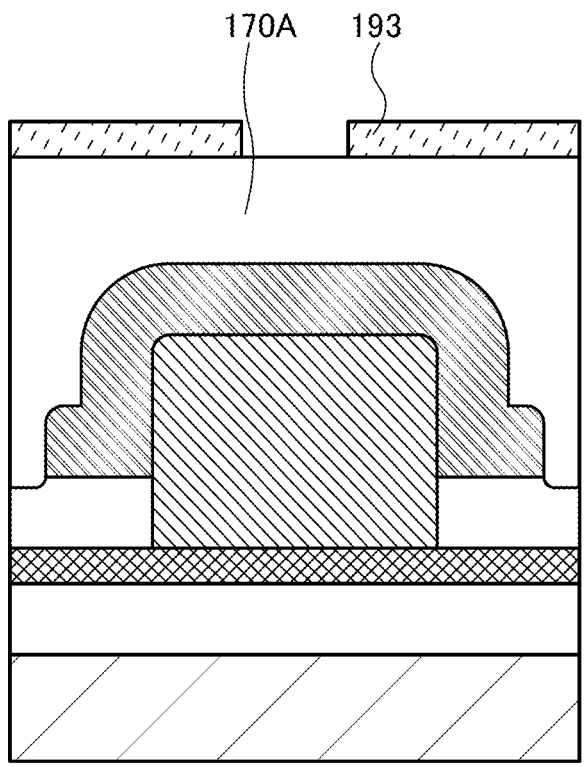
Figure 45C:
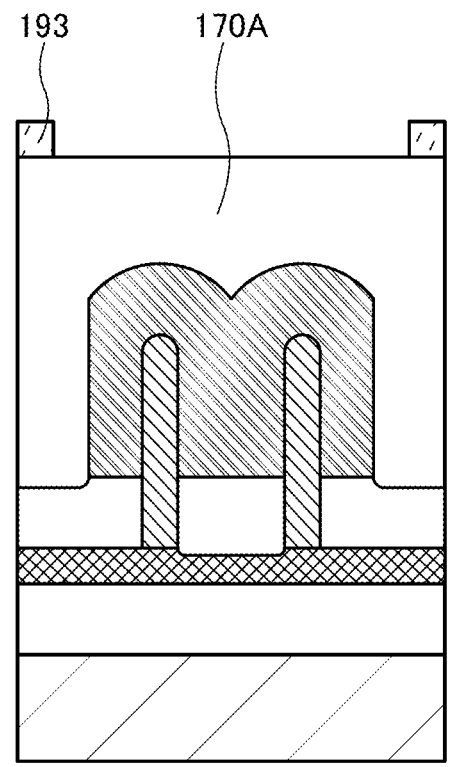
Figure 46A:
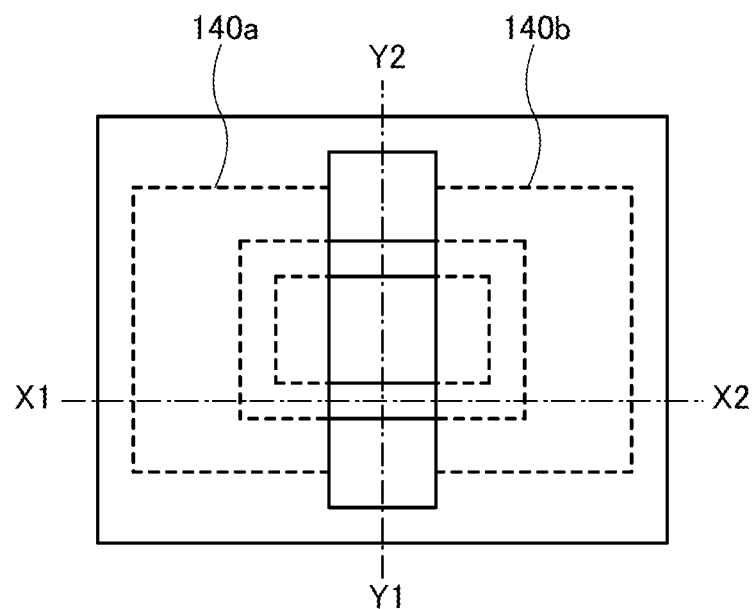
FIGS. 46A to 46C are a top view and cross-sectional views illustrating one embodiment of a method for manufacturing a semiconductor device.
Figure 46B:
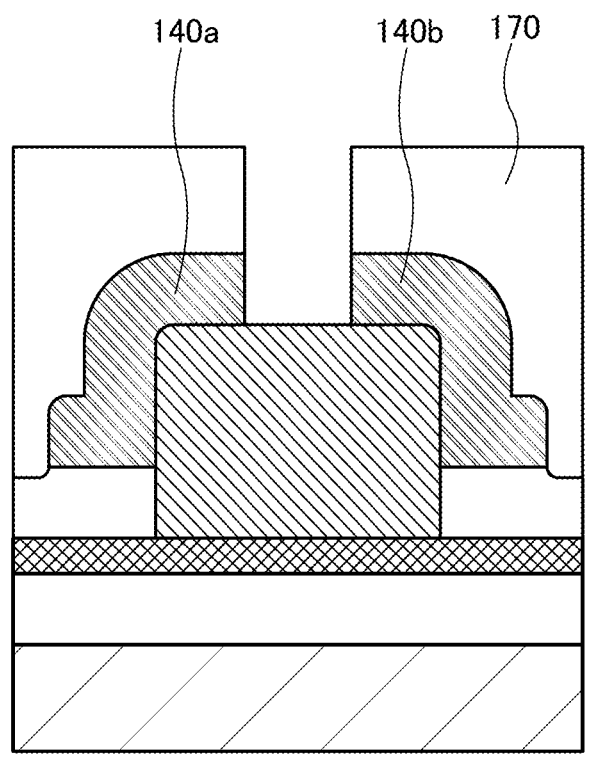
Figure 46C:
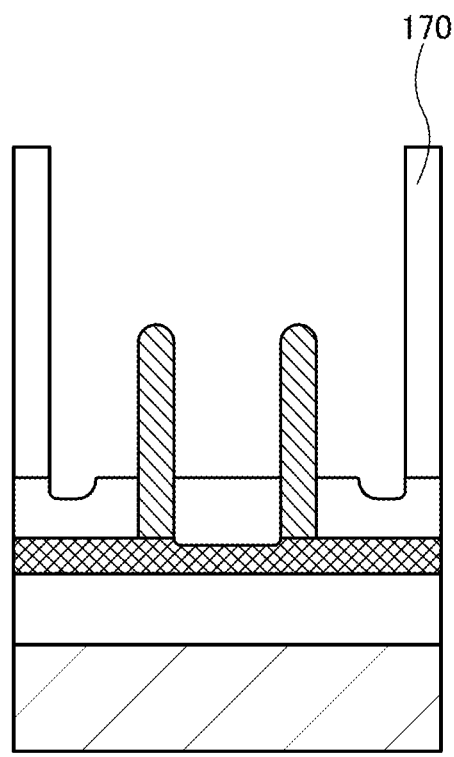

After that, the insulator 170A and the resist mask 193 are formed over the conductor 140B as illustrated in FIGS. 45A to 45C. Subsequently, unnecessary portions of the insulator 170A and the conductor 140A are removed by using the resist mask 193, whereby the insulator 170 and the conductor 140a and the conductor 140b are formed as illustrated in FIGS. 47A to 47C.

Figure 47A:
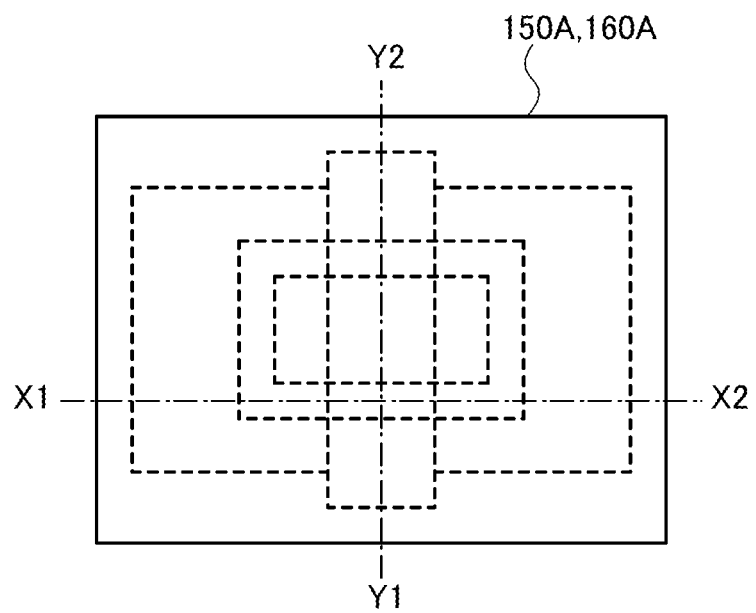
FIGS. 47A to 47C are a top view and cross-sectional views illustrating one embodiment of a method for manufacturing a semiconductor device.
Figure 47B:
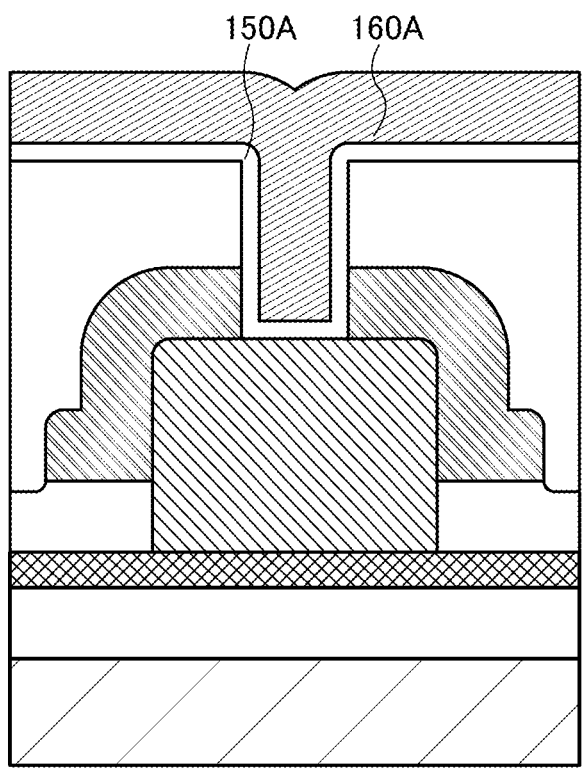
Figure 47C:
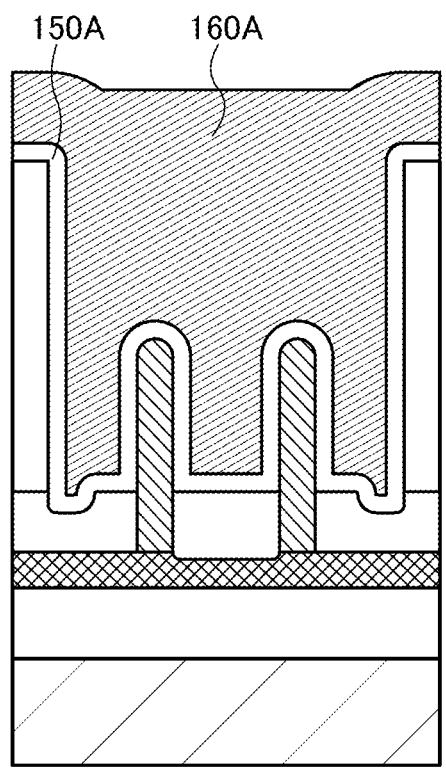
Figure 48A:
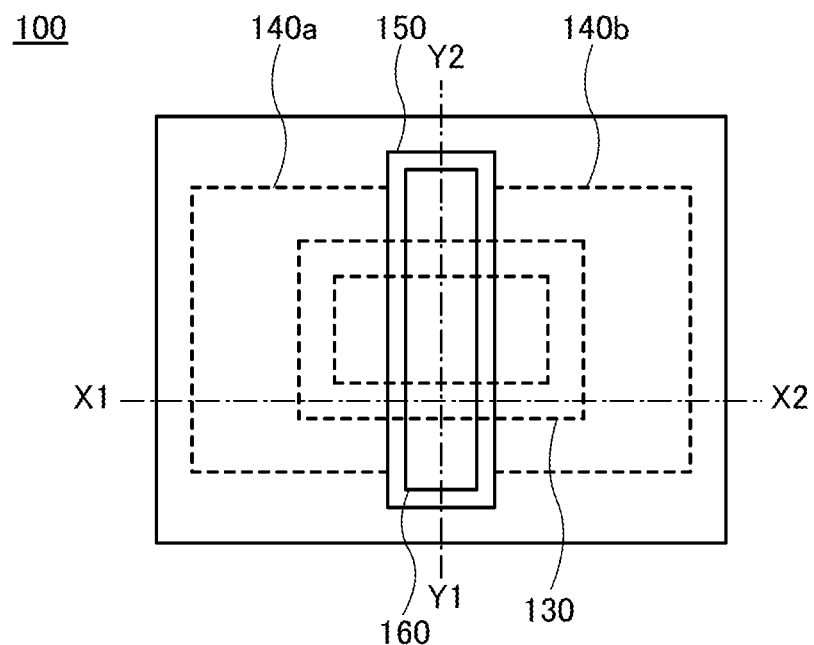
FIGS. 48A to 48C are a top view and cross-sectional views illustrating one embodiment of a semiconductor device.
Figure 48B:
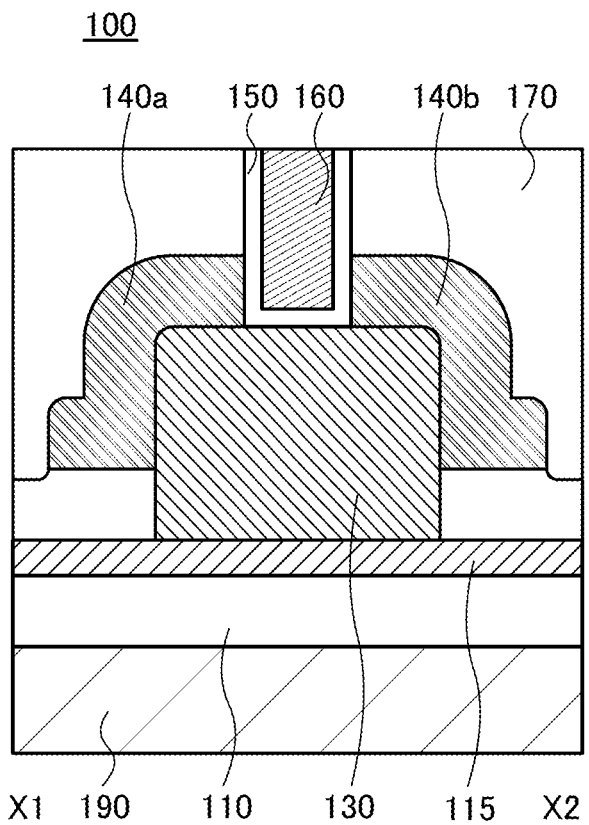
Figure 48C:
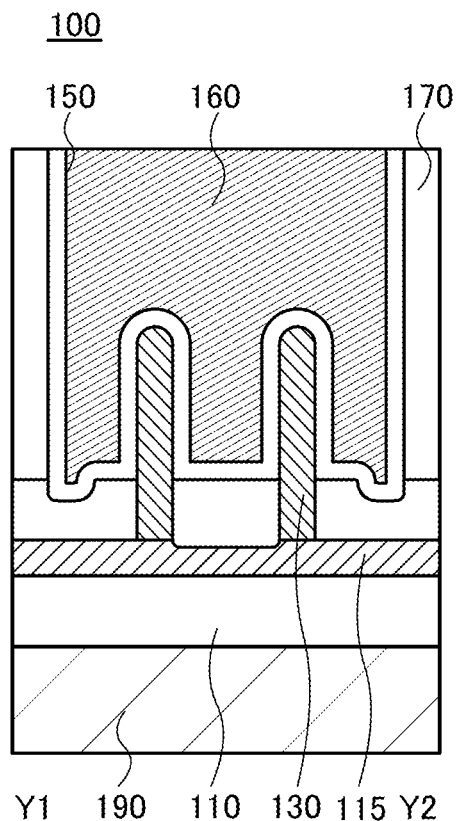

Next, the insulator 150A and the conductor 160A are formed over the oxide semiconductor 130 as illustrated in FIGS. 47A to 47C. Then, unnecessary portions of the insulator 150A and the conductor 160A are removed as illustrated in FIGS. 48A to 48C. Note that in this step, part of the insulator 150A and part of the conductor 160A may be removed by, for example, a CMP process until the insulator 170 is exposed. At that time, the insulator 170 can also be used as a stopper layer and the thickness of the insulator 170 is reduced in some cases.

Through the above-described steps, the transistor 100 illustrated in FIGS. 48A to 48C can be formed. In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In this structure, the width W of the oxide semiconductor 130 can be adjusted by changing the thickness of the oxide semiconductor 130 regardless of the size of the opening. Thus, a miniaturized transistor can be provided easily.

Furthermore, the area of the channel formation in this structure is twice as large as that in any of the structures described above. Accordingly, the on-state characteristics can be increased and the controllability of the transistor can be improved. Furthermore, the three sides of the channel formation region are surrounded by the conductor 160 with the insulator 150 positioned therebetween. That is, an electric field can be applied to at least the three sides of the channel formation region of the oxide semiconductor 130 owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130 which faces the conductor 160 is enlarged, the channel formation region is enlarged, whereby an on-state current of the transistor can be increased. In addition, as the width of the oxide semiconductor 130 is reduced, the proportion of a region with a high carrier controllability increases, leading to a smaller subthreshold swing value.

Accordingly, for example, the height of part of the oxide semiconductor 130 which faces the conductor 160 with the insulator 150 positioned therebetween is preferably greater than or equal to three times the width of the oxide semiconductor 130. With this structure, the transistor can have a small subthreshold swing value and exhibit favorable on-state characteristics. Specifically, for example, the height H of the oxide semiconductor 130 may be greater than or equal to 10 nm, preferably greater than or equal to 20 nm, further preferably greater than or equal to 30 nm, still further preferably greater than or equal to 50 nm. Note that the height H of the oxide semiconductor 130 is set to, for example, less than or equal to 300 nm, preferably less than or equal to 200 nm, and further preferably less than or equal to 150 nm because the productivity of the semiconductor device might be decreased.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 13 of Semiconductor Device

A modification example of the transistor 100 is described below with reference to FIGS. 49A to 49C. Note that, for components denoted by the same reference numerals as those of the transistor 100 described in Method 1 for manufacturing semiconductor device, Method 1 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 5 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a step similar to that described in Method 5 for manufacturing semiconductor device to expose the side surfaces of the oxide semiconductor 130. At that time, part of the oxide semiconductor 130 is embedded in the insulator 120, which prevents the oxide semiconductor 130 to fall down in a later step.

Subsequently, the conductor 140a, the conductor 140b, and the insulator 170 having an opening are formed by steps similar to those described in Method 5 for manufacturing semiconductor device.

Then, the oxide semiconductor 130C that is to be the oxide semiconductor 130c, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm.

Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130b with reduced impurities serves as a channel formation region, a highly reliable semiconductor device can be achieved.

Next, in a manner to similar to that in Method 5 for manufacturing semiconductor device, part of the conductor 160A, part of the insulator 150A, and part of the oxide semiconductor 130C are removed by a CMP process or the like until the insulator 170 is exposed, whereby the oxide semiconductor 130c, the insulator 150, and the conductor 160 are formed. At that time, the insulator 170 can be used as a stopper layer and the thickness of the insulator 170 is reduced in some cases.

Figure 49A:
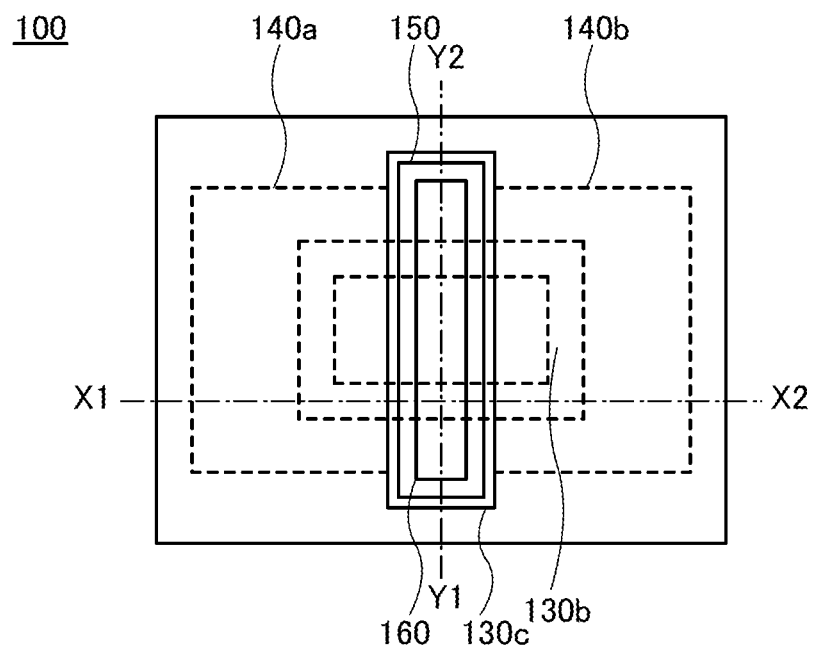
FIGS. 49A to 49C are a top view and cross-sectional views illustrating one embodiment of a semiconductor device.
Figure 49B:
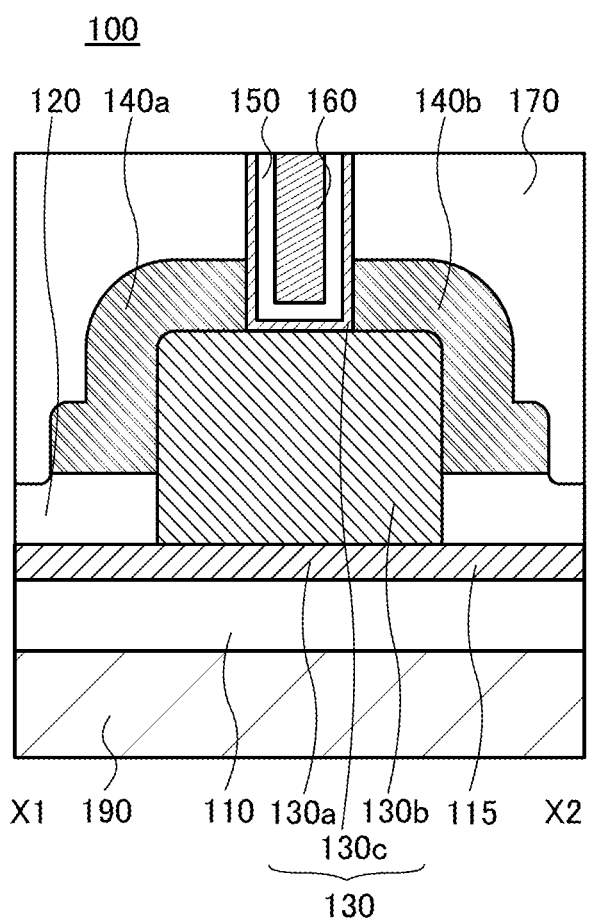
Figure 49C:
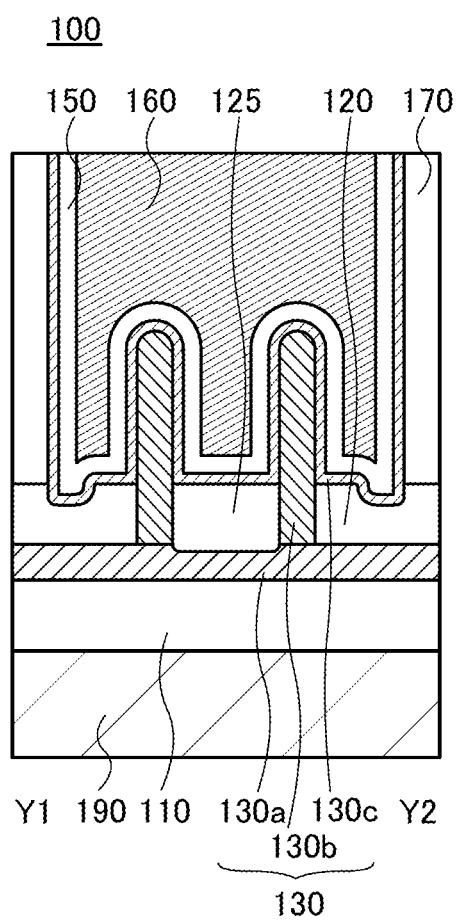

Through the above steps, the transistor 100 illustrated in FIGS. 49A to 49C can be manufactured.

FIG. 49A illustrates an example of a top view of the transistor 100. FIG. 49B is a cross-sectional view taken along dashed-dotted line X1-X2 in FIG. 49A, and FIG. 49C is a cross-sectional view take along dashed-dotted line Y1-Y2 in FIG. 49A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130b can be adjusted by changing the thickness of the oxide semiconductor 130b regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Therefore, for example, the height of the channel formation region is preferably greater than or equal to three times the width of the channel formation region in the oxide semiconductor 130b. When the height of the channel formation region is greater than or equal to three times the width of the channel formation region, the transistor can have a small subthreshold swing value and exhibits favorable on-state characteristics.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 14 of Semiconductor Device

A modification example of the transistor 100 is described below with reference to FIGS. 50A to 50C and FIGS. 51A to 51C. Note that, for components denoted by the same reference numerals as those of the transistor 100 described in Method 5 for manufacturing semiconductor device, Method 5 for manufacturing semiconductor device can be referred to.

First, the insulator 110, the film 115, the insulator 120B, the oxide semiconductor 130, and the insulator 125B are formed over the substrate 190 as illustrated in FIGS. 38A to 38C, FIGS. 39A to 39C, FIGS. 40A to 40C, and FIGS. 41A to 41C described in Method 5 for manufacturing semiconductor device.

Figure 50A:
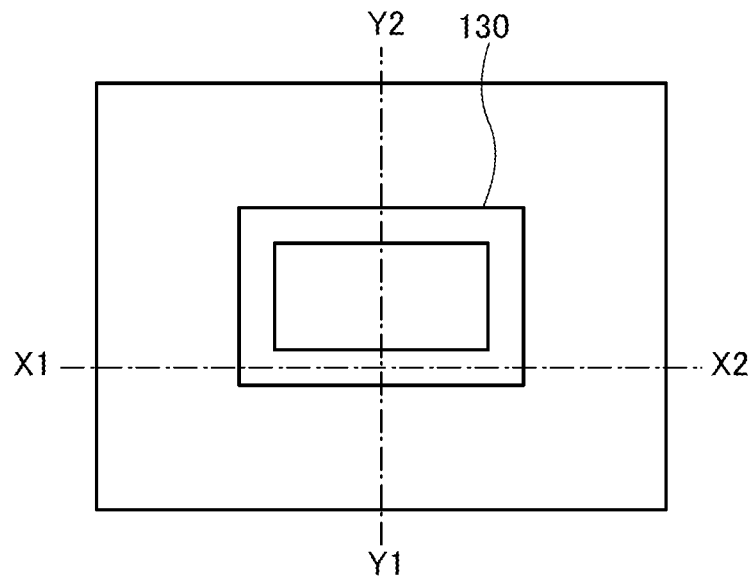
FIGS. 50A to 50C are a top view and cross-sectional views illustrating one embodiment of a method for manufacturing a semiconductor device.
Figure 50B:
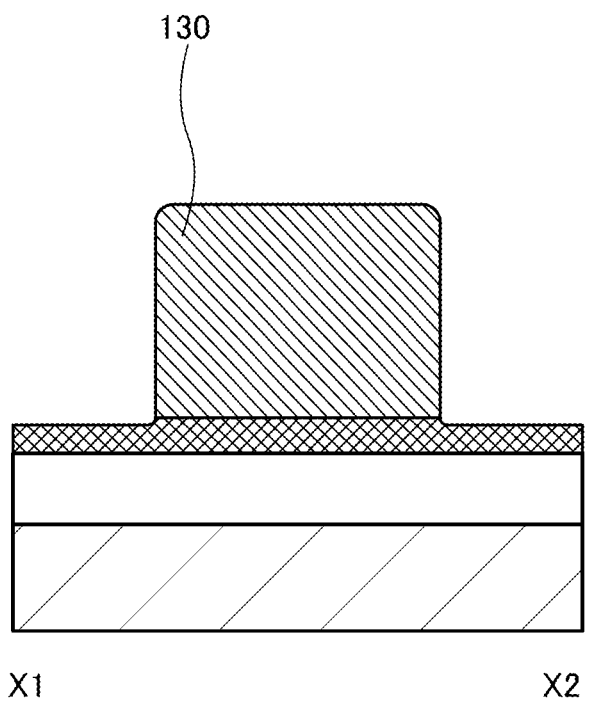
Figure 50C:
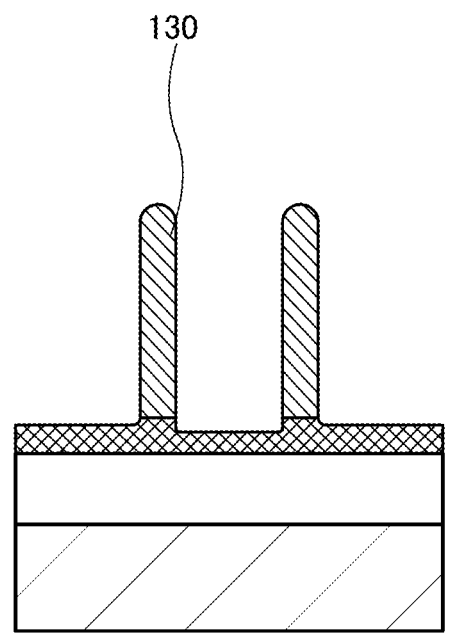

Next, the insulator 120B and the insulator 125A are removed to expose all the side surfaces of the oxide semiconductor 130 as illustrated in FIGS. 50A to 50C. The film 115 can also be used as a stopper film at that time, which facilitates the exposure of all the side surfaces of the oxide semiconductor 130. By exposing all the side surfaces of the oxide semiconductor 130 in this step, the region which faces the conductor 160 with the insulator 150, which is to be formed in a later step, positioned therebetween is enlarged, so that the region whose length serves as the channel length can be efficiently formed.

Then, after the step for exposing the oxide semiconductor 130, steps similar to those described in Method 5 for manufacturing semiconductor device are performed, whereby the transistor 100 illustrated in FIGS. 51A to 51C can be manufactured.

FIG. 51A illustrates an example of a top view of the transistor 100. FIG. 51B is a cross-sectional view taken along dashed-dotted line X1-X2 in FIG. 51A, and FIG. 51C is a cross-sectional view take along dashed-dotted line Y1-Y2 in FIG. 51A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130 can be adjusted by changing the thickness of the oxide semiconductor 130 regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, the channel formation region can be formed over a wide area of the side surface of the oxide semiconductor 130 in this structure, resulting in a transistor with favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 15 of Semiconductor Device

A modification example of the transistor 100 is described below with reference to FIGS. 52A to 52C. Note that, for components denoted by the same reference numerals as those of the transistor 100 described in Method 5 for manufacturing semiconductor device, Method 5 for manufacturing semiconductor device can be referred to.

First, the film 115 is formed over the insulator 110, and the insulator 120A is formed over the film 115. Then, an unnecessary portion of the insulator 120A is removed by using a resist mask.

Then, the oxide semiconductor 130 is formed in the opening formed in the insulator 120A by a process similar to that described in Method 5 for manufacturing semiconductor device.

Next, the insulator 120B is removed by a process similar to that described in Method 5 for manufacturing semiconductor device to expose all the side surfaces of the oxide semiconductor 130. At that time, the insulator 120B is removed so that the depth has a value obtained by adding at least the thickness of the insulator 150, which is to be formed later, to the height of the oxide semiconductor 130; as a result, the insulator 120 is formed. That is, in the completed transistor 100 illustrated in FIGS. 52A to 52C, the top surface and all the side surfaces of part of the oxide semiconductor 130 are covered with the conductor 160 with the insulator 150 positioned therebetween.

In this structure, the film 115 is preferably used as a stopper film. The use of the film 115 can prevent excess etching at the time of removing the insulator 120B so as not to etch a portion of the insulator 120B below the oxide semiconductor 130; accordingly, falling down of the oxide semiconductor 130 can be inhibited.

Figure 52A:
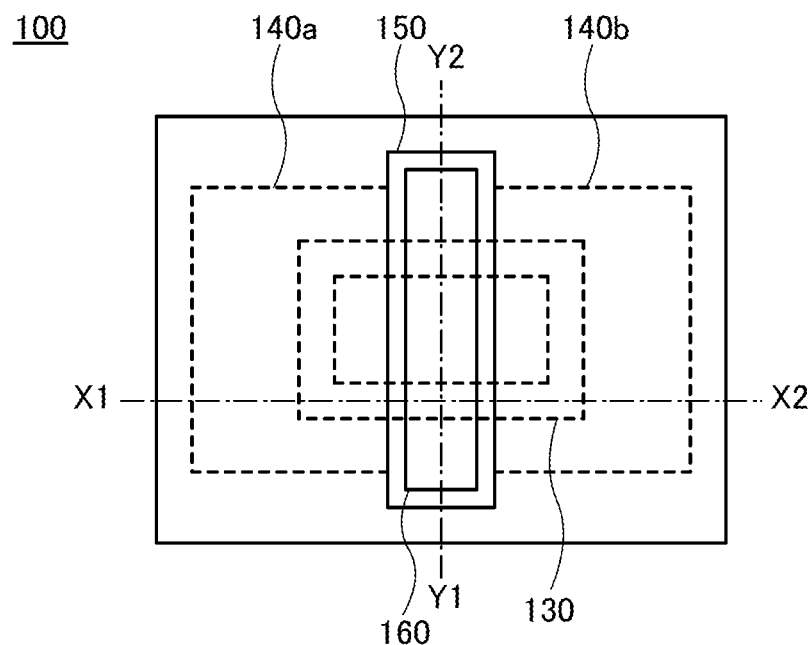
FIGS. 52A to 52C are a top view and cross-sectional views illustrating one embodiment of a semiconductor device.
Figure 52B:
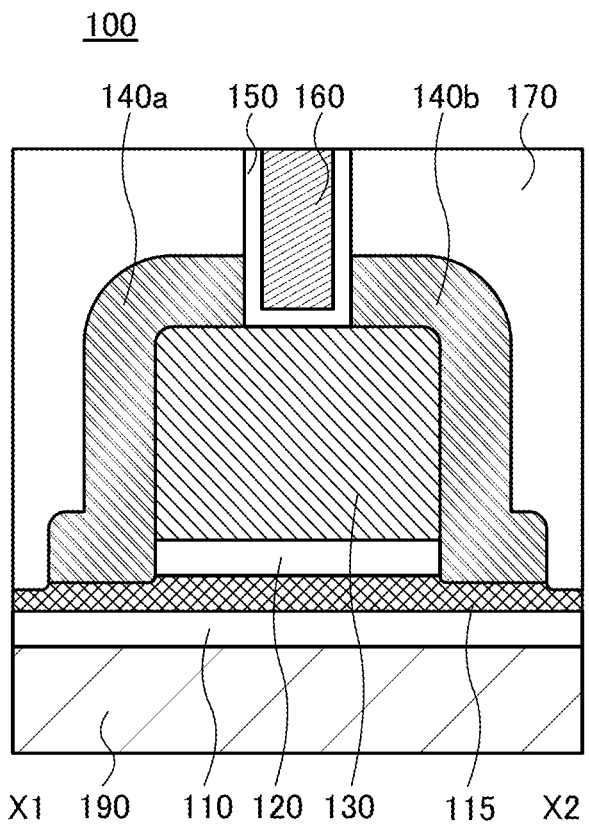
Figure 52C:
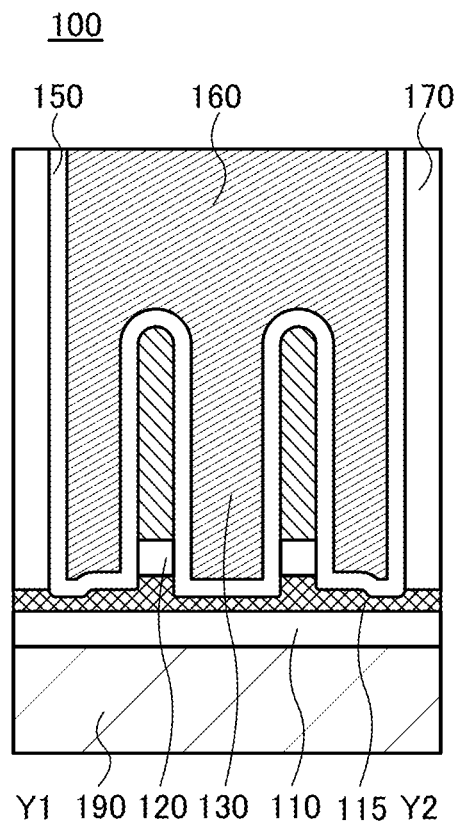

After the step for exposing the oxide semiconductor 130, steps similar to those described in Method 5 for manufacturing semiconductor device are performed, whereby the transistor 100 illustrated in FIGS. 52A to 52C can be manufactured.

FIG. 52A illustrates an example of a top view of the transistor 100. FIG. 52B is a cross-sectional view taken along dashed-dotted line X1-X2 in FIG. 52A, and FIG. 52C is a cross-sectional view take along dashed-dotted line Y1-Y2 in FIG. 52A.

In the transistor 100, the oxide semiconductor 130 functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130 can be adjusted by changing the thickness of the oxide semiconductor 130 regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130 which faces or overlaps with the conductor 160 with the insulator 150 positioned therebetween. In this structure, the channel formation region of the oxide semiconductor 130 is surrounded by the conductor 160 with the insulator 150 positioned therebetween.

In this structure, an electric field can be applied to at least the three sides of a region of the oxide semiconductor 130 where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130 which faces the conductor 160 with the insulator 150 positioned therebetween is enlarged, the channel formation region is enlarged, and the on-state current of the transistor can be increased. In addition, as the width of the channel formation region in the oxide semiconductor 130 is reduced, the proportion of a region with a high carrier controllability increases, leading to a smaller subthreshold swing value.

Accordingly, the channel formation region can be formed over a wide area of the side surface of the oxide semiconductor 130, resulting in a transistor with favorable on-state characteristics. In addition, for example, the height of the oxide semiconductor 130 may be greater than or equal to 10 nm, preferably greater than or equal to 20 nm, further preferably greater than or equal to 30 nm, still further preferably greater than or equal to 50 nm. Note that the height of the oxide semiconductor 130 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 16 of Semiconductor Device

A modification example of the transistor 100 is described below with reference to FIGS. 53A to 53C. Note that, for components denoted by the same reference numerals as those of the transistor 100 described in Method 5 for manufacturing semiconductor device, Method 5 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A described in Method 5 for manufacturing semiconductor device.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 5 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130*a* and can prevent diffusion of impurities from layers below the oxide semiconductor 130*b*.

Next, the insulator 120B is removed by a process similar to that described in Method 5 for manufacturing semiconductor device to expose all the side surfaces of the oxide semiconductor 130*b*. The oxide semiconductor 130*a* can be used as a stopper film at that time, which facilitates the exposure of all the side surfaces of the oxide semiconductor 130*b*. By exposing all the side surfaces of the oxide semiconductor 130*b* in this step, the region which faces the conductor 160 with the insulator 150, which is to be formed in a later step, positioned therebetween is enlarged, so that the region whose length serves as the channel length can be efficiently formed.

Next, the conductor 140*a*, the conductor 140*b*, and the insulator 170 having an opening are formed by steps similar to those described in Method 5 for manufacturing semiconductor device.

Then, the oxide semiconductor 130*c*, the insulator 150, and the conductor 160 are formed in the opening formed in the insulator 170 by steps similar to those described in Modification example 1 of semiconductor device.

The oxide semiconductor 130C can be formed in a similar manner to that of the oxide semiconductor 130*a* and the oxide semiconductor 130*b*. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130*b* where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130*b*.

That is, when the oxide semiconductor 130*c* with a small thickness is formed over the oxide semiconductor 130*b*, diffusion of impurities from layers over the oxide semiconductor 130 into the oxide semiconductor 130*b* can be prevented. By using a transistor formed so that the oxide semiconductor 130*b* with reduced impurities serves as a channel formation region, a highly reliable semiconductor device can be achieved.

Figure 53A:
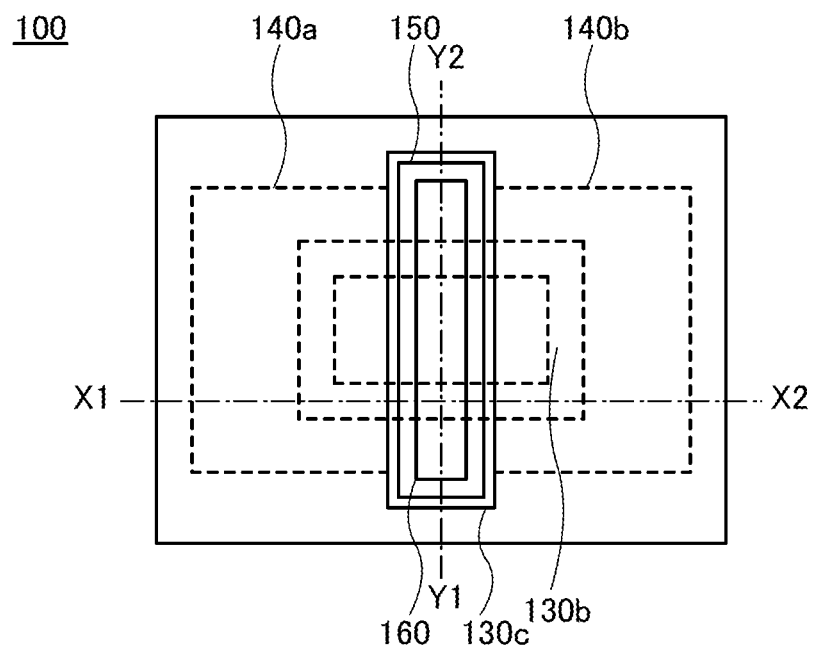
FIGS. 53A to 53C are a top view and cross-sectional views illustrating one embodiment of a semiconductor device.
Figure 53B:
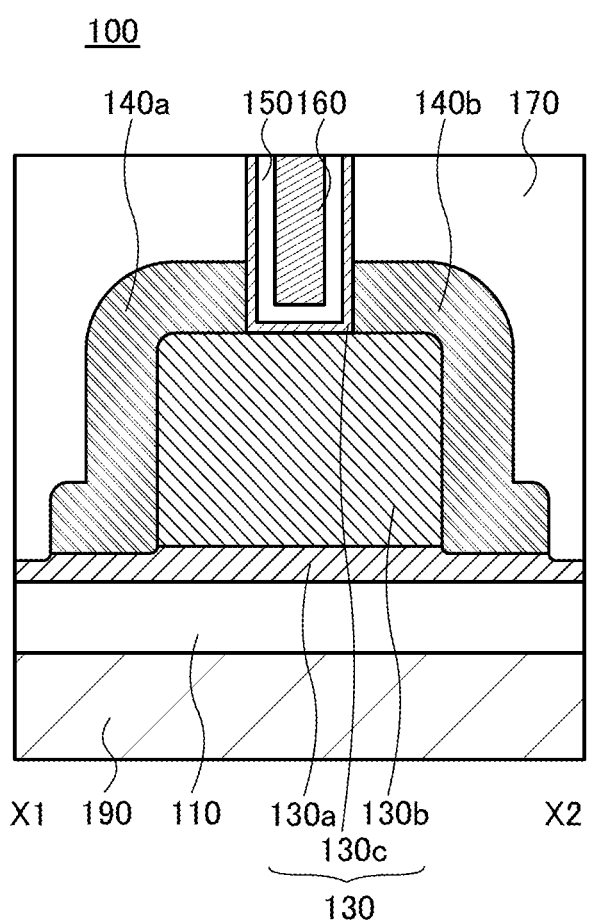
Figure 53C:
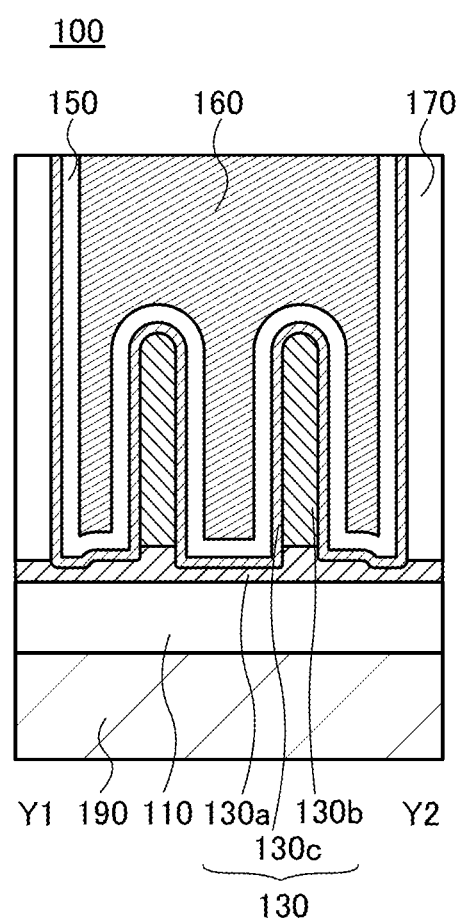

Through the above steps, the transistor 100 illustrated in FIGS. 53A to 53C can be manufactured.

FIG. 53A illustrates an example of a top view of the transistor 100. FIG. 53B is a cross-sectional view taken along dashed-dotted line X1-X2 in FIG. 53A, and FIG. 53C is a cross-sectional view take along dashed-dotted line Y1-Y2 in FIG. 53A.

In the transistor 100, the oxide semiconductor 130*b* functions as a channel formation region. The conductor 140*a* and the conductor 140*b* function as a source electrode and a drain electrode. The insulator 150 functions as a gate insulator. The conductor 160 functions as a gate electrode.

In this structure, the width of the oxide semiconductor 130*b* can be adjusted by changing the thickness of the oxide semiconductor 130*b* regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130*b* which faces or overlaps with the conductor 160 with the insulator 150 positioned therebetween. In this structure, the channel formation region of the oxide semiconductor 130*b* is surrounded by the conductor 160 with the insulator 150 positioned therebetween.

In this structure, an electric field can be applied to at least the three sides of a region of the oxide semiconductor 130*b* where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130*b* which faces the conductor 160 with the insulator 150 positioned therebetween is enlarged, the channel formation region is enlarged, and the on-state current of the transistor can be increased. In addition, as the width of the channel formation region in the oxide semiconductor 130*b* is reduced, the proportion of a region with a high carrier controllability increases, leading to a smaller subthreshold swing value.

Accordingly, the channel formation region can be formed over a wide area of the side surface of the oxide semiconductor 130*b* in this structure, resulting in a transistor with favorable on-state characteristics. In addition, for example, the height of the oxide semiconductor 130*b* may be greater than or equal to 10 nm, preferably greater than or equal to 20 nm, further preferably greater than or equal to 30 nm, still further preferably greater than or equal to 50 nm. Note that the height of the oxide semiconductor 130*b* is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140*a* and the conductor 140*b* hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue. Thus, the oxide semiconductor is formed in the opening formed in the insulator, whereby an island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

Modification Example 17 of Semiconductor Device

A modification example of the transistor 100 is described below with reference to FIGS. 54A to 54C. Note that, for components denoted by the same reference numerals as those of the transistor 100 described in Method 5 for manufacturing semiconductor device, Method 5 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A described in Method 5 for manufacturing semiconductor device.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130b is formed in the opening formed in the insulator 120A by steps similar to those described in Method 5 for manufacturing semiconductor device. That is, the oxide semiconductor 130b is formed in contact with the oxide semiconductor 130a. Accordingly, the oxide semiconductor 130b contains a smaller amount of impurities than the oxide semiconductor 130a and can prevent diffusion of impurities from layers below the oxide semiconductor 130b.

Next, the insulator 120B is removed by a process similar to that described in Method 5 for manufacturing semiconductor device to expose all the side surfaces of the oxide semiconductor 130. At that time, part of the oxide semiconductor 130a and part of the insulator 110 are removed so that the depth has a value greater than or equal to the sum of the height of the oxide semiconductor 130b and the thickness of the insulator 150 to be formed later. That is, in the completed transistor 100 illustrated in FIGS. 54A to 54C, the top and side surfaces of part of the oxide semiconductor 130b are covered with the conductor 160 with the insulator 150 positioned therebetween.

In this structure, when the thickness of the oxide semiconductor 130a is greater than the total thickness of the oxide semiconductor 130c and the insulator 150, the insulator 110 can be used as a stopper film. The use of the insulator 110 as a stopper film can prevent excess etching so as not to etch the insulator below the oxide semiconductor 130 at the time of exposing the side surfaces of the oxide semiconductor 130b; as a result, falling down of the oxide semiconductor 130 can be inhibited.

Next, the conductor 140a, the conductor 140b, and the insulator 170 having an opening are formed by steps similar to those described in Method 5 for manufacturing semiconductor device.

Then, the oxide semiconductor 130c, the insulator 150, and the conductor 160 are formed in the opening formed in the insulator 170 by steps similar to those described in Modification example 1 of semiconductor device.

The oxide semiconductor 130C can be formed in a similar manner to that of the oxide semiconductor 130a and the oxide semiconductor 130b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductor 130b.

That is, when the oxide semiconductor 130c with a small thickness is formed over the oxide semiconductor 130b, diffusion of impurities from layers over the oxide semiconductor 130 into the oxide semiconductor 130b can be prevented. By using a transistor formed so that the oxide semiconductor 130b with reduced impurities serves as a channel formation region, a highly reliable semiconductor device can be achieved.

Figure 54A:
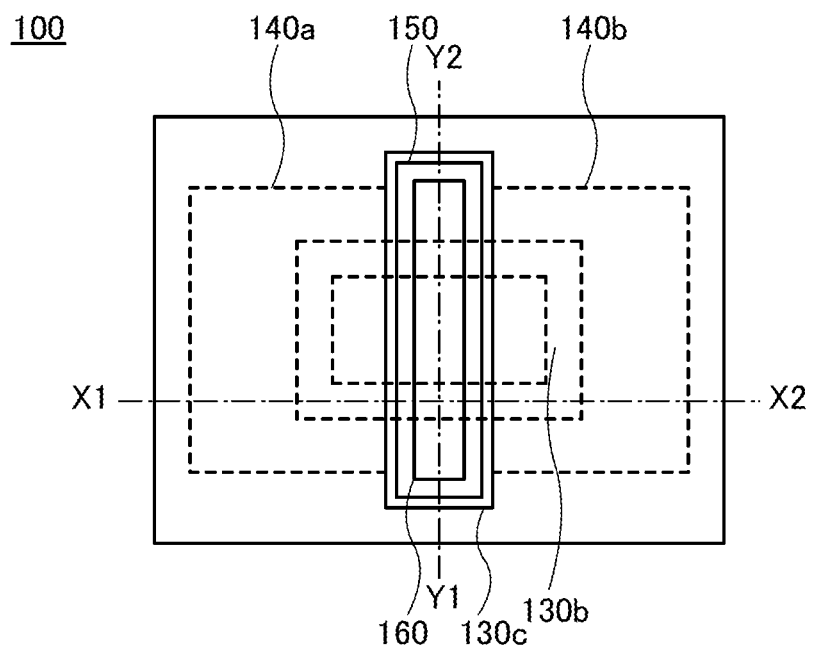
FIGS. 54A to 54C are a top view and cross-sectional views illustrating one embodiment of a semiconductor device.
Figure 54B:
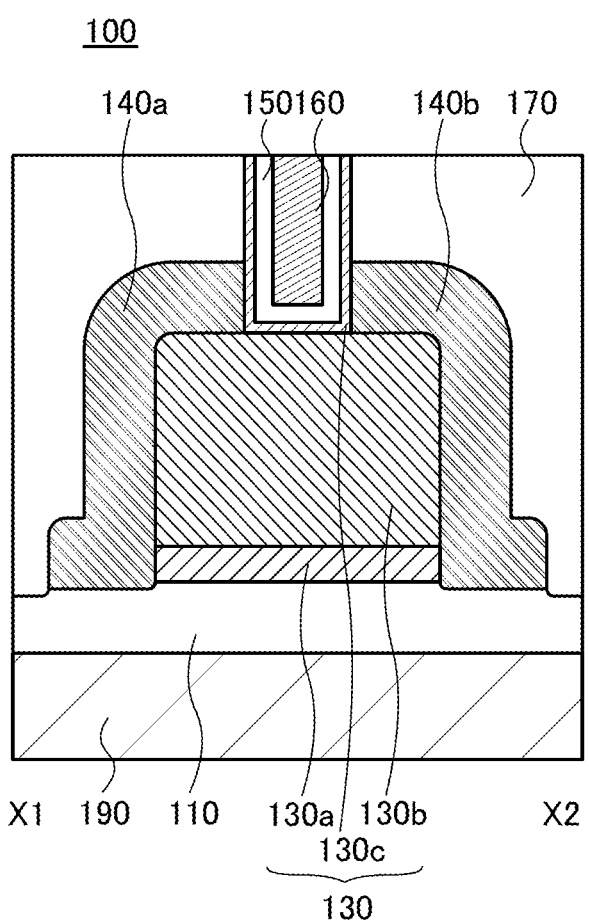
Figure 54C:
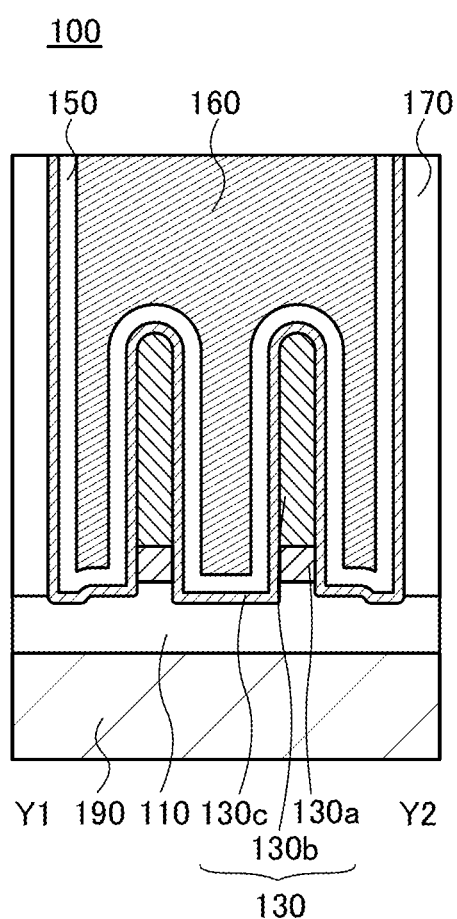

Through the above steps, the transistor 100 illustrated in FIGS. 54A to 54C can be manufactured.

FIG. 54A illustrates an example of a top view of the transistor 100. FIG. 54B is a cross-sectional view taken along dashed-dotted line X1-X2 in FIG. 54A, and FIG. 54C is a cross-sectional view take along dashed-dotted line Y1-Y2 in FIG. 54A.

In the transistor 100, the oxide semiconductor 130b functions as a channel formation region. The conductor 140a and the conductor 140b function as a source electrode and a drain electrode. The insulator 150 functions as a gate insulator. The conductor 160 functions as a gate electrode.

In this structure, the width of the oxide semiconductor 130b can be adjusted by changing the thickness of the oxide semiconductor 130b regardless of the size of the opening. Thus, a miniaturized transistor can be provided easily.

In addition, the channel formation region can be enlarged and the surface area of the channel formation region can be increased in this structure; therefore, the transistor can have high on-state characteristics and good controllability. In some cases, the channel is formed in a region of the oxide semiconductor 130b which faces or overlaps with the conductor 160 with the insulator 150 positioned therebetween. In this structure, the channel formation region of the oxide semiconductor 130b is surrounded by the conductor 160 with the insulator 150 positioned therebetween.

In this structure, an electric field can be applied to at least the three sides of a region of the oxide semiconductor 130b where the channel is formed, owing to the electric field generated from the conductor 160. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 130b which faces the conductor 160 with the insulator 150 positioned therebetween is enlarged, the channel formation region is enlarged, and the on-state current of the transistor can be increased. In addition, as the width of the channel formation region in the oxide semiconductor 130b is reduced, the proportion of a region with a high carrier controllability increases, leading to a smaller subthreshold swing value.

Accordingly, the channel formation region can be formed over a wide area of the side surface of the oxide semiconductor 130b, resulting in a transistor with favorable on-state characteristics. In addition, for example, the height of the oxide semiconductor 130b may be greater than or equal to 10 nm, preferably greater than or equal to 20 nm, further preferably greater than or equal to 30 nm, still further preferably greater than or equal to 50 nm. Note that the height of the oxide semiconductor 130b is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 100 has a structure in which the conductor 140a and the conductor 140b hardly overlap with the conductor 160, the parasitic capacitance relating to the conductor 160 can be reduced. That is, the transistor 100 has a high operation frequency.

In the case where an In—Sn—Zn—O film which is a hardly-etched material is used as the oxide semiconductor, the resist mask might disappear at the time of etching depending on the etching condition. Thus, the oxide semiconductor is formed in the opening formed in the insulator, whereby an island-shaped oxide semiconductor can be formed without a resist mask.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 5

Application Example 1 of Semiconductor Device

Figure 55:
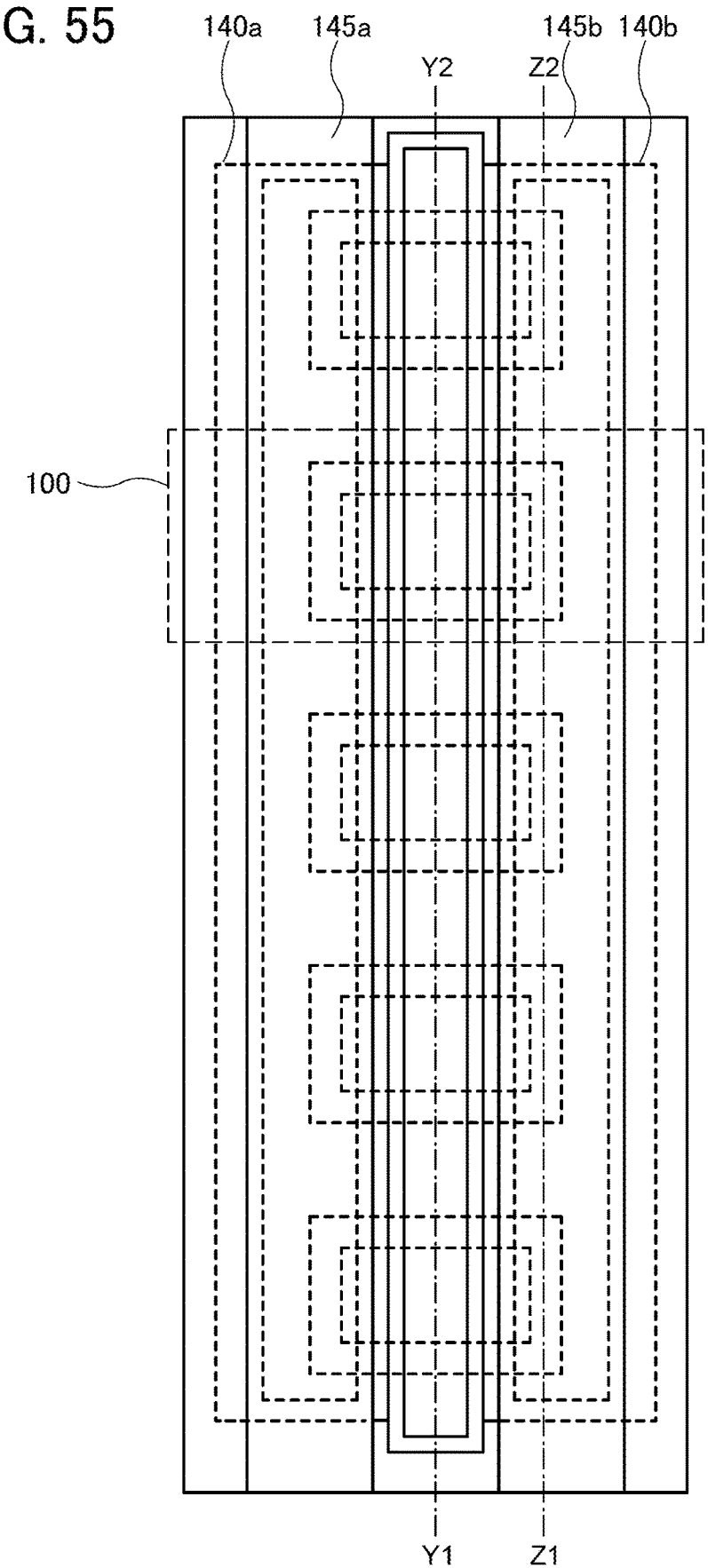
FIG. 55 is a top view illustrating one embodiment of a semiconductor device.
Figure 56:
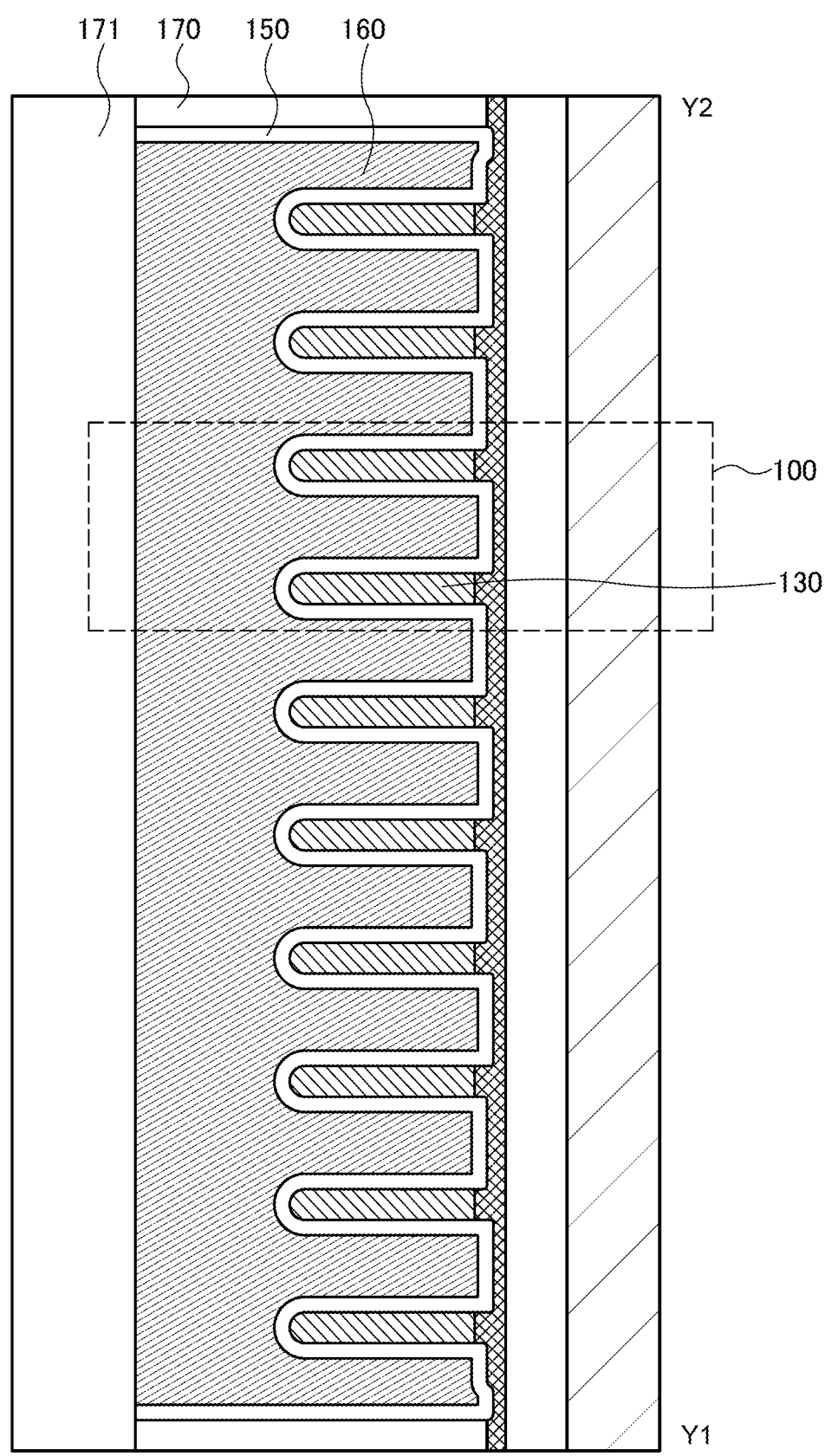
FIG. 56 is a cross-sectional view illustrating one embodiment of a semiconductor device.
Figure 57:
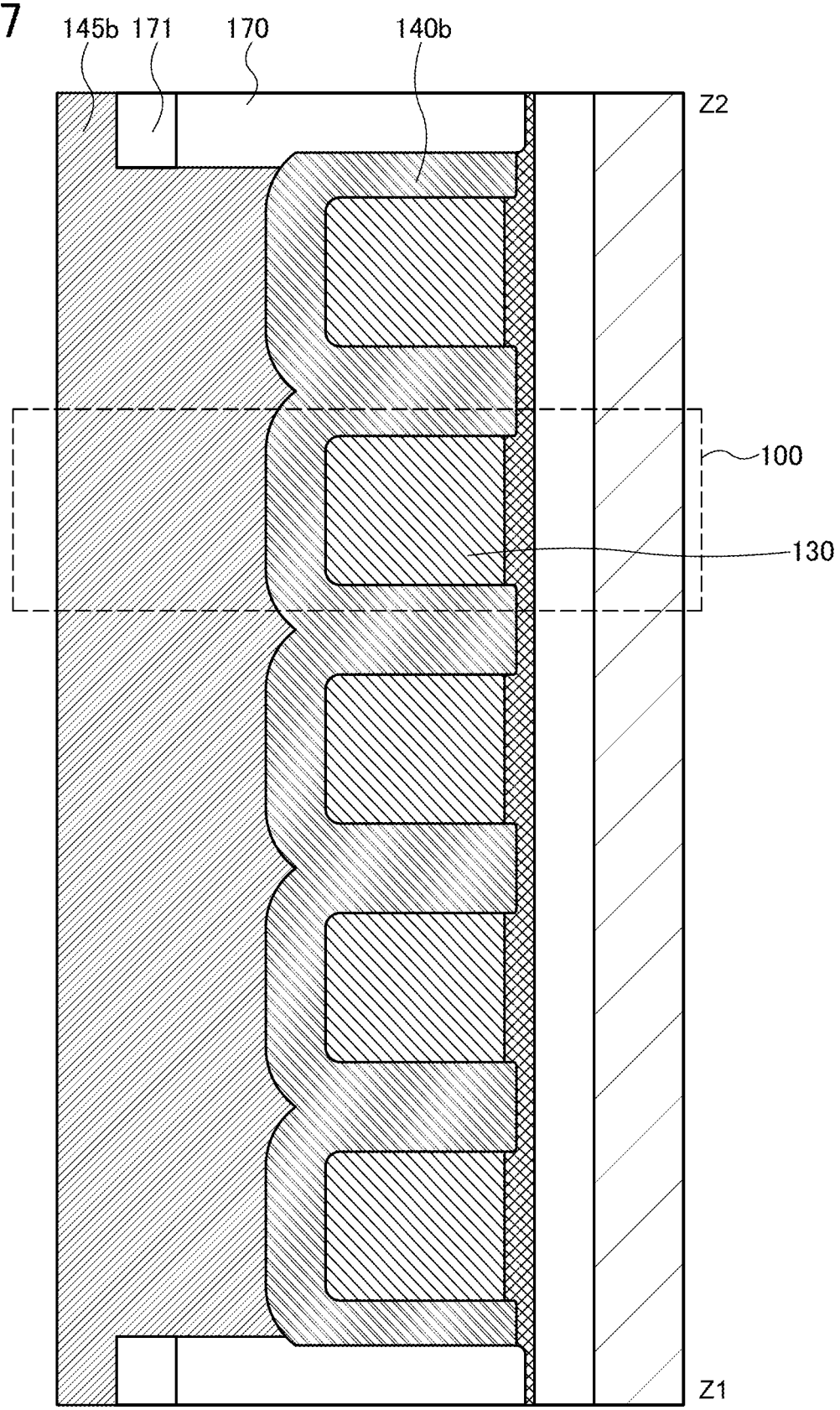
FIG. 57 is a cross-sectional view illustrating one embodiment of a semiconductor device.

An application example of the transistor 100 is described in this embodiment with reference to FIG. 55, FIG. 56, and FIG. 57. Note that the components having a function similar to those of the transistors 100 in Embodiments 3 and 4 are denoted by the same reference numerals as those in the transistors 100 in Embodiments 3 and 4, and the transistors in Embodiments 3 and 4 can be referred to.

FIG. 55 illustrates an example of a top view where a plurality of transistors 100 each of which is described in Embodiments 3 and 4 are connected in parallel. FIG. 56 and FIG. 57 illustrate cross-sectional views taken along dashed-dotted lines Y1-Y2 and Z1-Z2 shown in FIG. 55, respectively.

As illustrated in FIG. 55, FIG. 56, and FIG. 57, when the transistors 100 are formed to be parallel to each other, the conductor 140a, the conductor 140b, the insulator 150, and the conductor 160 are shared by the plurality of transistors 100.

Furthermore, as illustrated in FIG. 55, FIG. 56, and FIG. 57, after an insulator 171 is formed over the insulator 150, the insulator 170, and the conductor 160, a conductor 145a to be connected to the conductor 140a and a conductor 145b to be connected to the conductor 140b may be formed. Note that the conductor 145a and the conductor 145b function as a source wiring and a drain wiring.

In this embodiment, the plurality of miniaturized transistors 100 can be manufactured. In this embodiment, the source electrodes and the drain electrodes of the plurality of transistors can be formed at a time, which enables miniaturization of a semiconductor device. Furthermore, this structure, where long and narrow contact holes of the plurality of transistors 100 are formed at a time, can facilitate the processing and reduce the contact resistance.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 6

Structural Example 2 of Semiconductor Device

In this embodiment, the structures of transistors 101 and 102 are described with reference to FIGS. 58A to 58C, FIGS. 59A to 59C, FIGS. 60A to 60C, FIGS. 61A to 61C, FIGS. 62A to 62C, FIGS. 63A to 63C, FIGS. 64A to 64C, FIGS. 65A to 65C, FIGS. 66A to 66C, FIGS. 67A to 67C, FIGS. 68A to 68C, FIGS. 69A to 69C, FIGS. 70A to 70C, FIGS. 71A to 71C, FIGS. 72A to 72C, FIGS. 73A to 73C, FIGS. 74A to 74C, FIGS. 75A to 75C, FIGS. 76A to 76C, FIGS. 77A to 77C, FIGS. 78A to 78C, FIGS. 79A to 79C, and FIGS. 80A to 80C.

<Method 6 for Manufacturing Semiconductor Device>

Figure 58A:
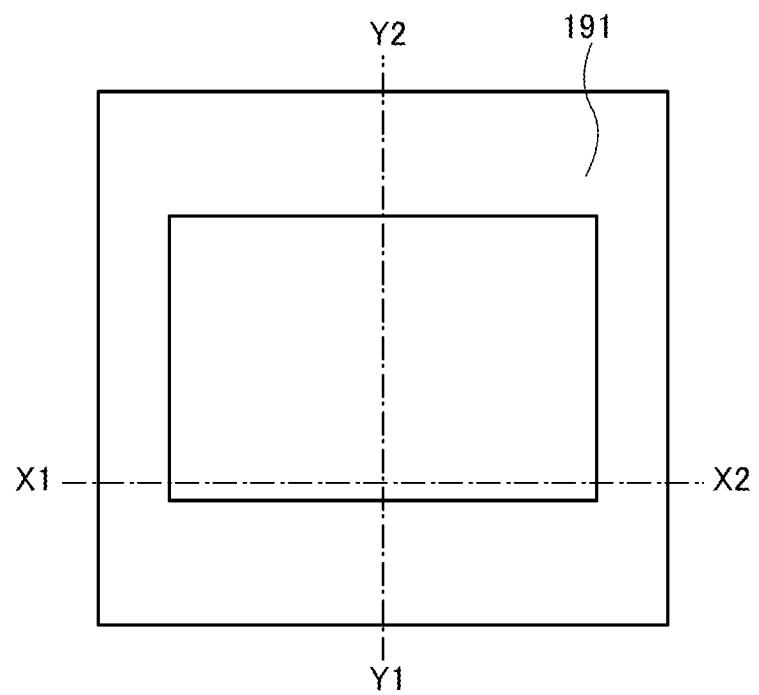
FIGS. 58A to 58C are a top view and cross-sectional views illustrating one embodiment of a method for manufacturing a semiconductor device.
Figure 58B:
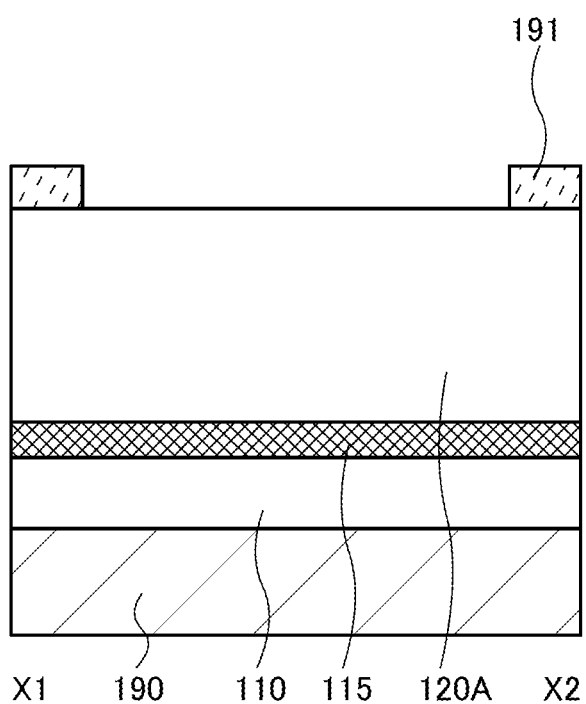
Figure 58C:
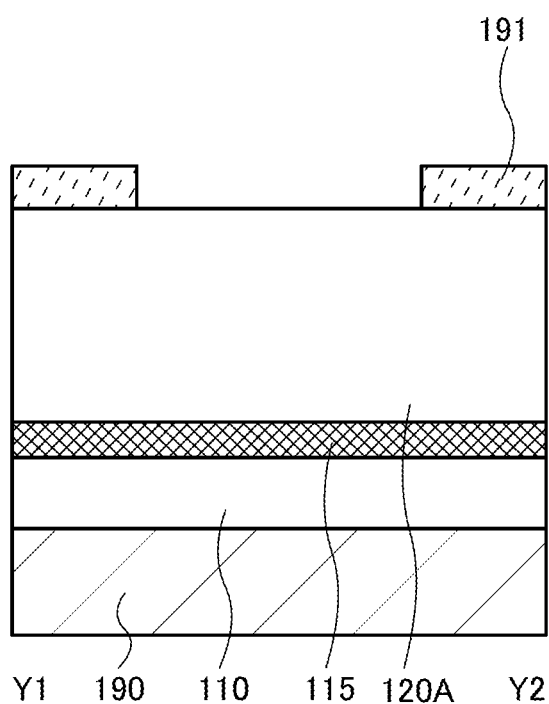

An example of a method for manufacturing a semiconductor device is described below with reference to FIGS. 58A to 58C, FIGS. 59A to 59C, FIGS. 60A to 60C, FIGS. 61A to 61C, FIGS. 62A to 62C, FIGS. 63A to 63C, FIGS. 64A to 64C, FIGS. 65A to 65C, FIGS. 66A to 66C, FIGS. 67A to 67C, FIGS. 8A to 68C, FIGS. 69A to 69C, and FIGS. 70A to 70C. Note that FIG. 58A is an example of a top view. FIG. 58B is a cross-sectional view taken along dashed-dotted line X1-X2 in FIG. 58A, and FIG. 58C is a cross-sectional view take along dashed-dotted line Y1-Y2 in FIG. 58A. The same applies to FIGS. 59A to 59C, FIGS. 60A to 60C, FIGS. 61A to 61C, FIGS. 62A to 62C, FIGS. 63A to 63C, FIGS. 64A to 64C, FIGS. 65A to 65C, FIGS. 66A to 66C, FIGS. 67A to 67C, FIGS. 8A to 68C, FIGS. 69A to 69C, and FIGS. 70A to 70C Note that the structure having a function similar to that of the transistor 100 in Embodiment 1 is denoted by the same reference numerals in the transistor 100, and the transistor in Embodiment 1 can be referred to First, the insulator 110, the film 115, the insulator 120A, and the resist mask 191 are formed over the substrate 190 as illustrated in FIGS. 58A to 58C.

Figure 59A:
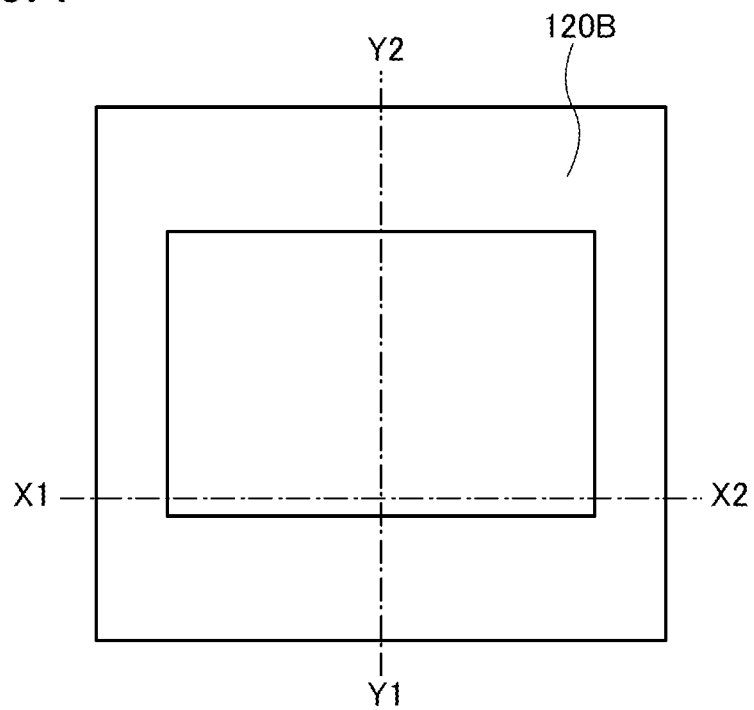
FIGS. 59A to 59C are a top view and cross-sectional views illustrating one embodiment of a method for manufacturing a semiconductor device.
Figure 59B:
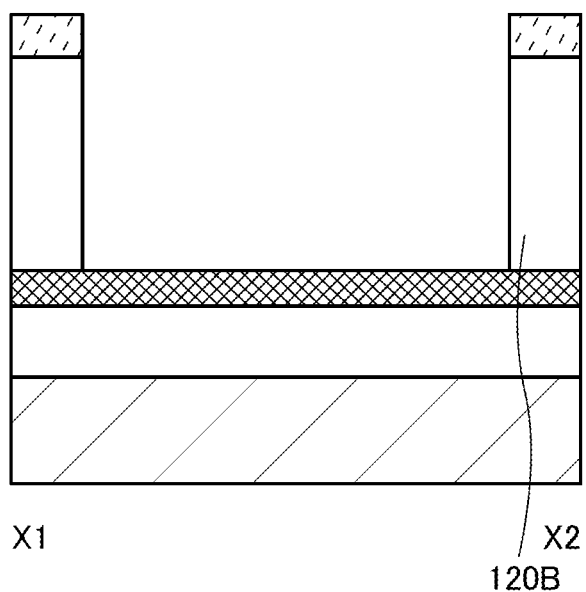
Figure 59C:
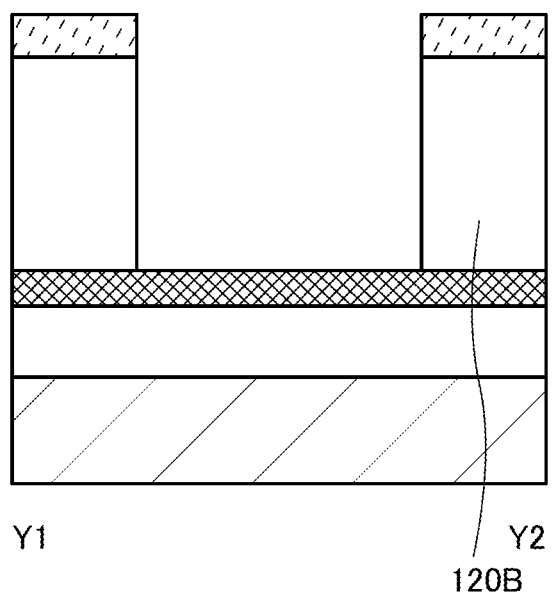

Next, an unnecessary portion of the insulator 120A is removed by using the resist mask 191 to form the insulator 120B as illustrated in FIGS. 59A to 59C. At that time, the film 115 functions as a stopper film. Therefore, the film 115 can reduce variation in the height of the opening although the film 115 is not an indispensable component. The uniform shape of the opening can reduce the variation in the size of the oxide semiconductor to be formed in a later step, resulting in a highly reliable transistor.

Figure 60A:
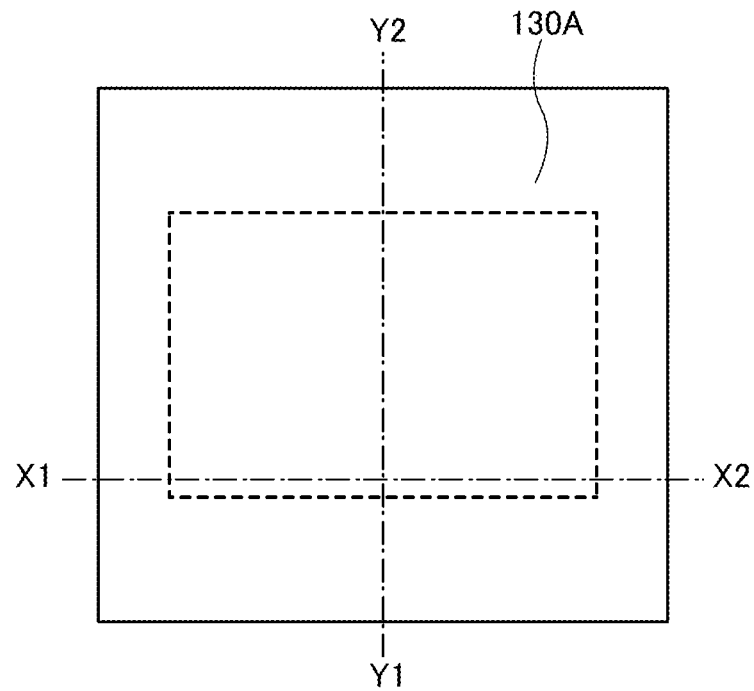
FIGS. 60A to 60C are a top view and cross-sectional views illustrating one embodiment of a method for manufacturing a semiconductor device.
Figure 60B:
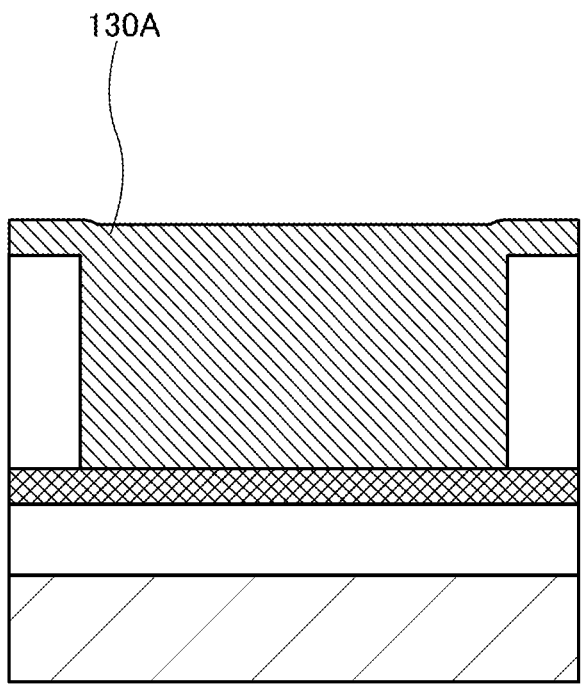
Figure 60C:
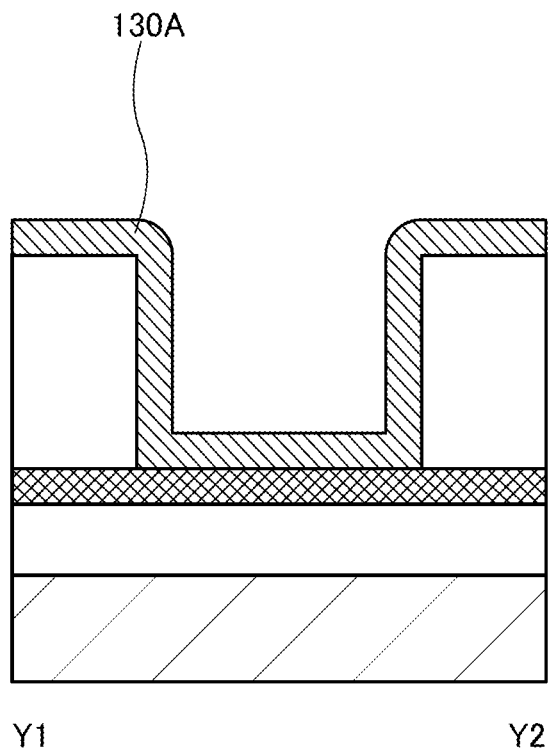
Figure 61A:
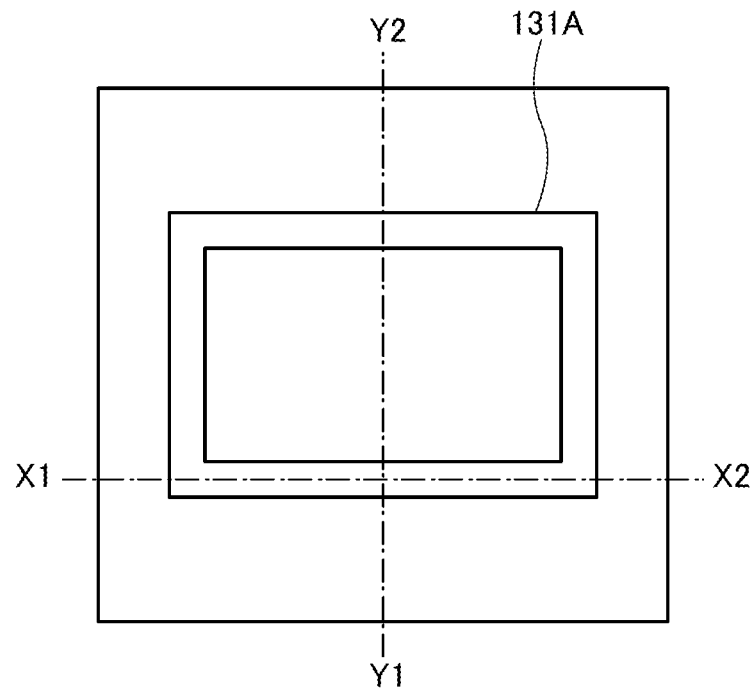
FIGS. 61A to 61C are a top view and cross-sectional views illustrating one embodiment of a method for manufacturing a semiconductor device.
Figure 61B:
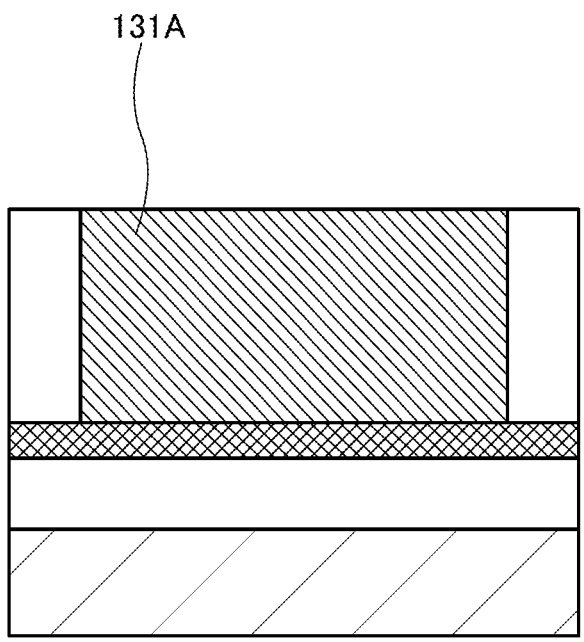
Figure 61C:
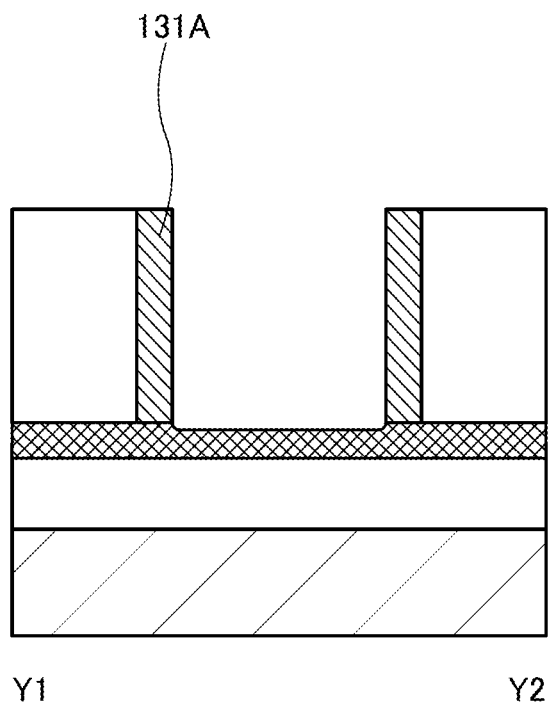

Subsequently, the oxide semiconductor 130A is formed along the inner wall of the opening of the insulator 120B as illustrated in FIGS. 60A to 60C. Then, an unnecessary portion of the oxide semiconductor 130A is removed to form an oxide semiconductor 131A having a ring shape as illustrated in FIGS. 61A to 61C. This step can be performed by an etch-back process employing a dry etching method, where the film 115 is used as a stopper film, for example.

Figure 62A:
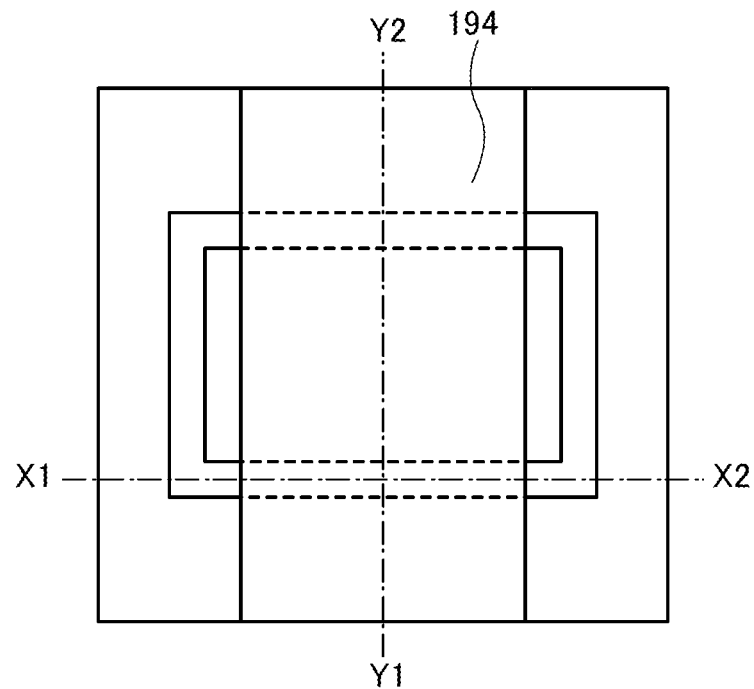
FIGS. 62A to 62C are a top view and cross-sectional views illustrating one embodiment of a method for manufacturing a semiconductor device.
Figure 62B:
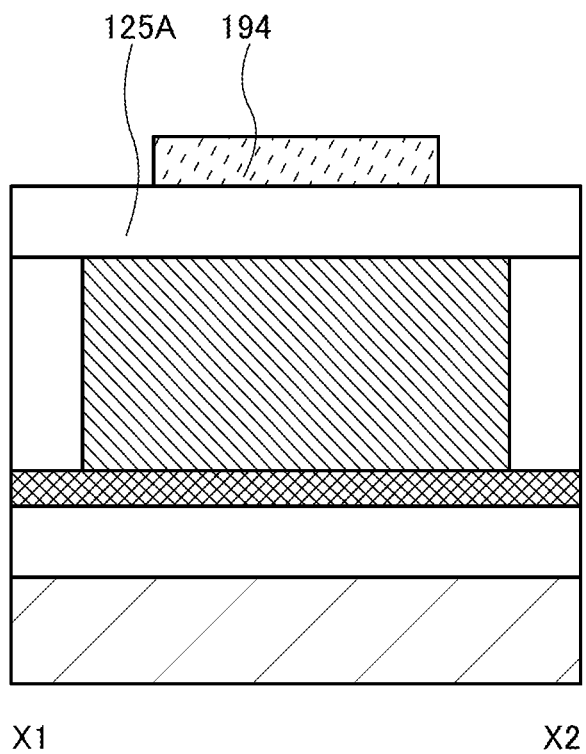
Figure 62C:
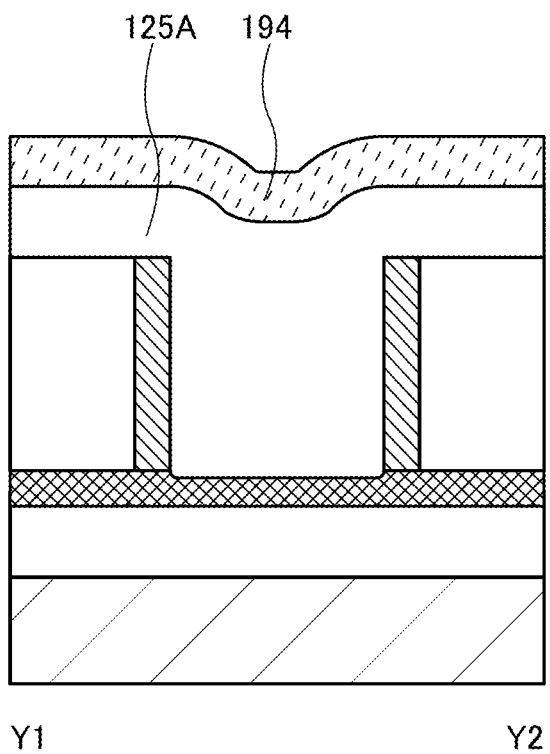

Next, the insulator 125A is formed over the oxide semiconductor 131A, and a resist mask 194 is formed as illustrated in FIGS. 62A to 62C.

Figure 63A:
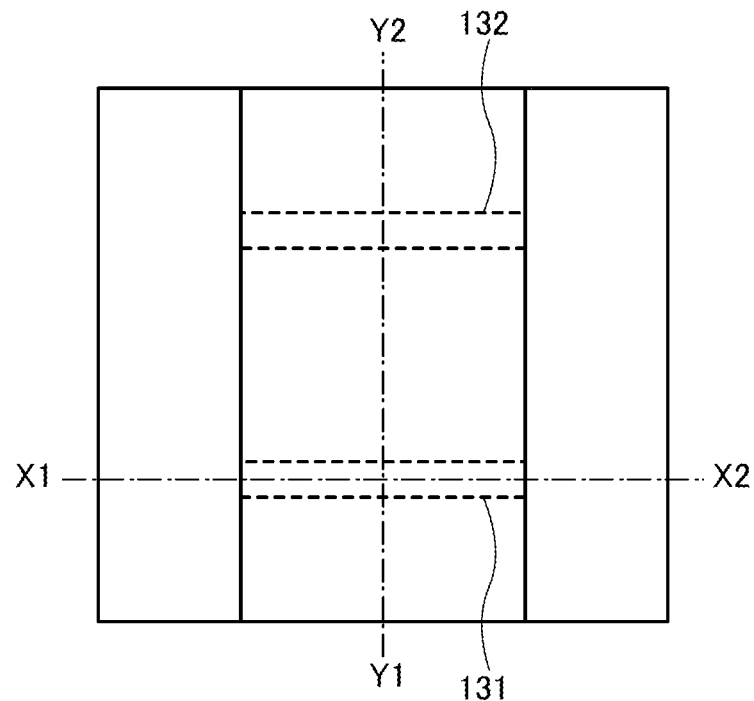
FIGS. 63A to 63C are a top view and cross-sectional views illustrating one embodiment of a method for manufacturing a semiconductor device.
Figure 63B:
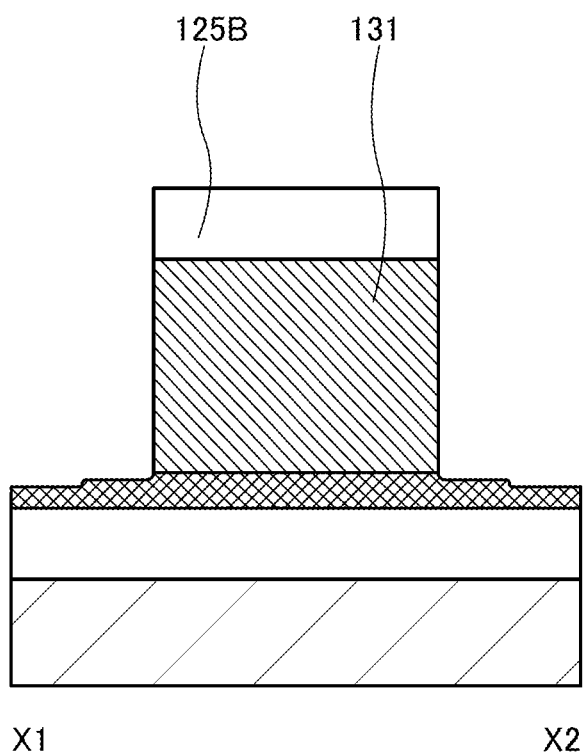
Figure 63C:
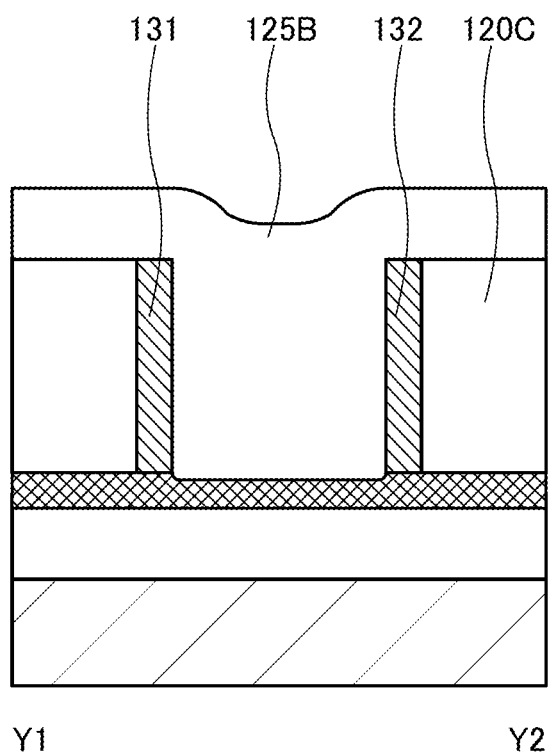

Then, unnecessary portions of the insulator 125A and the oxide semiconductor 131A are removed, whereby an oxide semiconductor 131, an oxide semiconductor 132, an insulator 120C, and the insulator 125B are formed as illustrated in FIGS. 63A to 63C.

Figure 64A:
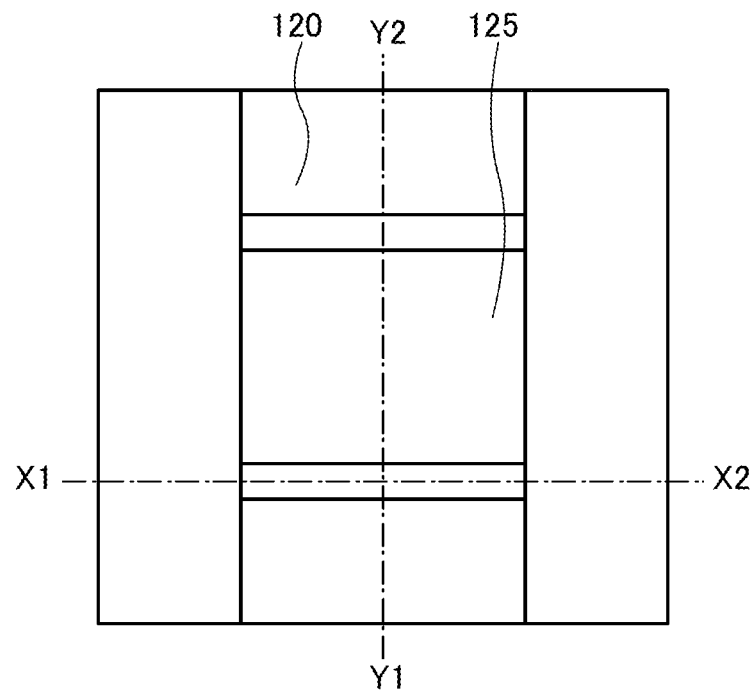
FIGS. 64A to 64C are a top view and cross-sectional views illustrating one embodiment of a method for manufacturing a semiconductor device.
Figure 64B:
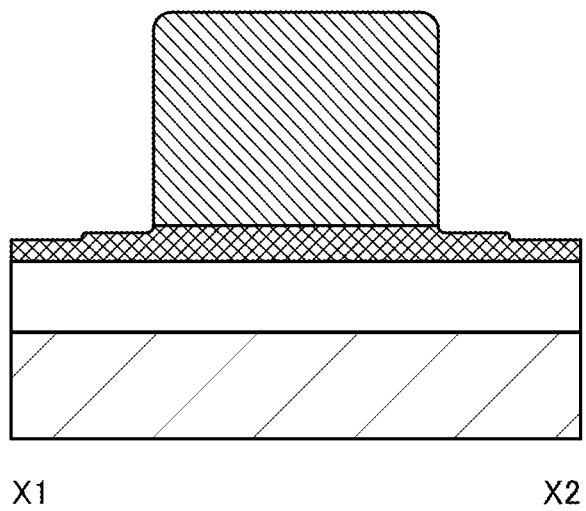
Figure 64C:
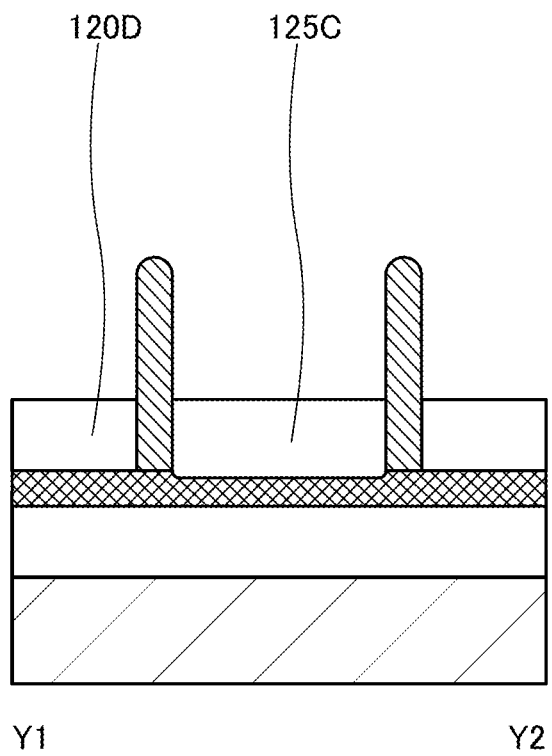

Then, unnecessary portions of the insulator 120C and the insulator 125B are removed, whereby the top surfaces and part of the side surfaces of the oxide semiconductors 131 and 132 are exposed and an insulator 120D and an insulator 125C are formed as illustrated in FIGS. 64A to 64C. In this step, an etch-back process using a dry etching method may be performed on the insulator 120C and the insulator 125B, for example. At that time, part of the oxide semiconductor 131 and part of the oxide semiconductor 132 are embedded in the insulator 120D and the insulator 125C as illustrated in FIGS. 64B and 64C, which can prevent the oxide semiconductor 131 and the semiconductor 132 to fall down in a later step.

Figure 65A:
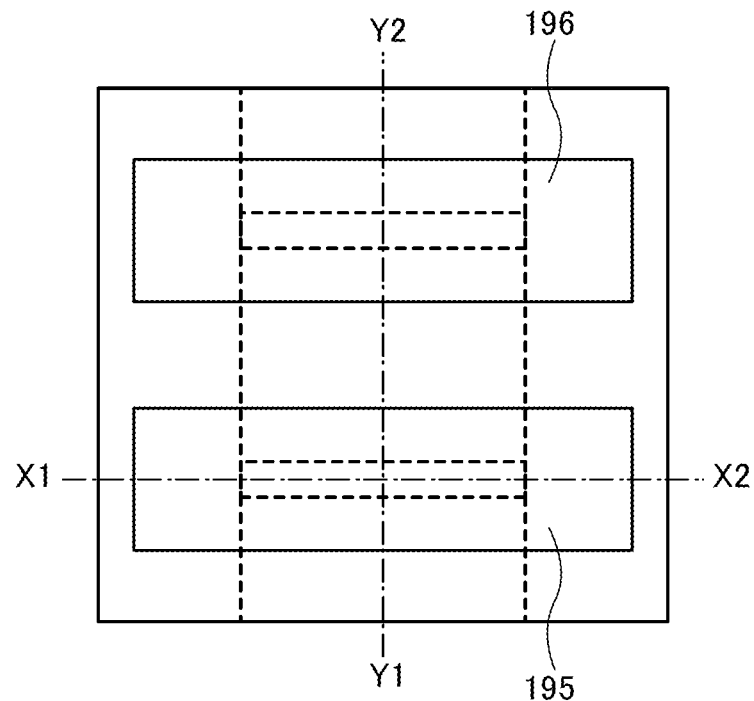
FIGS. 65A to 65C are a top view and cross-sectional views illustrating one embodiment of a method for manufacturing a semiconductor device.
Figure 65B:
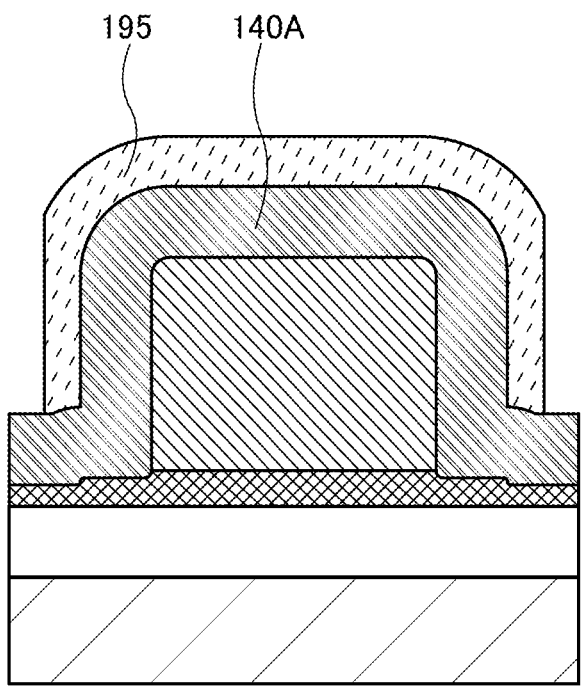
Figure 65C:
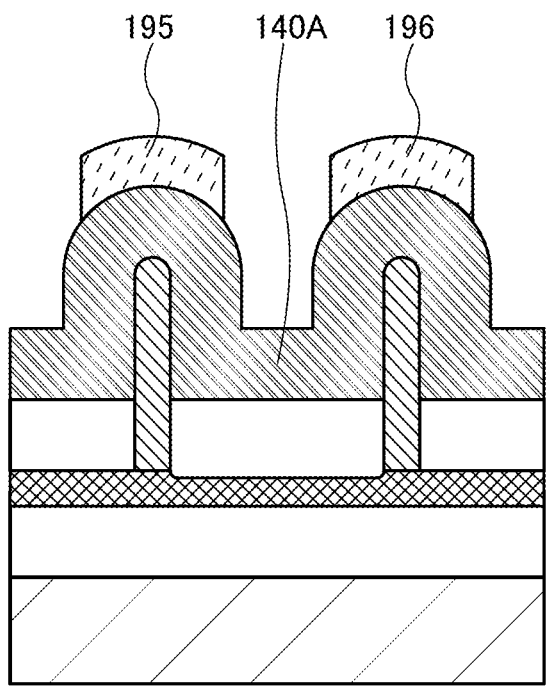
Figure 66A:
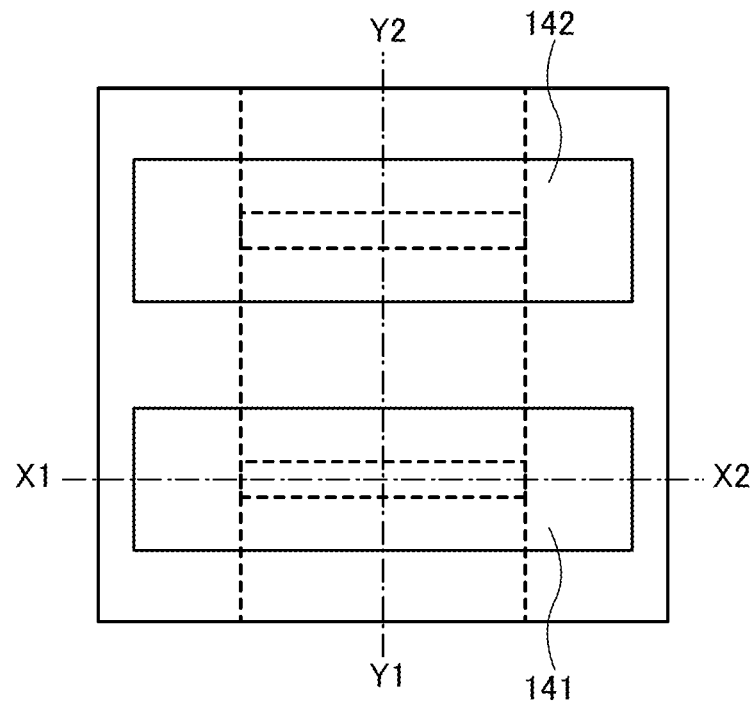
FIGS. 66A to 66C are a top view and cross-sectional views illustrating one embodiment of a method for manufacturing a semiconductor device.
Figure 66B:
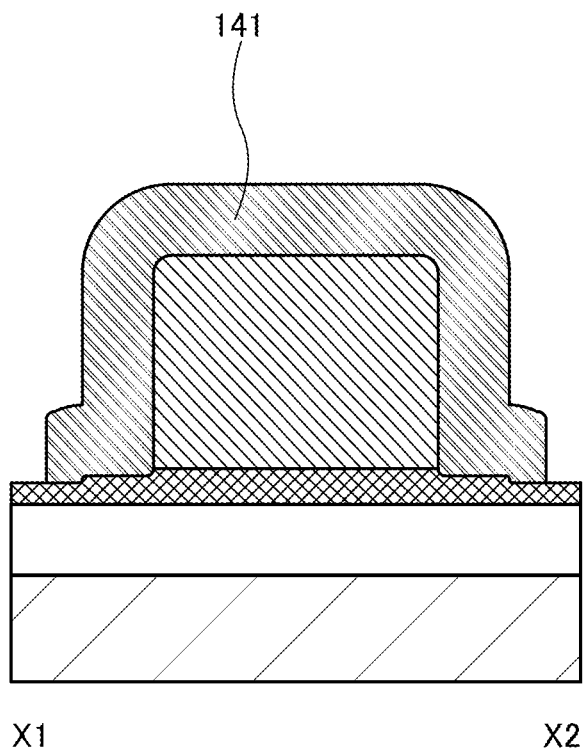
Figure 66C:
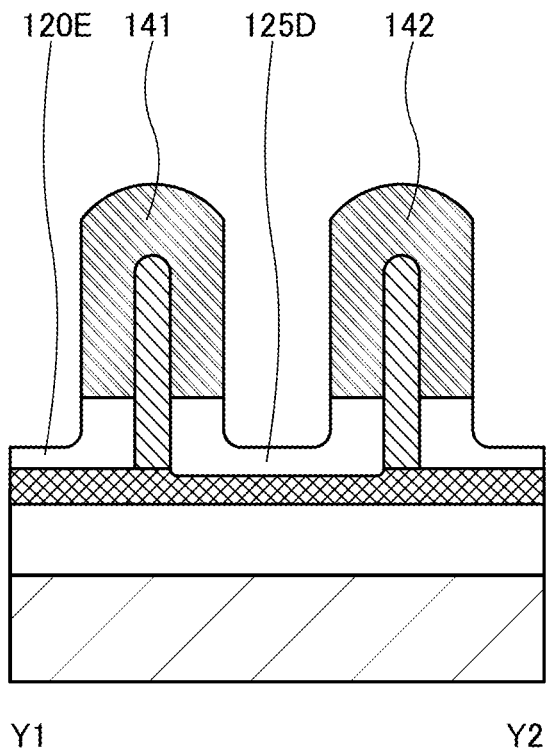

Next, the conductor 140A, a resist mask 195, and a resist mask 196 are formed over the oxide semiconductor 131 and the oxide semiconductor 132 as illustrated in FIGS. 65A to 65C. Then, unnecessary portions of the conductor 140A, the insulator 120D, and the insulator 125C are removed using the resist mask 195 and the resist mask 196, whereby an insulator 120E, an insulator 125D, a conductor 141, and a conductor 142 are formed as illustrated in FIGS. 66A to 66C. Here, components other than insulators which are positioned below the conductor 141 and the conductor 142 may be removed by using the film 115 as a stopper film.

Figure 67A:
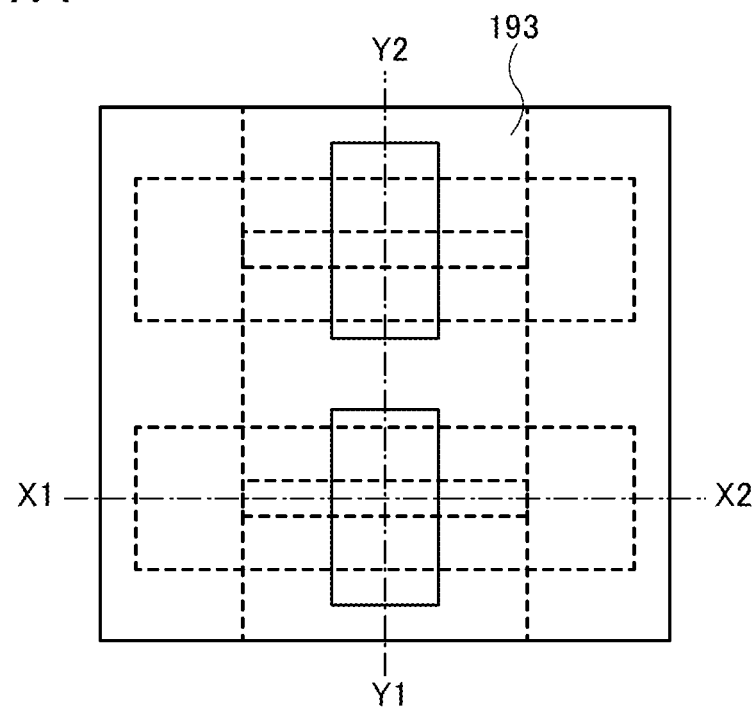
FIGS. 67A to 67C are a top view and cross-sectional views illustrating one embodiment of a method for manufacturing a semiconductor device.
Figure 67B:
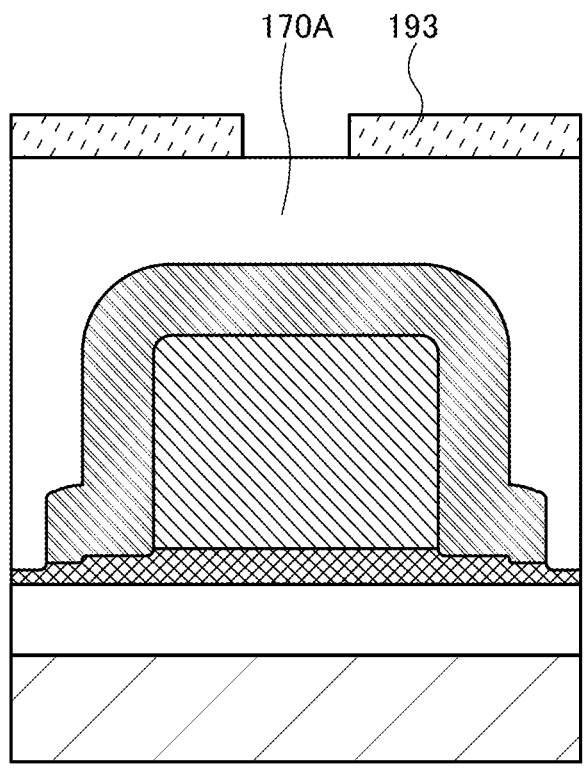
Figure 67C:
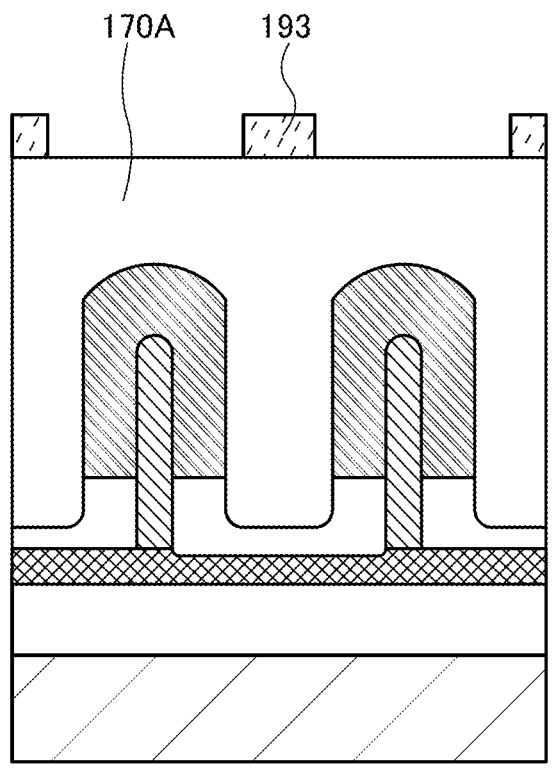
Figure 68A:
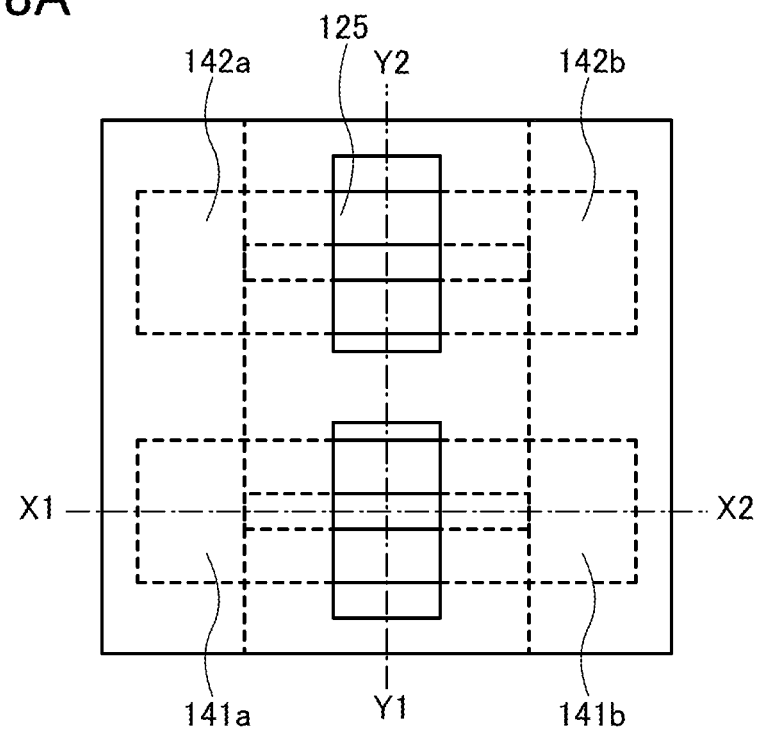
FIGS. 68A to 68C are a top view and cross-sectional views illustrating one embodiment of a method for manufacturing a semiconductor device.
Figure 68B:
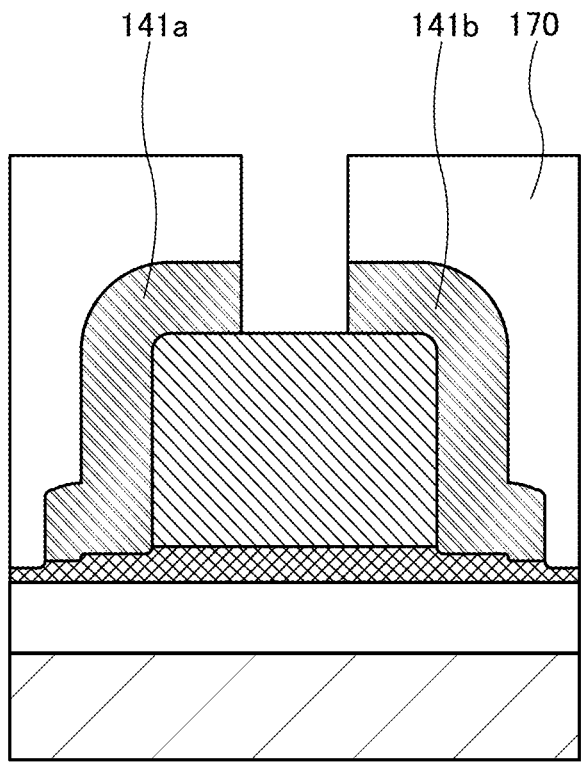
Figure 68C:
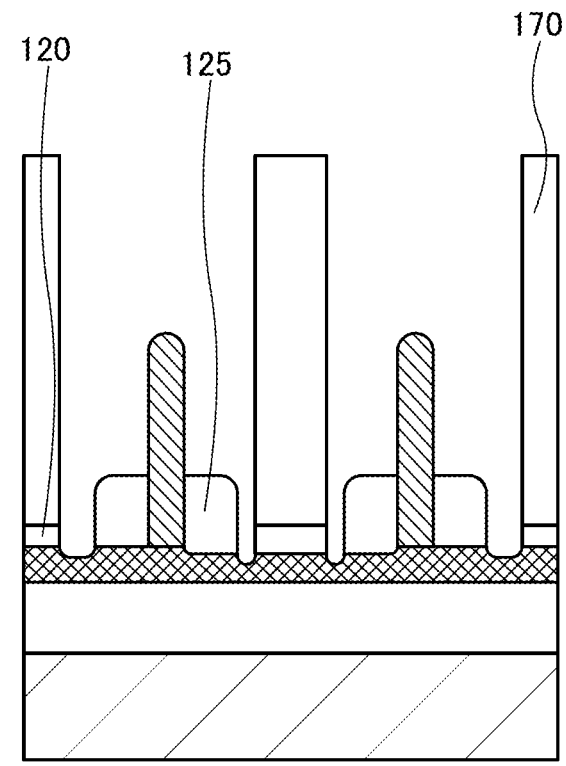

Next, the insulator 170A and the resist mask 193 are formed over the conductor 141 and the conductor 142 as illustrated in FIGS. 67A to 67C. Then, unnecessary portions of the insulator 170A, the conductor 141, and the conductor 142 are removed by using the resist mask 193, whereby the insulator 170, the insulator 120, insulator 125, a conductor 141a, a conductor 141b, a conductor 142a, and a conductor 142b are formed as illustrated in FIGS. 68A to 68C.

Figure 69A:
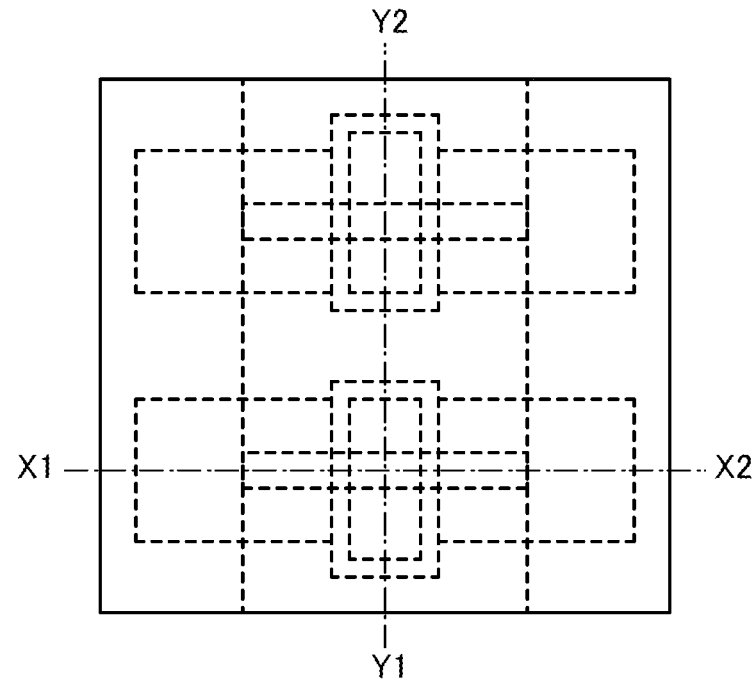
FIGS. 69A to 69C are a top view and cross-sectional views illustrating one embodiment of a method for manufacturing a semiconductor device.
Figure 69B:
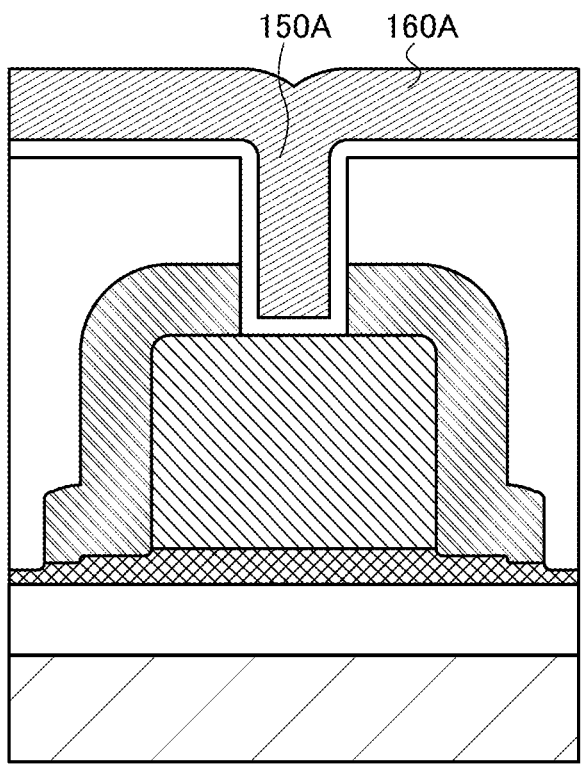
Figure 69C:
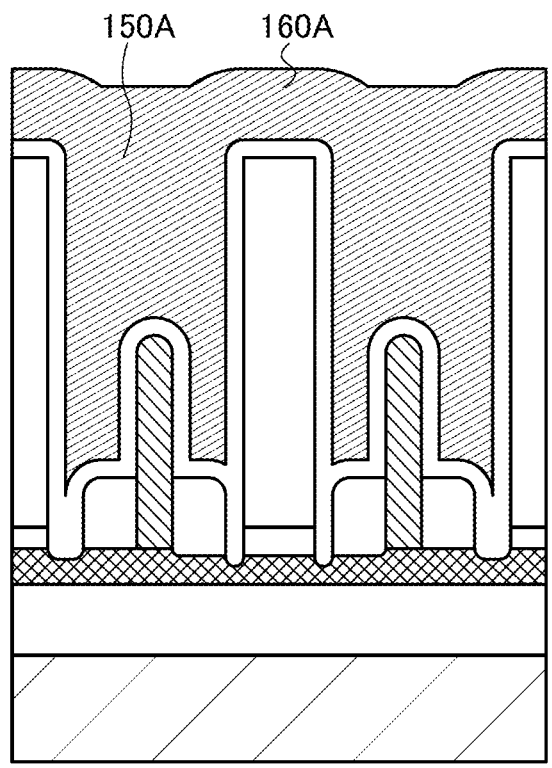
Figure 70A:
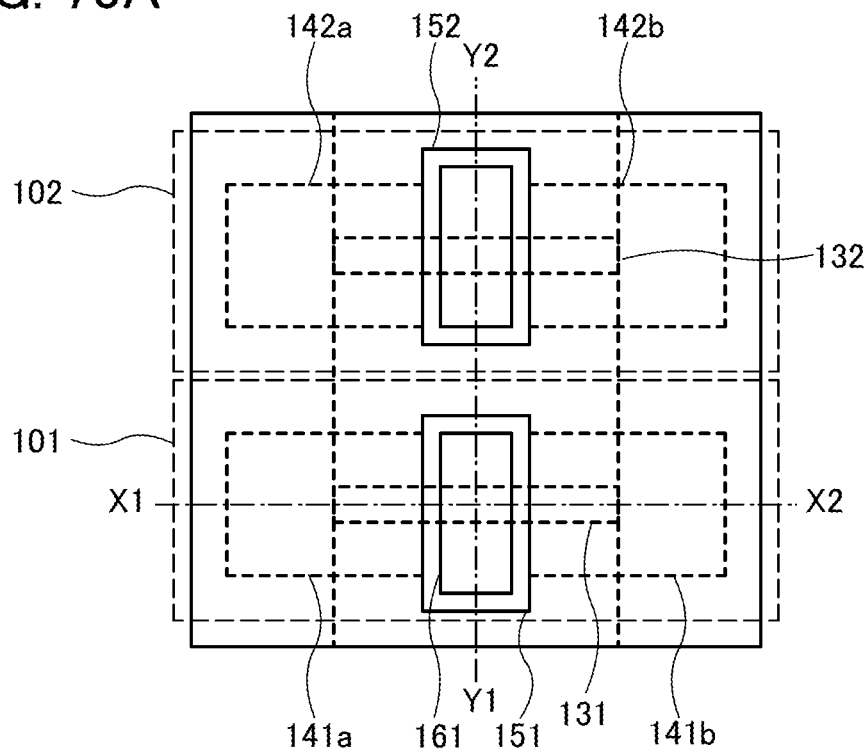
FIGS. 70A to 70C are a top view and cross-sectional views illustrating one embodiment of a method for manufacturing a semiconductor device.
Figures 70B, 70C:
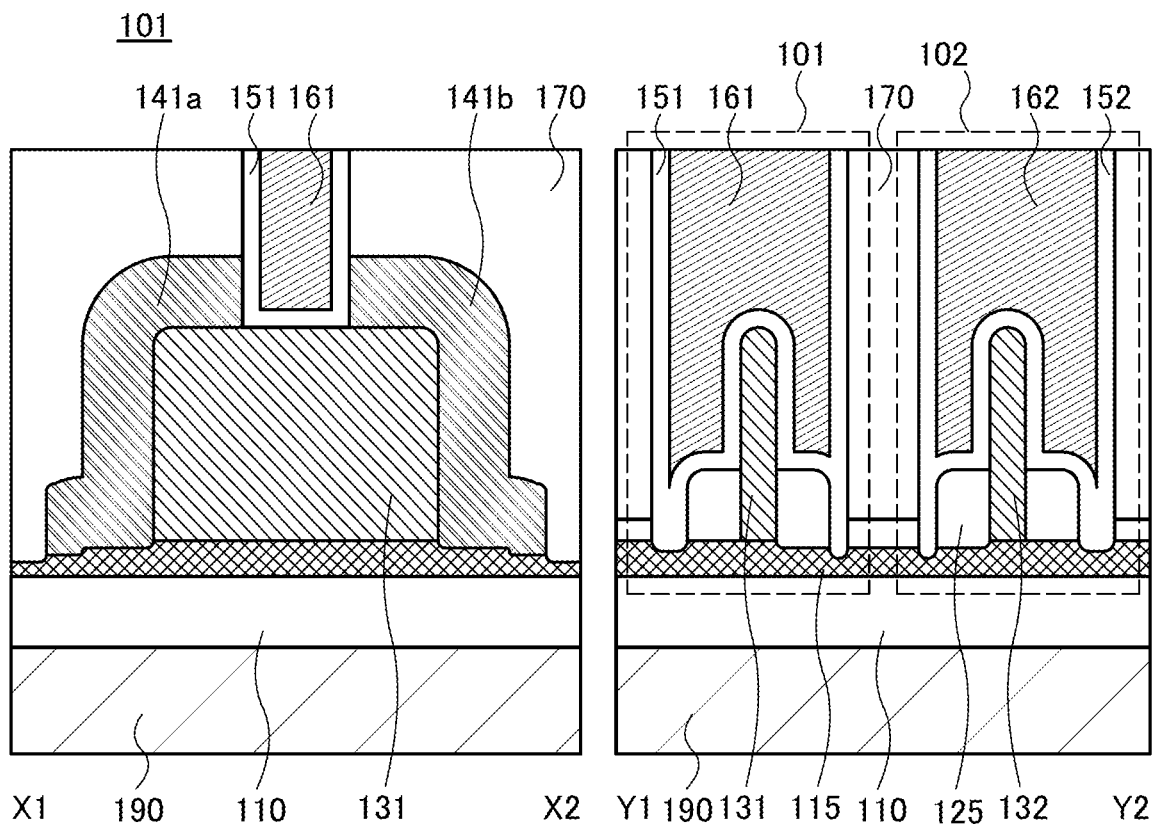
Figure 71A:
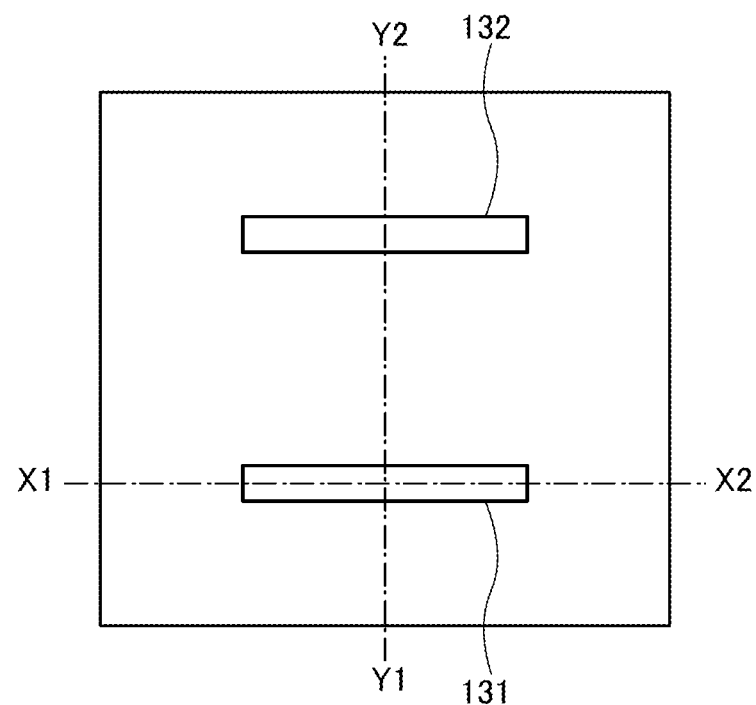
FIGS. 71A to 71C are a top view and cross-sectional views illustrating one embodiment of a method for manufacturing a semiconductor device.
Figure 71B:
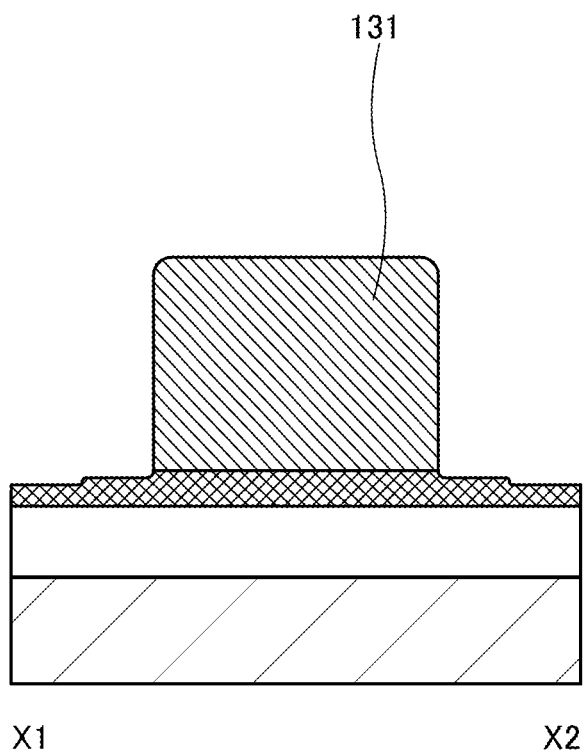
Figure 71C:
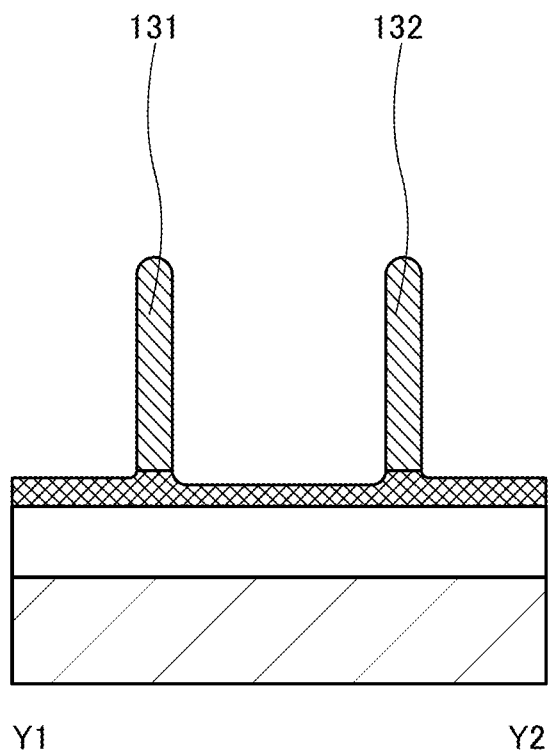

Next, the insulator 150A and the conductor 160A are formed over the oxide semiconductor 131 and the oxide semiconductor 132 as illustrated in FIGS. 69A to 69C. Then, unnecessary portions of the insulator 150A and the conductor 160A are removed to form an insulator 151, an insulator 152, a conductor 161, and a conductor 162 as illustrated in FIGS. 70A to 70C. Note that in this step, part of the insulator 150A and part of the conductor 160A may be removed by, for example, a CMP process until the insulator 170 is exposed. At that time, the insulator 170 can also be used as a stopper layer and the thickness of the insulator 170 is reduced in some cases.

Through the above-described steps, the transistor 101 and the transistor 102 illustrated in FIGS. 70A to 70C can be manufactured. The oxide semiconductor 131 and the oxide semiconductor 132 function as channel formation regions in the transistor 101 and the transistor 102, respectively. The conductor 141a, the conductor 141b, the conductor 142a, and the conductor 142b serve as source electrodes and drain electrodes. The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141a and the conductor 141b hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistors, a highly integrated semiconductor device in which variation in size and characteristics of the transistors is small can be provided.

Modification Example 18 of Semiconductor Device

Modification examples of the transistor 101 and the transistor 102 are described below with reference to FIGS. 71A to 71C, FIGS. 72A to 72C, FIGS. 73A to 73C, FIGS. 74A to 74C, FIGS. 75A to 75C, FIGS. 76A to 76C, and FIGS. 77A to 77C. Note that, for components denoted by the same reference numerals as those of the transistor 101 and the transistor 102 described in Method 6 for manufacturing semiconductor device, Method 6 for manufacturing semiconductor device can be referred to.

First, the insulator 110, the film 115, the insulator 120C, the insulator 125B, the oxide semiconductor 131, and the oxide semiconductor 132 are formed over the substrate 190 as illustrated in FIGS. 58A to 58C, FIGS. 59A to 59C, FIGS. 60A to 60C, FIGS. 61A to 61C, FIGS. 62A to 62C, and FIGS. 63 to 63C in Method 6 for manufacturing semiconductor device.

Next, the insulator 120C and the insulator 125B are removed by a process similar to that described in Method 6 for manufacturing semiconductor device to expose all the side surfaces of the oxide semiconductors 131 and 132. The film 115 can be used as a stopper film at that time, which facilitates the exposure of all the side surfaces of the oxide semiconductors 131 and 132. By exposing all the side surfaces of the oxide semiconductors 131 and 132 in this step, the region which faces the conductor 161 with the insulator 151, which is to be formed in a later step, positioned therebetween is enlarged, so that the region whose length serves as the channel length can be efficiently formed.

Figure 72A:
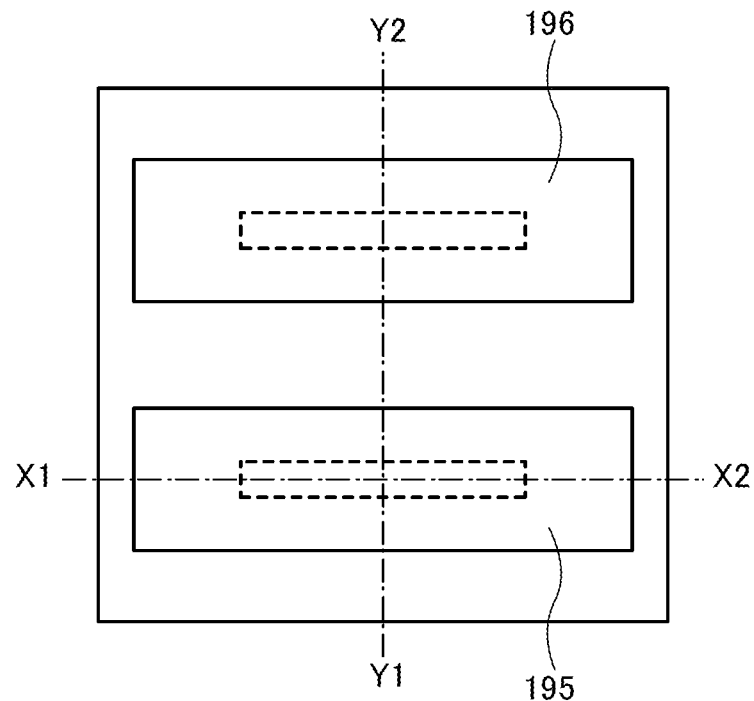
FIGS. 72A to 72C are a top view and cross-sectional views illustrating one embodiment of a method for manufacturing a semiconductor device.
Figure 72B:
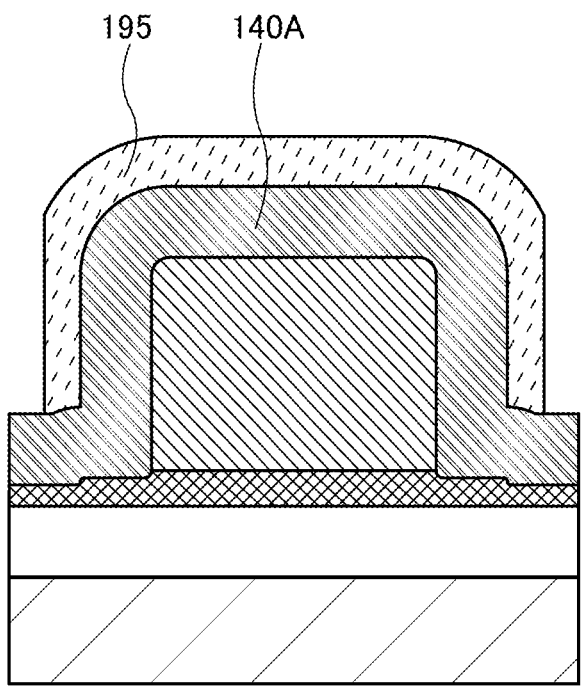
Figure 72C:
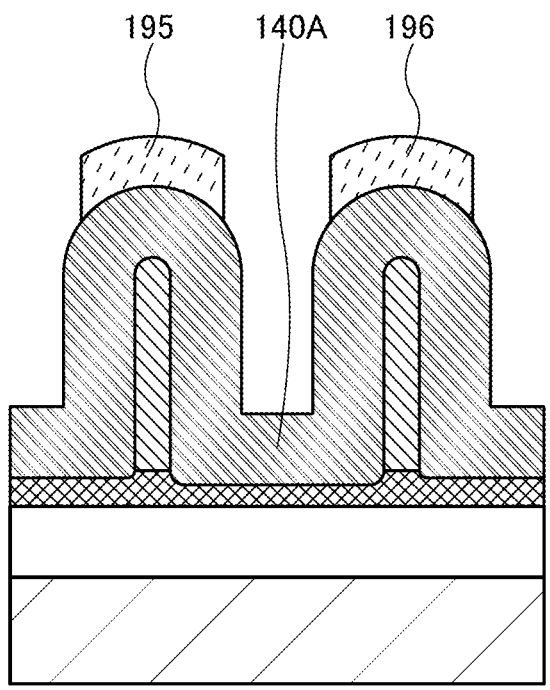
Figure 73A:
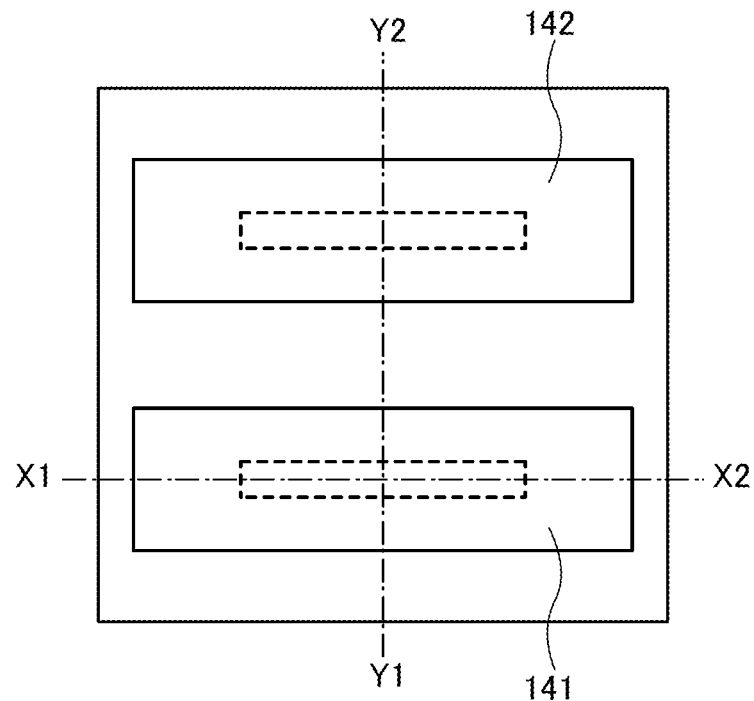
FIGS. 73A to 73C are a top view and cross-sectional views illustrating one embodiment of a method for manufacturing a semiconductor device.
Figure 73B:
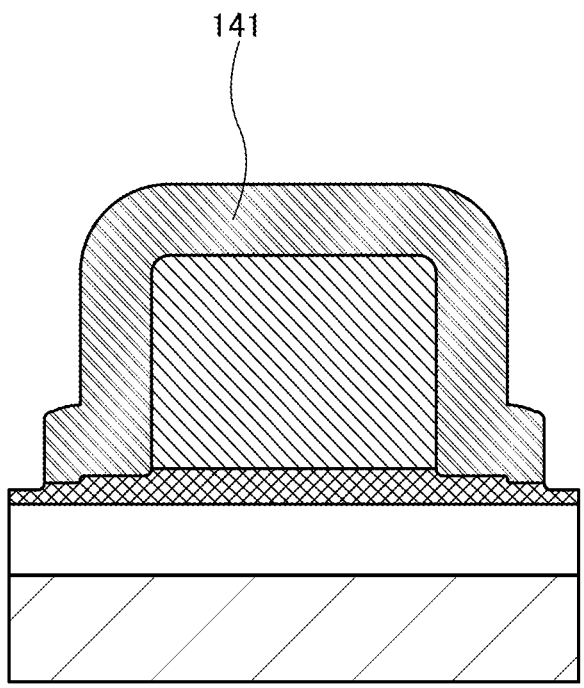
Figure 73C:
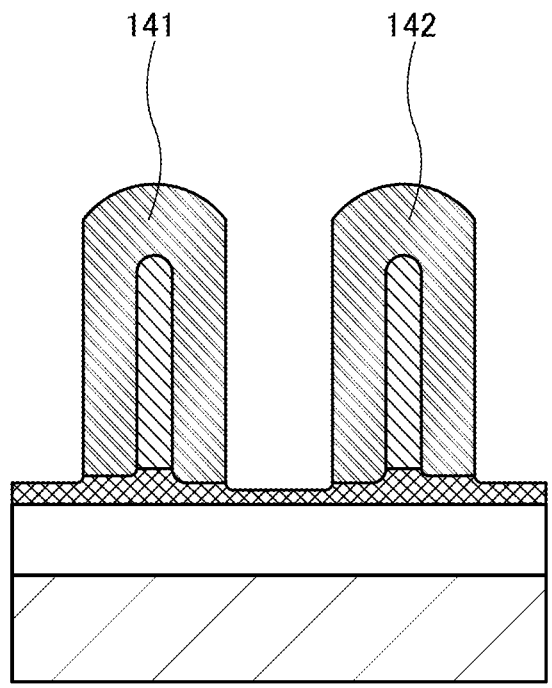

Next, the conductor 140A, the resist mask 195, and the resist mask 196 are formed over the oxide semiconductor 131 and the oxide semiconductor 132 as illustrated in FIGS. 72A to 72C. Then, an unnecessary portions of the conductor 140A is removed using the resist mask 195 and the resist mask 196, whereby the conductor 141 and the conductor 142 are formed as illustrated in FIGS. 73A to 73C. Here, the film 115 can be used as a stopper film.

Figure 74A:
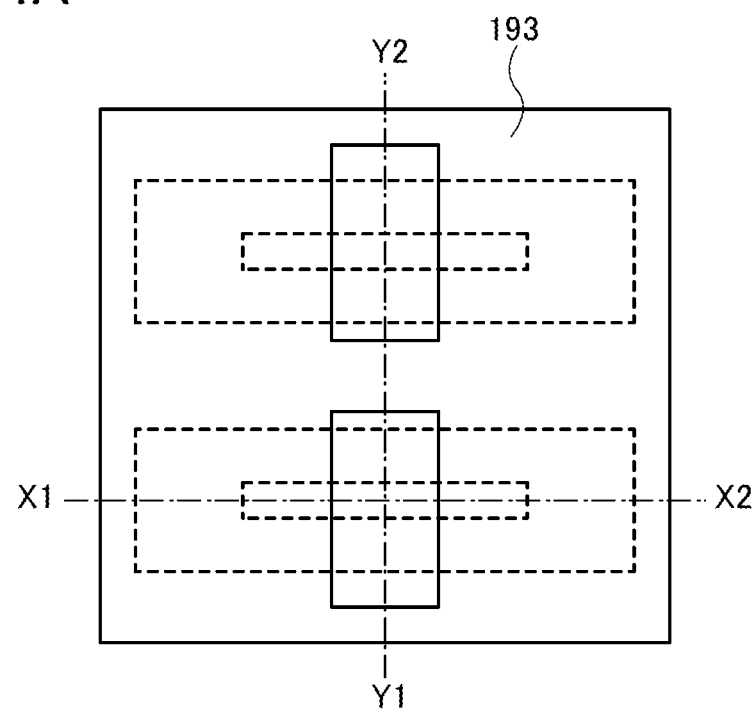
FIGS. 74A to 74C are a top view and cross-sectional views illustrating one embodiment of a method for manufacturing a semiconductor device.
Figure 74B:
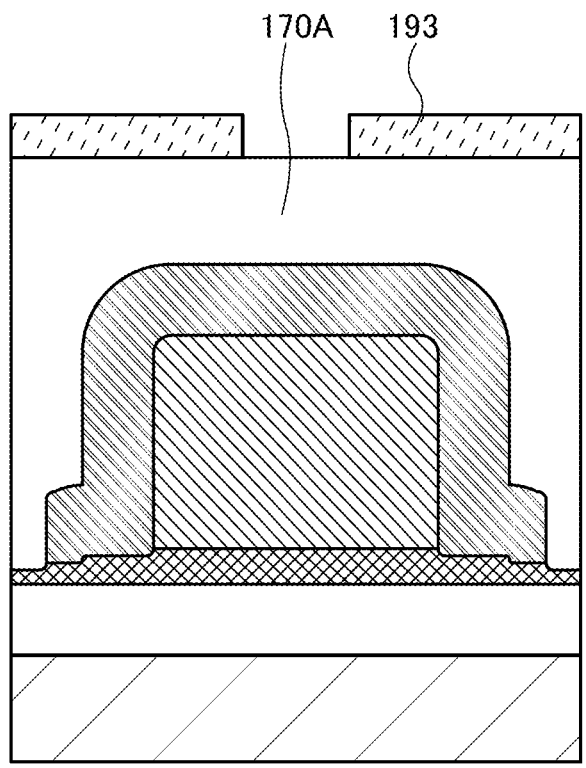
Figure 74C:
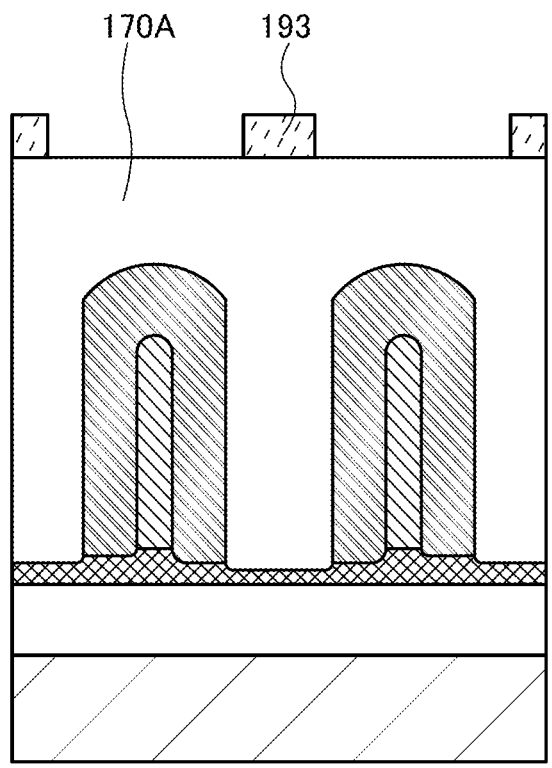
Figure 75A:
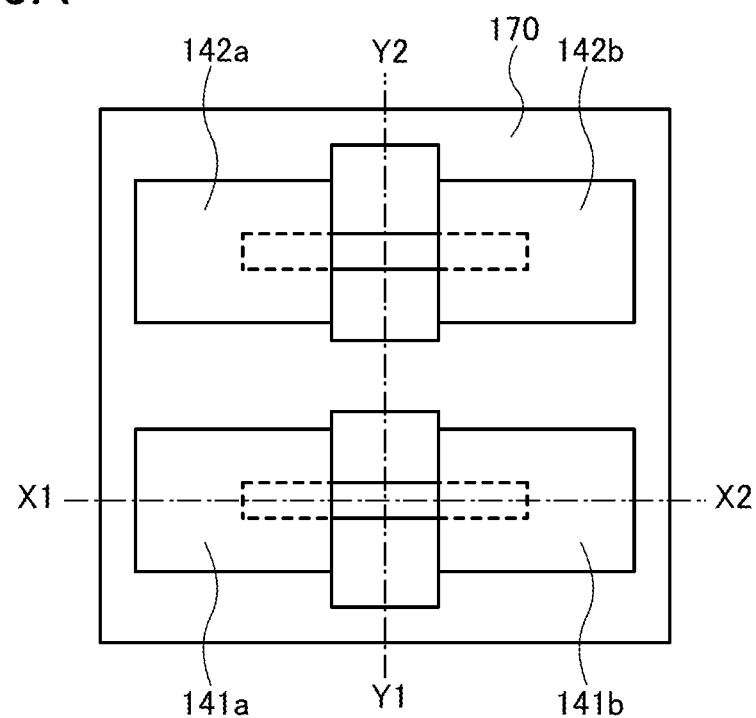
FIGS. 75A to 75C are a top view and cross-sectional views illustrating one embodiment of a method for manufacturing a semiconductor device.
Figure 75B:
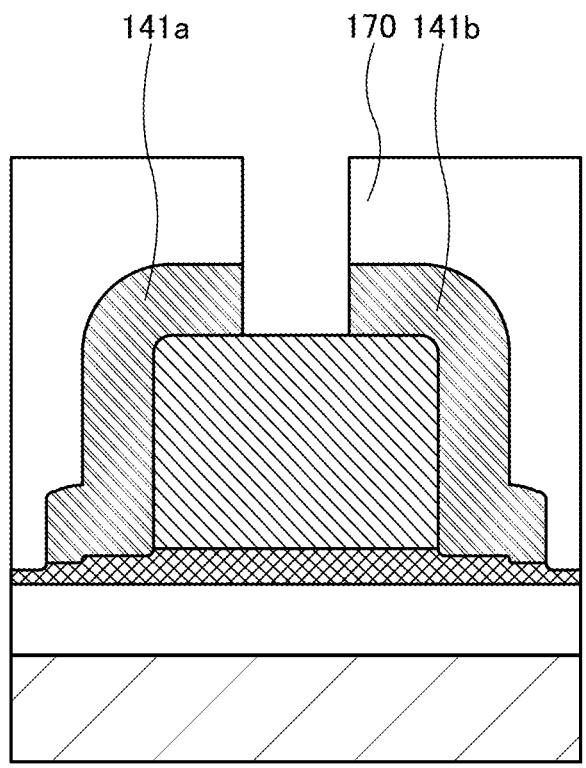
Figure 75C:
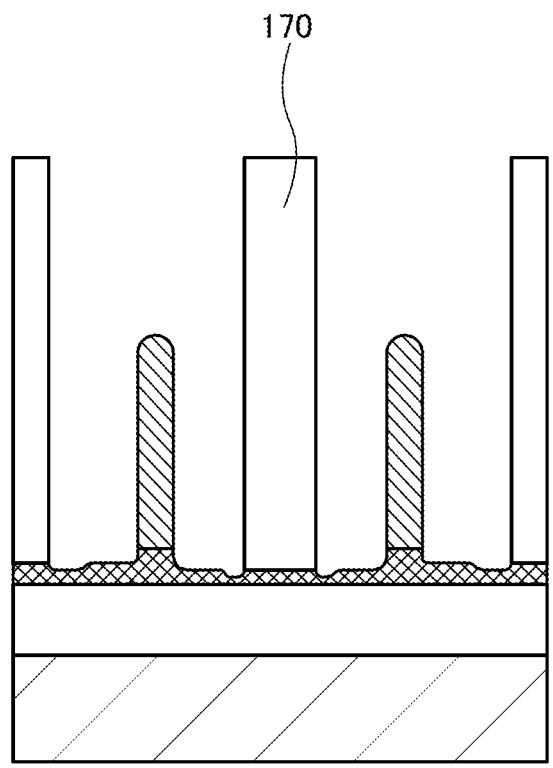

Next, the insulator 170A and the resist mask 193 are formed over the conductor 141 and the conductor 142 as illustrated in FIGS. 74A to 74C. Then, unnecessary portions of the insulator 170A, the conductor 141, and the conductor 142 are removed by using the resist mask 193, whereby the insulator 170, the conductor 141a, the conductor 141b, the conductor 142a, and the conductor 142b are formed as illustrated in FIGS. 75A to 75C.

Figure 76A:
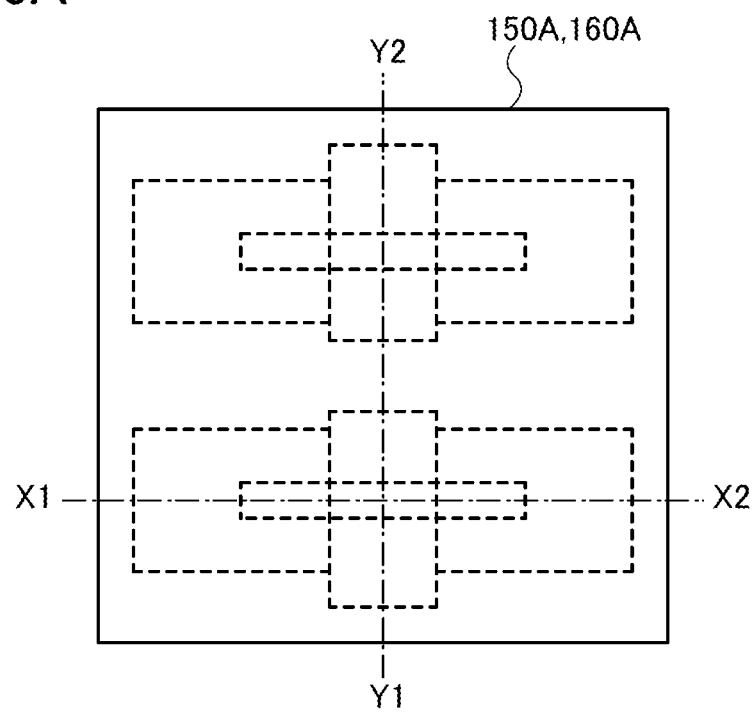
FIGS. 76A to 76C are a top view and cross-sectional views illustrating one embodiment of a method for manufacturing a semiconductor device.
Figure 76B:
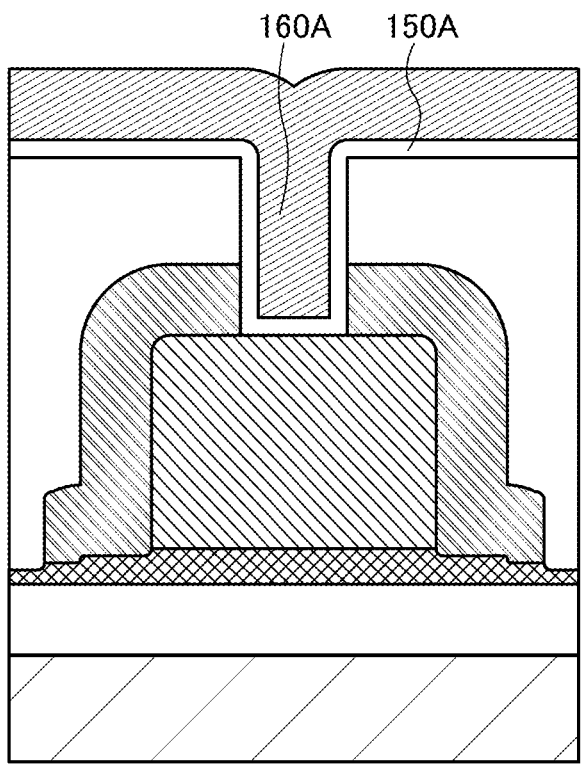
Figure 76C:
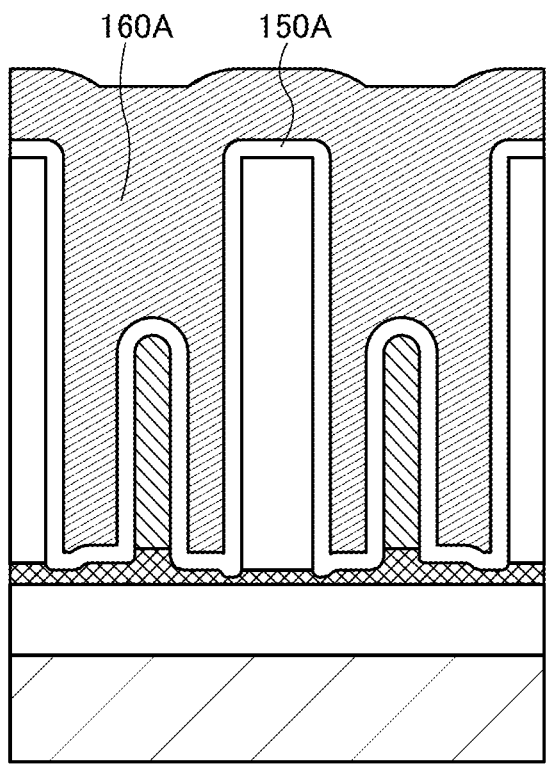
Figure 77A:
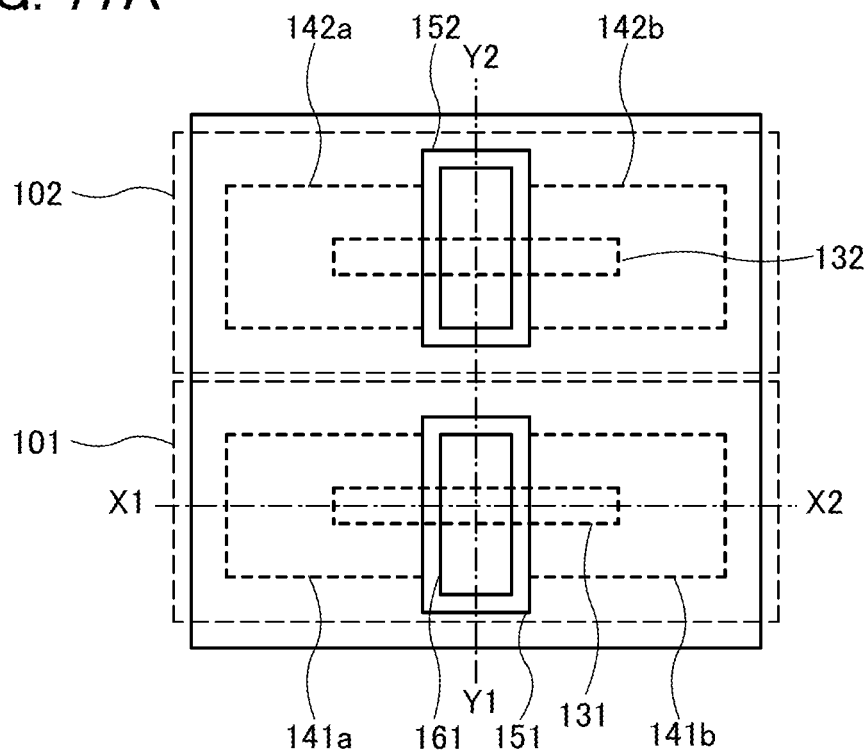
FIGS. 77A to 77C are a top view and cross-sectional views illustrating one embodiment of a semiconductor device.
Figure 77B:
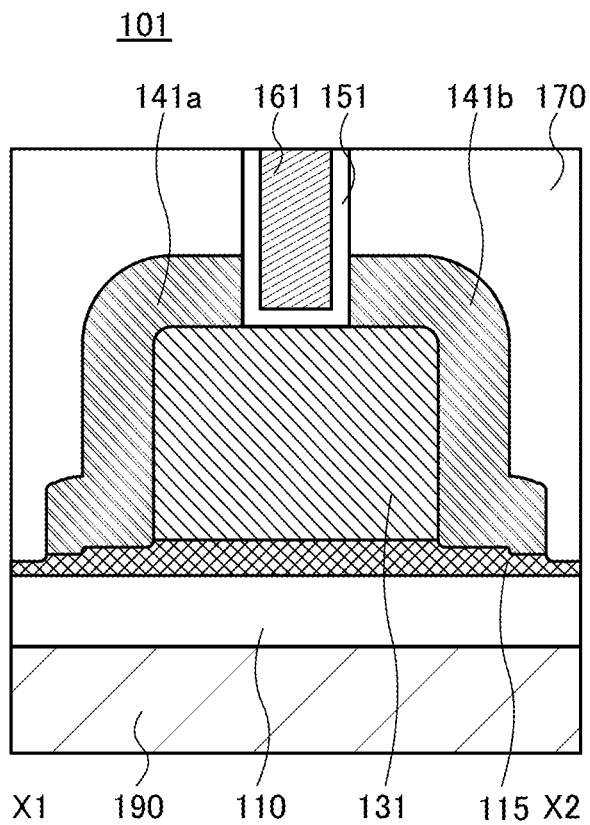
Figure 77C:
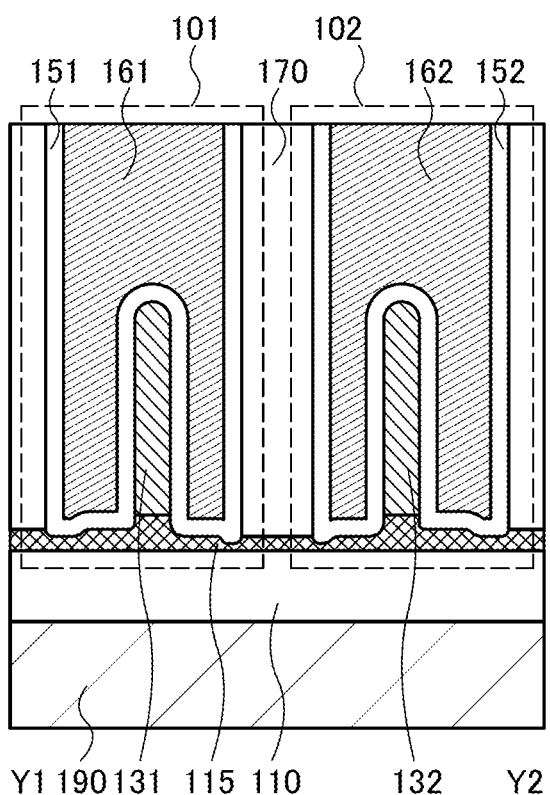

Next, the insulator 150A and the conductor 160A are formed over the oxide semiconductor 131 and the oxide semiconductor 132 as illustrated in FIGS. 76A to 76C. Then, unnecessary portions of the insulator 150A and the conductor 160A are removed to form the insulator 151, the insulator 152, the conductor 161, and the conductor 162 as illustrated in FIGS. 77A to 77C. Note that in this step, part of the insulator 150A and part of the conductor 160A may be removed by, for example, a CMP process until the insulator 170 is exposed. At that time, the insulator 170 can also be used as a stopper layer and the thickness of the insulator 170 is reduced in some cases.

Through the above-described steps, the transistor 101 and the transistor 102 illustrated in FIGS. 77A to 77C can be manufactured. The oxide semiconductor 131 and the oxide semiconductor 132 function as channel formation regions in the transistor 101 and the transistor 102, respectively. The conductor 141a, the conductor 141b, the conductor 142a, and the conductor 142b serve as source electrodes and drain electrodes. The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141a and the conductor 141b hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask.

When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistors, a highly integrated semiconductor device in which variation in size and characteristics of the transistors is small can be provided.

Modification Example 19 of Semiconductor Device

Modification examples of the transistor 101 and the transistor 102 are described below with reference to FIGS. 78A to 78C. Note that, for components denoted by the same reference numerals as those of the transistor 101 and the transistor 102 described in Method 6 for manufacturing semiconductor device, Method 6 for manufacturing semiconductor device can be referred to.

First, the insulator 110, the film 115, the insulator 120C, the insulator 125B, the oxide semiconductor 131, and the oxide semiconductor 132 are formed over the substrate 190 as illustrated in FIGS. 58A to 58C, FIGS. 59A to 59C, FIGS. 60A to 60C, FIGS. 61A to 61C, FIGS. 62A to 62C, and FIGS. 63 to 63C in Method 6 for manufacturing semiconductor device.

Next, the insulator 120C and insulator 125B are removed by a process similar to that described in Method 6 for manufacturing semiconductor device to expose all the side surfaces of the oxide semiconductors 131 and 132. At that time, the insulator 120B is removed so that the depth has a value obtained by adding at least the thickness of the insulator 150, which is to be formed later, to the height of the oxide semiconductor 130; as a result, the insulator 120 is formed. That is, in the completed transistor 101 illustrated in FIGS. 78A to 78C, the top surface and all the side surfaces of part of the oxide semiconductor 131 are covered with the conductor 161 with the insulator 151 positioned therebetween.

In this structure, the film 115 is preferably used as a stopper film. The use of the film 115 can prevent excess etching at the time of removing the insulator 120B so as not to etch a portion of the insulator 120B below the oxide semiconductor 131; accordingly, falling down of the oxide semiconductor 131 can be inhibited.

In the subsequent steps, the insulator 170, the conductor 141a, the conductor 141b, the conductor 142a, the conductor 142b, the insulator 151, the insulator 152, the conductor 161, and the conductor 162 are formed by steps similar to those described in Method 6 for manufacturing semiconductor device.

Figure 78A:
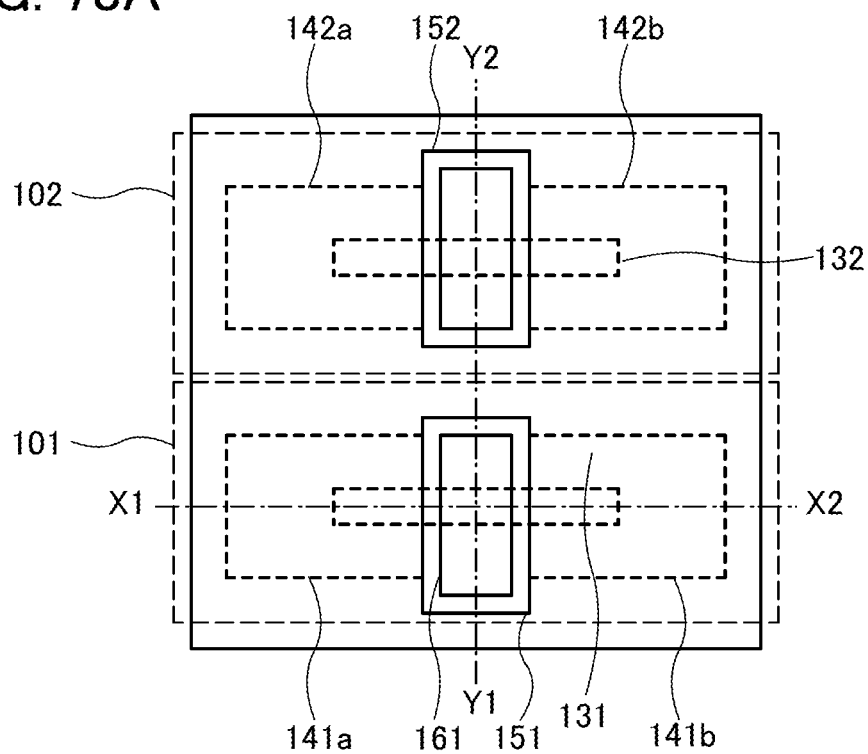
FIGS. 78A to 78C are a top view and cross-sectional views illustrating one embodiment of a semiconductor device.
Figure 78B:
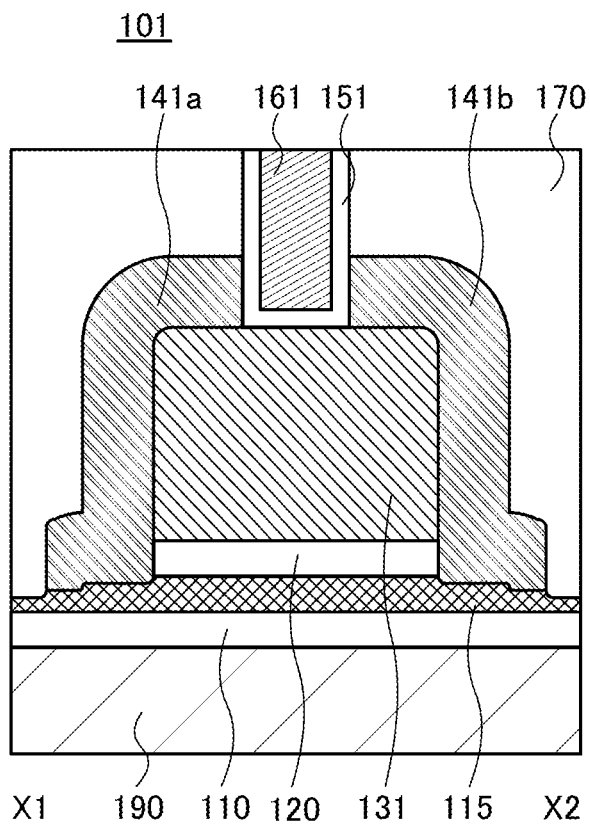
Figure 78C:
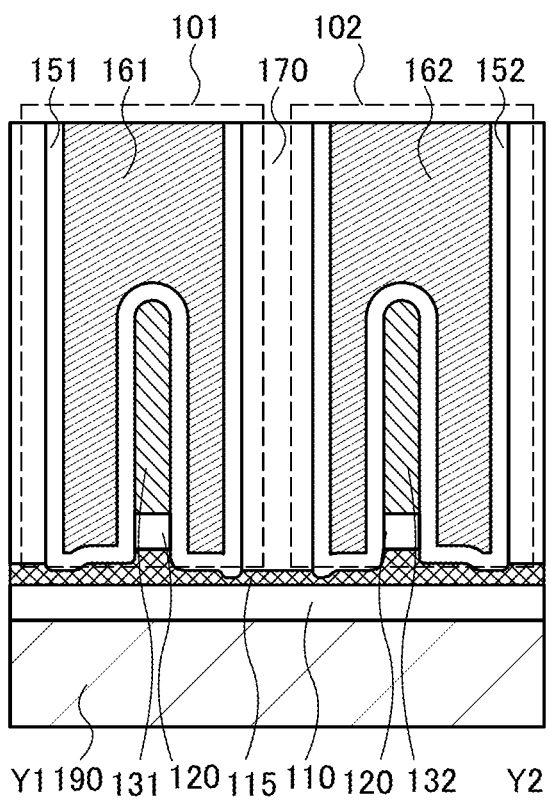

Through the above-described steps, the transistor 101 and the transistor 102 illustrated in FIGS. 78A to 78C can be manufactured. The oxide semiconductor 131 and the oxide semiconductor 132 function as channel formation regions in the transistor 101 and the transistor 102, respectively. The conductor 141a, the conductor 141b, the conductor 142a, and the conductor 142b serve as source electrodes and drain electrodes. The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, the width of the oxide semiconductor 130 can be adjusted by changing the thickness of the oxide semiconductor 130 regardless of the size of the opening. Thus, a miniaturized transistor can be provided easily.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141a and the conductor 141b hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistors, a highly integrated semiconductor device in which variation in size and characteristics of the transistors is small can be provided.

Modification Example 20 of Semiconductor Device

Modification examples of the transistor 101 and the transistor 102 are described below with reference to FIGS. 79A to 79C. Note that, for components denoted by the same reference numerals as those of the transistor 101 and the transistor 102 described in Method 6 for manufacturing semiconductor device, Method 6 for manufacturing semiconductor device can be referred to.

First, the oxide semiconductor 130a is formed over the insulator 110, and the insulator 120A is formed over the oxide semiconductor 130a. Note that the oxide semiconductor 130a can be formed by a step similar to that for forming the oxide semiconductor 130A.

Then, an unnecessary portion of the insulator 120A is removed by using a resist mask to expose the oxide semiconductor 130a. At that time, the oxide semiconductor 130a also functions as a stopper film. The use of the oxide semiconductor 130a as a stopper film can reduce variation in the height of the opening. The uniform shape of the opening can reduce the variation in the size of the oxide semiconductor to be formed in a later step, resulting in a highly reliable transistor.

Next, the oxide semiconductor 130B is formed in the opening formed in the insulator 120A. That is, the oxide semiconductor 130B is formed in contact with the oxide semiconductor 130a. Accordingly, the oxide semiconductor 130B contains a smaller amount of impurities than the oxide semiconductor 130a and can prevent diffusion of impurities from layers below the oxide semiconductor 130B. Note that the oxide semiconductor 130B can be formed by a process similar to that for forming the oxide semiconductor 130A.

Next, by steps similar to those described in Method 6 for manufacturing semiconductor device, the insulator 125A is formed and then unnecessary portions of the insulators 120B and 125A are removed, whereby the insulator 120C, the insulator 125B, an oxide semiconductor 131b, and an oxide semiconductor 132b are formed.

Next, unnecessary portions of the insulators 120C and 125B are removed by a step similar to that described in Method 6 for manufacturing semiconductor device, whereby the side surfaces of the oxide semiconductors 131b and 132b are exposed. At that time, part of the oxide semiconductor 131b and part of the oxide semiconductor 132b are embedded in the insulator 125, which prevents the oxide semiconductor 131 and the oxide semiconductor 132 to fall down in a later step.

Subsequently, the conductor 140a, the conductor 140b, and the insulator 170 having an opening are formed by steps similar to those described in Method 6 for manufacturing semiconductor device.

Then, the oxide semiconductor 130C that is to be the oxide semiconductor 130c, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130a, the oxide semiconductor 131b, and the oxide semiconductor 132b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 132b and the oxide semiconductor 131b where the channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductors 131b and 132b.

That is, when the oxide semiconductor 130C with a small thickness is formed over the oxide semiconductor 131b and the oxide semiconductor 132b, diffusion of impurities from layers over the oxide semiconductors 131 and 132 into the oxide semiconductors 131b and 132b can be prevented. By using transistors formed so that the oxide semiconductors 131b and 132b with reduced impurities serve as channel formation regions, a highly reliable semiconductor device can be achieved.

Next, in a manner to similar to that in Method 6 for manufacturing semiconductor device, part of the conductor 160A, part of the insulator 150A, and part of the oxide semiconductor 130C are removed by a CMP process or the like until the insulator 170 is exposed, whereby an oxide semiconductor 131c, an oxide semiconductor 132c, the insulator 151, the insulator 152, the conductor 161, and the conductor 162 are formed. At that time, the insulator 170 can be used as a stopper layer and the thickness of the insulator 170 is reduced in some cases.

Figure 79A:
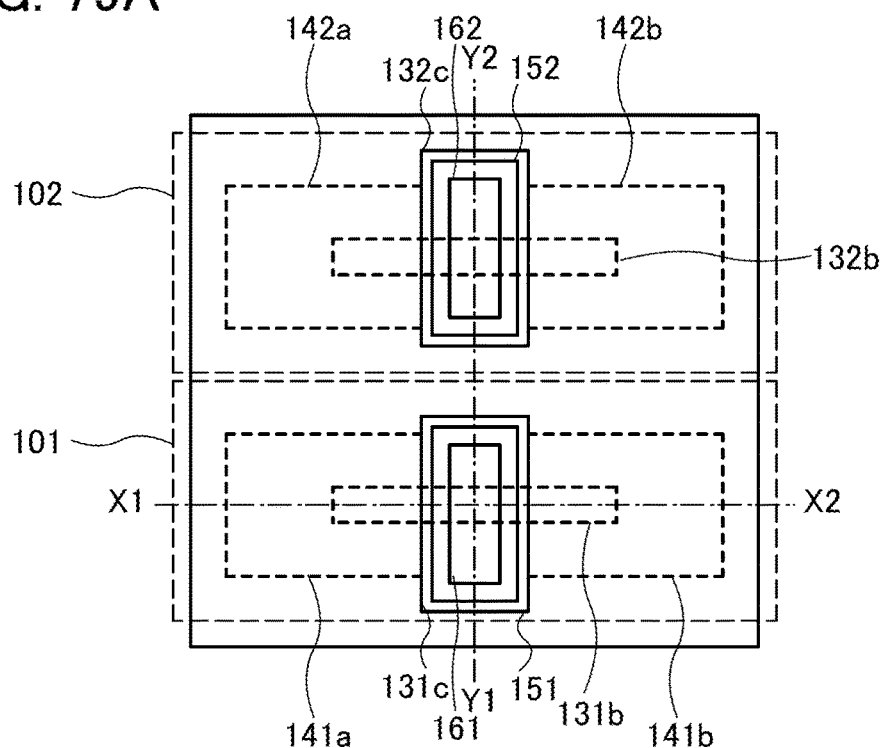
FIGS. 79A to 79C are a top view and cross-sectional views illustrating one embodiment of a semiconductor device.
Figure 79B:
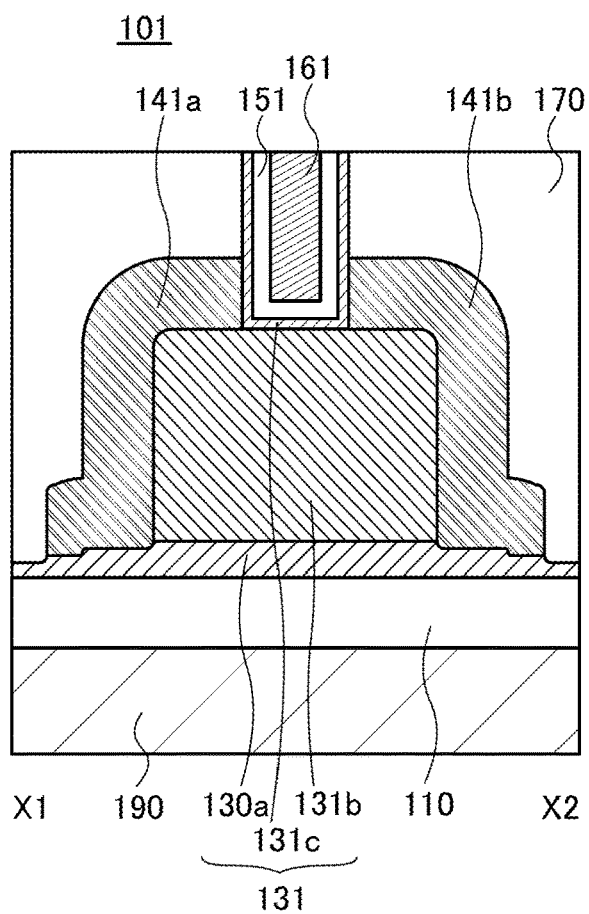
Figure 79C:
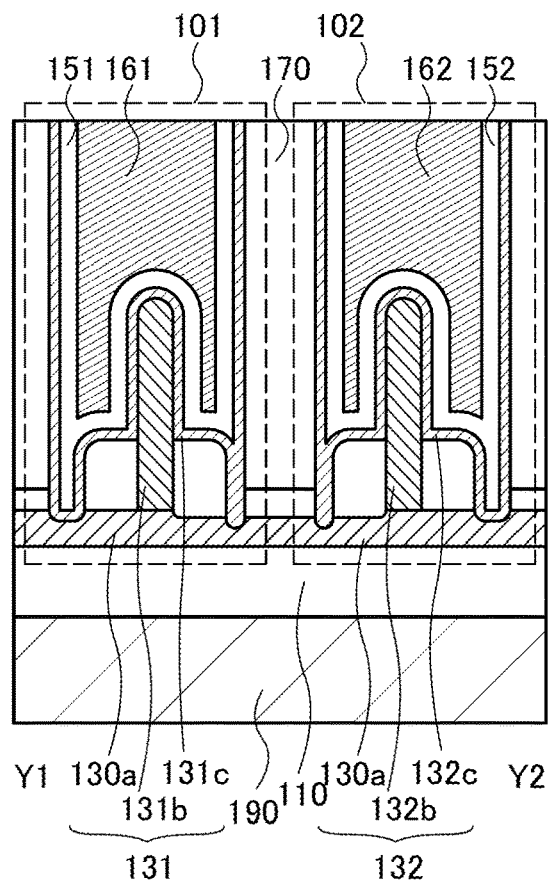

Through the above-described steps, the transistor 101 and the transistor 102 illustrated in FIGS. 79A to 79C can be manufactured. The oxide semiconductor 131 and the oxide semiconductor 132 function as channel formation regions in the transistor 101 and the transistor 102, respectively. The conductor 141a, the conductor 141b, the conductor 142a, and the conductor 142b serve as source electrodes and drain electrodes. The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141a and the conductor 141b hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistors, a highly integrated semiconductor device in which variation in size and characteristics of the transistors is small can be provided.

Modification Example 21 of Semiconductor Device

Modification examples of the transistor 101 and the transistor 102 are described below with reference to FIGS. 80A to 80C. Note that, for components denoted by the same reference numerals as those of the transistor 101 and the transistor 102 described in Method 6 for manufacturing semiconductor device, Method 6 for manufacturing semiconductor device can be referred to.

First, by steps similar to those described in Method 6 for manufacturing semiconductor device, the insulator 110, the oxide semiconductor 130a, the oxide semiconductor 131b, the oxide semiconductor 132b, the insulator 120C, and the insulator 125B are formed over the substrate 190.

Next, unnecessary portions of the insulator 120C and the insulator 125B are removed by a process similar to that described in Method 6 for manufacturing semiconductor device to expose all the side surfaces of the oxide semiconductors 131*b* and 132*b*. The oxide semiconductor 130*a* can be used as a stopper film at that time, which facilitates the exposure of all the side surfaces of the oxide semiconductors 131*b* and 132*b*. By exposing all the side surfaces of the oxide semiconductors 131*b* and 132*b* in this step, the region which faces the conductor 160 with the insulator 150, which is to be formed in a later step, positioned therebetween is enlarged, so that the region whose length serves as the channel length can be efficiently formed.

Subsequently, the conductor 140*a*, the conductor 140*b*, and the insulator 170 having an opening are formed by steps similar to those described in Method 6 for manufacturing semiconductor device.

Then, the oxide semiconductor 130C that is to be the oxide semiconductor 130*c*, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130*a*, the oxide semiconductor 131*b*, and the oxide semiconductor 132*b*. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 132*b* and the oxide semiconductor 131*b* where the channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductors 131*b* and 132*b*.

That is, when the oxide semiconductor 130C with a small thickness is formed over the oxide semiconductor 131*b* and the oxide semiconductor 132*b*, diffusion of impurities from layers over the oxide semiconductors 131 and 132 into the oxide semiconductors 131*b* and 132*b* can be prevented. By using transistors formed so that the oxide semiconductors 131*b* and 132*b* with reduced impurities serve as channel formation regions, a highly reliable semiconductor device can be achieved.

Next, in a manner to similar to that in Method 6 for manufacturing semiconductor device, part of the conductor 160A, part of the insulator 150A, and part of the oxide semiconductor 130C are removed by a CMP process or the like until the insulator 170 is exposed, whereby an oxide semiconductor 131*c*, an oxide semiconductor 132*c*, the insulator 151, the insulator 152, the conductor 161, and the conductor 162 are formed. At that time, the insulator 170 can be used as a stopper layer and the thickness of the insulator 170 is reduced in some cases.

Figure 80A:
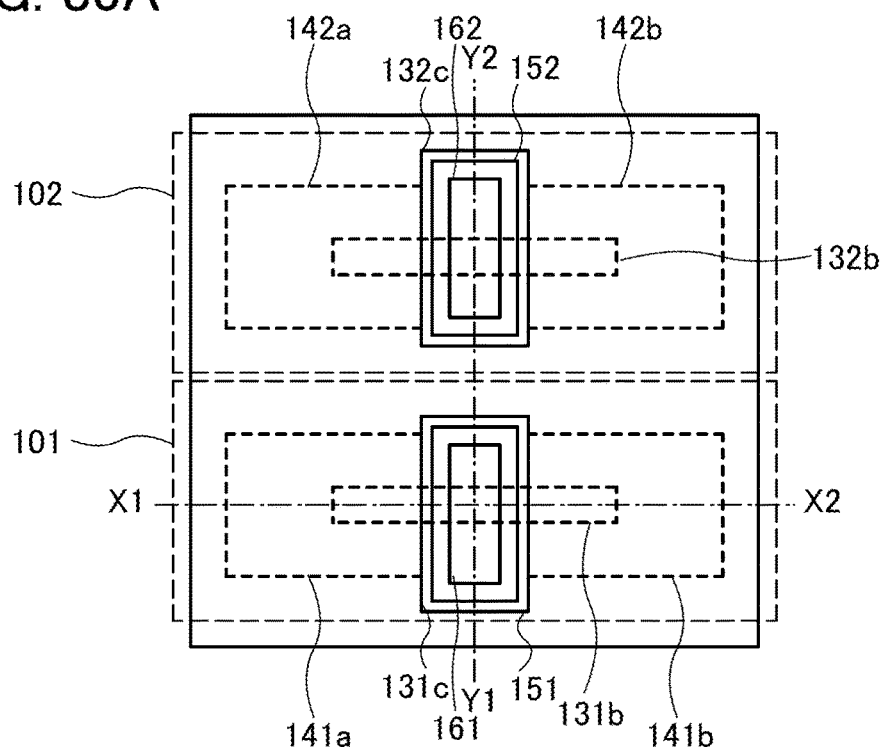
FIGS. 80A to 80C are a top view and cross-sectional views illustrating one embodiment of a semiconductor device.
Figure 80B:
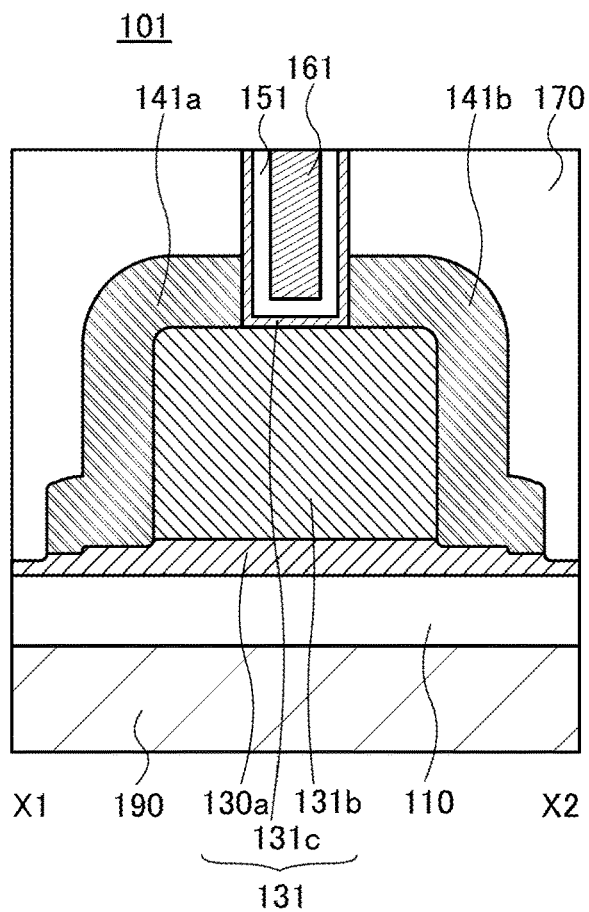
Figure 80C:
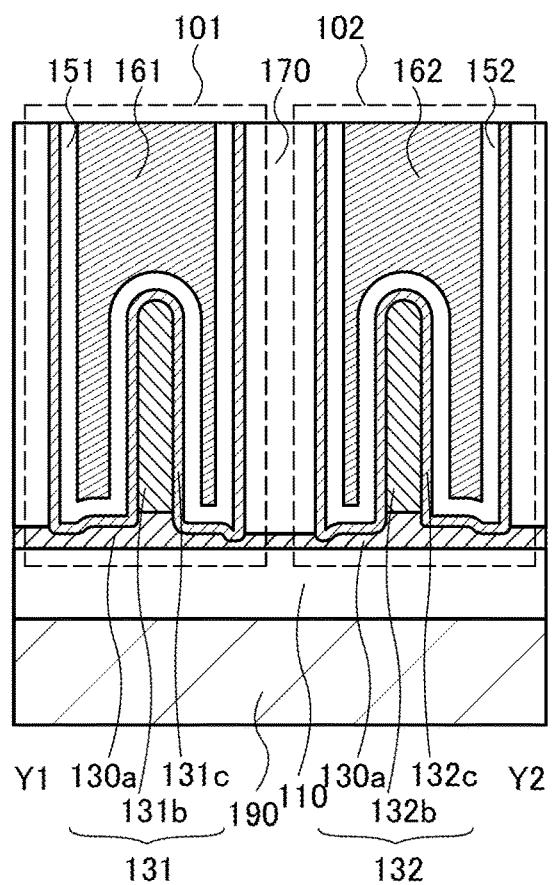

Through the above-described steps, the transistor 101 and the transistor 102 illustrated in FIGS. 80A to 80C can be manufactured. The oxide semiconductor 131 and the oxide semiconductor 132 function as channel formation regions in the transistor 101 and the transistor 102, respectively. The conductor 141*a*, the conductor 141*b*, the conductor 142*a*, and the conductor 142*b* serve as source electrodes and drain electrodes.

The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141*a* and the conductor 141*b* hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistors, a highly integrated semiconductor device in which variation in size and characteristics of the transistors is small can be provided.

Modification Example 22 of Semiconductor Device

Modification examples of the transistor 101 and the transistor 102 are described below with reference to FIGS. 81A to 81C. Note that, for components denoted by the same reference numerals as those of the transistor 101 and the transistor 102 described in Method 6 for manufacturing semiconductor device, Method 6 for manufacturing semiconductor device can be referred to.

First, by steps similar to those described in Method 6 for manufacturing semiconductor device, the insulator 110, an oxide semiconductor 131a, the oxide semiconductor 131b, an oxide semiconductor 132a, the oxide semiconductor 132b, the insulator 120C, and the insulator 125B are formed over the substrate 190.

Next, unnecessary portions of the insulator 120C and the insulator 125B are removed by a process similar to that described in Method 6 for manufacturing semiconductor device to expose all the side surfaces of the oxide semiconductors 131a, 131b, 132a, and 132b. At that time, part of the insulator 110 is removed so that the depth has a value greater than or equal to the sum of the height of the oxide semiconductor 131b and the thickness of the insulator 150 that is to be formed later. That is, in the completed transistor 101 illustrated in FIGS. 81A to 81C, the top and side surfaces of part of the oxide semiconductor 131b are covered with the conductor 161 with the insulator 151 positioned therebetween.

In this structure, when the thickness of the oxide semiconductor 131a is greater than the total thickness of the oxide semiconductor 131c and the insulator 151, the insulator 110 can be used as a stopper film. The use of the insulator 110 as a stopper film can prevent excess etching so as not to etch the insulator below the oxide semiconductors 131 and 132 at the time of exposing the side surfaces of the oxide semiconductor 131b; as a result, falling down of the oxide semiconductors 131 and 132 can be inhibited.

Subsequently, the conductor 140a, the conductor 140b, and the insulator 170 having an opening are formed by steps similar to those described in Method 6 for manufacturing semiconductor device.

Then, the oxide semiconductor 130C that is to be the oxide semiconductor 130c, the insulator 150A that is to be the insulator 150, and the conductor 160A that is to be the conductor 160 are formed in the opening formed in the insulator 170.

The oxide semiconductor 130C can be formed in a similar manner to that of the oxide semiconductor 130a, the oxide semiconductor 131b, and the oxide semiconductor 132b. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, further preferably less than or equal to 5 nm. Meanwhile, the oxide semiconductor 130C has a function of blocking entry of elements other than oxygen (such as hydrogen and silicon) included in the adjacent insulator into the oxide semiconductor 132b and the oxide semiconductor 131b where the channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, further preferably greater than or equal to 2 nm. The oxide semiconductor 130C preferably has an oxygen blocking property to prevent outward diffusion of oxygen released from the substrate 190, or an insulator or the like between the substrate 190 and the oxide semiconductors 131b and 132b.

That is, when the oxide semiconductor 130c with a small thickness is formed over the oxide semiconductor 131b and the oxide semiconductor 132b, diffusion of impurities from layers over the oxide semiconductor 130 into the oxide semiconductor 130b can be prevented. By using transistors formed so that the oxide semiconductor 131b and the oxide semiconductor 132b with reduced impurities serve as channel formation regions, a highly reliable semiconductor device can be achieved.

Next, in a manner to similar to that in Method 6 for manufacturing semiconductor device, part of the conductor 160A, part of the insulator 150A, and part of the oxide semiconductor 130C are removed by a CMP process or the like until the insulator 170 is exposed, whereby an oxide semiconductor 131c, an oxide semiconductor 132c, the insulator 151, the insulator 152, the conductor 161, and the conductor 162 are formed. At that time, the insulator 170 can be used as a stopper layer and the thickness of the insulator 170 is reduced in some cases.

Figure 81A:
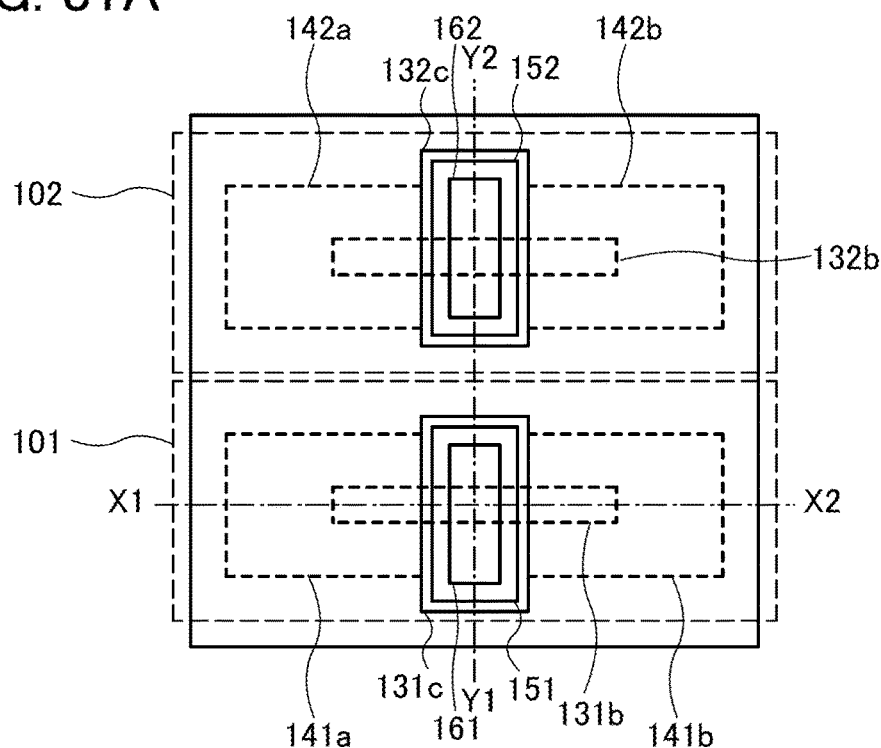
FIGS. 81A to 81C are a top view and cross-sectional views illustrating one embodiment of a semiconductor device.
Figure 81B:
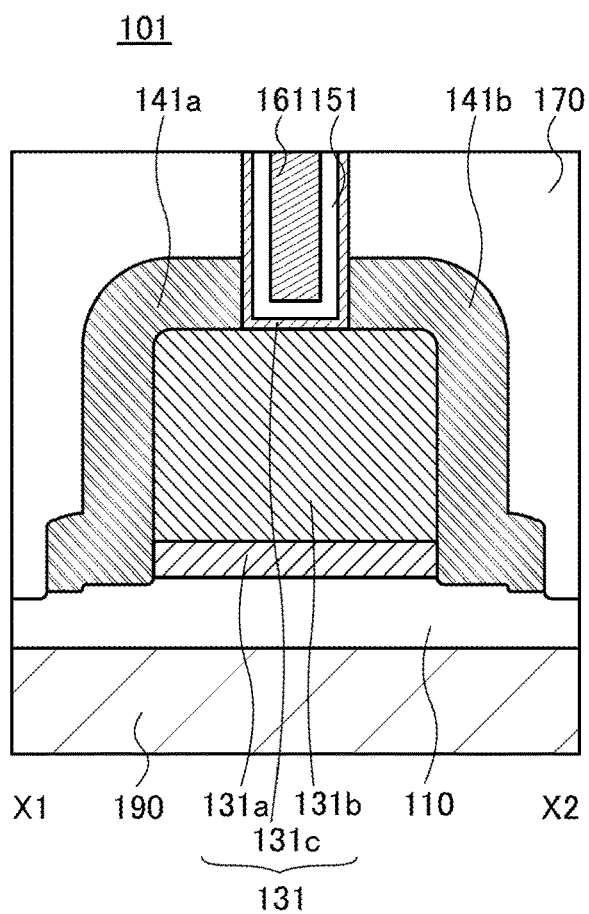
Figure 81C:
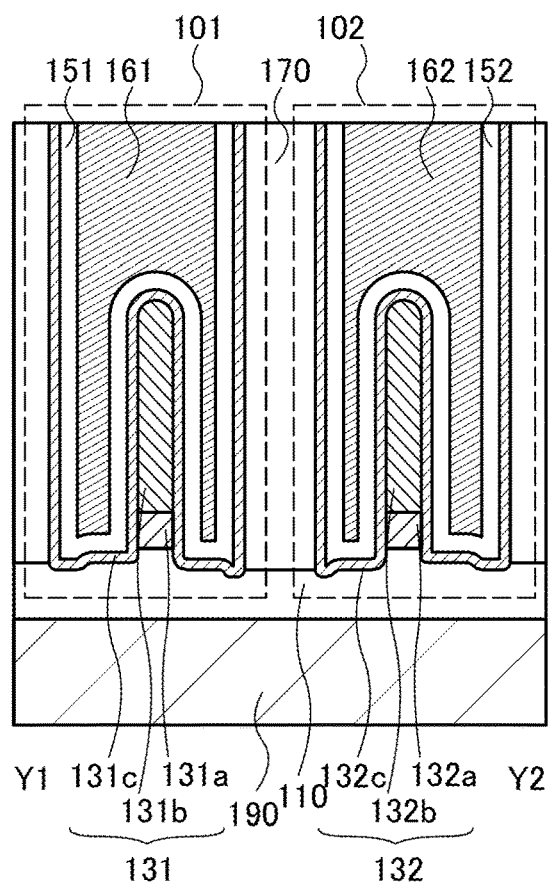

Through the above-described steps, the transistor 101 and the transistor 102 illustrated in FIGS. 81A to 81C can be manufactured. The oxide semiconductor 131 and the oxide semiconductor 132 function as channel formation regions in the transistor 101 and the transistor 102, respectively. The conductor 141a, the conductor 141b, the conductor 142a, and the conductor 142b serve as source electrodes and drain electrodes. The insulator 151 and the insulator 152 each function as a gate insulator. The conductor 161 and the conductor 162 each function as a gate electrode.

In this structure, the widths of the oxide semiconductors 131 and 132 can be adjusted by changing the thicknesses of the oxide semiconductors 131 and 132 regardless of the size of the opening. Thus, a miniaturized transistor can be provided easily.

In the transistor 101, in some cases, the channel is formed in a region of the oxide semiconductor 131 which faces or overlaps with the conductor 161 with the insulator 151 positioned therebetween. In this structure, the channel formation region of the oxide semiconductor 131 is surrounded by the conductor 161 with the insulator 151 positioned therebetween.

In this structure, an electric field can be applied to at least the three sides of a region of the oxide semiconductor 131 where the channel is formed, owing to the electric field generated from the conductor 161. Accordingly, a large current can flow between the source and drain of the transistor having this structure, so that the on-state current can be increased. In addition, the electric field is applied to at least the three sides of the region where the channel is formed, which makes it possible to provide a transistor whose leakage current due to a punch-through phenomenon is reduced.

Note that as the side surface of the oxide semiconductor 131 which faces the conductor 161 with the insulator 151 positioned therebetween is enlarged, the channel formation region is enlarged, and the on-state current of the transistor can be increased. In addition, as the width of the channel formation region in the oxide semiconductor 131 is reduced, the proportion of a region with a high carrier controllability increases, leading to a smaller subthreshold swing value.

Accordingly, the channel formation region can be formed over a wide area of the side surface of the oxide semiconductor 131, resulting in a transistor with a small subthreshold swing value and favorable on-state characteristics. In addition, for example, the height of the oxide semiconductor 131 may be greater than or equal to 10 nm, preferably greater than or equal to 20 nm, further preferably greater than or equal to 30 nm, still further preferably greater than or equal to 50 nm. Note that the height of the oxide semiconductor 131 is set to, for example, less than or equal to 300 nm, preferably less than or equal to 200 nm, and further preferably less than or equal to 150 nm because the productivity of the semiconductor device might be decreased.

This structure is suitable for a miniaturized transistor because a high on-state current can be obtained. A semiconductor device including the miniaturized transistor can have a high integration degree and high density. For example, in the transistor, the channel length is preferably less than or equal to 40 nm, further preferably less than or equal to 30 nm, still further preferably less than or equal to 20 nm and the channel width is preferably less than or equal to 40 nm, further preferably less than or equal to 30 nm, still further preferably less than or equal to 20 nm.

Since the transistor 101 has a structure in which the conductor 141a and the conductor 141b hardly overlap with the conductor 161, the parasitic capacitance relating to the conductor 161 can be reduced. That is, the transistor 101 has a high operation frequency.

Note that the transistor 102 has an effect similar to that of the transistor 101 because the transistor 102 is axisymmetric with the transistor 101.

In the case where an In—Sn—Zn—O film which is a hardly-etched material is used as the oxide semiconductor, the resist mask might disappear at the time of etching depending on the etching condition. Furthermore, it is difficult to etch the hardly-etched material without residue, which makes microfabrication difficult. Thus, the oxide semiconductor is formed in the opening formed in the insulator, whereby a minute island-shaped oxide semiconductor can be formed without a resist mask. When the insulator exiting in the periphery portion of the oxide semiconductor is removed, the island-shaped oxide semiconductor is exposed, which prevents generation of a residue or an etching residue of the oxide semiconductor.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 7

Structural Example 3 of Semiconductor Device

Figure 82A:
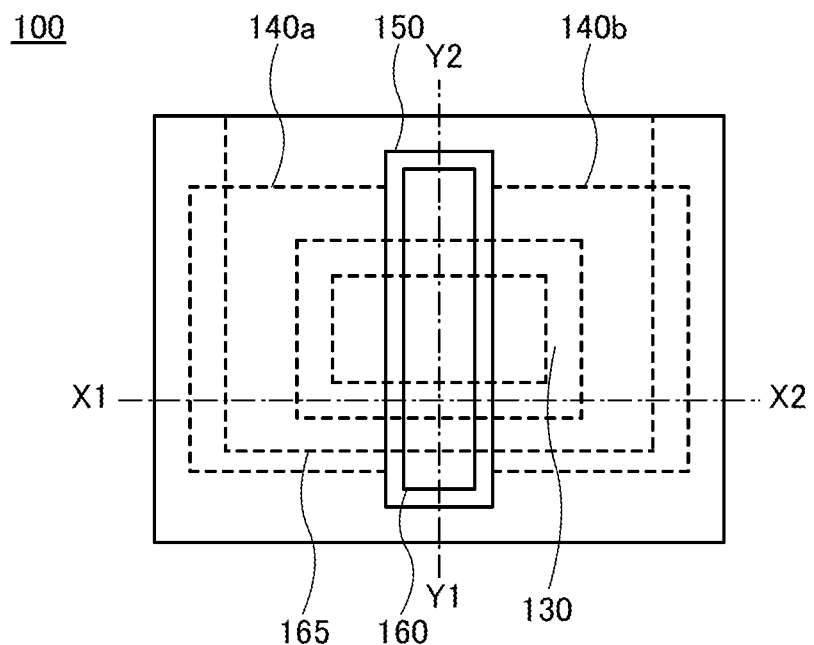
FIGS. 82A to 82C are a top view and cross-sectional views illustrating one embodiment of a semiconductor device.
Figure 82B:
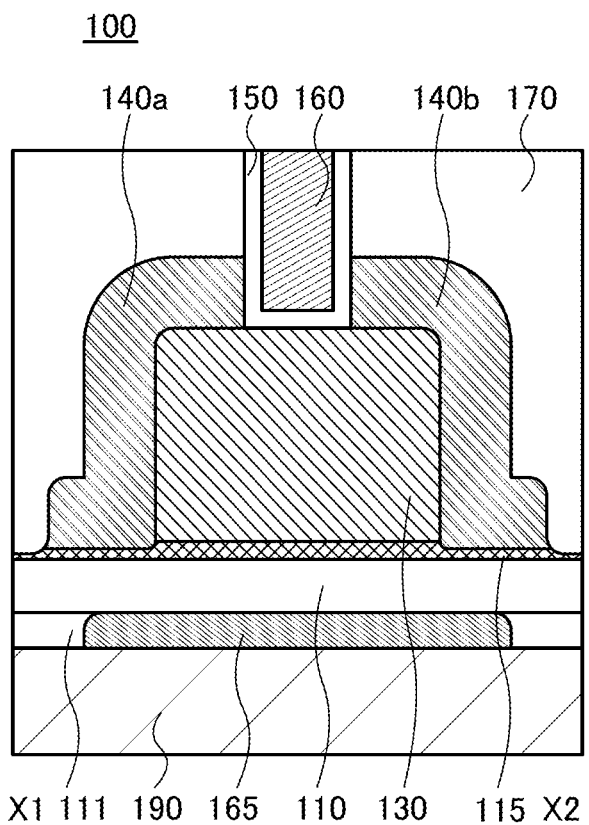
Figure 82C:
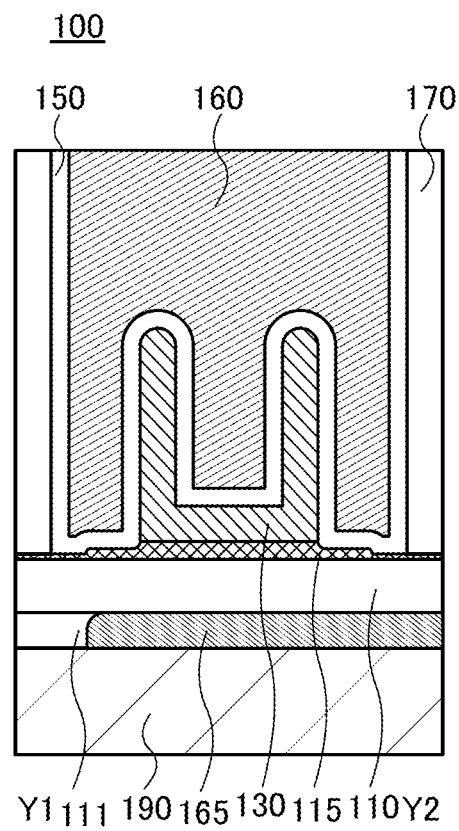

In this embodiment, a structure of the transistor 100 is described with reference to FIGS. 82A and 82B. Note that FIG. 82A is an example of a top view. FIG. 82B is a cross-sectional view taken along dashed-dotted line X1-X2 in FIG. 82A, and FIG. 82C is a cross-sectional view take along dashed-dotted line Y1-Y2 in FIG. 82A. Note that the components having a function similar to that of the transistor 100 in Embodiment 1 are denoted by the same reference numerals as those in the transistor 100 in Embodiment 1, and the transistor in Embodiment 1 can be referred to.

The transistor of one embodiment of the present invention may include a conductor 165 between the substrate 190 and the oxide semiconductor 130 as illustrated in FIGS. 82A to 82C. The conductor 165 functions as a second gate electrode (also referred to as a back gate electrode) of the transistor.

For example, the conductor 165 can be formed in such a manner that the conductor 165 is formed over the substrate 190, an insulator 111 is formed, and then part of the insulator 110 is removed by a CMP process or the like until the conductor 165 is exposed. Since the difference in height due to the conductor 165 is reduced by the CMP process, a shape defect of the transistor 100 is reduced and the reliability can be improved.

Note that the insulator 111 is not an indispensable component, and the insulator 110 may be formed after the conductor 165 is formed. The insulator 110 may be subjected to a CMP process.

For example, a voltage which is the same as that applied to the conductor 160 can be applied to the conductor 165. Thus, an electric field can be applied from upper and lower sides of the oxide semiconductor 130, resulting in increased on-state current of the transistor. In addition, the off-state current of the transistor can be reduced. Alternatively, for example, by applying a lower voltage or a higher voltage than a source electrode to the conductor 165, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 165 may be a variable or a fixed voltage. When the voltage applied to the conductor 165 is a variable, a circuit for controlling the voltage may be electrically connected to the conductor 165.

The conductor 165 may be formed to have a single-layer structure or a stacked-layer structure including a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 8

Structural Example 4 of Semiconductor Device

Figure 83A:
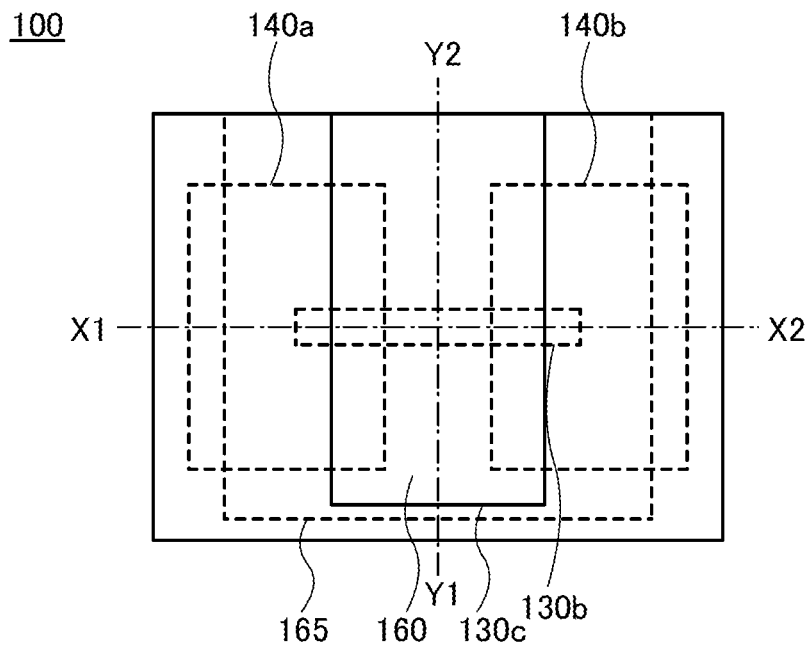
FIGS. 83A to 83C are a top view and cross-sectional views illustrating one embodiment of a semiconductor device.
Figure 83B:
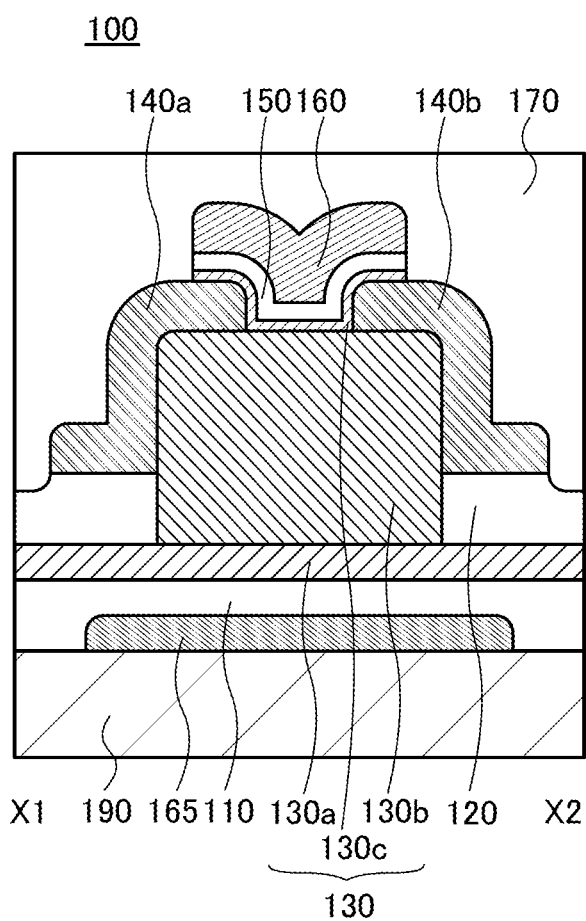
Figure 83C:
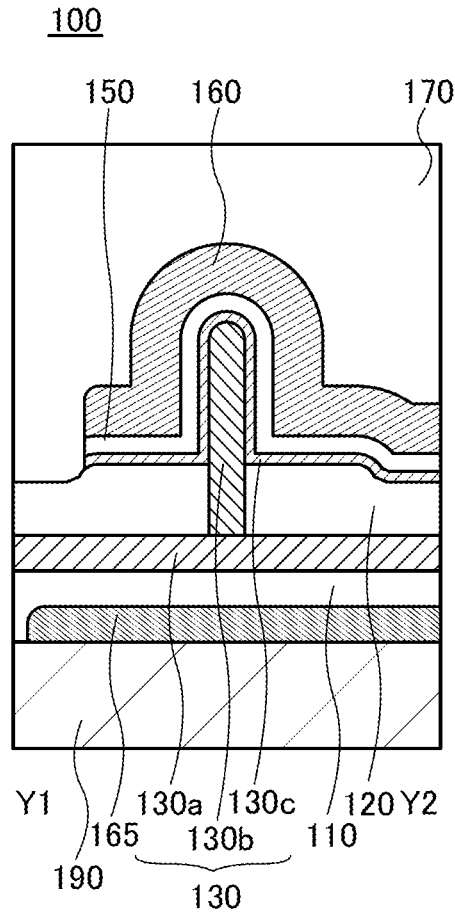

In this embodiment, the structure of the transistor 100 is described with reference to FIGS. 83A to 83C. Note that FIG. 8A illustrates an example of a top view. FIG. 83B is a cross-sectional view taken along dashed-dotted line X1-X2 in FIG. 83A, and FIG. 83C is a cross-sectional view take along dashed-dotted line Y1-Y2 in FIG. 83A. Note that the components having a function similar to that of the transistor 100 in Embodiment 1 are denoted by the same reference numerals as those in the transistor 100 in Embodiment 1, and the transistor in Embodiment 1 can be referred to.

In the transistor of one embodiment of the present invention, the conductor 160, the insulator 150, and the oxide semiconductor 130c each may have a shape illustrated in FIGS. 83A to 83C.

To provide the transistor 100 illustrated in FIGS. 83A to 83C, for example, the conductor 165, the insulator 110, the conductor 165, the oxide semiconductor 130a, the oxide semiconductor 130b, and the insulator 120 are formed over the substrate 190 by steps similar to those described in Embodiments 1 to 7.

Next, the conductor 140A is formed, and then the conductor 140a and the conductor 140b are formed by using a resist mask.

Subsequently, the oxide semiconductor 130C, the insulator 150A, and the conductor 160 are formed, and then the oxide semiconductor 130c, the insulator 150, and the conductor 160 are formed by using a resist mask. After that, the insulator 170 is formed.

Thus, a miniaturized transistor having stable electrical characteristics and a high operation speed can be provided. Furthermore, with use of the transistor, a highly integrated semiconductor device in which variation in size and characteristics of the transistors is small can be provided.

The structures, the methods, and the like described in this embodiment can be combined as appropriate with any of the structures, the methods, and the like described in the other embodiments.

Embodiment 9

Figure 85A:
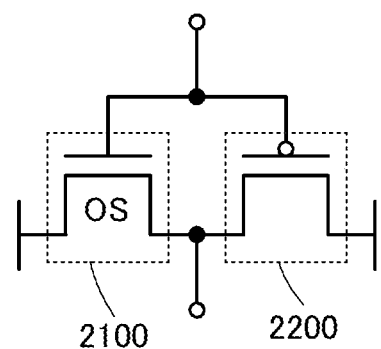
FIGS. 85A and 85B are circuit diagrams of one embodiment of the present invention.

In this embodiment, an example of a circuit of a semiconductor device including a transistor or the like of one embodiment of the present invention is described.
<CMOS Inverter>
A circuit diagram in FIG. 85A shows a configuration of a so-called CMOS inverter in which a p-channel transistor 2200 and an n-channel transistor 2100 are connected to each other in series and in which gates of them are connected to each other.

Figure 86:
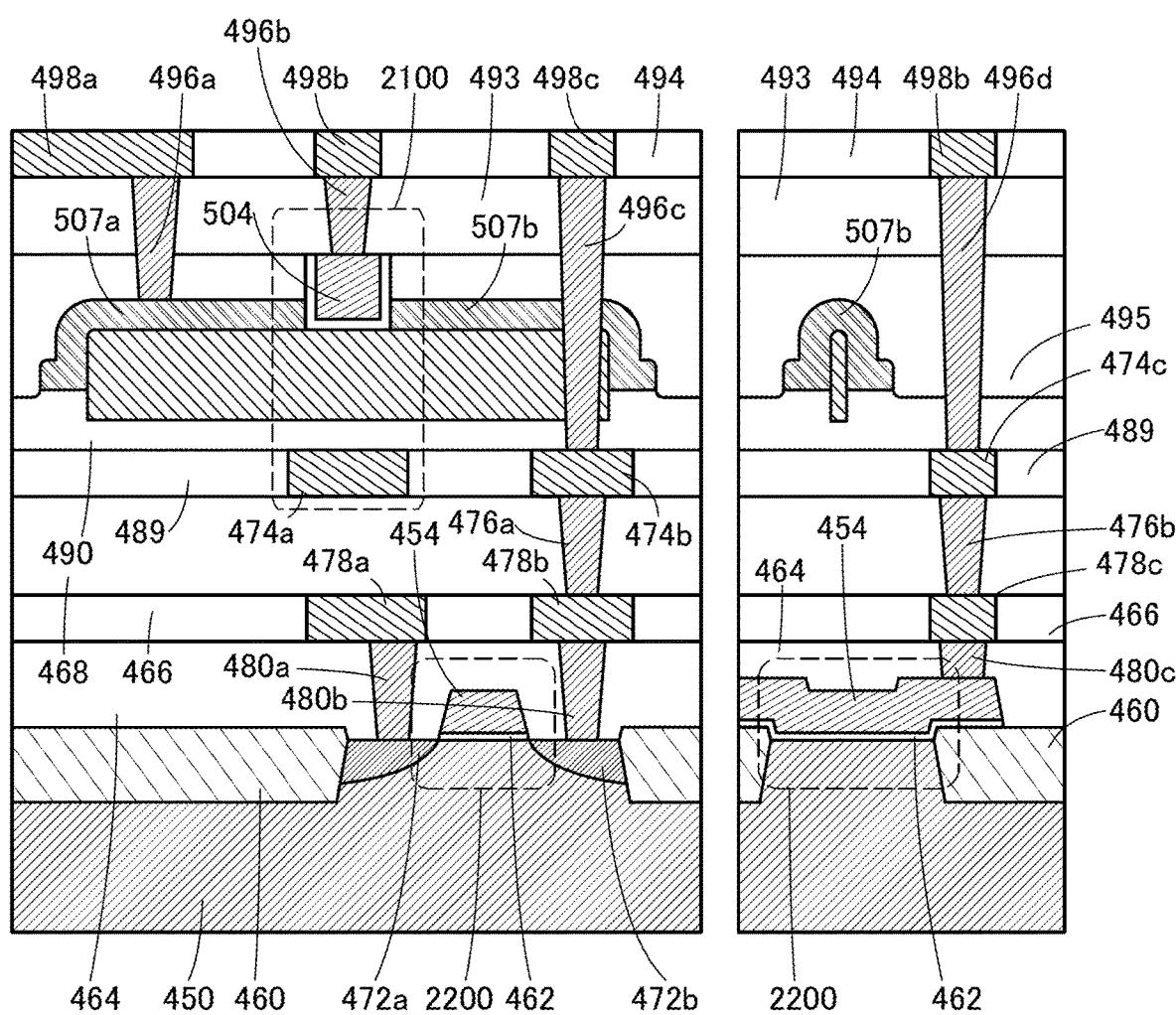
FIG. 86 is a cross-sectional view illustrating a semiconductor device of one embodiment of the present invention.

<Structure 1 of Semiconductor Device>
FIG. 86 is a cross-sectional view of the semiconductor device of FIG. 85A. The semiconductor device shown in FIG. 86 includes the transistor 2200 and the transistor 2100. The transistor 2100 is placed above the transistor 2200. Any of the transistors described in the above embodiments can be used as the transistor 2100. Therefore, the description regarding the above-mentioned transistors is referred to for the transistor 2100 as appropriate.

The transistor 2200 shown in FIG. 86 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b function as a source region and a drain region. The insulator 462 functions as a gate insulator. The conductor 454 functions as a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 86 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 165 in the above embodiment and thus, the description of the conductor 165 can be referred to for details about the conductor 474a.

The insulator 490 includes an opening reaching the conductor 474b. Note that the insulator 490 corresponds to the insulator 120 in the above embodiment and thus, the description of the insulator 120 can be referred to for details about the insulator 490.

The insulator 495 includes an opening reaching the conductor 474b through a conductor 507b that is one of a source and a drain of the transistor 2100, an opening reaching a conductor 507a that is the other of the source and the drain of the transistor 2100, an opening reaching the conductor 504 that is the gate electrode of the transistor 2100, and an opening reaching the conductor 474c. Note that the insulator 495 corresponds to the insulator 170 in the above embodiment and thus, the description of the insulator 170 can be referred to for details about the insulator 495.

The insulator 493 includes an opening reaching the conductor 474b through the conductor 507b that is the one of the source and the drain of the transistor 2100, an opening reaching the conductor 507a that is the other of the source and the drain of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 87:
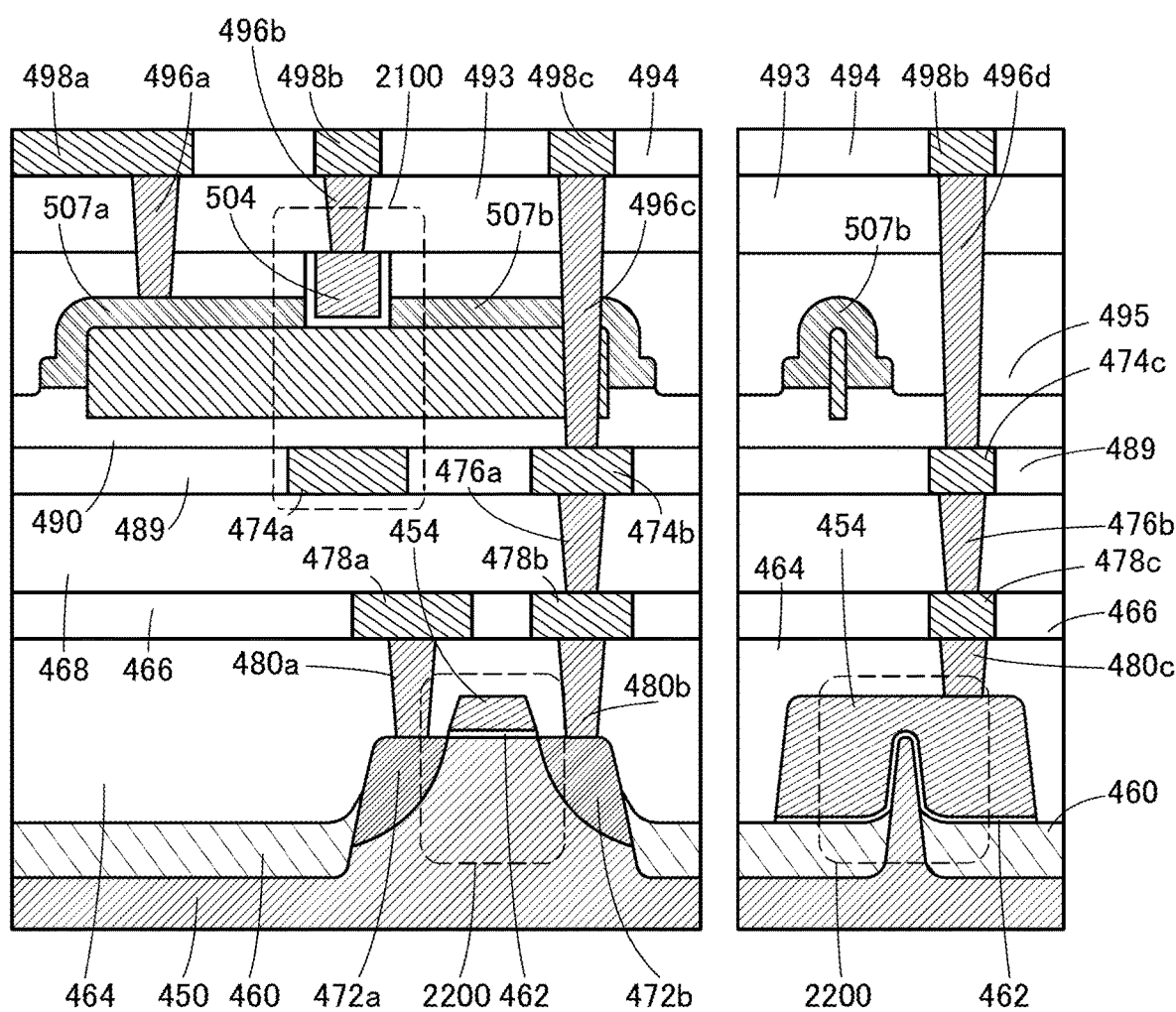
FIG. 87 is a cross-sectional view illustrating a semiconductor device of one embodiment of the present invention.

Note that a semiconductor device in FIG. 87 is the same as the semiconductor device in FIG. 86 except the structure of the transistor 2200. Therefore, the description of the semiconductor device in FIG. 86 is referred to for the semiconductor device in FIG. 87. In the semiconductor device in FIG. 87, the transistor 2200 is a Fin transistor. The effective channel width is increased in the Fin transistor 2200, whereby the on-state characteristics of the transistor 2200 can be improved. In addition, since contribution of the electric field of the gate electrode can be increased, the off-state characteristics of the transistor 2200 can be improved.

Figure 88:
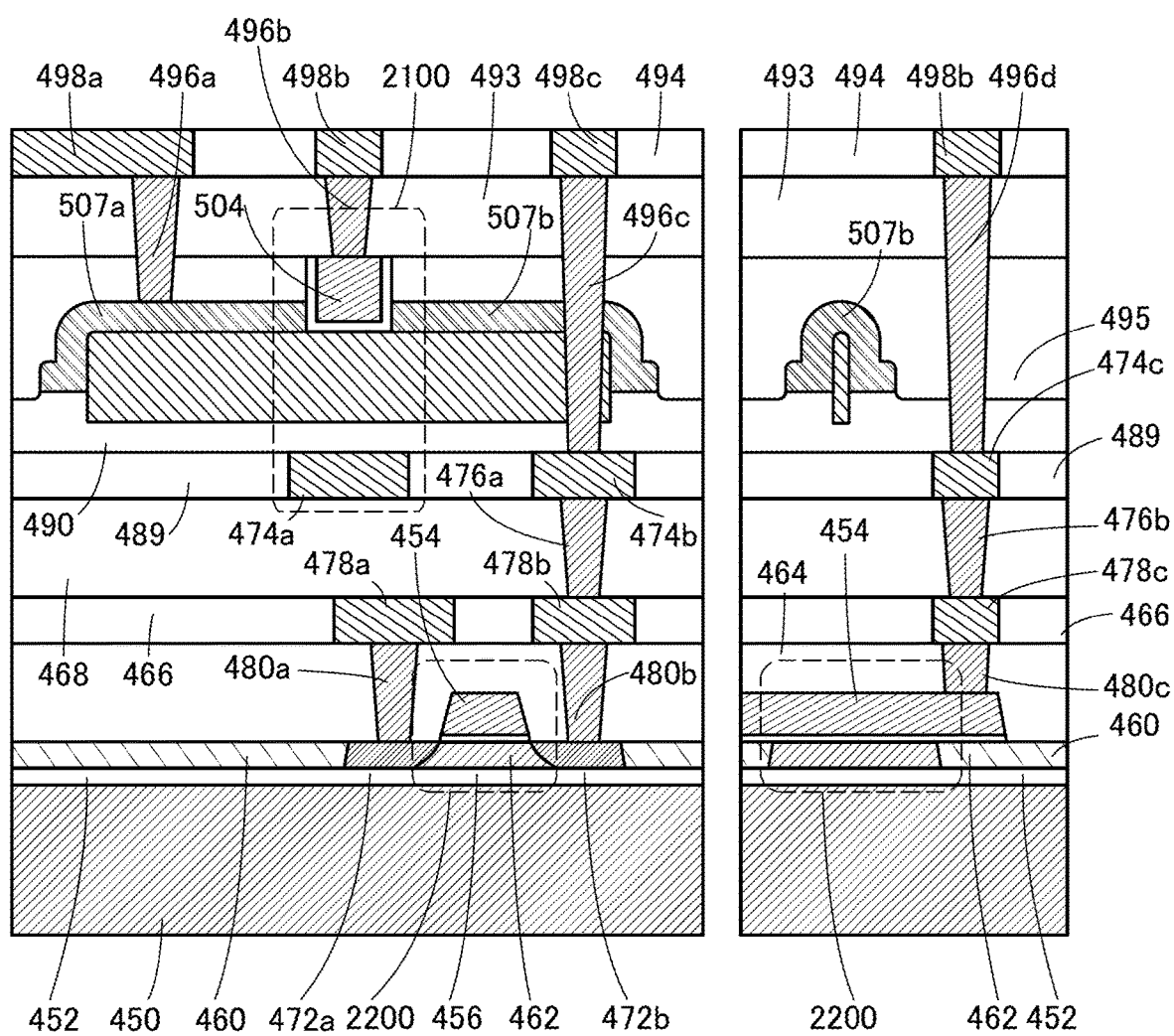
FIG. 88 is a cross-sectional view illustrating a semiconductor device of one embodiment of the present invention.

Note that a semiconductor device in FIG. 88 is the same as the semiconductor device in FIG. 86 except the structure of the transistor 2200. Therefore, the description of the semiconductor device in FIG. 86 is referred to for the semiconductor device in FIG. 88. Specifically, in the semiconductor device in FIG. 88, the transistor 2200 is formed in the semiconductor substrate 450 that is an SOI substrate. In the structure in FIG. 88, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 86, FIG. 87, and FIG. 88, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 85B:
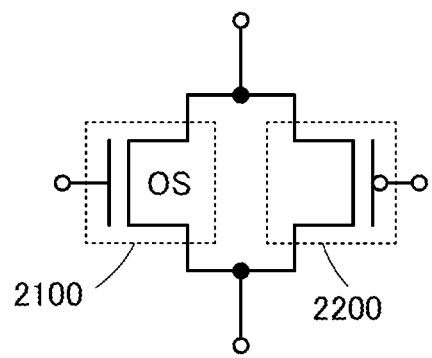

A circuit diagram in FIG. 85B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 89A:
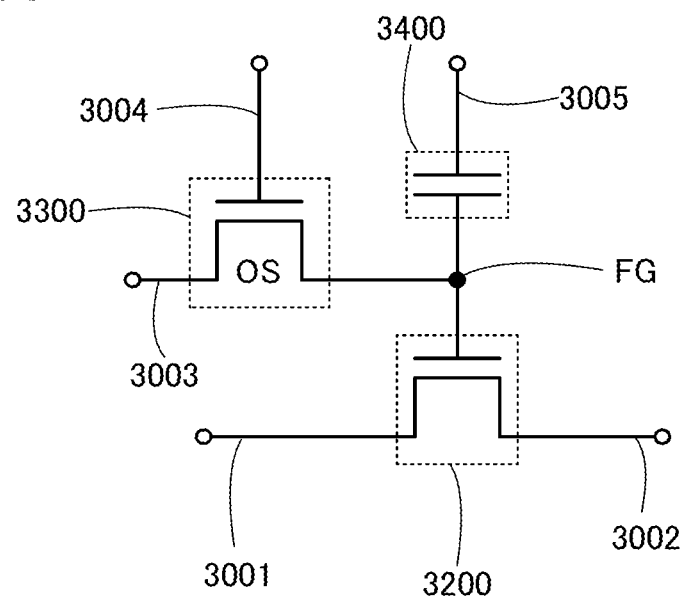
FIGS. 89A and 89B are circuit diagrams each illustrating a semiconductor device of one embodiment of the present invention.
Figure 89B:
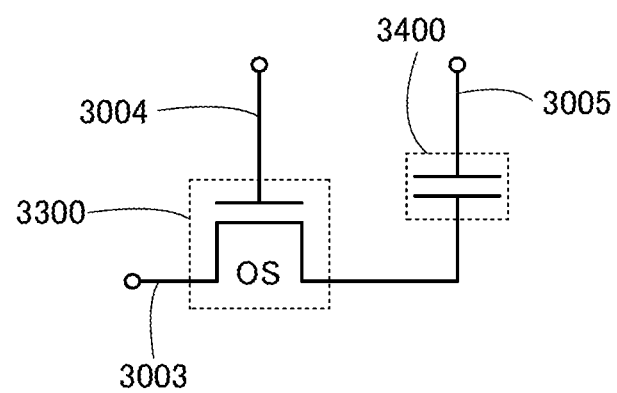

An example of a semiconductor device (memory device) which includes the transistor of one embodiment of the present invention, which can retain stored data even when not powered, and which has an unlimited number of write cycles is shown in FIGS. 89A and 89B.

The semiconductor device illustrated in FIG. 89A includes a transistor 3200 using a first semiconductor, a transistor 3300 using a second semiconductor, and a capacitor 3400. Note that a transistor similar to the above-described transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 89A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 89A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_x}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed, for example. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure 1 of Memory Device>

Figure 90:
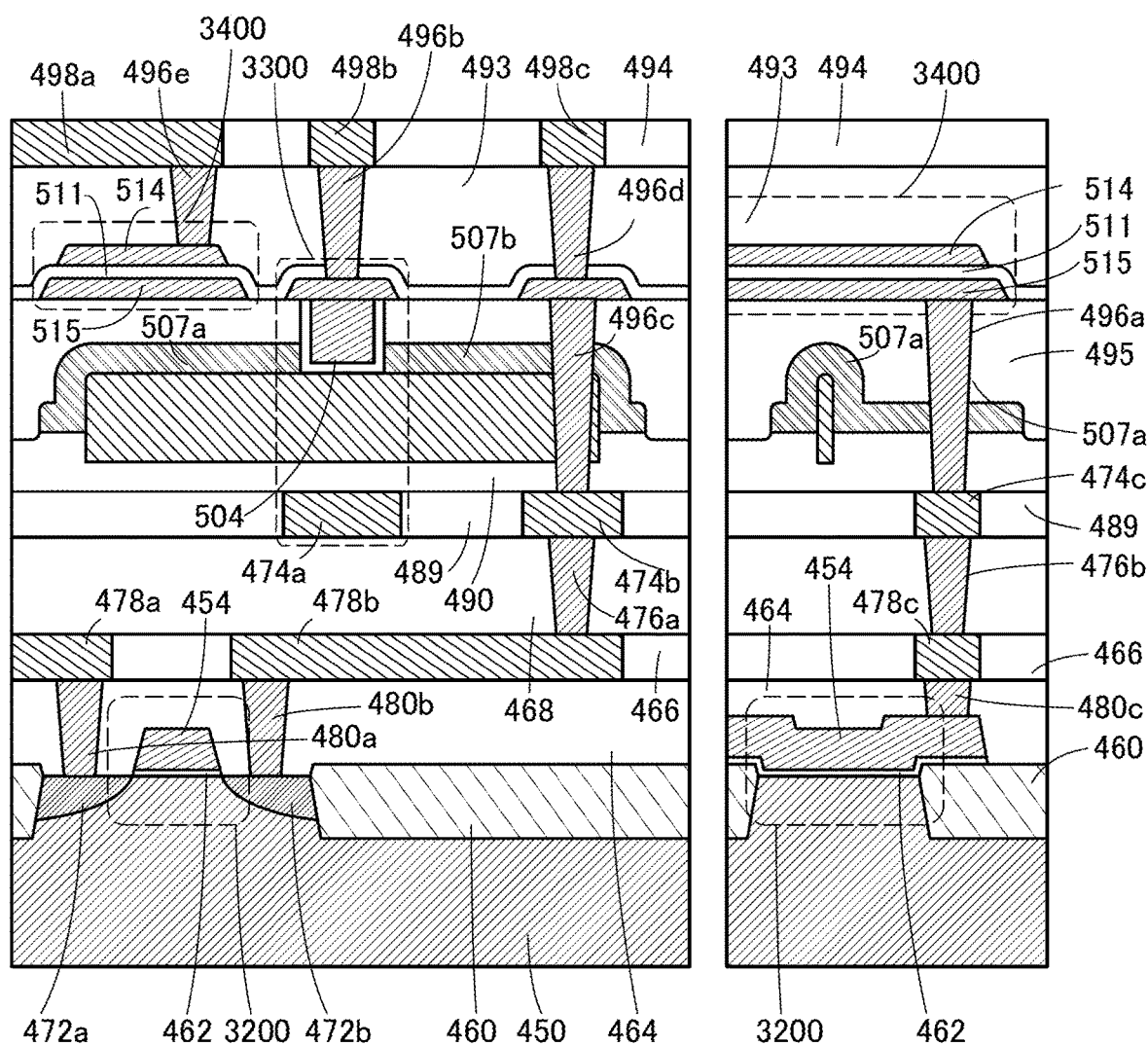
FIG. 90 is a cross-sectional view illustrating a semiconductor device of one embodiment of the present invention.

FIG. 90 is a cross-sectional view of the semiconductor device of FIG. 89A.

The semiconductor device shown in FIG. 90 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 86 is referred to. Note that although the transistor 2200 is illustrated as a p-channel transistor in FIG. 86, the transistor 3200 may be an n-channel transistor.

The transistor 2200 illustrated in FIG. 90 is a transistor using a semiconductor substrate 450. The transistor 2200 includes a region 472a in the semiconductor substrate 450, a region 472b in the semiconductor substrate 450, an insulator 462, and a conductor 454.

The semiconductor device illustrated in FIG. 90 includes insulators 464, 466, and 468, conductors 480a, 480b, 480c, 478a, 478b, 478c, 476a, 476b, 474a, 474b, 474c, 496a, 496b, 496c, 496d, 498a, 498b, and 498c, and the insulators 489, 490, 492, 493, 494, and 495.

The insulator 464 is provided over the transistor 3200. The insulator 466 is provided over the insulator 464. The insulator 468 is provided over the insulator 466. The insulator 489 is provided over the insulator 468. The transistor 2100 is provided over the insulator 489. The insulator 493 is provided over the transistor 2100. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 504 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 490 includes an opening reaching the conductor 474b and an opening reaching the conductor 474c.

Furthermore, the insulator 495 includes an opening reaching the conductor 474b through a conductor 507b which is one of a source electrode and a drain electrode of the transistor 3300, and an opening reaching the conductor 474c through the conductor 507a which is one of a source and a drain of the transistor 3300. In the openings, the conductor 496a and the conductor 496b are embedded. Note that in some cases, an opening provided in a component of the transistor 3300 or the like is positioned between openings provided in other components.

The insulator 493 includes an opening reaching the conductor 514 which is one of electrodes of the capacitor 3400, and an opening reaching a conductor that is in contact with the conductor 496c connected to the conductor 507b which is the other of a source and the drain of the transistor 3300. In the openings, the conductor 496e and the conductor 496d are embedded.

The insulator 494 includes an opening reaching the conductor 496b, an opening reaching the conductor 496d, and an opening reaching the conductor 496e. In the openings, the conductor 498a, the conductor 498b, and the conductor 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 507b that is one of a source and a drain of the transistor 3300 through the conductor 480b, the conductor 478b, the conductor 476a, the conductor 474b, and the conductor 496c. The conductor 454 that is the gate electrode of the transistor 3200 is electrically connected to the conductor 507a that is the other of the source and the drain of the transistor 3300 through the conductor 480c, the conductor 478c, the conductor 476b, the conductor 474c, and the conductor 496d.

The capacitor 3400 includes a conductor 515, the conductor 514, and the insulator 511.

For the structures of other components, the description of FIG. 86 and the like can be referred to as appropriate.

Figure 91:
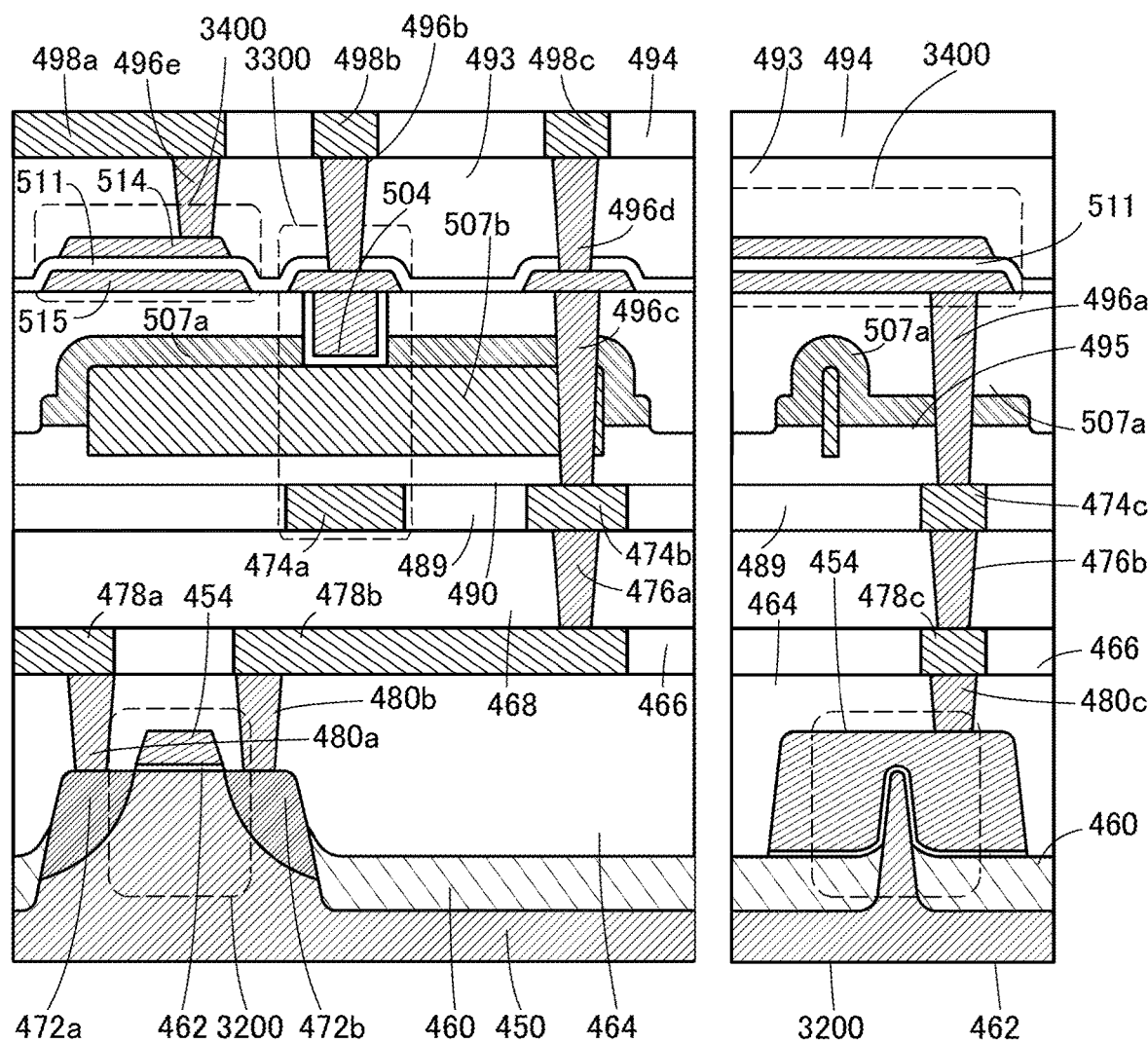
FIG. 91 is a cross-sectional view illustrating a semiconductor device of one embodiment of the present invention.

A semiconductor device in FIG. 91 is the same as the semiconductor device in FIG. 90 except the structure of the transistor 3200. Therefore, the description of the semiconductor device in FIG. 90 is referred to for the semiconductor device in FIG. 91. Specifically, in the semiconductor device in FIG. 91, the transistor 3200 is a Fin transistor. For the Fin transistor 3200, the description of the transistor 2200 in FIG. 87 is referred to. Note that although the transistor 2200 is illustrated as a p-channel transistor in FIG. 87, the transistor 3200 may be an n-channel transistor.

Figure 92:
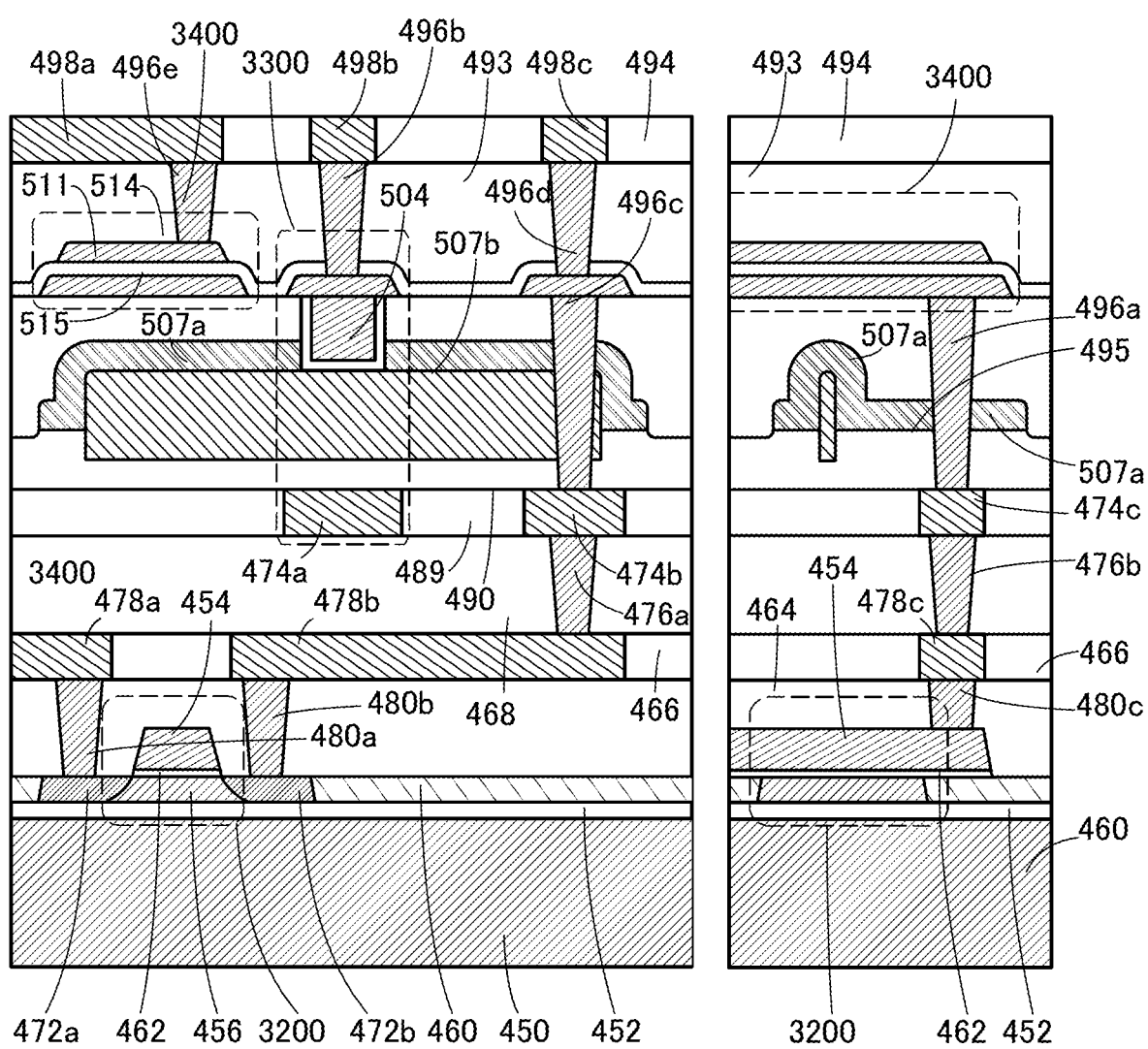
FIG. 92 is a cross-sectional view illustrating a semiconductor device of one embodiment of the present invention.

A semiconductor device in FIG. 92 is the same as the semiconductor device in FIG. 90 except a structure of the transistor 3200. Therefore, the description of the semiconductor device in FIG. 90 is referred to for the semiconductor device in FIG. 92. Specifically, in the semiconductor device in FIG. 92, the transistor 3200 is provided in the semiconductor substrate 450 that is an SOI substrate. For the transistor 3200, which is provided in the semiconductor substrate 450 that is an SOI substrate, the description of the transistor 2200 in FIG. 88 is referred to. Note that although the transistor 2200 is illustrated as a p-channel transistor in FIG. 88, the transistor 3200 may be an n-channel transistor.

<Memory Device 2>

The semiconductor device in FIG. 89B is different from the semiconductor device in FIG. 89A in that the transistor 3200 is not provided. Also in this case, data can be written and retained in a manner similar to that of the semiconductor device in FIG. 89A.

Reading of data in the semiconductor device in FIG. 89B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 89A is described with reference to a circuit diagram in FIG. 93.

Figure 93:
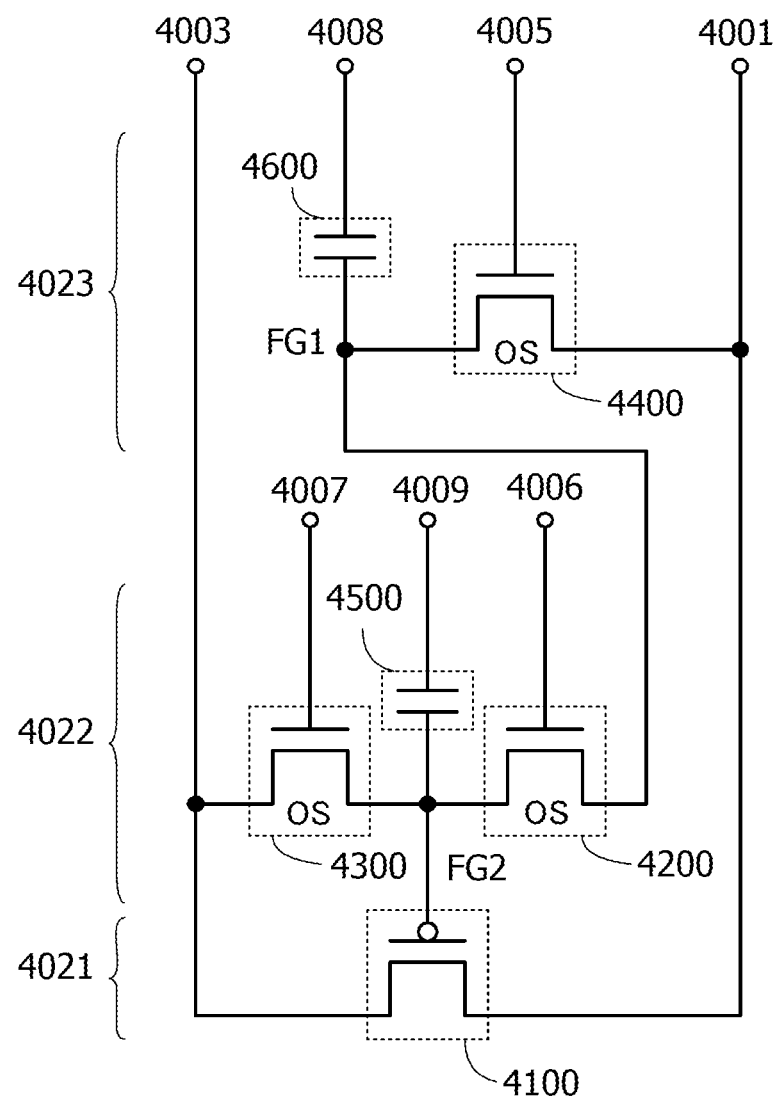
FIG. 93 is a circuit diagram illustrating a semiconductor device of one embodiment of the present invention.

The semiconductor device illustrated in FIG. 93 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 93, a plurality of semiconductor devices in FIG. 93 are provided in a matrix. The semiconductor devices in FIG. 93 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 93, the transistor 4100 may be an n-channel transistor.

The semiconductor device in FIG. 93 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 93, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 93 preferably includes, as illustrated in FIG. 93, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 93 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 93, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 93 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 93, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 94:
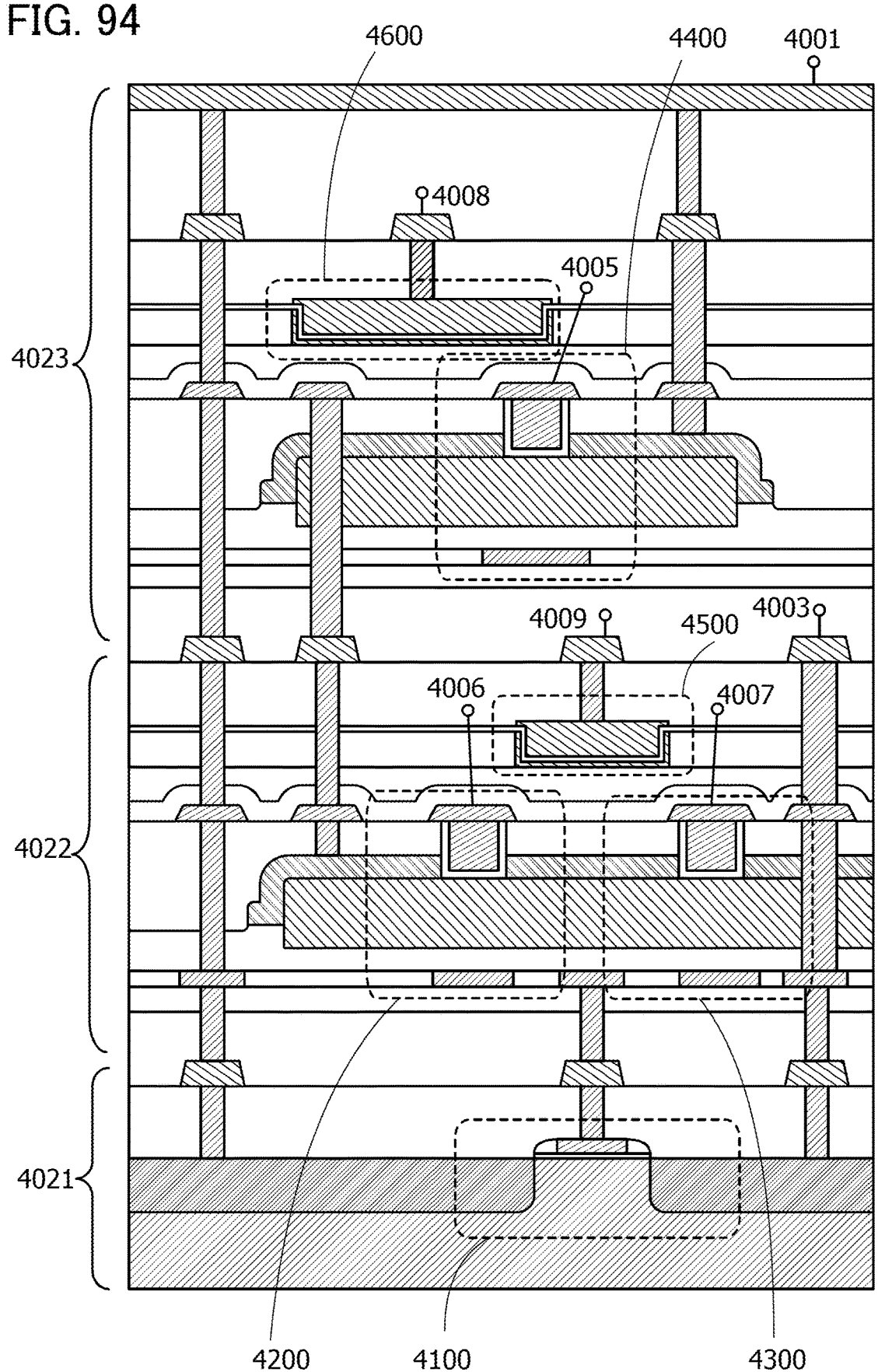
FIG. 94 is a cross-sectional view illustrating a semiconductor device of one embodiment of the present invention.

FIG. 94 is a cross-sectional view of a semiconductor device that corresponds to FIG. 93. The semiconductor device illustrated in FIG. 94 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200 to 4400, and the description of the transistor 3200 can be referred to for the transistor 4100. The description made with reference to FIG. 90 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 90 is parallel to the substrate. With this structure, a larger capacity can be obtained without increasing the occupation area.

<FPGA>

One embodiment of the present invention can also be applied to an LSI such as a field programmable gate array (FPGA).

Figure 95A:
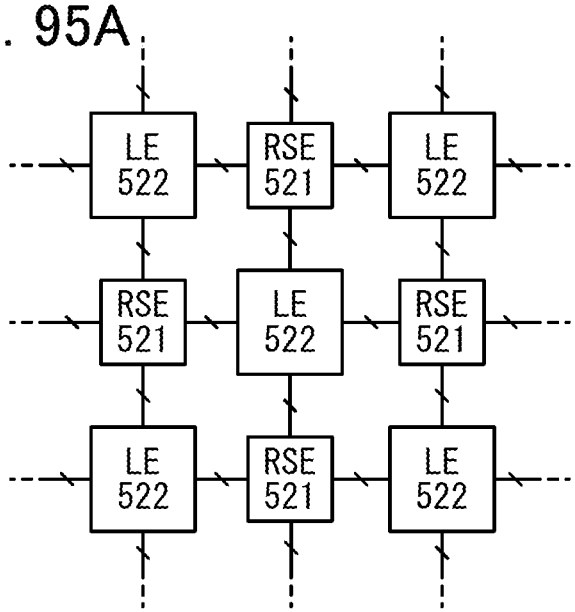
FIGS. 95A to 95E are circuit diagrams illustrating a semiconductor device of one embodiment of the present invention.

FIG. 95A illustrates an example of a block diagram of an FPGA. The FPGA includes a routing switch element 521 and a logic element 522. The logic element 522 can switch functions of a logic circuit, such as a combination circuit or a sequential circuit, in accordance with configuration data stored in a configuration memory.

Figure 95B:
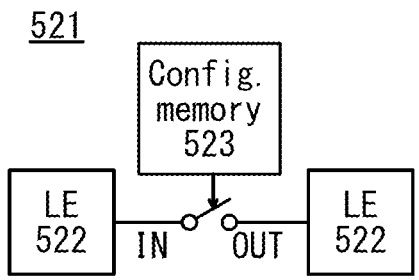

FIG. 95B is a schematic view illustrating a function of the routing switch element 521. The routing switch element 521 can switch a connection between the logic elements 522 in accordance with configuration data stored in a configuration memory 523. Note that although FIG. 95B illustrates one switch which switches connection between a terminal IN and a terminal OUT, in an actual FPGA, a plurality of switches are provided between a plurality of the logic elements 522.

Figure 95C:
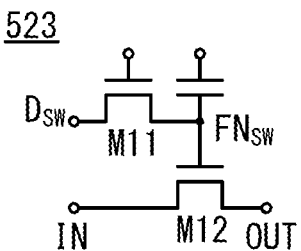

FIG. 95C illustrates an example of a configuration of a circuit serving as the configuration memory 523. The configuration memory 523 includes a transistor M11 that is an OS transistor and a transistor M12 that is a silicon transistor. Configuration data $D_{SW}$ is supplied to a node $FN_{SW}$ through the transistor M11. The potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 95D:
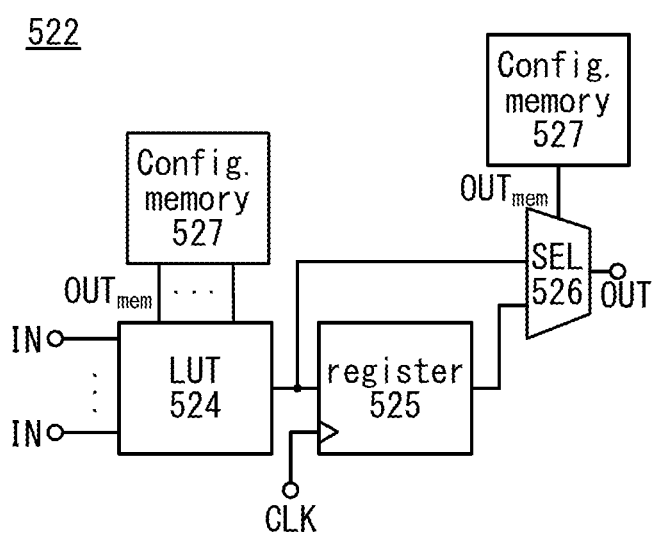

FIG. 95D is a schematic view illustrating a function of the logic element 522. The logic element 522 can switch a potential of a terminal $OUT_{mem}$ in accordance with configuration data stored in a configuration memory 527. A lookup table 524 can switch functions of a combination circuit that processes a signal of the terminal IN in accordance with the potential of the terminal $OUT_{mem}$. The logic element 522 includes a register 525 that is a sequential circuit and a selector 526 that switches signals of the terminal OUT. The selector 526 can select to output a signal of the lookup table 524 or to output a signal of the register 525 in accordance with the potential of the terminal $OUT_{mem}$, which is output from the configuration memory 527.

Figure 95E:
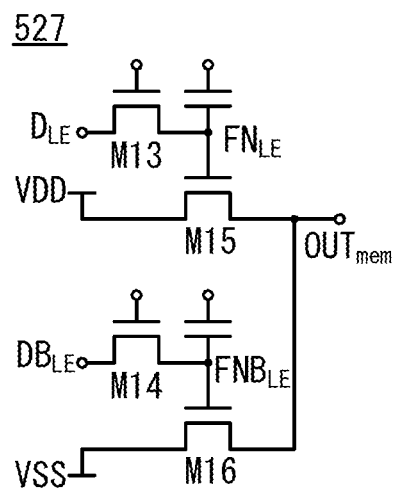

FIG. 95E illustrates an example of a configuration of a circuit serving as the configuration memory 527. The configuration memory 527 includes a transistor M13, a transistor M14, a transistor M15, and a transistor M16. The transistors M13 and M14 are OS transistors. The transistors M15 and M16 are silicon transistors. Configuration data $D_{LE}$ is supplied to a node $FN_{LE}$ through the transistor M13. Configuration data $DB_{LE}$ is supplied to a node $FNB_{LE}$ through the transistor M14. The configuration data $DB_{LE}$ corresponds to a potential of the configuration data $D_{LE}$ whose logic is inverted. The potential of the configuration data $D_{LE}$ and the potential of the configuration data $DB_{LE}$ can be retained by turning off the transistor M13 and the transistor M14, respectively. The on and off states of one of the transistors M15 and M16 are switched in accordance with the retained potential of the configuration data $D_{LE}$ or the configuration data $DB_{LE}$, so that a potential VDD or a potential VSS can be supplied to the terminal $OUT_{mem}$.

For the configuration illustrated in FIGS. 95A to 95E, any of the structures described in this embodiment can be used. For example, silicon transistors are used as the transistors M12, M15, and M16, and OS transistors are used as the transistors M11, M13, and M14. In this case, a wiring for connecting the Si transistors each provided in a lower layer to each other can be formed with a low-resistance conductive material. Therefore, a circuit with high access speed and low power consumption can be obtained.

The structure described in this embodiment can be used in appropriate combination with the structure described in any of the other embodiments.

Embodiment 10

In this embodiment, an example of an imaging device including the transistor or the like of one embodiment of the present invention will be described.

<Configuration of Imaging Device>

Figure 96A:
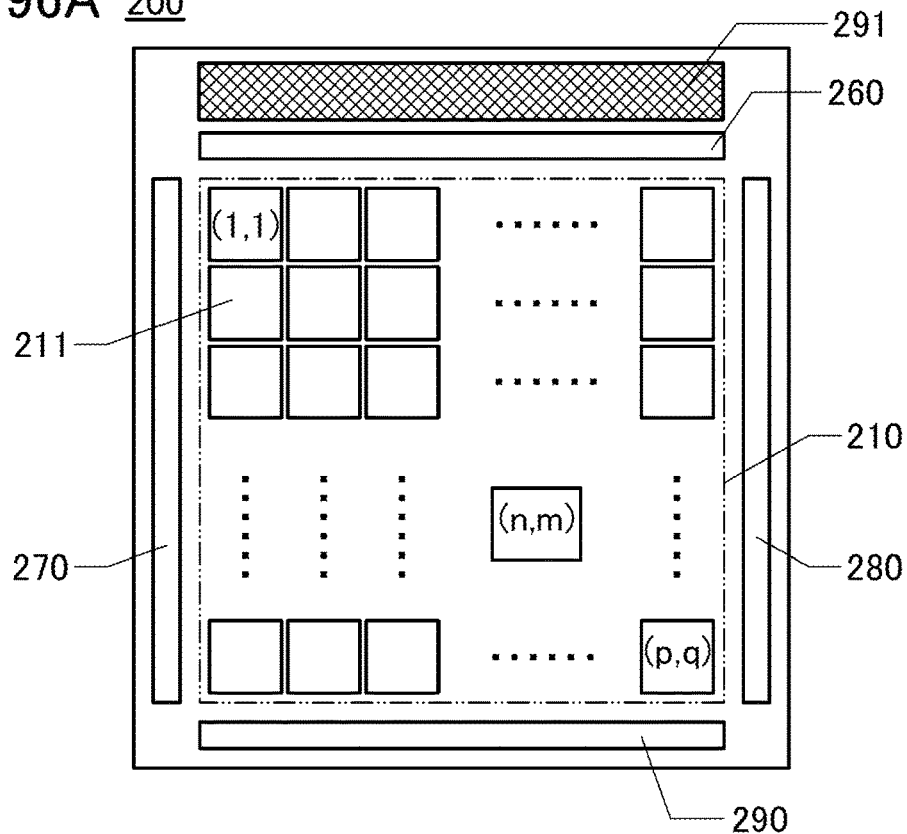
FIGS. 96A and 96B are top views each illustrating a semiconductor device of one embodiment of the present invention.

FIG. 96A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 96B:
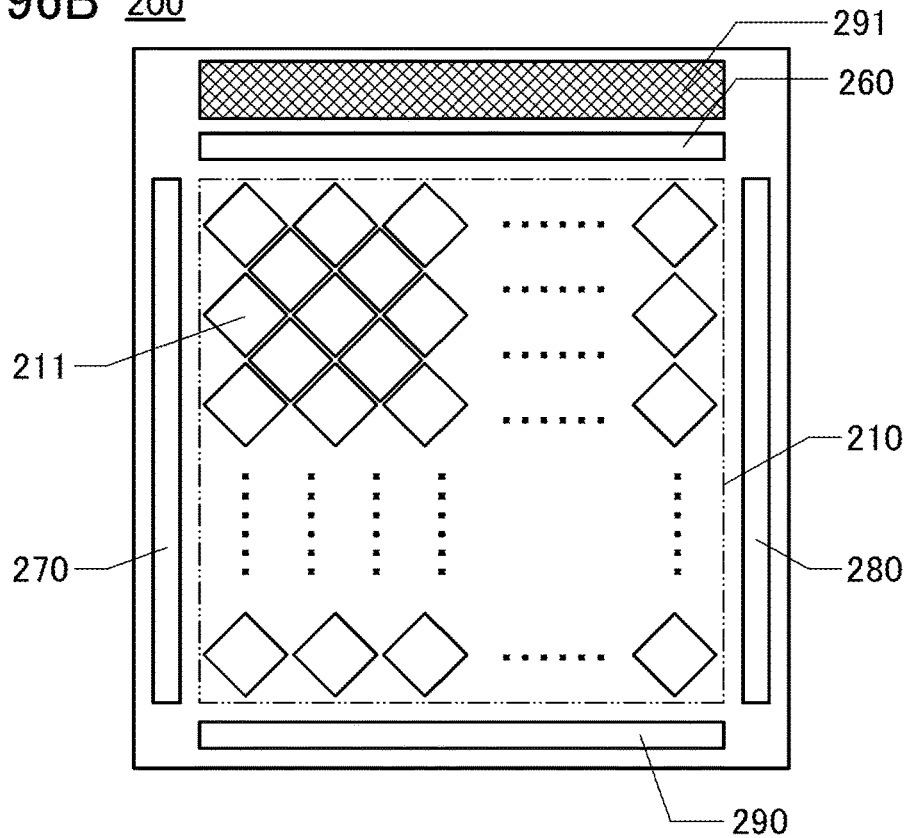

As illustrated in FIG. 96B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 97A:
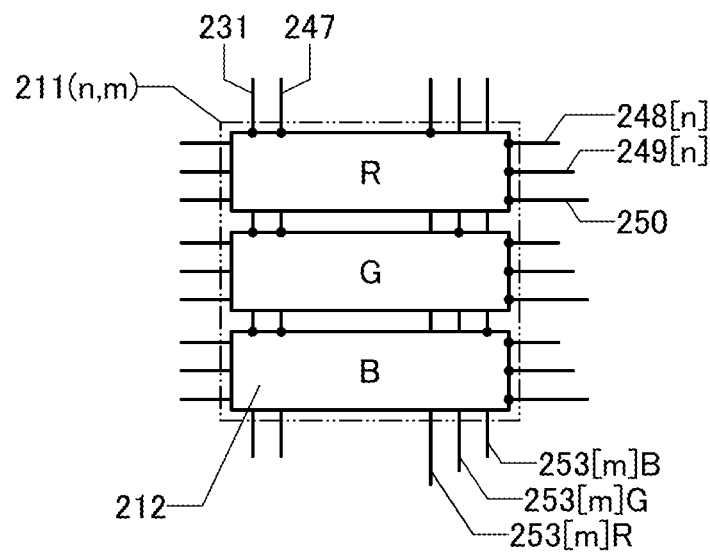
FIGS. 97A and 97B are block diagrams illustrating a semiconductor device of one embodiment of the present invention.

FIG. 97A is a top view showing an example of the pixel 211 with which a color image is obtained. The pixel 211 illustrated in FIG. 97A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 97A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 97B:
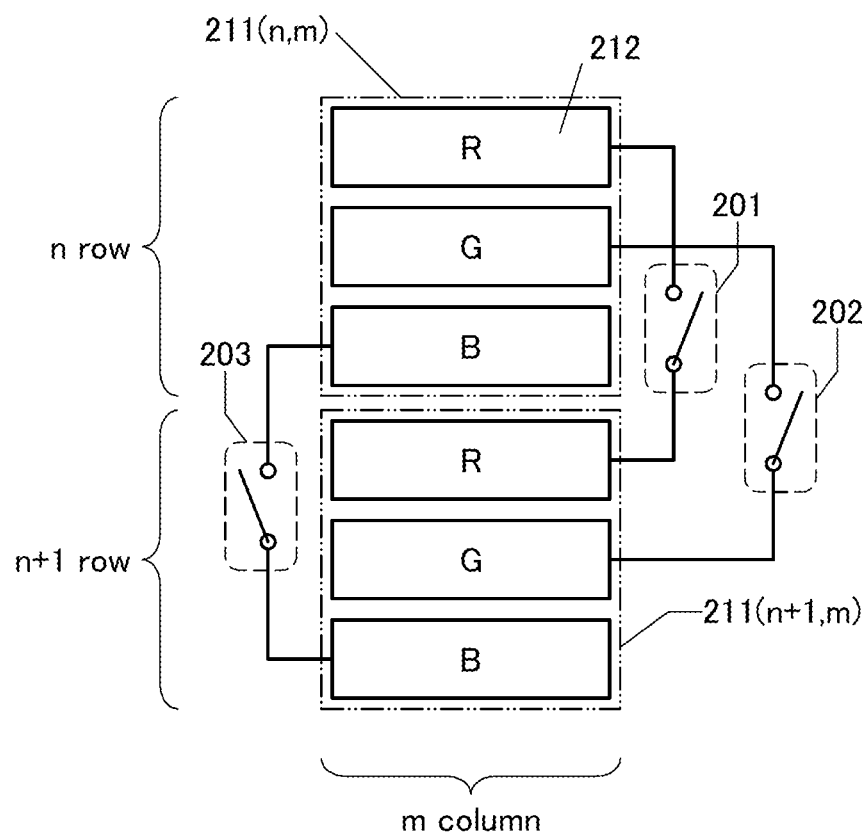

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 97B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 97B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 97A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 98A and 98B. With the lens 255, the photoelectric conversion element can receive incident light efficiently. Specifically, as illustrated in FIG. 98A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 98B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 98A:
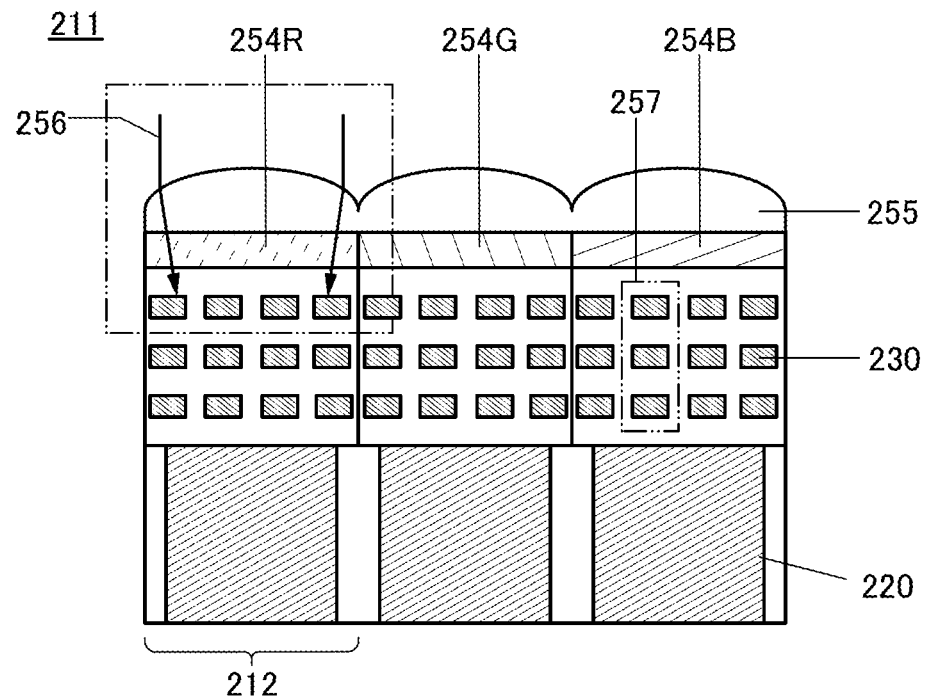
FIGS. 98A and 98B are cross-sectional views each illustrating a semiconductor device of one embodiment of the present invention.
Figure 98B:
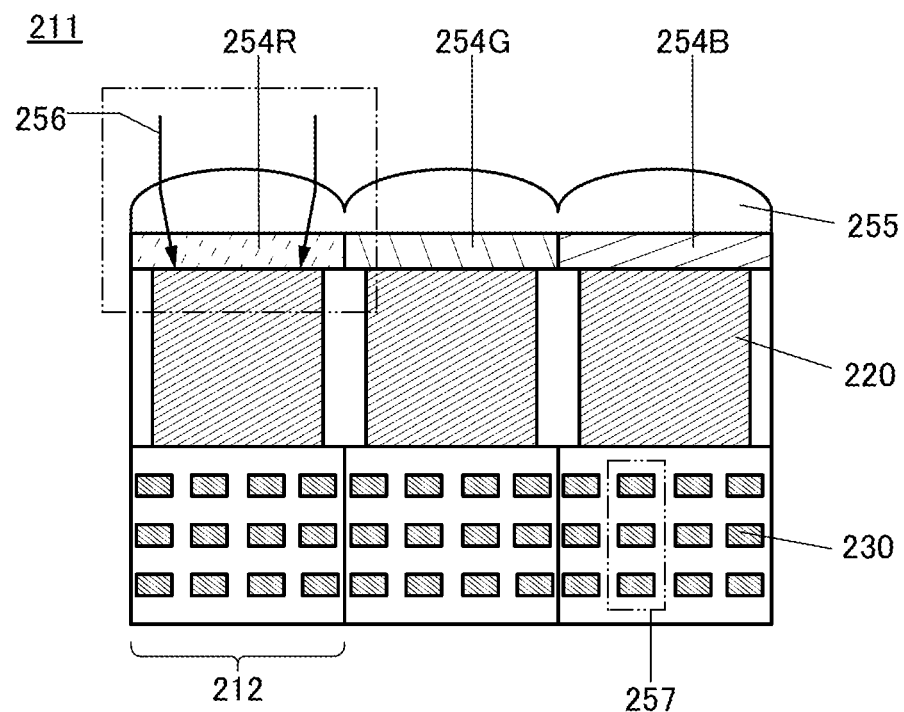

As the photoelectric conversion element 220 illustrated in FIGS. 98A and 98B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 97A and 97B.

Configuration Example 2 of Pixel

An example of a pixel including a transistor using silicon and a transistor using an oxide semiconductor is described below.

Figure 99A:
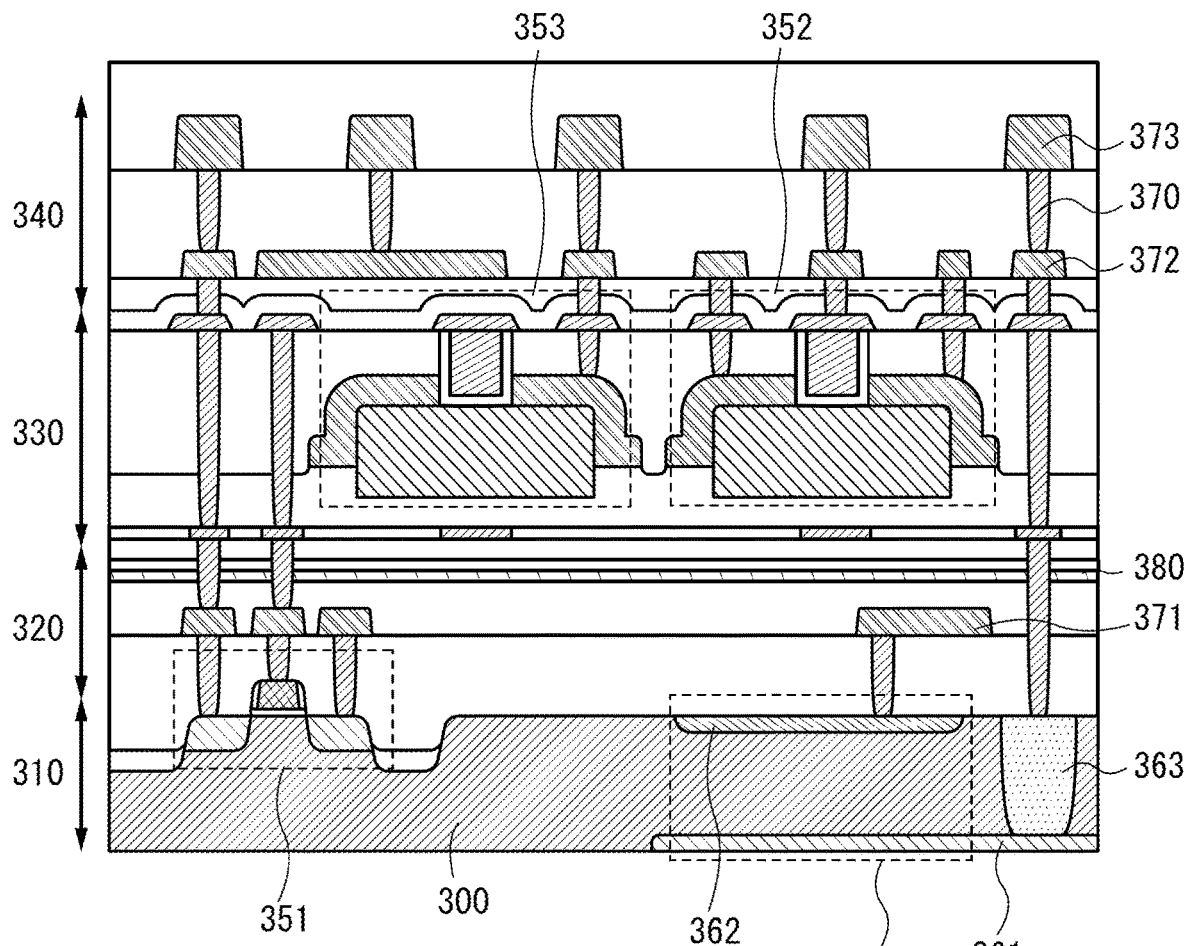
FIGS. 99A and 99B are cross-sectional views illustrating a semiconductor device of one embodiment of the present invention.
Figure 99B:
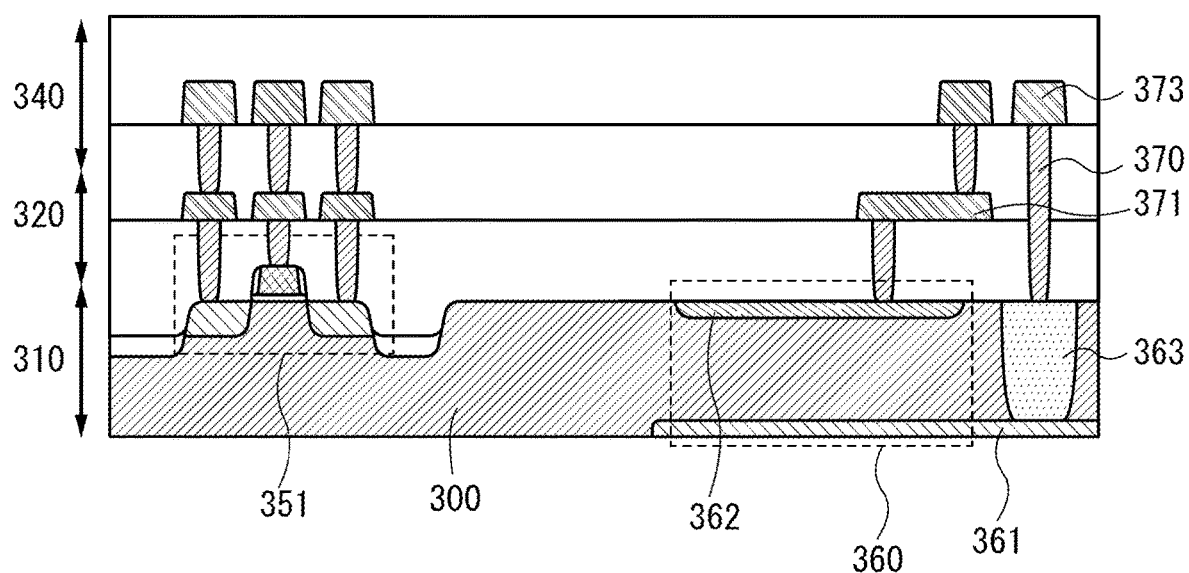

FIGS. 99A and 99B are each a cross-sectional view of an element included in an imaging device. The imaging device illustrated in FIG. 99A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 99A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 99B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors.

When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 99A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 100A1 and FIG. 100B1, part or the whole of the imaging device can be bent. FIG. 100A1 illustrates a state in which the imaging device is bent in the direction of a dashed-dotted line X1-X2. FIG. 100A2 is a cross-sectional view illustrating a portion indicated by the dashed-dotted line X1-X2 in FIG. 100A1. FIG. 100A3 is a cross-sectional view illustrating a portion indicated by a dashed-dotted line Y1-Y2 in FIG. 100A1.

FIG. 100B1 illustrates a state where the imaging device is bent in the direction of a dashed-dotted line X3-X4 and the direction of a dashed-dotted line Y3-Y4. FIG. 100B2 is a cross-sectional view illustrating a portion indicated by the dashed-dotted line X3-X4 in FIG. 100B1. FIG. 100B3 is a cross-sectional view illustrating a portion indicated by the dashed-dotted line Y3-Y4 in FIG. 100B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 11

In this embodiment, examples of CPUs including semiconductor devices such as the transistor of one embodiment of the present invention and the above-described memory device will be described.

<Configuration of CPU>

Figure 101:
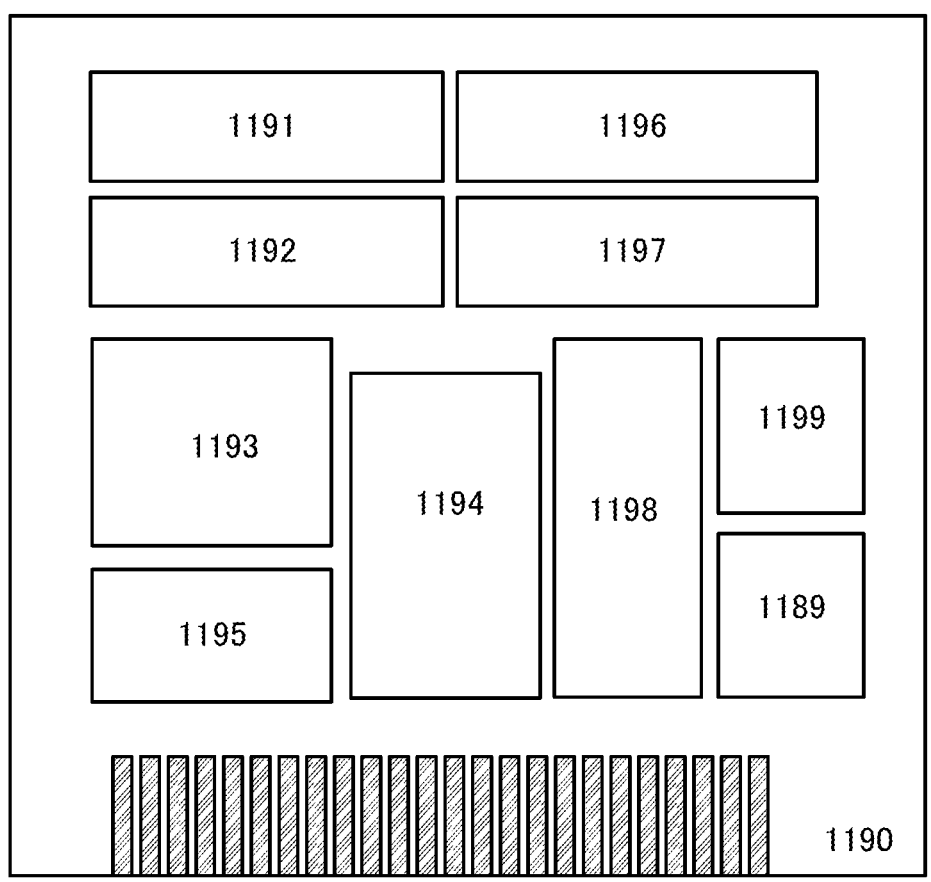
FIG. 101 is a block diagrams illustrating a semiconductor device of one embodiment of the present invention.

FIG. 101 is a block diagram illustrating a configuration example of a CPU including any of the above-described transistors as a component.

The CPU illustrated in FIG. 101 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 101 is just an example in which the configuration has been simplified, and an actual CPU may have a variety of configurations depending on the application. For example, the CPU may have the following configuration: a structure including the CPU illustrated in FIG. 101 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 101, a memory cell is provided in the register 1196. For the memory cell of the register 1196, any of the above-described transistors, the above-described memory device, or the like can be used.

In the CPU illustrated in FIG. 101, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 102:
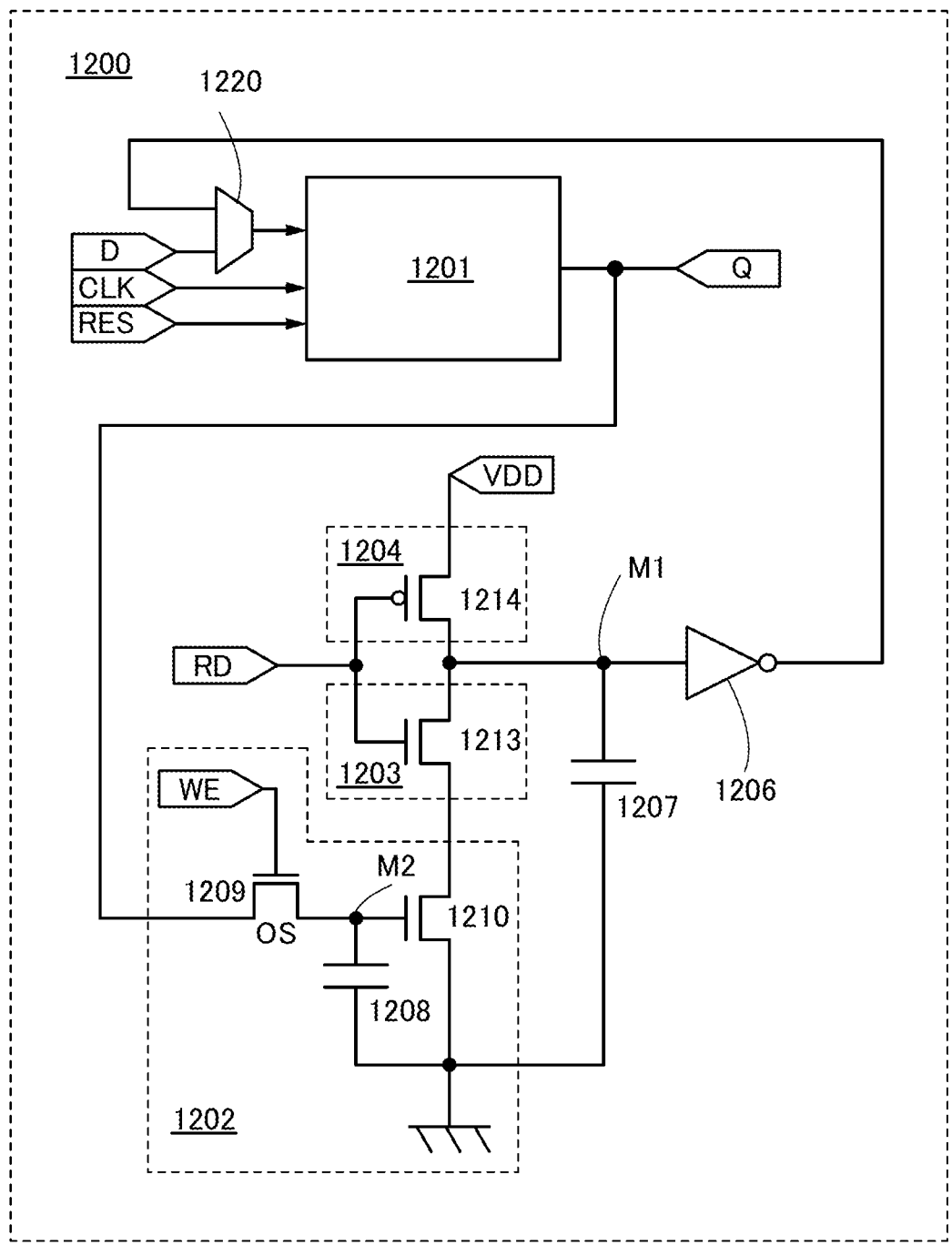
FIG. 102 is a circuit diagram of a semiconductor device of one embodiment of the present invention.

FIG. 102 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 102 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 102, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 102, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 102, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP) or a custom LSI, and a radio frequency (RF) device. The memory element 1200 can also be used in an LSI such as a programmable logic circuit including a field programmable gate array (FPGA) or a complex programmable logic device (CPLD), and a radio frequency (RF) device.

The structures described in this embodiment can be used in appropriate combination with any of the structures described in the other embodiments.

Embodiment 12

In this embodiment, display devices each including the transistor or the like of one embodiment of the present invention are described with reference to FIGS. 103A to 103C and FIGS. 104A and 104B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 103A:
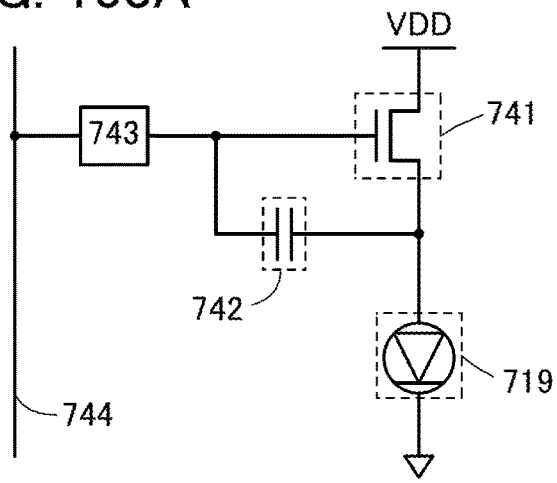
FIGS. 103A to 103C are a circuit diagram, a top view, and a cross-sectional view illustrating a semiconductor device of one embodiment of the present invention.
Figure 103B:
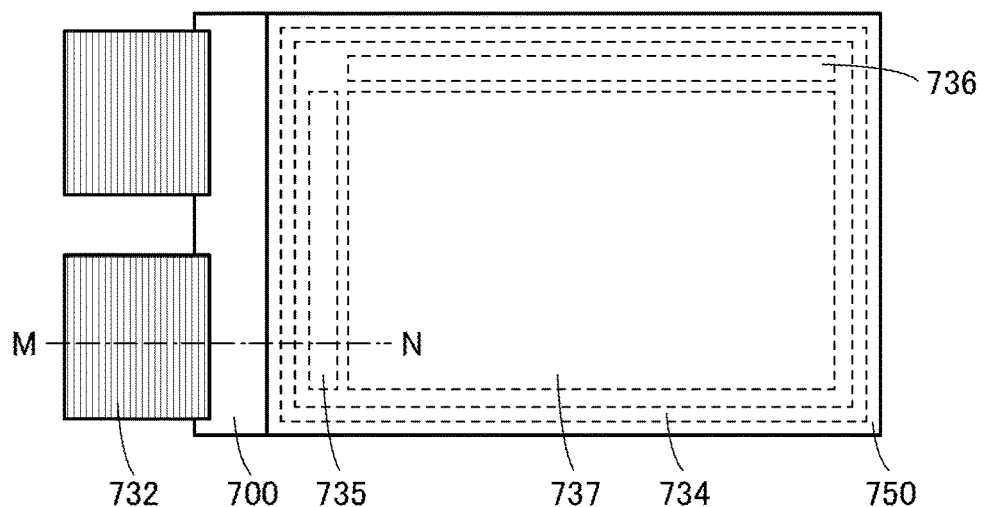
Figure 103C:
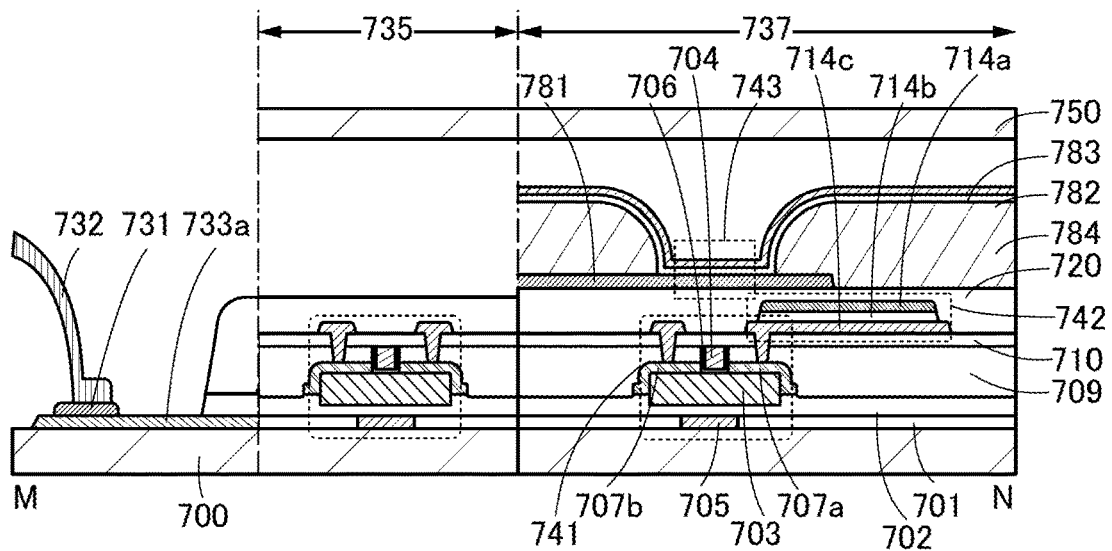

FIGS. 103A to 103C illustrate an example of an EL display device of one embodiment of the present invention. FIG. 103A is a circuit diagram of a pixel in an EL display device. FIG. 103B is a plan view showing the whole of the EL display device. FIG. 103C is a cross-sectional view taken along part of dashed-dotted line M-N in FIG. 103B.

FIG. 103A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 103A includes a switching element 743, a transistor 741, a capacitor 742, and a light-emitting element 719.

Note that FIG. 103A and the like each illustrate an example of a circuit structure; therefore, a transistor can be provided additionally. In contrast, for each node in FIG. 103A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 103B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 103C is a cross-sectional view of the EL display device taken along part of dashed-dotted line M-N in FIG. 103B.

The transistor 741 in FIG. 103C includes a conductor 705 over the substrate 700, an insulator 701 in which the conductor 705 is embedded, an insulator 702 over the insulator 701, a semiconductor 703 over the insulator 702, a conductor 707a and a conductor 707b over the semiconductor 703, an insulator 706 over the semiconductor 703, and a conductor 704 over the insulator 706. Note that the structure of the transistor 741 is just an example; the transistor 741 may have a structure different from that illustrated in FIG. 103C.

Thus, in the transistor 741 illustrated in FIG. 103C, the conductors 704 and 705 each function as a gate electrode, the insulators 702 and 706 each function as a gate insulator, and the conductors 707a and 707b function as a source electrode or a drain electrode. Note that in some cases, electrical characteristics of the semiconductor 703 change if light enters the semiconductor 703. To prevent this, it is preferable that one or more of the conductor 705 and the conductor 704 have a light-blocking property.

FIG. 103C illustrates the capacitor 742 that includes a conductor 714a over an insulator 710, an insulator 714b over the conductor 714a, and a conductor 714c over the insulator 714b.

In the capacitor 742, the conductor 714a serves as one electrode, and the conductor 714c serves as the other electrode.

The capacitor 742 illustrated in FIG. 103C has a large capacitance per area occupied by the capacitor. Therefore, the EL display device illustrated in FIG. 103C has high display quality.

An insulator 720 is provided over the transistor 741 and the capacitor 742. Here, an insulator 709 and the insulator 710 may have openings reaching the conductors 707a and 707b that function as the source electrode or the drain electrode of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 104A:
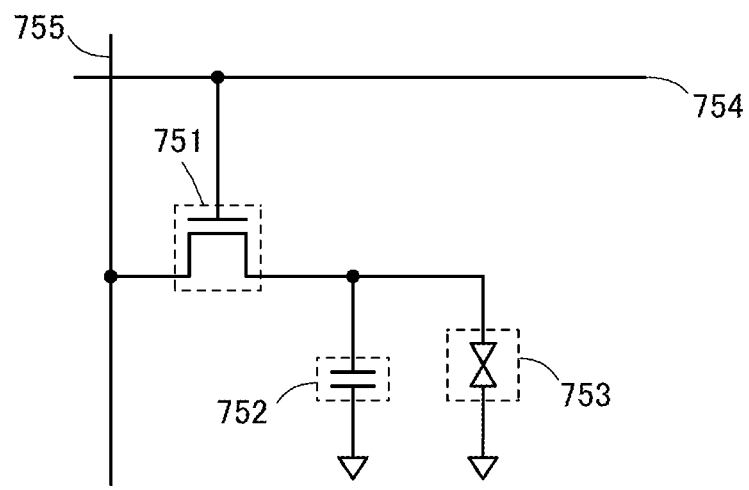
FIGS. 104A and 104B are a circuit diagram and a cross-sectional view illustrating a semiconductor device of one embodiment of the present invention.

FIG. 104A is a circuit diagram illustrating a configuration example of a pixel of a liquid crystal display device. A pixel shown in FIGS. 104A and 104B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 104B:
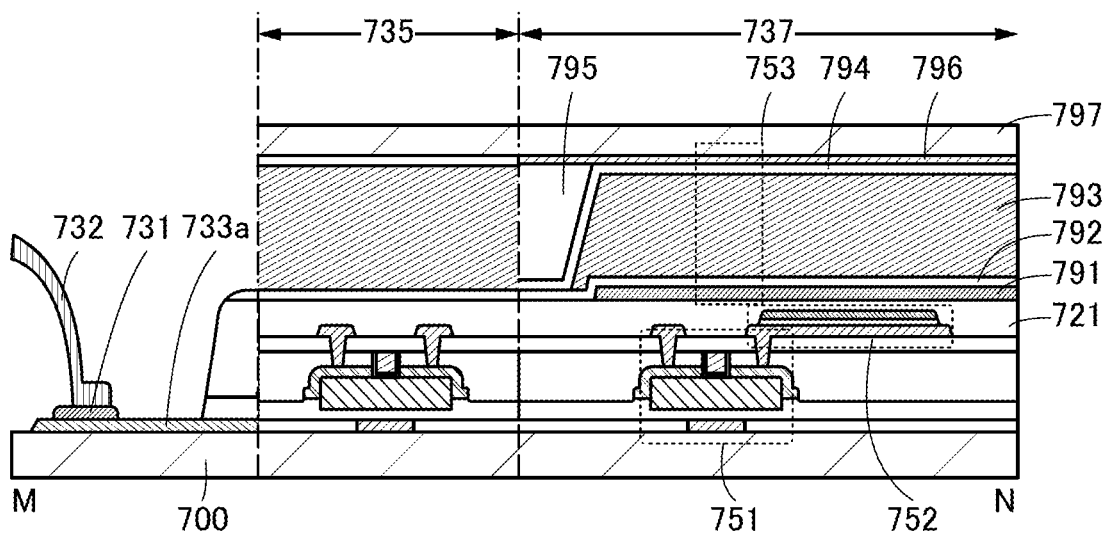

Note that the description of the liquid crystal display device is made on the assumption that the plan view of the liquid crystal display device is similar to that of the EL display device. FIG. 104B is a cross-sectional view of the liquid crystal display device taken along dashed-dotted line M-N in FIG. 103B. In FIG. 104B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 104B corresponds to, but is not limited to, the structure of the capacitor 742 in FIG. 103C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 13

In this embodiment, electronic devices each including the transistor or the like of one embodiment of the present invention are described.
<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 105A to 105F illustrate specific examples of these electronic devices.

Figure 105A:
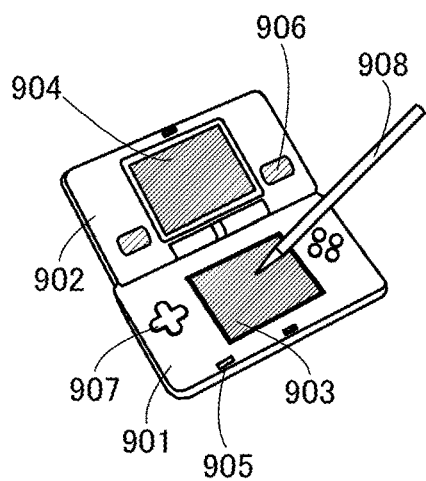
FIGS. 105A to 105F are perspective views illustrating electronic devices of one embodiment of the present invention.

FIG. 105A illustrates a portable game console including a housing 901, a housing 902, a display portion 903, a display portion 904, a microphone 905, a speaker 906, an operation key 907, a stylus 908, and the like. Although the portable game console in FIG. 105A has the two display portions 903 and 904, the number of display portions included in a portable game console is not limited to this.

Figure 105B:
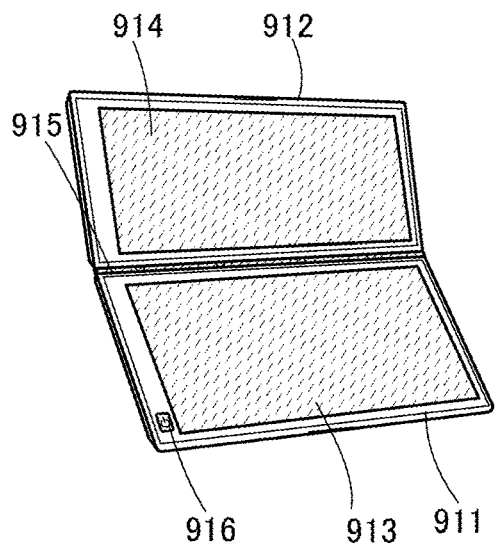

FIG. 105B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 105C:
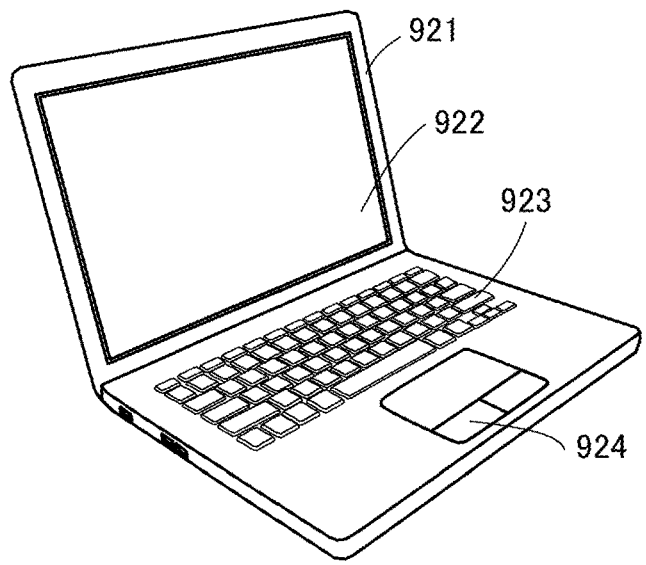

FIG. 105C illustrates a notebook personal computer, which includes a housing 921, a display portion 922, a keyboard 923, a pointing device 924, and the like.

Figure 105D:
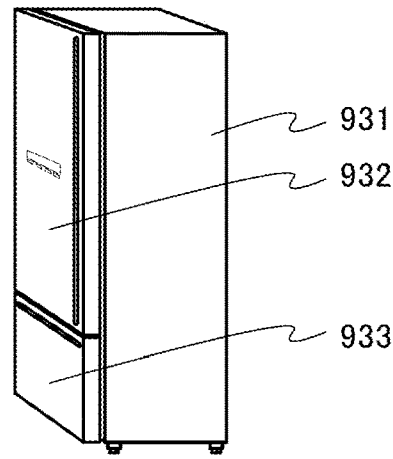

FIG. 105D illustrates an electric refrigerator-freezer, which includes a housing 931, a door for a refrigerator 932, a door for a freezer 933, and the like.

Figure 105E:
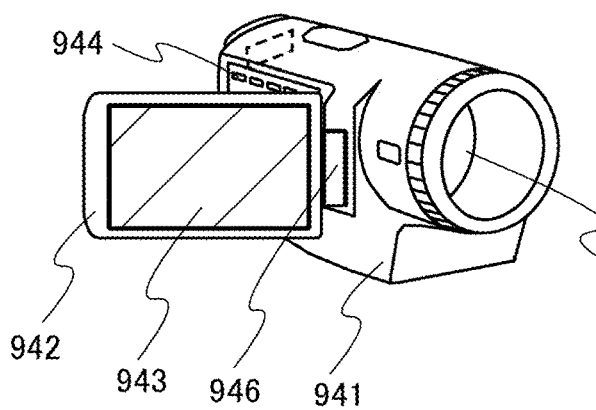

FIG. 105E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 105F:
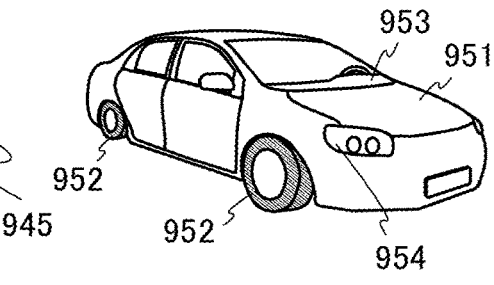

FIG. 105F illustrates a car including a car body 951, wheels 952, a dashboard 953, lights 954, and the like.

The structures described in this embodiment can be used in appropriate combination with any of the structures described in the other embodiments.

This application is based on Japanese Patent Application serial no. 2015-143858 filed with Japan Patent Office on Jul. 21, 2015, the entire contents of which are hereby incorporated by reference.

What is claimed is:

1. A method for manufacturing a semiconductor device comprising steps of:
   forming a first insulator over a substrate;
   forming an opening in the first insulator;
   forming a first oxide semiconductor along an inner wall of the opening;
   forming a second insulator in the opening;
   removing part of the first oxide semiconductor, part of the first insulator, and part of the second insulator to form a second oxide semiconductor having an island shape with two side surfaces exposed and a third oxide semiconductor having an island shape with two side surfaces exposed;
   removing part of the first insulator, and part of the second insulator to expose other two side surfaces of the second oxide semiconductor and other two side surfaces of the third oxide semiconductor so as to form a fourth oxide semiconductor and a fifth oxide semiconductor;

forming a first conductor over the fourth oxide semiconductor and a second conductor over the fifth oxide semiconductor;

forming a third insulator over the first conductor, and the second conductor;

removing part of the third insulator and part of the first conductor so as to expose part of the fourth oxide semiconductor and to form a third conductor and a fourth conductor, removing another part of the third insulator and part of the second conductor so as to expose part of the fifth oxide semiconductor and to form a fifth conductor and a sixth conductor;

forming a fourth insulator over the fourth oxide semiconductor and the fifth oxide semiconductor; and forming a seventh conductor over the fourth insulator.

2. A method for manufacturing a semiconductor device comprising steps of:

forming a first insulator over a substrate;

forming an opening in the first insulator;

forming a first oxide semiconductor along an inner wall of the opening;

removing part of the first oxide semiconductor to form a second oxide semiconductor having a ring shape;

forming a second insulator over the second oxide semiconductor;

removing part of the second oxide semiconductor, part of the first insulator, and part of the second insulator to form a third oxide semiconductor having an island shape with two side surfaces exposed and a fourth oxide semiconductor having an island shape with two side surfaces exposed;

removing part of the first insulator and part of the second insulator to expose other two side surfaces of the third oxide semiconductor and other two side surfaces of the fourth oxide semiconductor so as to form a fifth oxide semiconductor and sixth oxide semiconductor;

forming a first conductor over the fifth oxide semiconductor and a second conductor over the sixth oxide semiconductor;

forming a third insulator over the first conductor;

removing part of the third insulator and part of the first conductor so as to expose part of the fifth oxide semiconductor and to form a third conductor and a fourth conductor, removing another part of the third insulator and part of the second conductor so as to expose part of the sixth oxide semiconductor and to form a fifth conductor and a sixth conductor;

forming a fourth insulator over the fifth oxide semiconductor and the sixth oxide semiconductor; and forming a seventh conductor over the fourth insulator.

* * * * *